(12) United States Patent
Kim et al.

(10) Patent No.: US 12,225,818 B2
(45) Date of Patent: Feb. 11, 2025

(54) ORGANIC LIGHT-EMITTING DEVICE

(71) Applicant: LG CHEM, LTD., Seoul (KR)

(72) Inventors: Joo Ho Kim, Daejeon (KR); Ji Young Choi, Daejeon (KR); Woochul Lee, Daejeon (KR); Dong Hoon Lee, Daejeon (KR); Dongheon Kim, Daejeon (KR); Sang Duk Suh, Daejeon (KR); Hyungjin Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 710 days.

(21) Appl. No.: 16/969,513

(22) PCT Filed: Jun. 11, 2019

(86) PCT No.: PCT/KR2019/006998
§ 371 (c)(1),
(2) Date: Aug. 12, 2020

(87) PCT Pub. No.: WO2019/240462
PCT Pub. Date: Dec. 19, 2019

(65) Prior Publication Data
US 2020/0411771 A1 Dec. 31, 2020

(30) Foreign Application Priority Data
Jun. 11, 2018 (KR) .................. 10-2018-0066876

(51) Int. Cl.
H10K 85/60 (2023.01)
H10K 50/11 (2023.01)
H10K 101/00 (2023.01)

(52) U.S. Cl.
CPC ....... *H10K 85/6574* (2023.02); *H10K 85/615* (2023.02); *H10K 85/626* (2023.02);
(Continued)

(58) Field of Classification Search
None
See application file for complete search history.

(56) References Cited

U.S. PATENT DOCUMENTS

2004/0251816 A1  12/2004  Leo et al.
2007/0205412 A1   9/2007  Bae et al.
(Continued)

FOREIGN PATENT DOCUMENTS

CN   105399658 A      3/2016
CN   106467553 A  *   3/2017  ............... C07F 5/02
(Continued)

OTHER PUBLICATIONS

Huang, J. and Li, Y., 2018. BN embedded polycyclic π-conjugated systems: Synthesis, optoelectronic properties, and photovoltaic applications. Frontiers in chemistry, 6, p. 341. (Year: 2018).*
(Continued)

*Primary Examiner* — Dawn L Garrett
(74) *Attorney, Agent, or Firm* — BRYAN CAVE LEIGHTON PAISNER LLP

(57) ABSTRACT

An organic light emitting device including a first electrode, a second electrode, and a light emitting layer provided between the first electrode and the second electrode, wherein the light emitting layer includes a compound of Chemical Formula 1, a compound of Chemical Formula 2 and a compound of Chemical Formula 3.

19 Claims, 2 Drawing Sheets

(52) U.S. Cl.
CPC ......... *H10K 85/631* (2023.02); *H10K 85/656* (2023.02); *H10K 85/6572* (2023.02); *H10K 85/658* (2023.02); *H10K 50/11* (2023.02); *H10K 2101/90* (2023.02)

(56) References Cited

U.S. PATENT DOCUMENTS

| | | | |
|---|---|---|---|
| 2009/0295275 A1* | 12/2009 | Parham | C09B 19/00 977/754 |
| 2016/0072079 A1 | 3/2016 | Cho et al. | |
| 2017/0222158 A1 | 8/2017 | Jung et al. | |
| 2018/0069182 A1 | 3/2018 | Hatakeyama et al. | |
| 2018/0094000 A1 | 4/2018 | Hatakeyama et al. | |
| 2018/0287068 A1 | 10/2018 | Ha et al. | |
| 2018/0301629 A1 | 10/2018 | Hatakeyama et al. | |
| 2019/0058124 A1* | 2/2019 | Hatakeyama | C09K 11/06 |
| 2019/0115538 A1 | 4/2019 | Lim et al. | |
| 2019/0148650 A1 | 5/2019 | Kwak et al. | |
| 2019/0152919 A1 | 5/2019 | Cha et al. | |
| 2019/0207112 A1 | 7/2019 | Hatakeyama et al. | |
| 2019/0326518 A1 | 10/2019 | Lui et al. | |
| 2019/0393419 A1* | 12/2019 | Hatakeyama | H10K 85/631 |
| 2020/0266350 A1* | 8/2020 | Hatakeyama | G09F 9/30 |

FOREIGN PATENT DOCUMENTS

| | | |
|---|---|---|
| CN | 107155330 A | 9/2017 |
| CN | 107851724 A | 3/2018 |
| CN | 108137527 A | 6/2018 |
| EP | 3109253 A1 | 12/2016 |
| JP | 2018-043984 | 3/2018 |
| KR | 10-2007-0091540 | 9/2007 |
| KR | 10-2016-0050614 | 5/2016 |
| KR | 10-2017-0130434 | 11/2017 |
| KR | 10-2017-0130435 | 11/2017 |
| KR | 10-2018-0028948 | 3/2018 |
| KR | 10-2018-0058472 A | 6/2018 |
| KR | 10-2019-0042791 | 4/2019 |
| WO | 2003-012890 | 2/2003 |
| WO | 2015-102118 | 7/2015 |
| WO | 2017-188111 | 11/2017 |
| WO | 2017/204594 A1 | 11/2017 |

OTHER PUBLICATIONS

Hirai et al., Chemical Reviews, (2019), vol. 119, pp. 8291-8331 (Year: 2019).*

Lee, Hyun Woo, et al. "Blue emitting materials containing dibenzo [b, d] furan and dibenzo [b, d] thiophene for organic light-emitting diodes." Japanese Journal of Applied Physics 55.6S1 (2016): 06GK07. (Year: 2016).*

Machine translation for CN-106467553-A (publication date: Mar. 2017). (Year: 2017).*

Szcs, R., Bouit, P. A., Nyulászi, L., & Hissler, M. (2017). Phosphorus-Containing Polycyclic Aromatic Hydrocarbons. ChemPhysChem, 18(19), 2618-2630. (Year: 2017).*

\* cited by examiner

[FIG. 1]
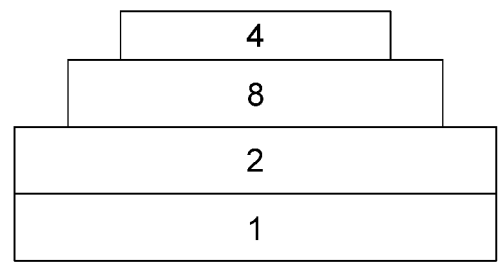
[FIG. 2]
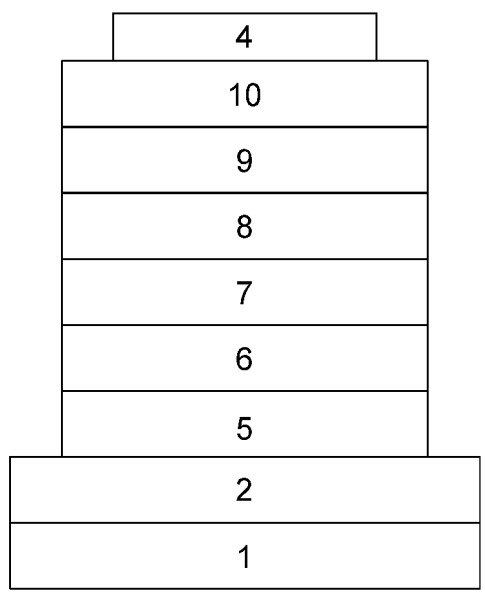

【FIG. 3】
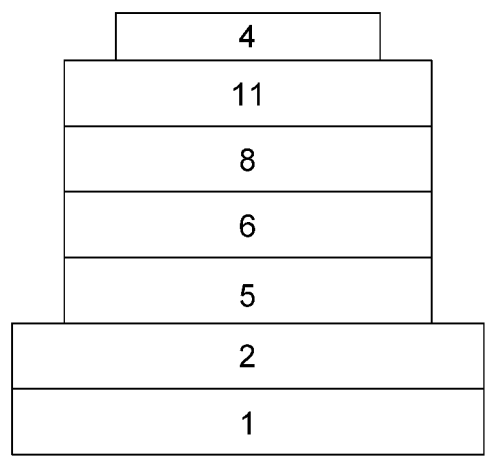

ORGANIC LIGHT-EMITTING DEVICE

This application is a National Stage Application of International Application No. PCT/KR2019/006998 filed on Jun. 11, 2019, which claims priority to and the benefit of Korean Patent Application No. 10-2018-0066876 filed in the Korean Intellectual Property Office on Jun. 11, 2018, the entire contents of which are incorporated herein by reference.

TECHNICAL FIELD

The present disclosure provides an organic light emitting device including a first electrode, a second electrode, and a light emitting layer provided between the first electrode and the second electrode, wherein the light emitting layer includes a compound of Chemical Formula 1, a compound of Chemical Formula 2 and a compound of Chemical Formula 3.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is formed in a multilayer structure formed with different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

PRIOR ART DOCUMENTS

Patent Documents

Korean Patent Application Laid-Open Publication No. 10-2007-0091540

Technical Problem

The present specification is directed to providing an organic light emitting device having, by including all of a compound of Chemical Formula 1, a compound of Chemical Formula 2 and a compound of Chemical Formula 3 in a light emitting layer, a low driving voltage, high light emission efficiency or favorable lifetime properties.

Technical Solution

One embodiment of the present specification provides an organic light emitting device including a first electrode, a second electrode, and a light emitting layer provided between the first electrode and the second electrode, wherein the light emitting layer includes a compound of the following Chemical Formula 1, a compound of the following Chemical Formula 2 and a compound of the following Chemical Formula 3.

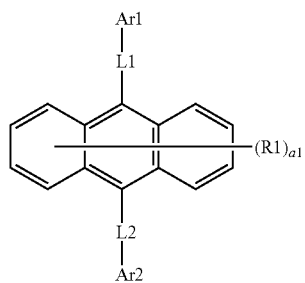

Chemical Formula 1

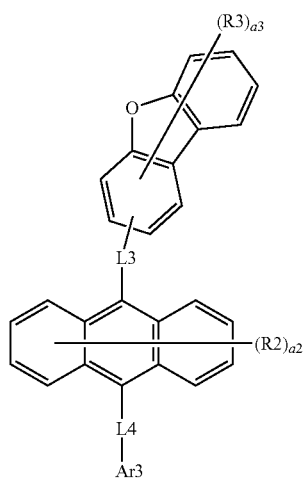

Chemical Formula 2

In Chemical Formulae 1 and 2,

L1 to L4 are the same as or different from each other, and each independently a direct bond; or a substituted or unsubstituted arylene group, Ar1 and Ar2 are the same as or different from each other, and each independently a substituted or unsubstituted aryl group, Ar3 is a substituted or unsubstituted aryl group; or a substituted or unsubstituted heteroaryl group, $R_1$ to $R_3$ are the same as or different from each other, and each independently hydrogen; deuterium; a halogen group; a cyano group; a silyl group; an alkyl group; an alkenyl group; an alkynyl group; an alkoxy group; an aryloxy group; an amino group; an aryl group; or a heteroaryl group, and a1 and a2 are each independently an integer of 0 to 8, a3 is an integer of 0 to 7, and when a1 is 2 or greater, R1s are the same as or different from each other, when a2 is 2 or greater, R2s are the same as or different from each other, and when a3 is 2 or greater, R3s are the same as or different from each other,

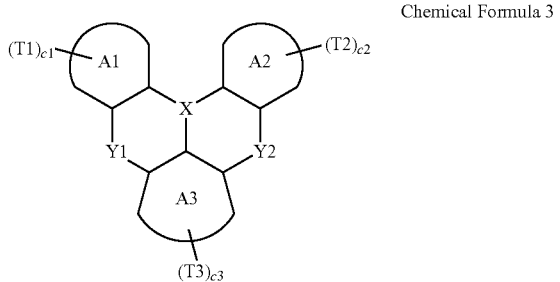

Chemical Formula 3 in Chemical Formula 3,

X is B, P=O or P=S,

A1 to A3 are the same as or different from each other, and each independently monocyclic or polycyclic ring, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; —SiR$_{46}$R$_{47}$R$_{48}$; or —NR$_{41}$R$_{42}$, or bond to adjacent groups to form a substituted or unsubstituted ring, R$_{41}$ and R$_{42}$ are the same as or different from each other and each independently hydrogen; an alkyl group; a cycloalkyl group; an aryl group unsubstituted or substituted with an alkyl group or a silyl group; or a heteroaryl group, and R$_{46}$ to R$_{48}$ are the same as or different from each other and each independently hydrogen; deuterium; an alkyl group; a cycloalkyl group; or an aryl group, Y1 is O or NR$_{11}$, and Y2 is O or NR$_{12}$, R$_{11}$ and R$_{12}$ are the same as or different from each other, and each independently hydrogen; deuterium; an alkyl group; a cycloalkyl group; or an aryl group unsubstituted or substituted with an alkyl group, an arylalkyl group or an aryl group, or bond to adjacent groups to form a substituted or unsubstituted ring, and c1 to c3 are each independently an integer of 0 or greater, and when c1 is 2 or greater, T1s are the same as or different from each other, when c2 is 2 or greater, T2s are the same as or different from each other, and when c3 is 2 or greater, T3s are the same as or different from each other.

Advantageous Effects

A compound of Chemical Formula 1 and a compound of Chemical Formula 2 described in the present specification are used as a host of a light emitting layer, and a compound of Chemical Formula 3 is used as a dopant of the light emitting layer.

In some embodiments, an organic light emitting device including the compound of the present disclosure can have enhanced efficiency.

In some embodiments, an organic light emitting device including the compound of the present disclosure can have a lowered driving voltage.

In some embodiments, an organic light emitting device including the compound of the present disclosure can have enhanced lifetime properties.

BRIEF DESCRIPTION OF THE DRAWINGS

FIG. 1 illustrates an example of an organic light emitting device formed with a substrate (1), an anode (2), a light emitting layer (8) and a cathode (4).

FIG. 2 illustrates an example of an organic light emitting device formed with a substrate (1), an anode (2), a hole injection layer (5), a hole transfer layer (6), a hole control layer (7), a light emitting layer (8), an electron transfer layer (9), an electron injection layer (10) and a cathode (4).

FIG. 3 illustrates an example of an organic light emitting device formed with a substrate (1), an anode (2), a hole injection layer (5), a hole transfer layer (6), a light emitting layer (8), an electron injection and transfer layer (11) and a cathode (4).

REFERENCE NUMERAL

1: Substrate
2: Anode
4: Cathode
5: Hole Injection Layer
6: Hole Transfer Layer
7: Hole Control Layer
8: Light Emitting Layer
9: Electron Transfer Layer
10: Electron Injection Layer
11: Electron Injection and Transfer Layer

DETAILED DESCRIPTION

Hereinafter, the present disclosure will be described in more detail.

In the present specification,

means a site bonding to other substituents or bonding sites.

In one embodiment of the present specification, the term "substitution" means a hydrogen atom bonding to a carbon atom of a compound is changed to another substituent. The position of substitution is not limited as long as it is a position at which a hydrogen atom is substituted, that is, a position at which a substituent may substitute. When there are two or more substituents, the two or more substituents may be the same as or different from each other.

In the present specification, the term "substituted or unsubstituted" means being substituted with one or more substituents selected from the group consisting of deuterium; a hydroxyl group; an alkyl group; an alkenyl group; an alkynyl group; a halogen group; a silyl group; an alkoxy group; an aryloxy group; an aryl group; and a heteroaryl group, or being substituted with a substituent linking two or more substituents of the substituents, or having no substituents.

Examples of the substituents in the present specification will be described below, however, the substituents are not limited thereto.

In the present specification, examples of the halogen group include fluorine, chlorine, bromine or iodine.

In the present specification, the silyl group may be a chemical formula of —SiRxRyRz, and Rx, Ry and Rz are each independently hydrogen; a substituted or unsubstituted alkyl group; or a substituted or unsubstituted aryl group. In one embodiment, Rx, Ry and Rz are each independently hydrogen; an alkyl group; or an aryl group. In one embodiment, Rx, Ry and Rz are each independently hydrogen; a C1-C6 alkyl group; or a C6-C18 aryl group. In one embodiment, Rx, Ry and Rz are each independently hydrogen; a C1-C4 alkyl group; or a C6-C12 aryl group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the alkyl group means linear or branched saturated hydrocarbon. According to one embodiment, the number of carbon atoms of the alkyl group is from 1 to 20. According to another embodiment, the number of carbon atoms of the alkyl group is from 1 to 10. According to another embodiment, the number of carbon atoms of the alkyl group is from 1 to 6. Specific examples of the alkyl group may include methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methylpentyl, 3,3-dimethylbutyl, 2-ethylbutyl, heptyl, n-heptyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, 5-methylhexyl and the like, but are not limited thereto.

In the present specification, the cycloalkyl group means linear or branched cyclic saturated hydrocarbon. In the present specification, the number of carbon atoms of the cycloalkyl group is not particularly limited, but is preferably from 3 to 40. According to one embodiment, the number of carbon atoms of the cycloalkyl group is from 3 to 24. According to another embodiment, the number of carbon atoms of the cycloalkyl group is from 3 to 14. According to another embodiment, the number of carbon atoms of the cycloalkyl group is from 3 to 8. Specific examples of the cycloalkyl group may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the alkenyl group represents a hydrocarbon group having a carbon-carbon double bond, and although not particularly limited thereto, the number of carbon atoms is preferably from 2 to 30. According to one embodiment, the number of carbon atoms of the alkenyl group is from 2 to 20. According to one embodiment, the number of carbon atoms of the alkenyl group is from 2 to 10. Specific examples of the alkenyl group may include ethenyl, vinyl, propenyl, allyl, isopropenyl, butenyl, isobutenyl, n-pentenyl and n-hexenyl, but are not limited thereto.

In the present specification, the alkynyl group represents a hydrocarbon group having a carbon-carbon triple bond, and although not particularly limited thereto, the number of carbon atoms is preferably from 2 to 30. According to one embodiment, the number of carbon atoms of alkynyl group is from 2 to 20. According to one embodiment, the number of carbon atoms of alkynyl group is from 2 to 10. Specific examples of the alkynyl group may include ethynyl, 2-propynyl, 2-butynyl, 2-pentynyl and the like, but are not limited thereto.

In the present specification, the alkoxy group means a group in which an alkyl group bonds to an oxygen atom, and although not particularly limited thereto, the number of carbon atoms is preferably from 1 to 20. According to one embodiment, the number of carbon atoms of the alkoxy group is from 1 to 10. According to another embodiment, the number of carbon atoms of the alkoxy group is from 1 to 6. Specific examples of the alkoxy group may include a methoxy group, an ethoxy group, a propoxy group, an isobutyloxy group, a sec-butyloxy group, a pentyloxy group, an iso-amyloxy group, a hexyloxy group and the like, but are not limited thereto.

In the present specification, the aryloxy group means a group in which an aryl group bonds to an oxygen atom. For the aryl group in the aryloxy group, descriptions on the following aryl group may be used.

In the present specification, the aryl group means a totally or partially unsaturated substituted or unsubstituted monocyclic or polycyclic. According to one embodiment, the number of carbon atoms of the aryl group is from 6 to 40. According to one embodiment, the number of carbon atoms of the aryl group is from 6 to 30. According to one embodiment, the number of carbon atoms of the aryl group is from 6 to 25. The aryl group may be a monocyclic aryl group or a polycyclic aryl group. Examples of the monocyclic aryl group may include a phenyl group, a biphenyl group, a terphenyl group and the like, but are not limited thereto. Examples of the polycyclic aryl group may include a naphthyl group, an anthracenyl group, a phenanthrenyl group, a perylenyl group, a fluoranthenyl group, a triphenylenyl group, a phenalenyl group, a pyrenyl group, a tetracenyl group, a chrysenyl group, a pentacenyl group, a fluorenyl group, an indenyl group, an acenaphthylenyl group, a benzofluorenyl group, a spirofluorenyl group and the like, but are not limited thereto.

In the present specification, the fluorenyl group may be substituted, and two substituents may bond to each other to form a spiro structure.

The substituted fluorenyl group may be, for example, any one selected from among the following structures, but is not limited thereto.

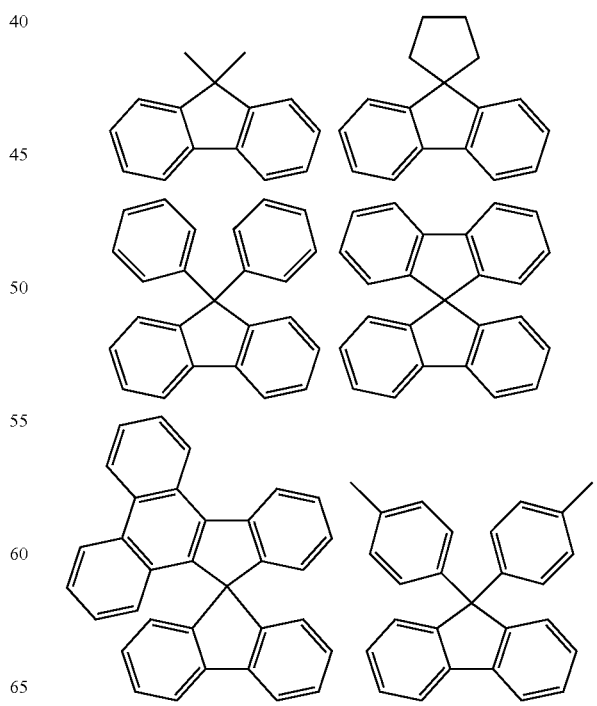

-continued

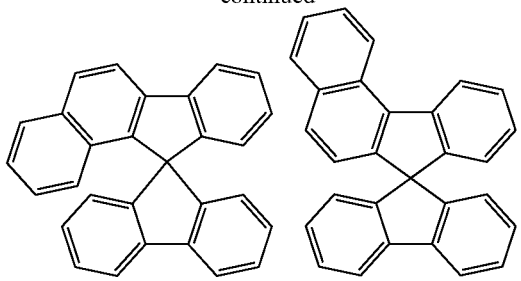

In the present specification, the heteroaryl group is a cyclic group including one or more of N, O, S and Se as a heteroatom, and although not particularly limited thereto, the number of carbon atoms is preferably from 2 to 40. According to one embodiment, the number of carbon atoms of the heteroaryl group is from 2 to 30. According to another embodiment, the number of carbon atoms of the heteroaryl group is from 2 to 20. Examples of the heteroaryl group may include a thiophenyl group, furanyl group, a pyrrolyl group, an imidazolyl group, a thiazolyl group, an oxazolyl group, an oxadiazolyl group, a triazolyl group, a pyridinyl group, a bipyridinyl group, a pyrimidinyl group, a triazinyl group, an acridinyl group, a carbolinyl group, an acenaphthoquinoxalinyl group, an indenoquinazolinyl group, an indenoisoquinolinyl group, an indenoquinolinyl group, a pyridoindolyl group, a pyridazinyl group, a pyrazinyl group, a quinolinyl group, a quinazolinyl group, a quinoxalinyl group, a phthalazinyl group, a pyridopyrimidinyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophenyl group, a dibenzothiophenyl group, a benzofuranyl group, a phenanthrolinyl group, an isoxazolyl group, a thiadiazolyl group, a phenoxazinyl group, a phenothiazinyl group, a dibenzoselenophenyl group, a dibenzofuranyl group and the like, but are not limited thereto.

In the present specification, the alkylaryl group means an aryl group substituted with an alkyl group.

In the present specification, the arylalkyl group means an alkyl group substituted with an aryl group.

In the present specification, an "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

In the present specification, bonding to adjacent groups to form a ring means bonding to adjacent groups to form a substituted or unsubstituted aliphatic hydrocarbon ring; a substituted or unsubstituted aromatic hydrocarbon ring; a substituted or unsubstituted aliphatic heteroring, a substituted or unsubstituted aromatic heteroring; or a fused ring thereof. The hydrocarbon ring means a ring formed only with carbon and hydrogen atoms, and the hydrocarbon ring may be an aliphatic hydrocarbon ring or an aromatic hydrocarbon ring. The heteroring means a ring including one or more of heteroatoms, and the heteroring may be an aliphatic heteroring or an aromatic heteroring. In the present specification, the aliphatic hydrocarbon ring, the aromatic hydrocarbon ring, the aliphatic heteroring and the aromatic heteroring may be monocyclic or polycyclic.

The aliphatic hydrocarbon ring means, as a ring that is not aromatic, a ring formed only with carbon and hydrogen atoms. Examples of the aliphatic hydrocarbon ring may include cyclopropane, cyclobutane, cyclobutene, cyclopentane, cyclopentene, cyclohexane, cyclohexene, 1,4-cyclohexadiene, cycloheptane, cycloheptene, cyclooctane, cyclooctene and the like, but are not limited thereto.

The aromatic hydrocarbon ring means an aromatic ring formed only with carbon and hydrogen atoms. Examples of the aromatic hydrocarbon ring may include benzene, naphthalene, anthracene, phenanthrene, perylene, fluoranthene, triphenylene, phenalene, pyrene, tetracene, chrysene, pentacene, fluorene, indene, acenaphthylene, benzofluorene, spirofluorene and the like, but are not limited thereto.

The aliphatic heteroring means an aliphatic ring including one or more of heteroatoms. Examples of the aliphatic heteroring may include oxirane, tetrahydrofuran, 1,4-dioxane, pyrrolidine, piperidine, morpholine, oxepane, azokane, thiokane and the like, but are not limited thereto.

The aromatic heteroring means an aromatic ring including one or more of heteroatoms. Examples of the aromatic heteroring may include pyridine, pyrrole, pyrimidine, pyridazine, furan, thiophene, imidazole, parazole, oxazole, isoxazole, thiazole, isothiazole, triazole, oxadiazole, thiadiazole, dithiazole, tetrazole, pyran, thiopyran, diazine, oxazine, thiazine, dioxin, triazine, tetrazine, isoquinoline, quinoline, quinazoline, quinoxaline, naphthyridine, acridine, phenanthridine, diazanaphthalene, triazaindene, indole, indolizine, benzothiazole, benzoxazole, benzimidazole, benzothiophene, benzofuran, dibenzothiophene, dibenzofuran, dibenzoselenophene, carbazole, benzocarbazole, dibenzocarbazole, phenazine, imidazopyridine, phenoxazine, phenanthridine, indolocarbazole, indenocarbazole and the like, but are not limited thereto.

Hereinafter, various embodiments of the present disclosure will be described in more detail.

According to one embodiment of the present specification, the compound of Chemical Formula 3 includes rings of A1 to A3 around X, and two or more rings of A1 to A3 form a ring with adjacent groups transferring electrons to electron-deficient X, and obtaining a stabilized form. In addition, the compound of Chemical Formula 3 has a light emission spectrum with a narrow full width at half maximum, and an organic light emitting device including the compound in a light emitting layer has high light emission efficiency and excellent color gamut.

When using the compounds of Chemical Formula 1 and Chemical Formula 2 as a host, an energy level of the light emitting layer is readily controlled compared when using each of the compounds as a single material, and electrons and holes in the light emitting layer readily migrate due to a difference in the polarity of the compounds, and as a result, effects of obtaining low voltage driving and enhancing a lifetime are obtained compared to when using a single material as a host material.

In the light emitting layer of the organic light emitting device of the present disclosure, the compound of Chemical Formula 1 and the compound of Chemical Formula 2 are used as a host material, and the compound of Chemical Formula 3 is used as a dopant material. Since light emission wavelengths of the compound of Chemical Formula 1 and the compound of Chemical Formula 2 overlap with an absorption wavelength of the compound of Chemical Formula 3, energy transfer between the compounds may be smooth, and a device including the light emitting layer formed with the compounds of Chemical Formulae 1 to 3 may emit light with high efficiency.

One embodiment of the present specification provides an organic light emitting device including a first electrode, a second electrode, and a light emitting layer provided between the first electrode and the second electrode, wherein the light emitting layer includes a compound of Chemical Formula 1, a compound of Chemical Formula 2 and a compound of Chemical Formula 3.

In one embodiment of the present specification, L1 to L4 are the same as or different from each other, and each independently a direct bond; or an arylene group.

In one embodiment of the present specification, L1 to L4 are the same as or different from each other, and each independently a direct bond; or a C6 to C20 arylene group.

When L1 to L4 are an arylene group having more than 20 carbon atoms, it is difficult to form a deposited device due to an increase in the molecular weight of the compound, and therefore, the arylene group of L1 to L4 preferably has 20 or less carbon atoms.

In one embodiment of the present specification, L1 to L4 are the same as or different from each other, and each independently a direct bond; or a C6 to C16 arylene group.

In one embodiment of the present specification, L1 to L4 are the same as or different from each other, and each independently a direct bond; or a C6 to C12 arylene group.

In one embodiment of the present specification, L1 to L4 are the same as or different from each other, and each independently a direct bond; a phenylene group; a biphenylene group; or a naphthalene group.

In the present specification, the naphthalene group means a divalent naphthyl group.

In one embodiment of the present specification, Ar1 and Ar2 are the same as or different from each other, and each independently a C6 to C24 aryl group.

In one embodiment of the present specification, Ar1 and Ar2 are the same as or different from each other, and each independently a C6 to C22 aryl group.

In one embodiment of the present specification, Ar1 and Ar2 are the same as or different from each other, and each independently a C6 to C18 aryl group.

In one embodiment of the present specification, Ar1 and Ar2 are the same as or different from each other, and each independently a phenyl group; a biphenyl group; a terphenyl group; or a naphthyl group.

In one embodiment of the present specification, Ar3 is a substituted or unsubstituted C6 to C26 aryl group; or a substituted or unsubstituted C2 to C20 heteroaryl group.

In one embodiment of the present specification, Ar3 is a substituted or unsubstituted C6 to C22 aryl group; or a substituted or unsubstituted C2 to C16 heteroaryl group.

In one embodiment of the present specification, Ar3 is a substituted or unsubstituted C6 to C18 aryl group; or a substituted or unsubstituted C2 to C12 heteroaryl group.

In one embodiment of the present specification, Ar3 is an aryl group unsubstituted or substituted with an aryl group; or a heteroaryl group unsubstituted or substituted with an aryl group.

In one embodiment of the present specification, Ar3 is an aryl group unsubstituted or substituted with a C6 to C18 aryl group; or a heteroaryl group unsubstituted or substituted with a C6 to 12 aryl group.

In one embodiment of the present specification, Ar3 is a C6 to C18 aryl group unsubstituted or substituted with a C6 to C18 aryl group; or a C2 to C12 heteroaryl group unsubstituted or substituted with a C6 to 12 aryl group.

In one embodiment of the present specification, Ar3 is a substituted or unsubstituted phenyl group; a substituted or unsubstituted biphenyl group; a substituted or unsubstituted terphenyl group; a substituted or unsubstituted naphthyl group; a substituted or unsubstituted phenanthrenyl group; a substituted or unsubstituted triphenylenyl group; a substituted or unsubstituted fluoranthenyl group; a substituted or unsubstituted pyrenyl group; a substituted or unsubstituted dibenzofuranyl group; a substituted or unsubstituted dibenzothiophenyl group; or a substituted or unsubstituted carbazolyl group.

In one embodiment of the present specification, Ar3 is a phenyl group unsubstituted or substituted with an aryl group; a biphenyl group unsubstituted or substituted with an aryl group; a terphenyl group; a naphthyl group unsubstituted or substituted with an aryl group; a phenanthrenyl group; a triphenylenyl group; a fluoranthenyl group; a pyrenyl group; a dibenzofuranyl group; a dibenzothiophenyl group; or a carbazolyl group unsubstituted or substituted with an aryl group.

In one embodiment of the present specification, Ar3 is a phenyl group unsubstituted or substituted with a phenyl group, a naphthyl group, a phenanthrenyl group, a triphenylenyl group, a fluoranthenyl group or a pyrenyl group; a naphthyl group unsubstituted or substituted with a phenyl group or a naphthyl group; a biphenyl group; a terphenyl group; a phenanthrenyl group; a triphenylenyl group; a fluoranthenyl group; a pyrenyl group; a dibenzofuranyl group; a dibenzothiophenyl group; or a carbazolyl group substituted with a phenyl group.

In one embodiment of the present specification, $R_1$ to $R_3$ are the same as or different from each other, and each independently hydrogen; deuterium; or an aryl group.

In one embodiment of the present specification, $R_1$ is hydrogen.

In one embodiment of the present specification, $R_2$ is hydrogen.

In one embodiment of the present specification, $R_3$ is hydrogen or an aryl group.

In one embodiment of the present specification, $R_3$ is hydrogen or a phenyl group.

In one embodiment of the present specification, a1 is 0.
In one embodiment of the present specification, a2 is 0.
In one embodiment of the present specification, a3 is 0 or 1.

In one embodiment of the present specification, A1 to A3 are the same as or different from each other, and each independently a ring having 1 ring to 5 rings.

In one embodiment of the present specification, A1 to A3 are the same as or different from each other, and each independently a ring having 1 ring to 4 rings.

In one embodiment of the present specification, A1 to A3 are the same as or different from each other, and each independently a ring having 1 ring to 3 rings.

In one embodiment of the present specification, A1 to A3 are the same as or different from each other, and each independently a C2 to C6 monocyclic ring or a C6 to C26 polycyclic ring.

In one embodiment of the present specification, A1 to A3 are the same as or different from each other, and each independently a C2 to C6 monocyclic ring or a C6 to C22 polycyclic ring.

In one embodiment of the present specification, A1 to A3 are the same as or different from each other, and each independently a C2 to C6 monocyclic ring or a C6 to C18 polycyclic ring.

In one embodiment of the present specification, A1 to A3 are the same as or different from each other, and each independently a C4 to C6 monocyclic ring or a C9 to C12 polycyclic ring.

In one embodiment of the present specification, A1 to A3 are the same as or different from each other, and each independently benzene, naphthalene, triphenylene, 9,9'-spirobifluorene, dibenzofuran, dibenzothiophene, dibenzoselenophene, carbazole, indolocarbazole, naphthobenzofuran,

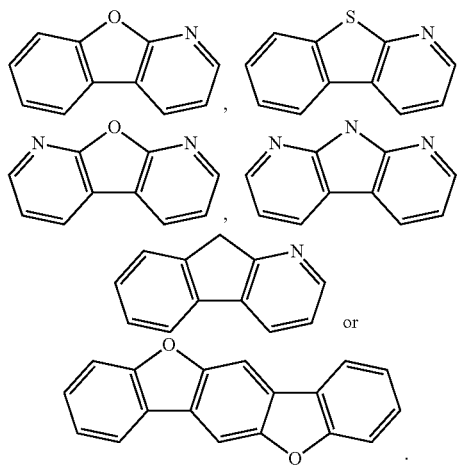

In one embodiment of the present specification, A1 to A3 are the same as or different from each other, and each independently benzene, naphthalene, dibenzofuran, dibenzothiophene or carbazole.

In one embodiment of the present specification, A1 to A3 are the same as or different from each other, and each independently benzene, naphthalene or dibenzofuran.

In one embodiment of the present specification, T1 to T3 are the same as or different from each other, and each independently hydrogen; deuterium; a hydroxyl group; a C1 to C15 alkyl group; a C3 to C12 cycloalkyl group; a C1 to C15 alkoxy group; a C6 to C25 aryloxy group; a C6 to C25 aryl group; a C2 to C24 heteroaryl group; —SiR$_{46}$R$_{47}$R$_{48}$; or —NR$_{41}$R$_{42}$, or bond to adjacent groups to form a substituted or unsubstituted C5 to C20 ring.

In the present specification, T1 to T3 bonding to adjacent groups to form a substituted or unsubstituted ring means a radical formed at a position where T1, T2 or T3 bonds to the core

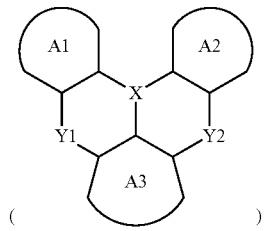

and a radical formed by T1, T2 or T3 and an adjacent group are connected by an organic group to form a ring. Herein, examples of the organic group may include a direct bond; —N(R$_{100}$)—; —C(R$_{101}$)(R$_{102}$)—; —Si(R$_{103}$)(R$_{104}$)— and the like, and R$_{100}$ to R$_{104}$ are the same as or different from each other and each independently hydrogen; an alkyl group; or an aryl group, or bond to adjacent groups to form a ring.

In the present specification, when describing a group adjacent to T2 as an example as groups adjacent to T1 to T3, (1) T2 bonding to α carbon and T1 bonding to ε carbon are adjacent groups to each other in the following ex.1, (2) T2' bonding to α carbon and T2" bonding to β carbon are adjacent groups to each other in the following ex.2, and (3) T2 bonding to α carbon and R$_{12}$ bonding to γ nitrogen are adjacent groups to each other in the following ex.3.

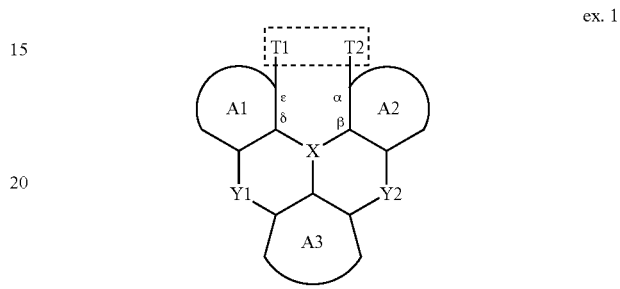
ex. 1

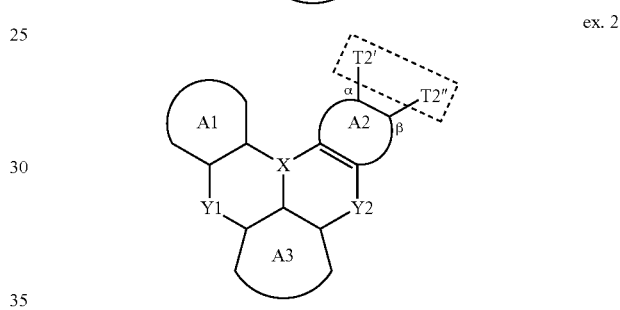
ex. 2

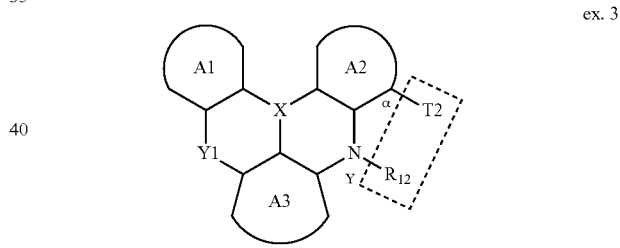
ex. 3

In the present specification, a certain substituent bonding to adjacent groups to form a ring may be, for example, accomplished in a manner of T1 and T2 bonding to form a ring in ex.1 as follows. Specifically, a ring may be formed in a manner of forming a ring by radicals (*) each formed at a site where T1 and T2 bond bonding to radicals of another organic group (for example—divalent fluorene).

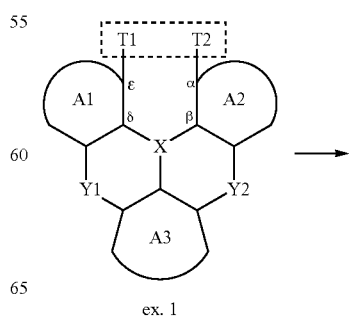
ex. 1

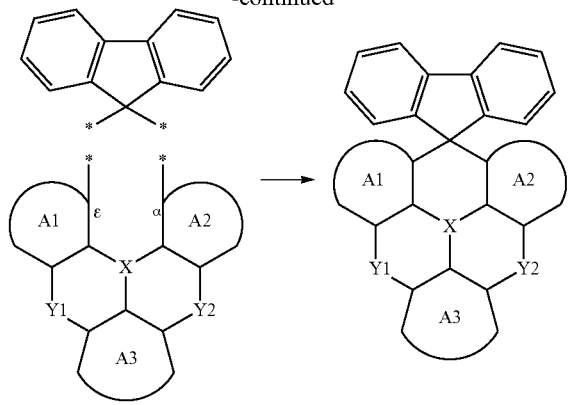

In one embodiment of the present specification, T1 to T3 are the same as or different from each other, and each independently hydrogen; deuterium; a hydroxyl group; a C1 to C10 alkyl group; a C3 to C10 cycloalkyl group; a C1 to C10 alkoxy group; a C6 to C22 aryloxy group; a C6 to C22 aryl group; a C2 to C20 heteroaryl group; —SiR$_{46}$R$_{47}$R$_{48}$; or —NR$_{41}$R$_{42}$, or bond to adjacent groups to form a substituted or unsubstituted C5 to C18 ring.

In one embodiment of the present specification, T1 to T3 are the same as or different from each other, and each independently hydrogen; deuterium; a hydroxyl group; a C1 to C6 alkyl group; a C3 to C8 cycloalkyl group; a C1 to C6 alkoxy group; a C6 to C18 aryloxy group; a C6 to C18 aryl group; a C2 to C18 heteroaryl group; —SiR$_{46}$R$_{47}$R$_{48}$; or —NR$_{41}$R$_{42}$, or bond to adjacent groups to form a substituted or unsubstituted C5 to C14 ring.

In one embodiment of the present specification, R$_{41}$ and R$_{42}$ are the same as or different from each other, and each independently hydrogen; a C1 to C20 alkyl group; a C3 to C12 cycloalkyl group; a C6 to C25 aryl group unsubstituted or substituted with a C1 to C10 alkyl group or a tri(C1 to C10 alkyl)silyl group; or a C2 to C24 heteroaryl group.

In one embodiment of the present specification, R$_{41}$ and R$_{42}$ are the same as or different from each other, and each independently hydrogen; a C1 to C10 alkyl group; a C3 to C10 cycloalkyl group; a C6 to C20 aryl group unsubstituted or substituted with a C1 to C6 alkyl group or a tri(C1 to C6 alkyl)silyl group; or a C2 to C18 heteroaryl group.

In one embodiment of the present specification, R$_{41}$ and R$_{42}$ are the same as or different from each other, and each independently hydrogen; a C1 to C6 alkyl group; a C3 to C8 cycloalkyl group; a C6 to C15 aryl group unsubstituted or substituted with a C1 to C6 alkyl group or a tri(C1 to C6 alkyl)silyl group; or a C2 to C12 heteroaryl group.

In one embodiment of the present specification, R$_{41}$ and R$_{42}$ are the same as or different from each other, and each independently an aryl group unsubstituted or substituted with an alkyl group or a silyl group.

In one embodiment of the present specification, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; an alkylamine group; an arylamine group; —SiR$_{46}$R$_{47}$R$_{48}$; or —NR$_{41}$R$_{42}$, or bond to adjacent groups to form a ring unsubstituted or substituted with deuterium, an alkyl group, a cycloalkyl group, an aryl group, a heteroaryl group or —NR$_{43}$R$_{44}$.

In one embodiment of the present specification, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; an alkylamine group; an arylamine group; —SiR$_{46}$R$_{47}$R$_{48}$; or —NR$_{41}$R$_{42}$, or bond to adjacent groups to form a ring unsubstituted or substituted with deuterium, a C1 to C10 alkyl group, a C3 to C10 cycloalkyl group, a C6 to C24 aryl group, a C2 to C20 heteroaryl group or —NR$_{43}$R$_{44}$.

In one embodiment of the present specification, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; an alkylamine group; an arylamine group; —SiR$_{46}$R$_{47}$R$_{48}$; or —NR$_{41}$R$_{42}$, or bond to adjacent groups to form a ring unsubstituted or substituted with deuterium, a C1 to C6 alkyl group, a C3 to C8 cycloalkyl group, a C6 to C18 aryl group, a C2 to C16 heteroaryl group or —NR$_{43}$R$_{44}$.

In one embodiment of the present specification, R$_{43}$ and R$_{44}$ are the same as or different from each other, and each independently hydrogen; a C1 to C15 alkyl group; a C1 to C10 cycloalkyl group; a C6 to C22 aryl group; or a C2 to C20 heteroaryl group.

In one embodiment of the present specification, R$_{43}$ and R$_{44}$ are the same as or different from each other, and each independently hydrogen; a C1 to C10 alkyl group; a C1 to C8 cycloalkyl group; a C6 to C20 aryl group; or a C2 to C18 heteroaryl group.

In one embodiment of the present specification, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; —SiR$_{4}$R$_{47}$R$_{48}$; or —NR$_{41}$R$_{42}$, or bond to adjacent groups to form a substituted or unsubstituted ring having 1 ring to 7 rings.

In one embodiment of the present specification, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; —SiR$_{46}$R$_{47}$R$_{48}$; or —NR$_{41}$R$_{42}$, or bond to adjacent groups to form a substituted or unsubstituted ring having 1 ring to 6 rings.

In one embodiment of the present specification, T1 to T3 are the same as or different from each other, and each independently hydrogen; deuterium; a hydroxyl group; an alkyl group; a cycloalkyl group; an alkoxy group; an aryloxy group; an aryl group; a heteroaryl group; —SiR$_{46}$R$_{47}$R$_{48}$; or —NR$_{41}$R$_{42}$, or bond to adjacent groups to form a substituted or unsubstituted ring having 1 ring to 5 rings.

In one embodiment of the present specification, R$_{46}$ to R$_{48}$ are the same as or different from each other, and each independently hydrogen; deuterium; a C1 to C15 alkyl group; a C3 to C12 cycloalkyl group; or a C6 to C25 aryl group.

In one embodiment of the present specification, R$_{46}$ to R$_{48}$ are the same as or different from each other, and each independently hydrogen; deuterium; a C1 to C10 alkyl group; a C3 to C10 cycloalkyl group; or a C6 to C20 aryl group.

In one embodiment of the present specification, R$_{46}$ to R$_{48}$ are the same as or different from each other, and each independently hydrogen or a C6 to C12 aryl group.

In one embodiment of Chemical Formula 3, R$_{11}$ and R$_{12}$ are the same as or different from each other, and each independently hydrogen; deuterium; a C1 to C10 alkyl group; a C3 to C10 cycloalkyl group; or a C6 to C20 aryl group unsubstituted or substituted with a C1 to C10 alkyl group, a C7 to C18 arylalkyl group or a C6 to C18 aryl group, or bond to adjacent groups to form a substituted or unsubstituted ring.

In one embodiment of Chemical Formula 3, $R_{11}$ and $R_{12}$ are the same as or different from each other, and each independently hydrogen; deuterium; a C1 to C6 alkyl group; a C3 to C8 cycloalkyl group; or a C6 to C13 aryl group unsubstituted or substituted with a C1 to C6 alkyl group, a C7 to C14 arylalkyl group or a C6 to C13 aryl group, or bond to adjacent groups to form a substituted or unsubstituted ring.

In one embodiment of the present specification, Chemical Formula 2 is any one of the following Chemical Formula 2-1 to Chemical Formula 2-4.

Chemical Formula 2-1

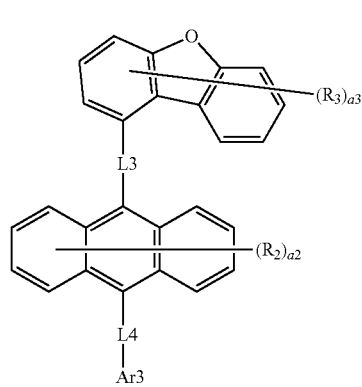

Chemical Formula 2-2

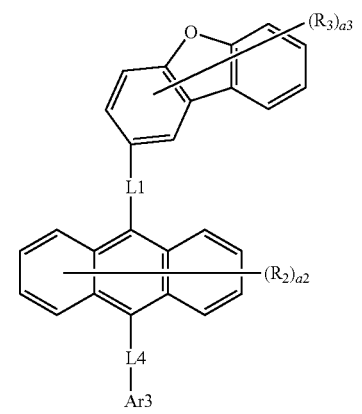

Chemical Formula 2-3

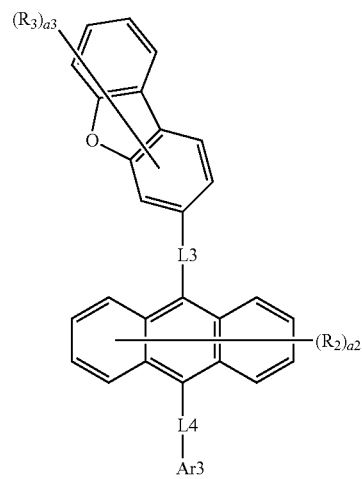

Chemical Formula 2-4

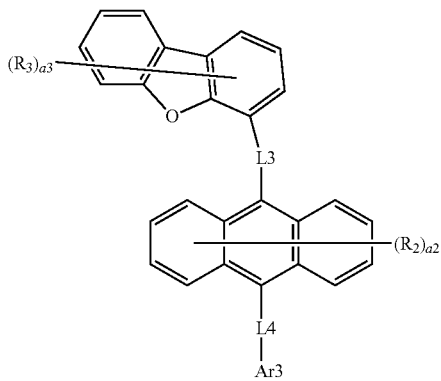

In Chemical Formula 2-1 to Chemical Formula 2-4,

L3 to L4, Ar3, $R_2$, $R_3$ and a2 to a3 have the same definitions as in Chemical Formula 1.

In one embodiment of the present specification, Chemical Formula 3 is any one of the following Chemical Formula 3-1 to Chemical Formula 3-6.

Chemical Formula 3-1

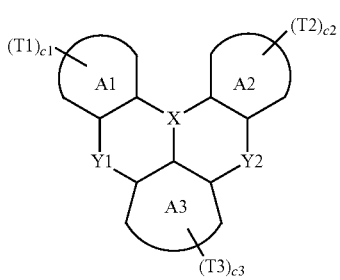

Chemical Formula 3-2

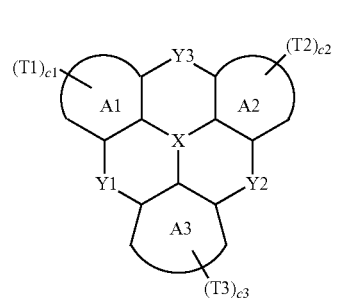

Chemical Formula 3-3

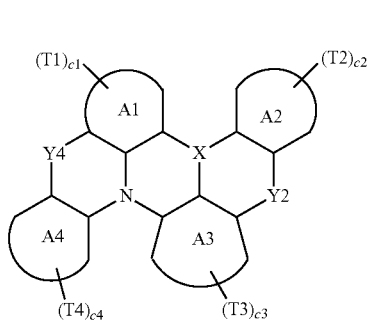

-continued

Chemical Formula 3-4

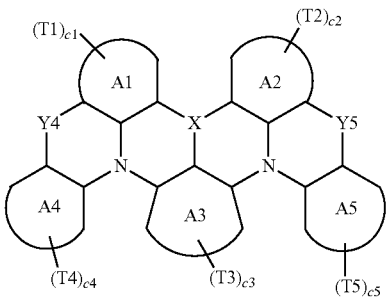

Chemical Formula 3-5

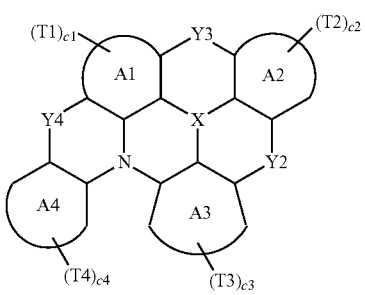

Chemical Formula 3-6

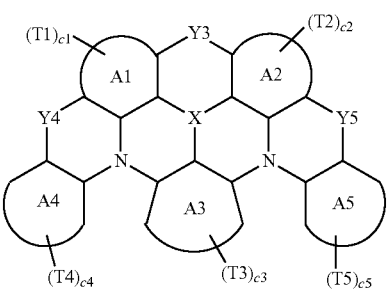

In Chemical Formula 3-1 to Chemical Formula 3-6,

X and A1 to A3 have the same definitions as in Chemical Formula 3,

A4 and A5 are the same as or different from each other, and each independently a monocyclic or polycyclic ring, Y1 is O or $NR_{11}$, and Y2 is O or $NR_{12}$, Y3 is O, $CR_{21}R_{22}$, $SiR_{27}R_{28}$ or $NR_{13}$, Y4 is a direct bond, O, $CR_{23}R_{24}$ or $NR_{14}$, and Y5 is a direct bond, O, $CR_{25}R_{26}$ or $NR_{15}$, $R_{11}$ to $R_{15}$ are the same as or different from each other, and each independently hydrogen; deuterium; an alkyl group; a cycloalkyl group; or an aryl group unsubstituted or substituted with an alkyl group, an arylalkyl group or an aryl group, $R_{21}$ and $R_{22}$ are the same as or different from each other, and each independently hydrogen, deuterium, an alkyl group, a cycloalkyl group or an aryl group, or bond to each other to form a ring, $R_{23}$ and $R_{24}$ are the same as or different from each other, and each independently hydrogen, deuterium, an alkyl group, a cycloalkyl group or an aryl group, or bond to each other to form a ring, $R_{25}$ and $R_{26}$ are the same as or different from each other, and each independently hydrogen, deuterium, an alkyl group, a cycloalkyl group or an aryl group, or bond to each other to form a ring, $R_{27}$ and $R_{28}$ are the same as or different from each other, and each independently hydrogen, deuterium, an alkyl group, a cycloalkyl group or an aryl group, T1 to T5 are the same as or different from each other, and each independently hydrogen; deuterium; a hydroxyl group; an alkyl group; a cycloalkyl group; an alkoxy group; an aryloxy group; an aryl group; a heteroaryl group; or —$NR_{41}R_{42}$, and $R_{41}$ and $R_{42}$ are the same as or different from each other and each independently hydrogen; an alkyl group; an aryl group unsubstituted or substituted with an alkyl group or a silyl group; or a heteroaryl group, and c1 to c5 are each independently an integer of 0 or greater, and when c1 is 2 or greater, T1s are the same as or different from each other, when c2 is 2 or greater, T2s are the same as or different from each other, when c3 is 2 or greater, T3s are the same as or different from each other, when c4 is 2 or greater, T4s are the same as or different from each other, and when c5 is 2 or greater, T5s are the same as or different from each other.

In one embodiment of the present specification, A4 and A5 are the same as or different from each other, and each independently a ring having 1 ring to 5 rings.

In one embodiment of the present specification, A4 and A5 are the same as or different from each other, and each independently a ring having 1 ring to 4 rings.

In one embodiment of the present specification, A4 and A5 are the same as or different from each other, and each independently a ring having 1 ring to 3 rings.

In one embodiment of the present specification, A4 and A5 are the same as or different from each other, and each independently a C2 to C6 monocyclic ring or a C6 to C26 polycyclic ring.

In one embodiment of the present specification, A4 and A5 are the same as or different from each other, and each independently a C2 to C6 monocyclic ring or a C6 to C22 polycyclic ring.

In one embodiment of the present specification, A4 and A5 are the same as or different from each other, and each independently a C2 to C6 monocyclic ring or a C6 to C18 polycyclic ring.

In one embodiment of the present specification, A4 and A5 are the same as or different from each other, and each independently cyclohexane, benzene, naphthalene, triphenylene, 9,9'-spirobifluorene, dibenzofuran, dibenzothiophene, dibenzoselenophene, carbazole, indolocarbazole, naphthobenzofuran

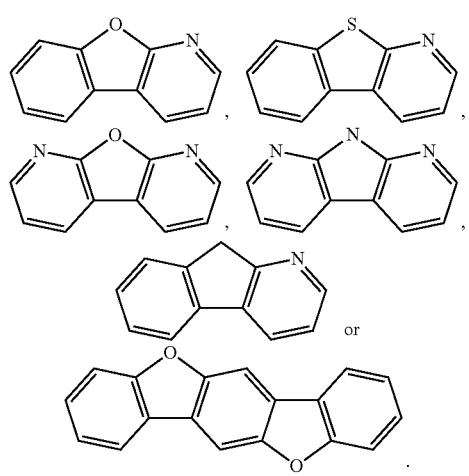

In one embodiment of the present specification, A4 and A5 are each cyclohexane; or benzene.

In one embodiment of Chemical Formulae 3-1 to 3-6, $R_{11}$ to $R_{15}$ are the same as or different from each other, and each independently hydrogen; deuterium; a C1 to C10 alkyl group; a C3 to 10 cycloalkyl group; or a C6 to C20 aryl group unsubstituted or substituted with a C1 to C10 alkyl group, a C7 to C18 arylalkyl group or a C6 to C18 aryl group.

In one embodiment of Chemical Formulae 3-1 to 3-6, $R_{11}$ to $R_{15}$ are the same as or different from each other, and each independently hydrogen; deuterium; a C1 to C6 alkyl group; a C3 to C8 cycloalkyl group; or a C6 to C13 aryl group unsubstituted or substituted with a C1 to C6 alkyl group, a C7 to C14 arylalkyl group or a C6 to C13 aryl group.

In one embodiment of Chemical Formulae 3-1 to 3-6, $R_{11}$ to $R_{15}$ are the same as or different from each other, and each independently a phenyl group; a phenyl group substituted with a methyl group; a phenyl group substituted with a t-butyl group; a phenyl group substituted with a phenyl group or a 1-methyl-1-phenyl-ethan-1-yl group and a phenyl group; or a phenyl group substituted with a t-butyl group and a t-butylphenyl group.

In one embodiment of the present specification, Chemical Formula 3 is any one of the following Chemical Formula 4-1 to Chemical Formula 4-9.

Chemical Formula 4-1
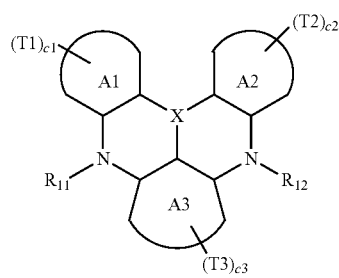

Chemical Formula 4-2
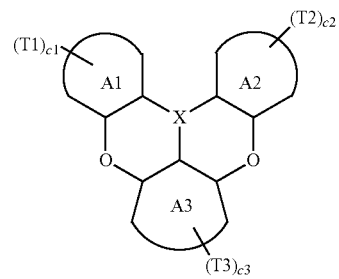

Chemical Formula 4-3]
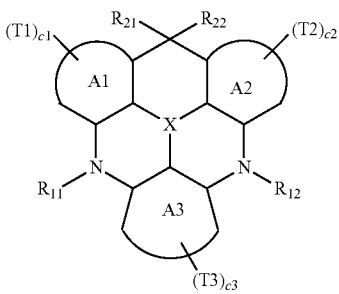

Chemical Formula 4-4
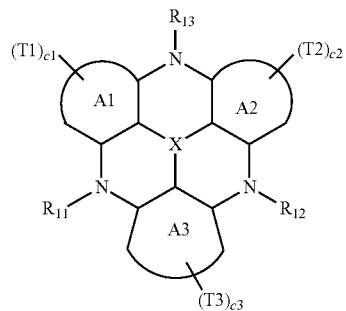

Chemical Formula 4-5
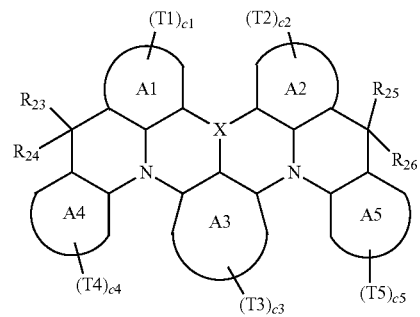

Chemical Formula 4-6
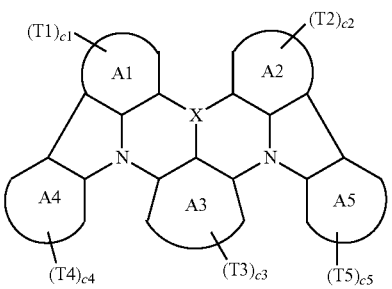

Chemical Formula 4-7
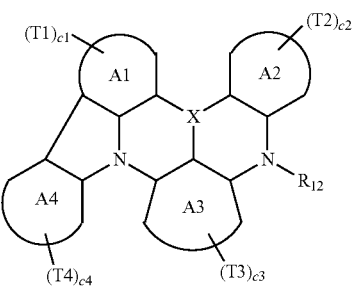

Chemical Formula 4-8
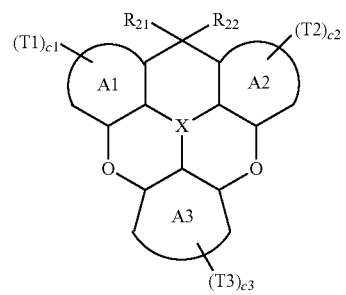

Chemical Formula 4-9

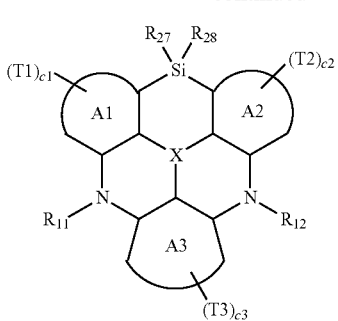

In Chemical Formula 4-1 to Chemical Formula 4-9,

X and A1 to A3 have the same definitions as in Chemical Formula 3,

A4 and A5 are the same as or different from each other, and each independently a monocyclic or polycyclic ring, $R_{11}$ to $R_{13}$ are the same as or different from each other, and each independently hydrogen; deuterium; an alkyl group; a cycloalkyl group; or an aryl group unsubstituted or substituted with an alkyl group, an arylalkyl group or an aryl group, $R_{21}$ and $R_{22}$ are the same as or different from each other, and each independently hydrogen, deuterium, an alkyl group, a cycloalkyl group or an aryl group, or bond to each other to form a ring, $R_{23}$ and $R_{24}$ are the same as or different from each other, and each independently hydrogen, deuterium, an alkyl group, a cycloalkyl group or an aryl group, or bond to each other to form a ring, $R_{25}$ and $R_{26}$ are the same as or different from each other, and each independently hydrogen, deuterium, an alkyl group, a cycloalkyl group or an aryl group, or bond to each other to form a ring, $R_{27}$ and $R_{28}$ are the same as or different from each other, and each independently hydrogen, deuterium, an alkyl group, a cycloalkyl group or an aryl group, T1 to T5 are the same as or different from each other, and each independently hydrogen; deuterium; a hydroxyl group; an alkyl group; a cycloalkyl group; an alkoxy group; an aryloxy group; an aryl group; a heteroaryl group; or —$NR_{41}R_{42}$, and $R_{41}$ and $R_{42}$ are the same as or different from each other and each independently hydrogen; an alkyl group; a cycloalkyl group; an aryl group unsubstituted or substituted with an alkyl group or a silyl group; or a heteroaryl group, and c1 to c5 are each independently an integer of 0 or greater, and when c1 is 2 or greater, T1s are the same as or different from each other, when c2 is 2 or greater, T2s are the same as or different from each other, when c3 is 2 or greater, T3s are the same as or different from each other, when c4 is 2 or greater, T4s are the same as or different from each other, and when c5 is 2 or greater, T5s are the same as or different from each other.

In one embodiment of the present specification, $R_{21}$ and $R_{22}$ are the same as or different from each other, and each independently hydrogen, deuterium, a C1 to C10 alkyl group; or a C6 to C18 aryl group, or bond to each other to form a C5 to C17 ring.

In one embodiment of the present specification, $R_{23}$ and $R_{24}$ are the same as or different from each other, and each independently hydrogen, deuterium, a C1 to C10 alkyl group or a C6 to C18 aryl group, or bond to each other to form a C5 to C17 ring.

In one embodiment of the present specification, $R_{25}$ and $R_{26}$ are the same as or different from each other, and each independently hydrogen, deuterium, a C1 to C10 alkyl group or a C6 to C18 aryl group, or bond to each other to form a C5 to C17 ring.

In one embodiment of the present specification, $R_{21}$ and $R_{22}$ are the same as or different from each other, and each independently a methyl group or a phenyl group, or bond to each other to form a fluorene ring.

In one embodiment of the present specification, $R_{23}$ and $R_{24}$ are the same as or different from each other, and each independently a methyl group or a phenyl group, or bond to each other to form a fluorene ring.

In one embodiment of the present specification, $R_{25}$ and $R_{26}$ are the same as or different from each other, and each independently a methyl group or a phenyl group, or bond to each other to form fluorene ring.

In one embodiment of the present specification, $R_{27}$ and $R_{28}$ are the same as or different from each other, and each independently hydrogen, deuterium, a C1 to C10 alkyl group; or a C6 to C18 aryl group.

In one embodiment of the present specification, $R_{27}$ and $R_{28}$ are the same as or different from each other, and each independently hydrogen, deuterium, a C1 to C6 alkyl group; or a C6 to C12 aryl group.

In one embodiment of the present specification, $R_{27}$ and $R_{28}$ are the same as or different from each other, and each independently hydrogen or a phenyl group.

In one embodiment of the present specification, c1 is 0 or 1.

In one embodiment of the present specification, c2 is 0 or 1.

In one embodiment of the present specification, c3 is 0 or 1.

In one embodiment of the present specification, c4 is 0 or 1.

In one embodiment of the present specification, c5 is 0 or 1.

In one embodiment of the present specification, a sum of c1 to c5 is 1 or greater.

In one embodiment of the present specification, the compound of Chemical Formula 1 is any one selected from among the following compounds.

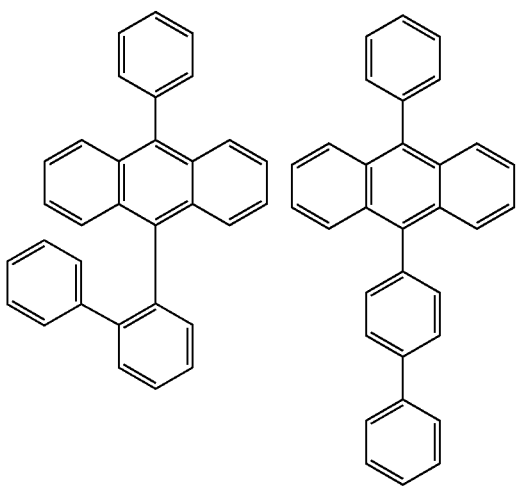

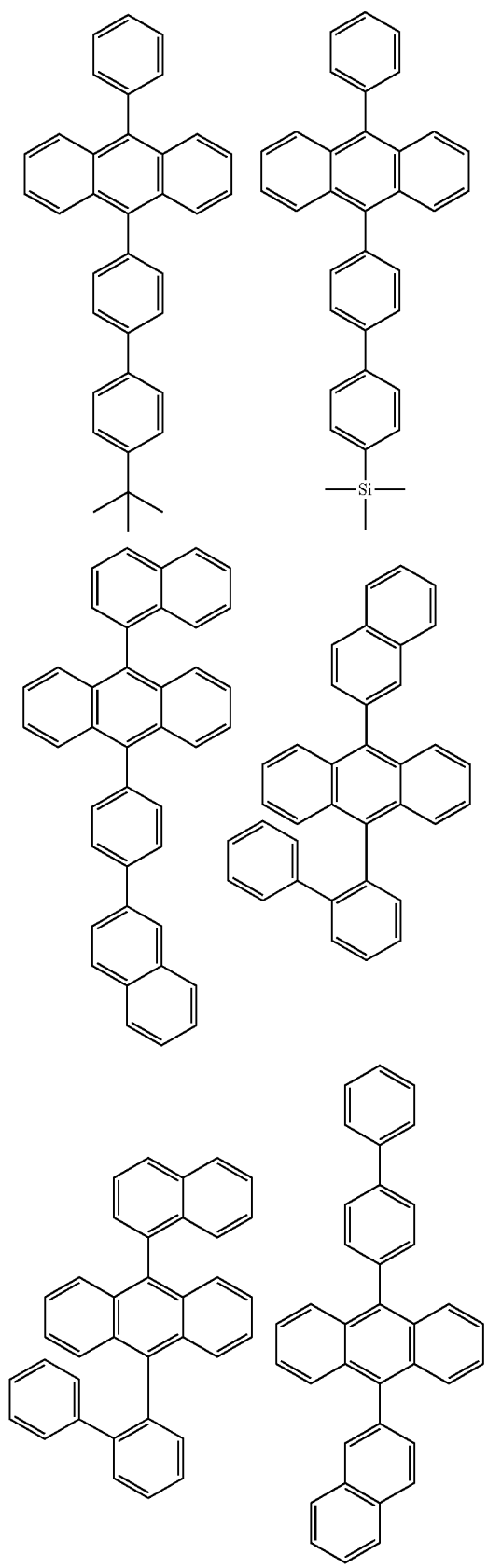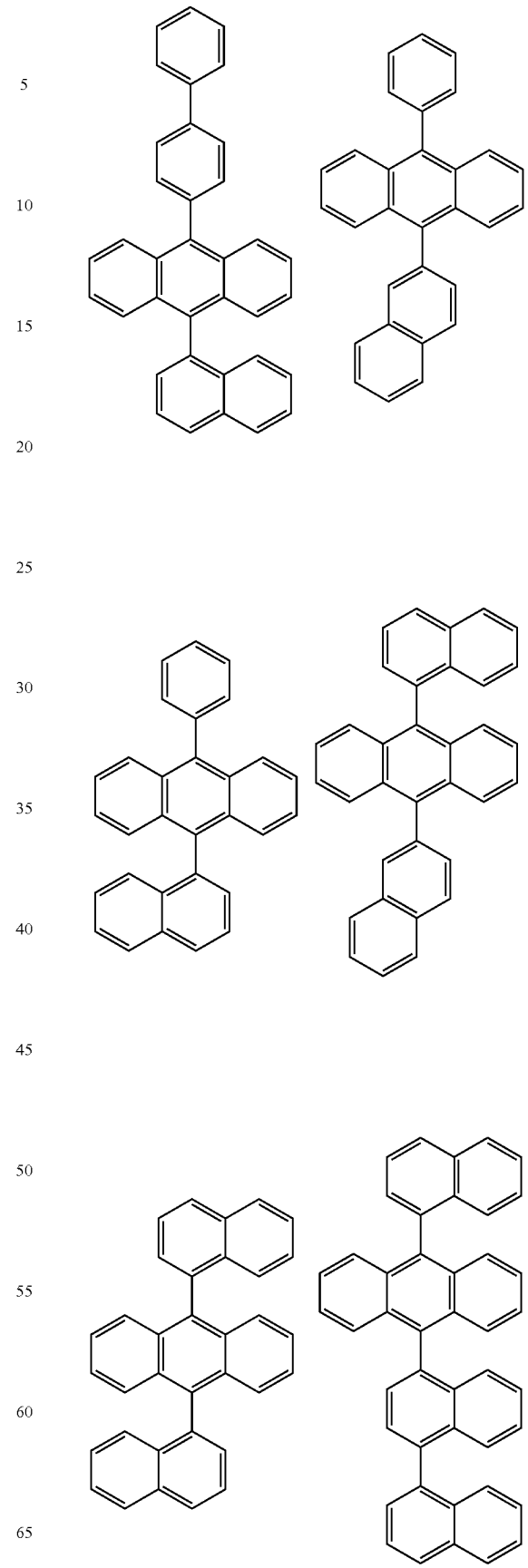

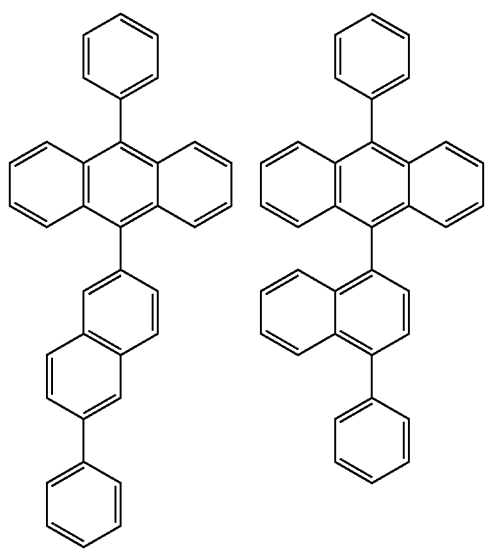
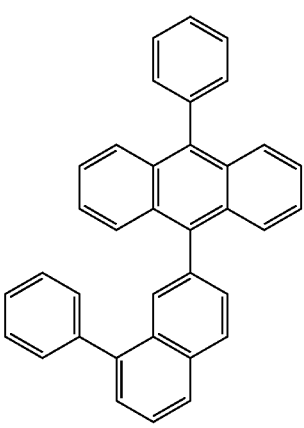
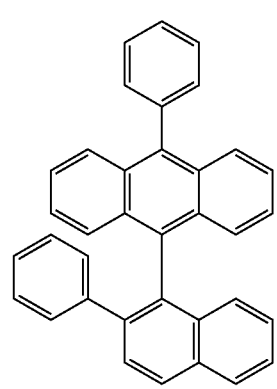
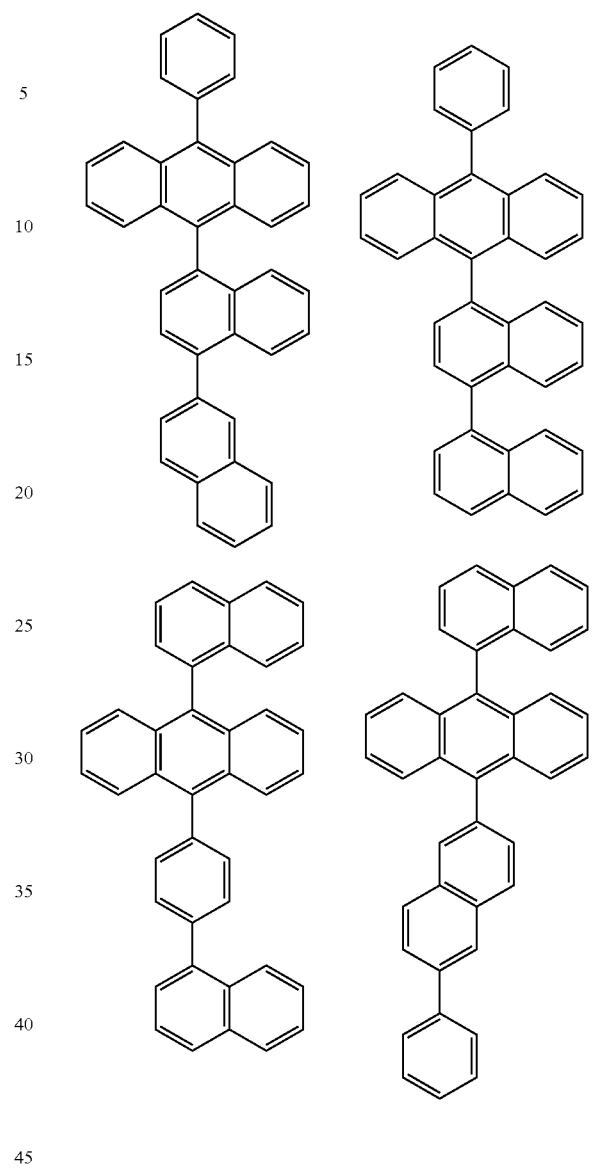
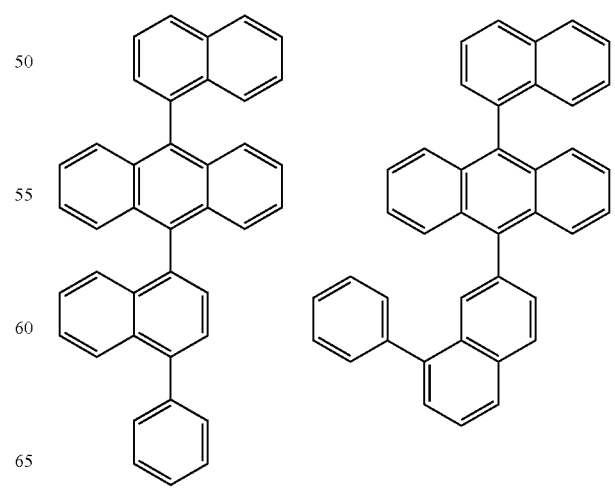

-continued
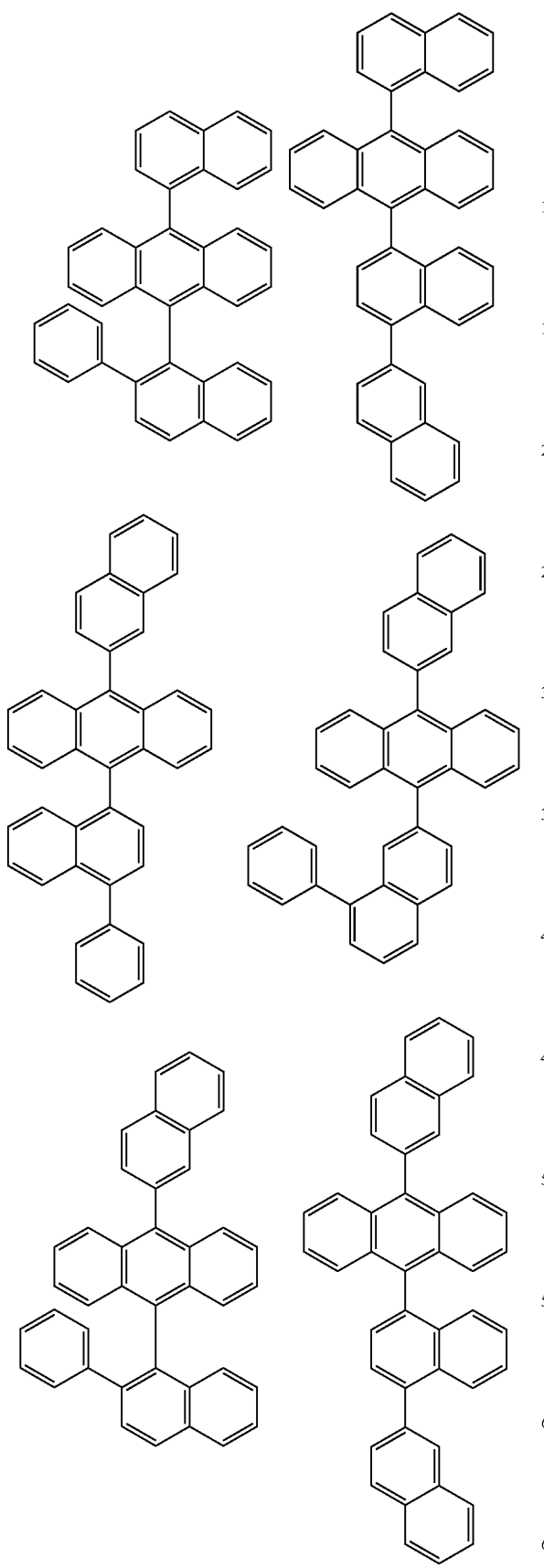
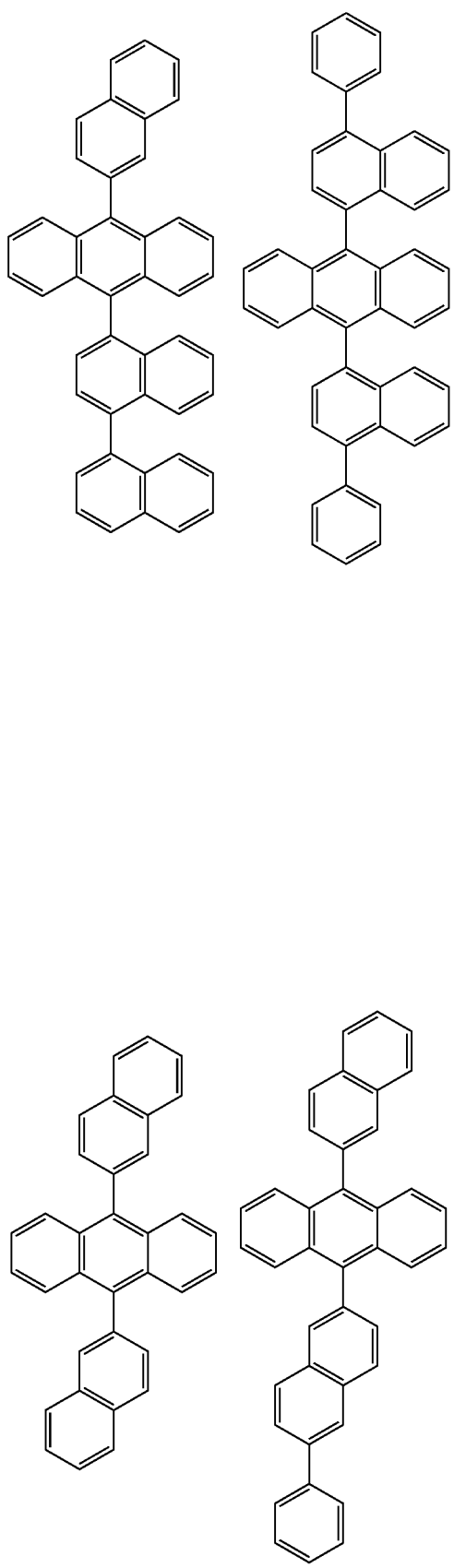

-continued
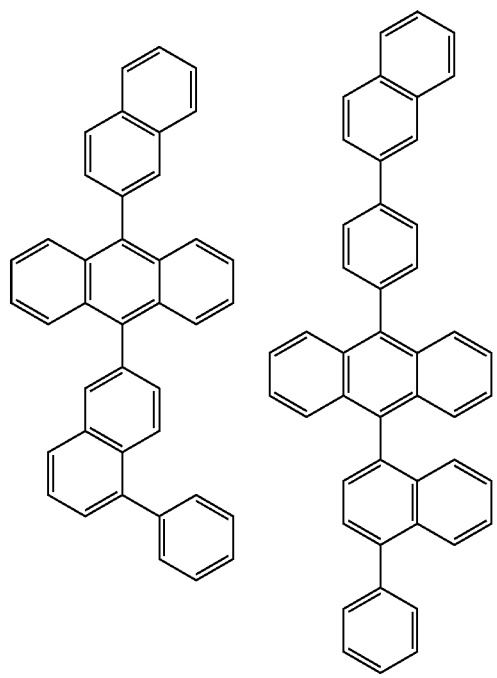
-continued
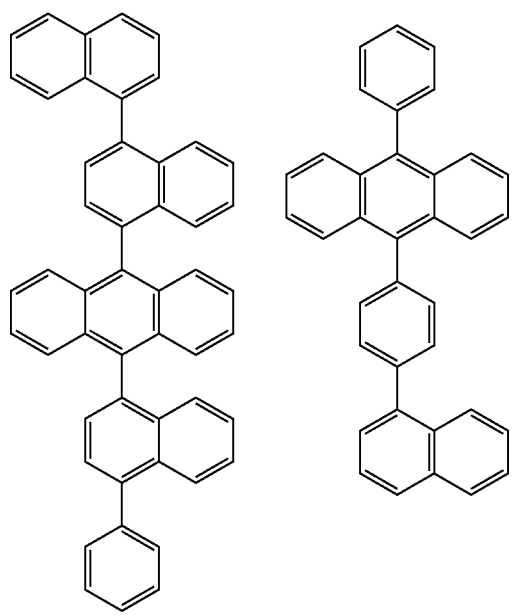
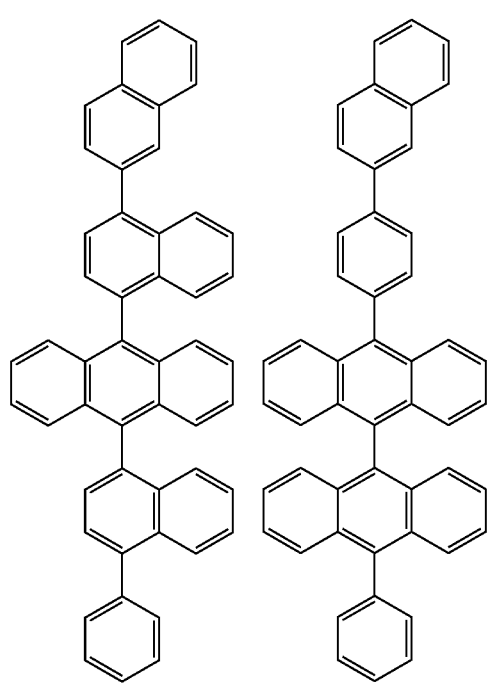
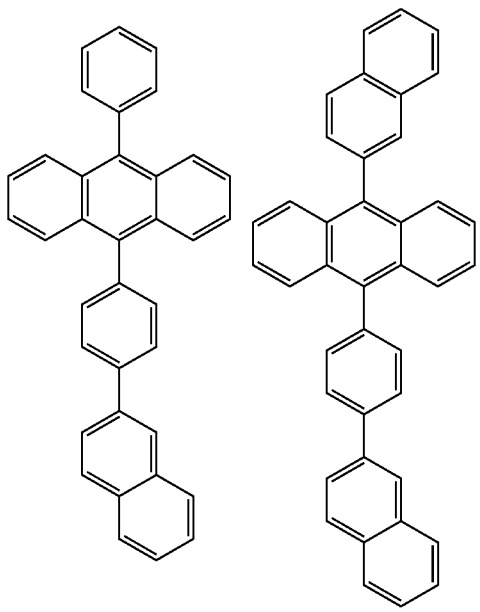

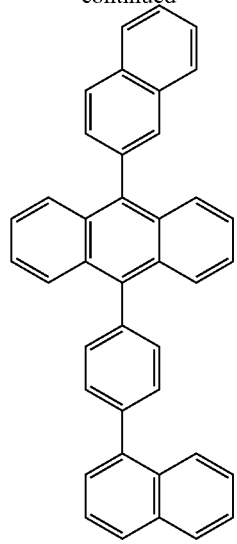
In one embodiment of the present specification, the compound of Chemical Formula 2 is any one selected from among the following compounds.
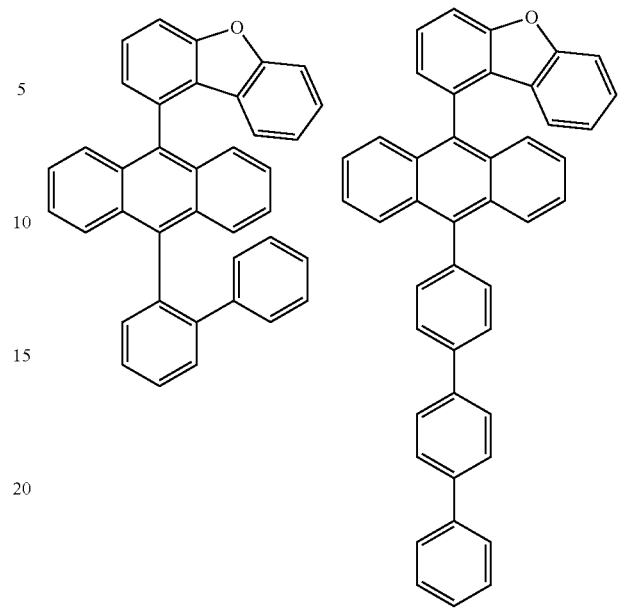
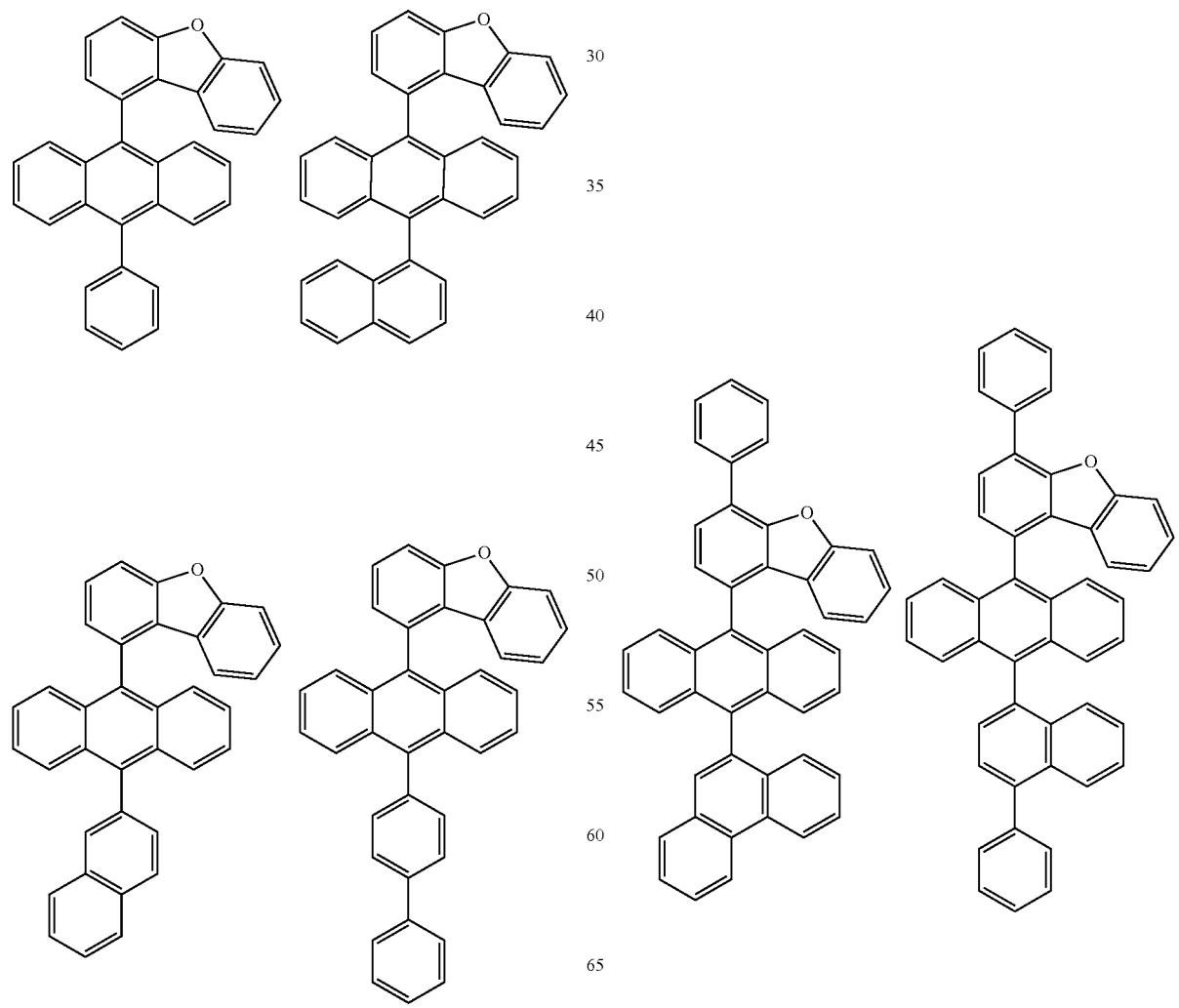

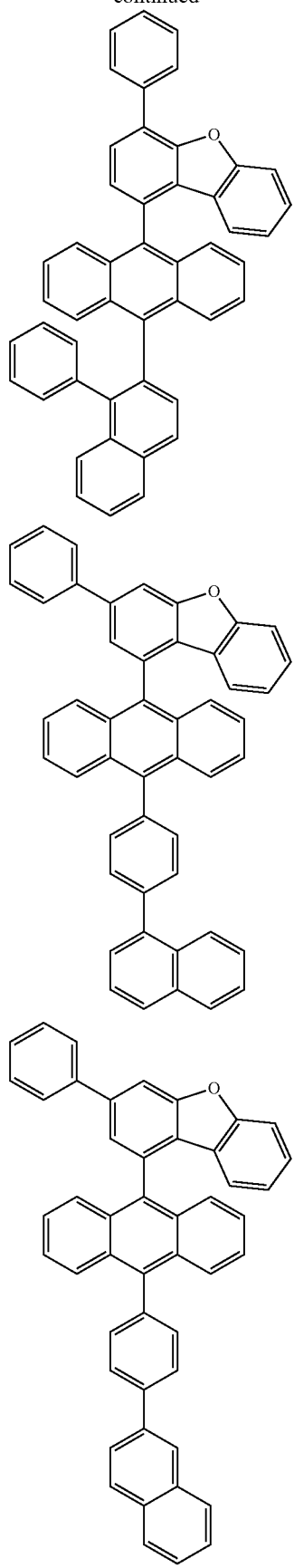
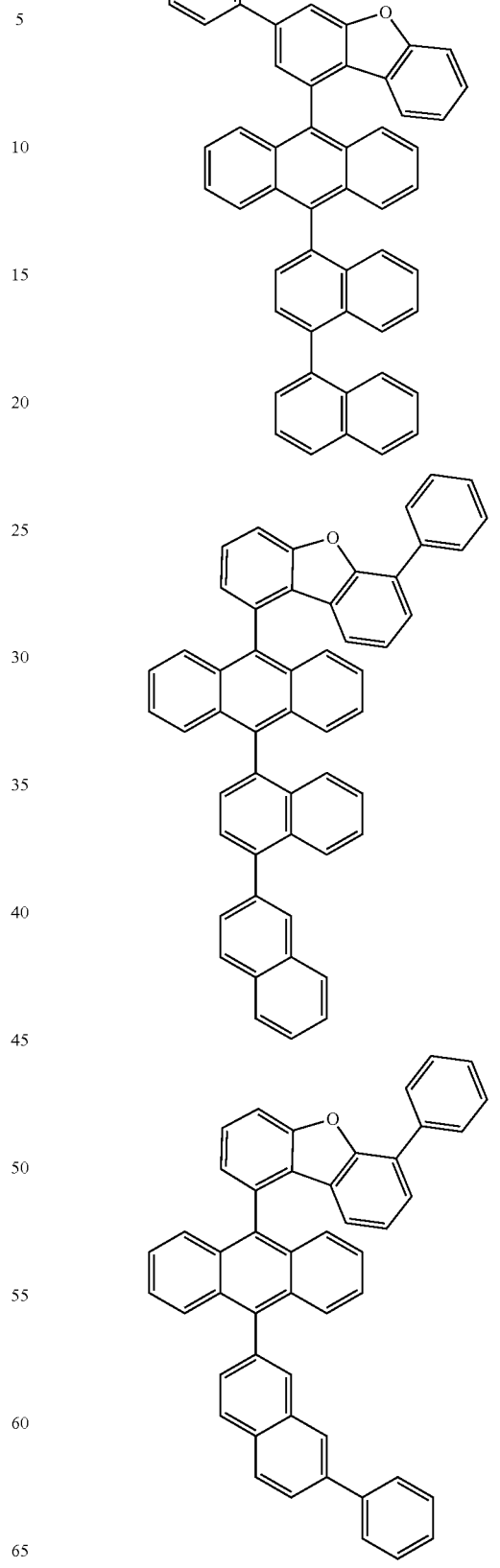

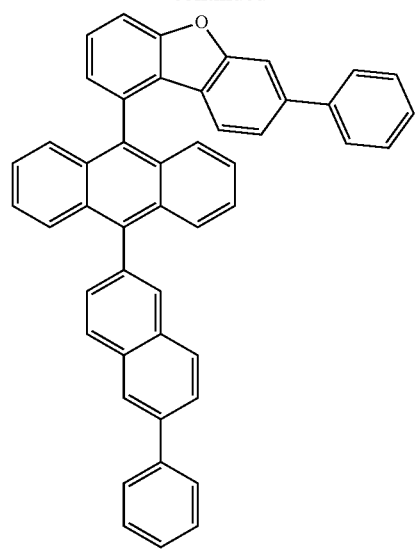
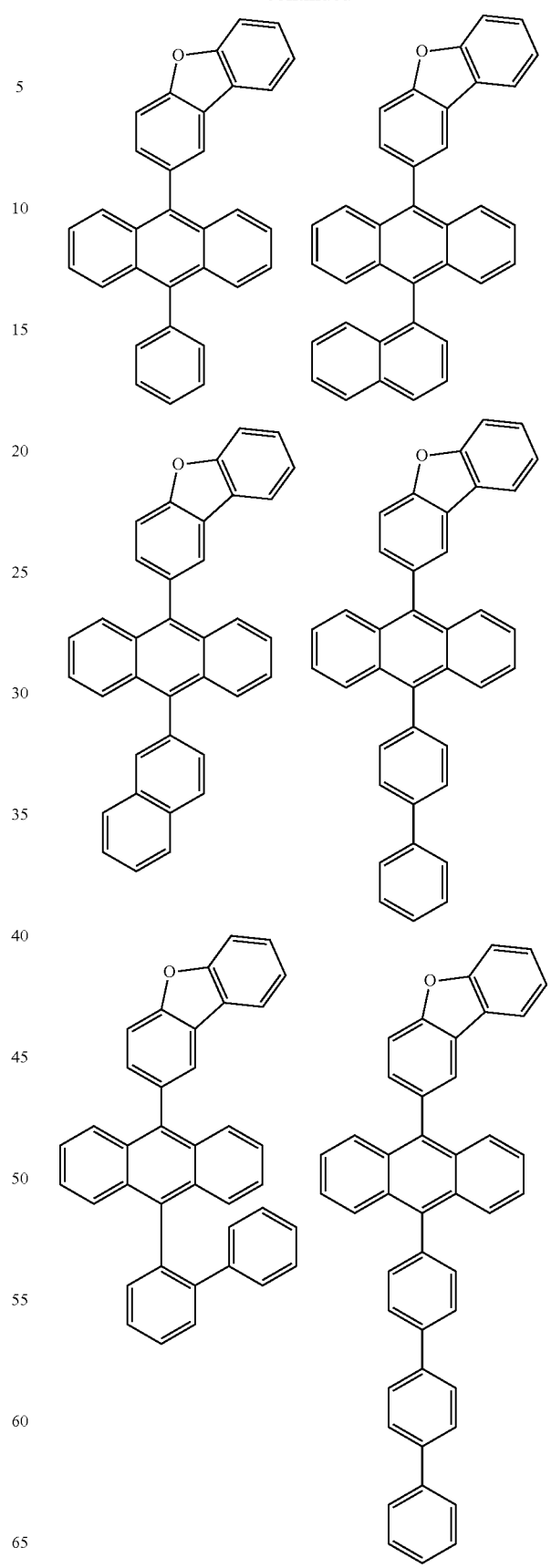

37
-continued
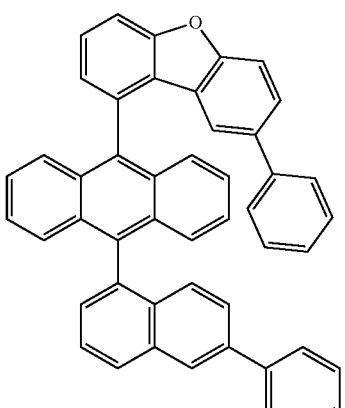
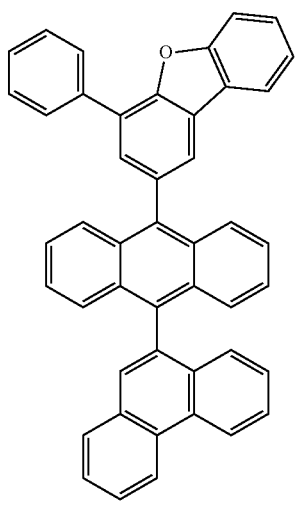
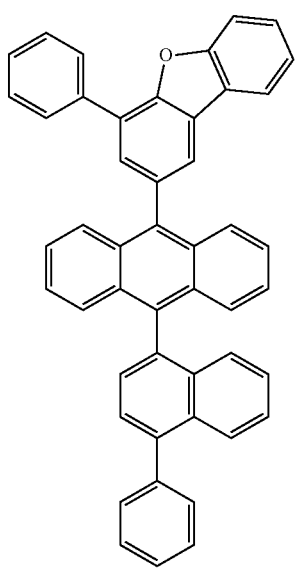
38
-continued
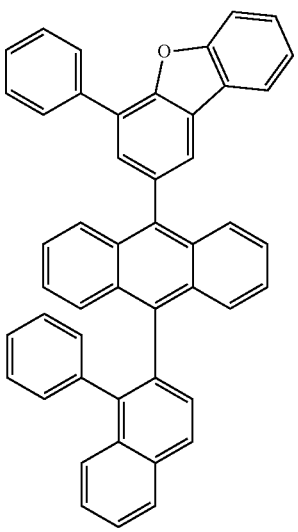
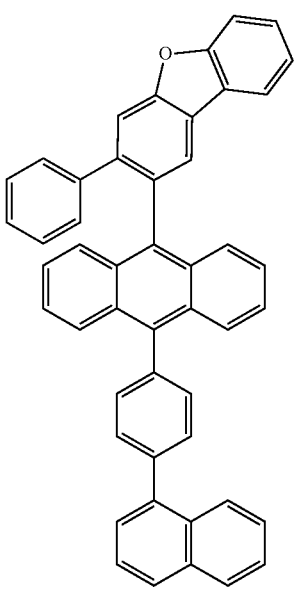

39
-continued
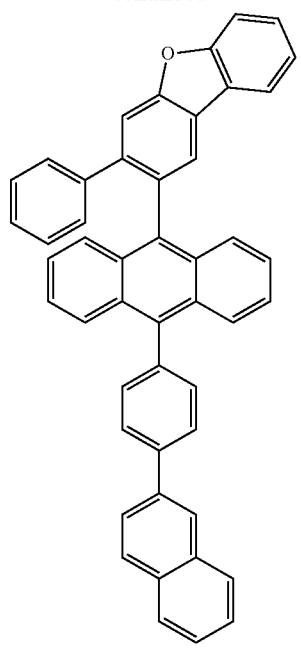
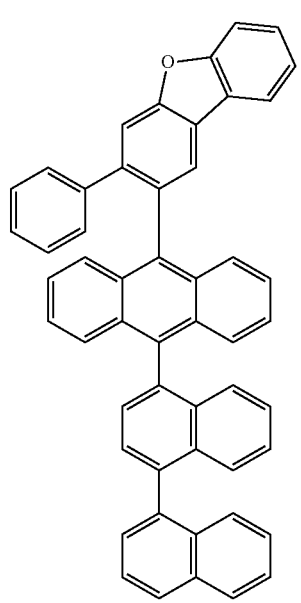
40
-continued
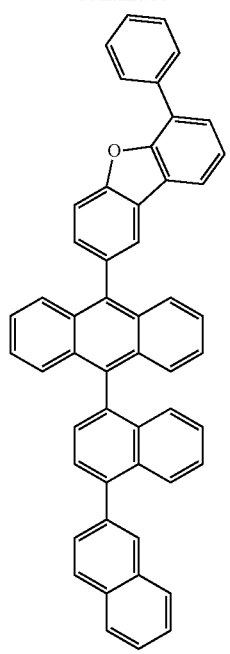
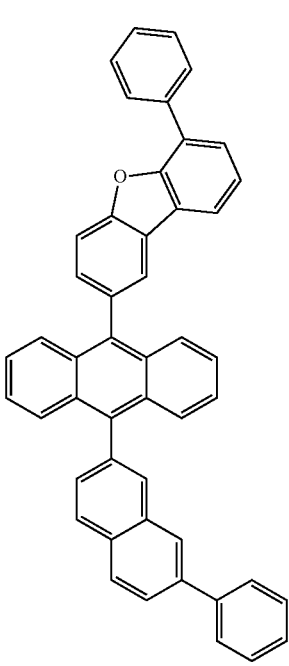

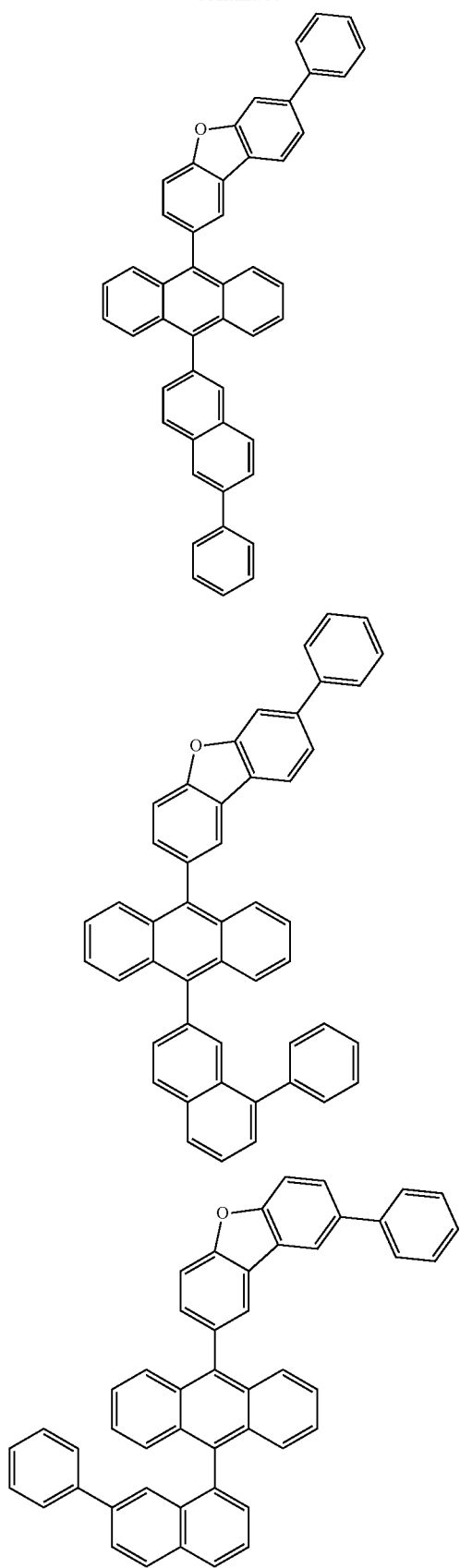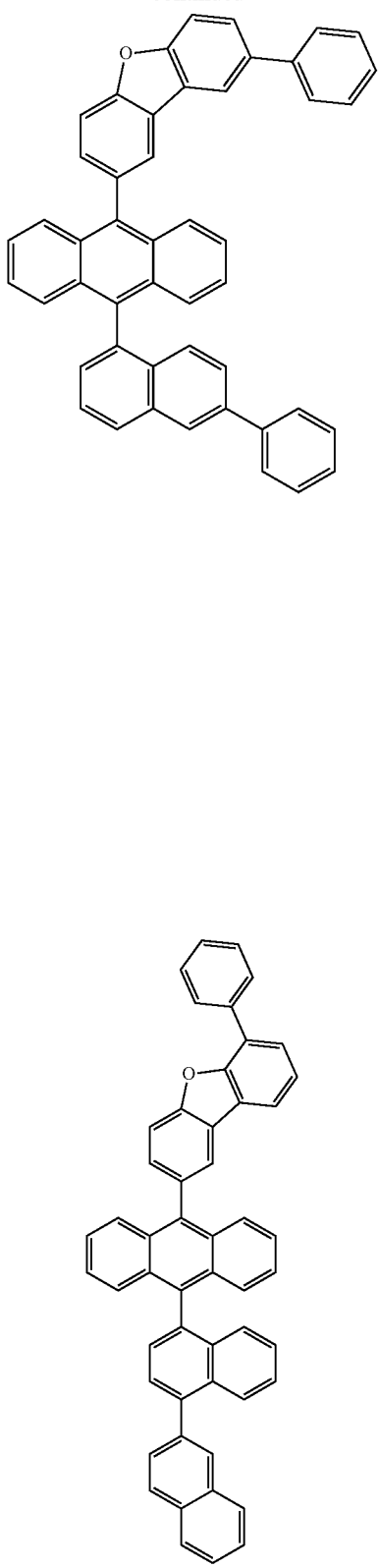

-continued
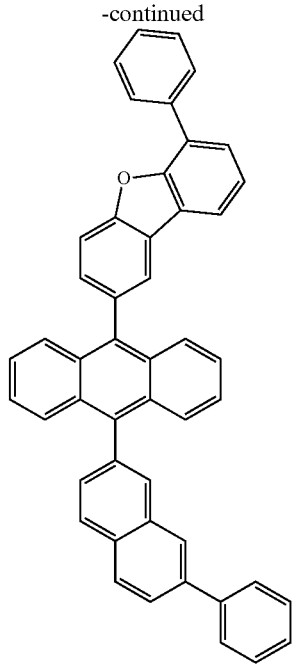
-continued
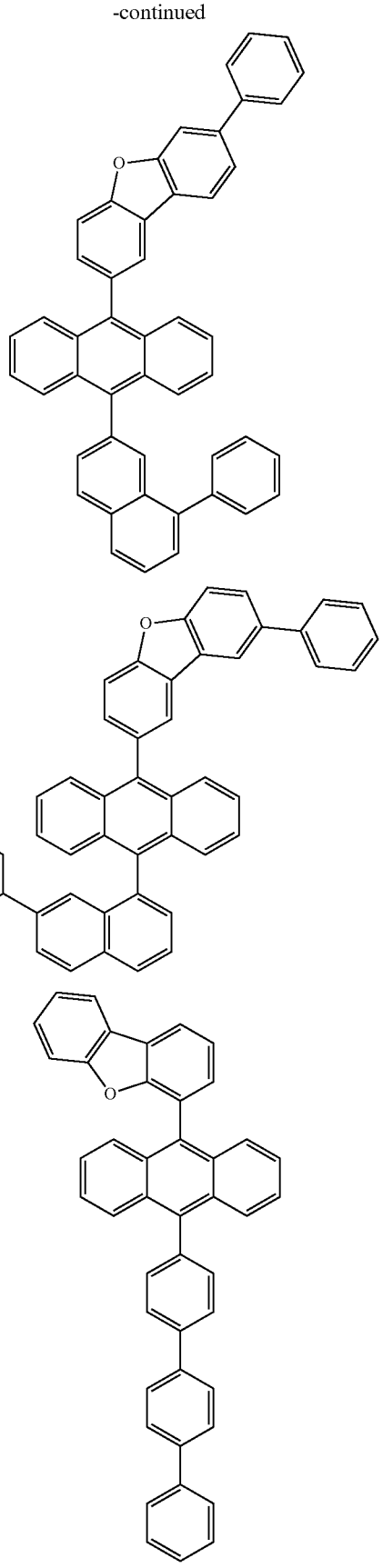

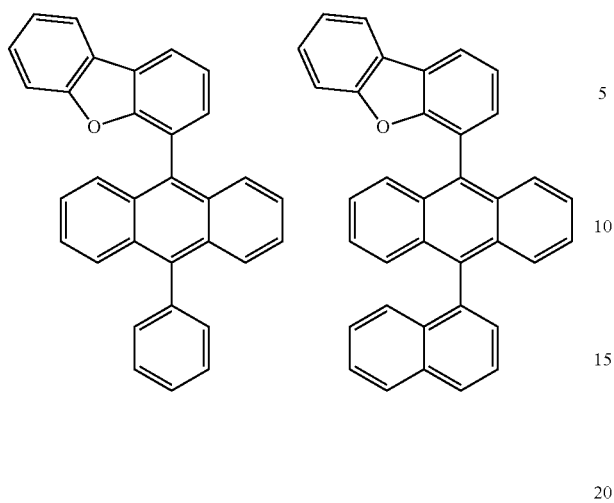
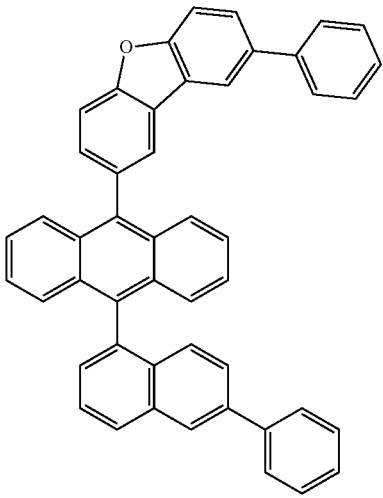
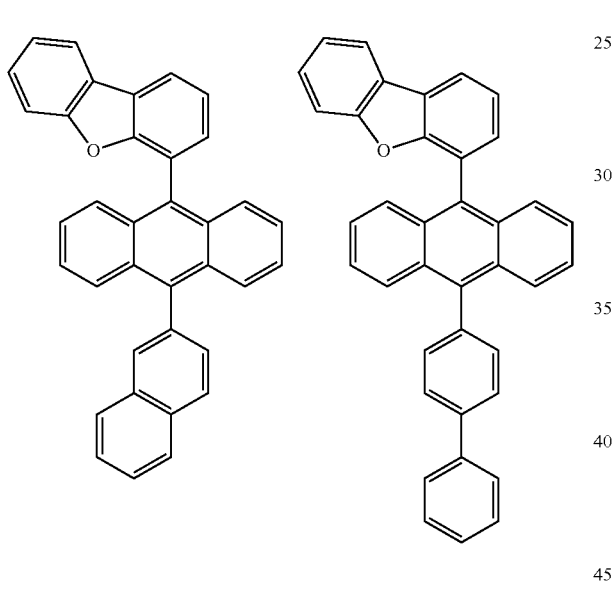
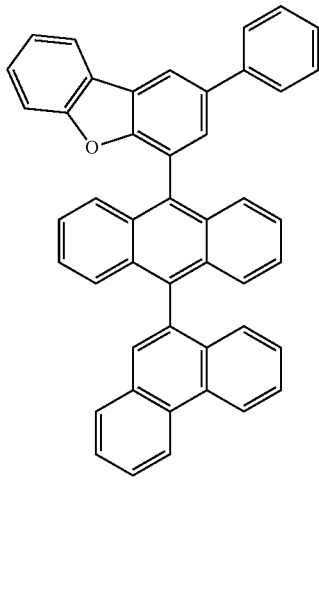

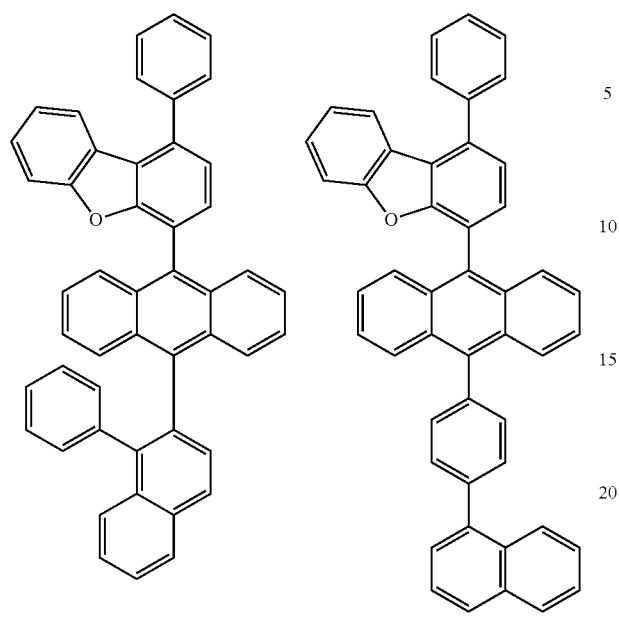
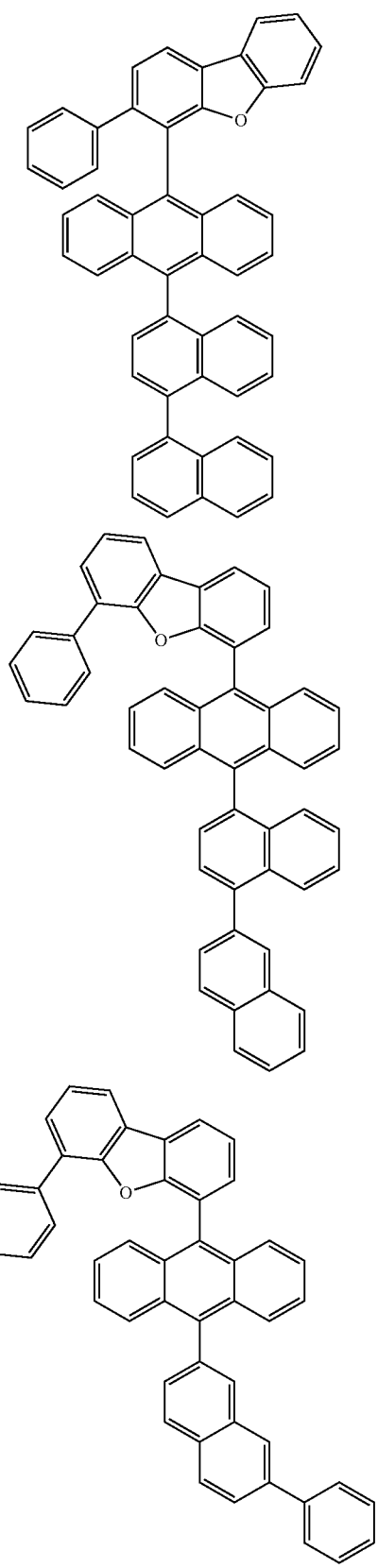

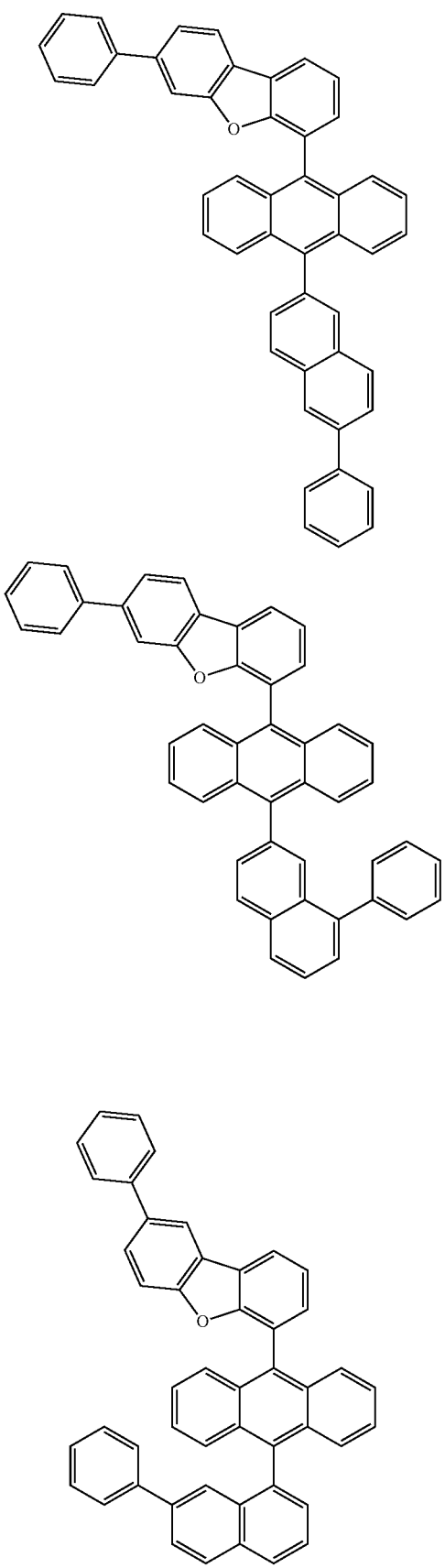
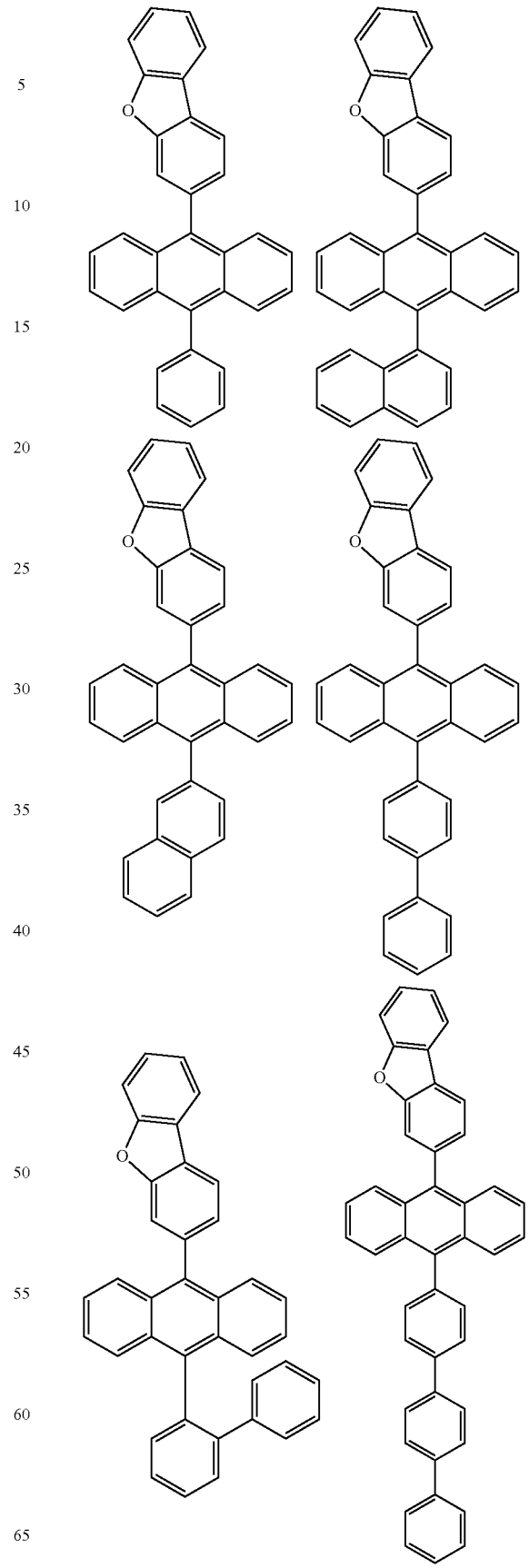

51
-continued
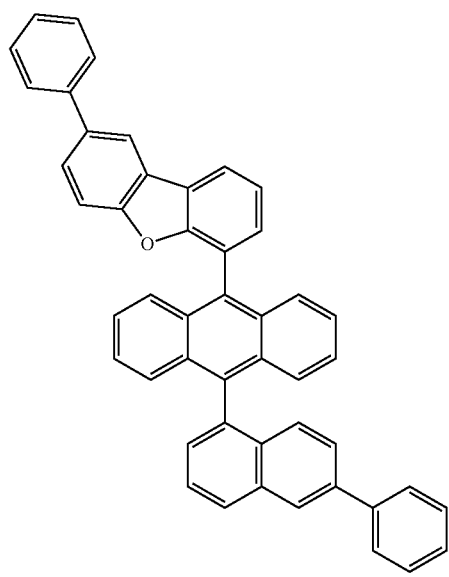
52
-continued
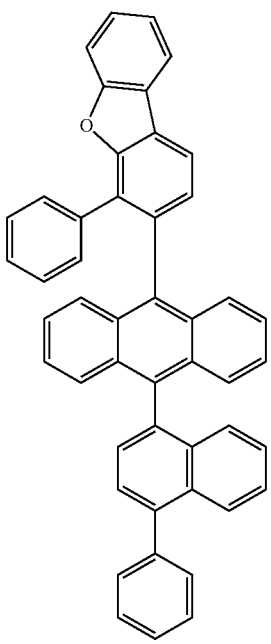
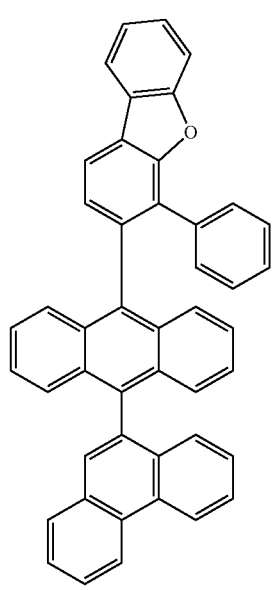
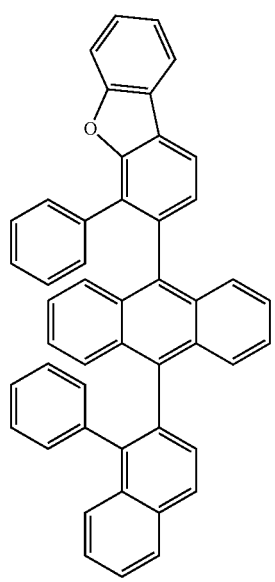

53
-continued
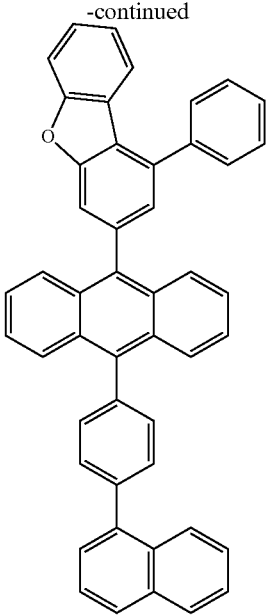
54
-continued
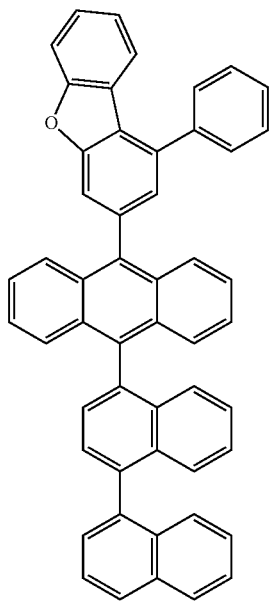
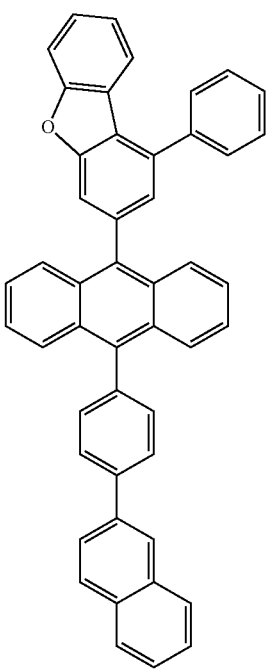
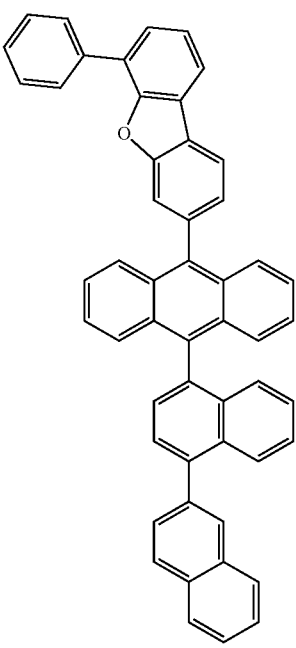

55
-continued
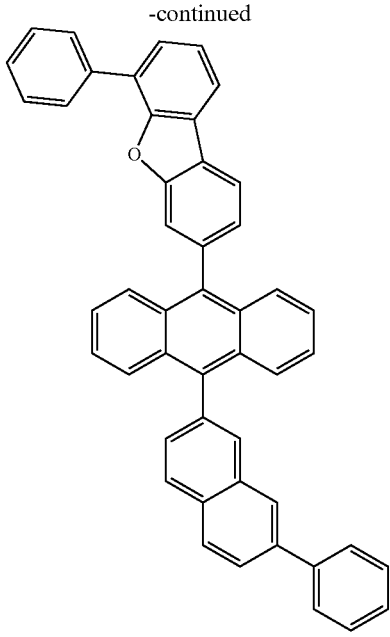
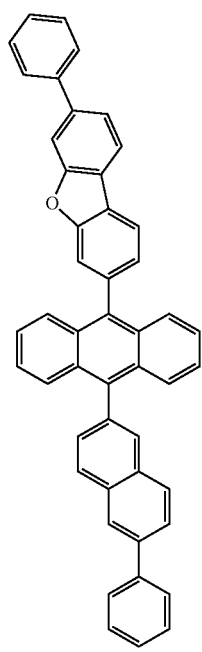
56
-continued
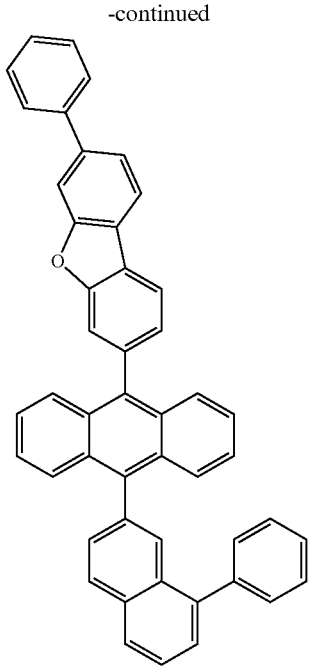
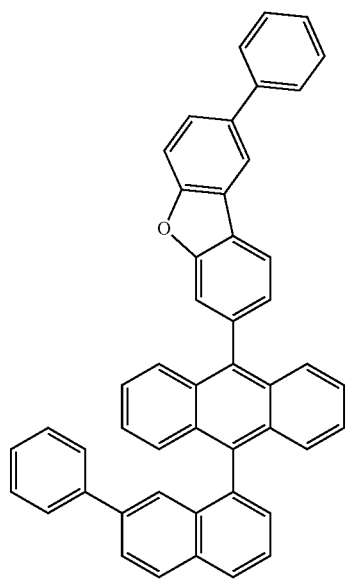

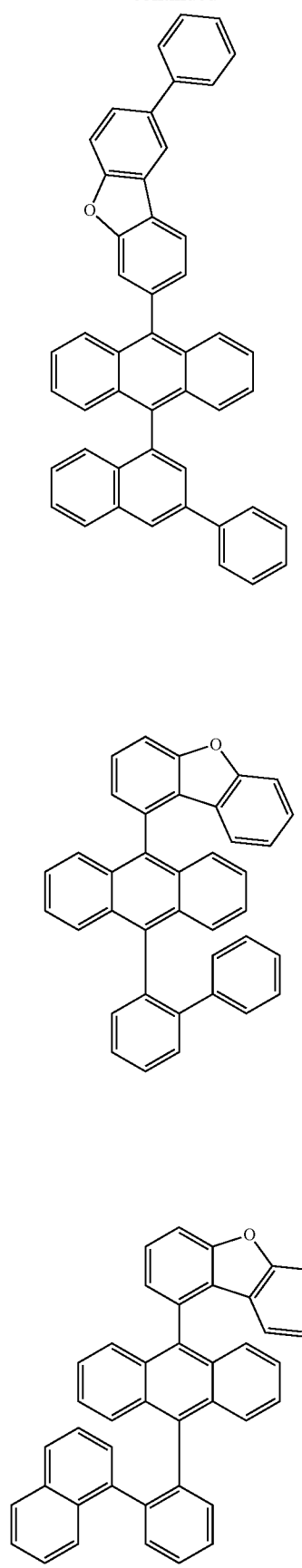
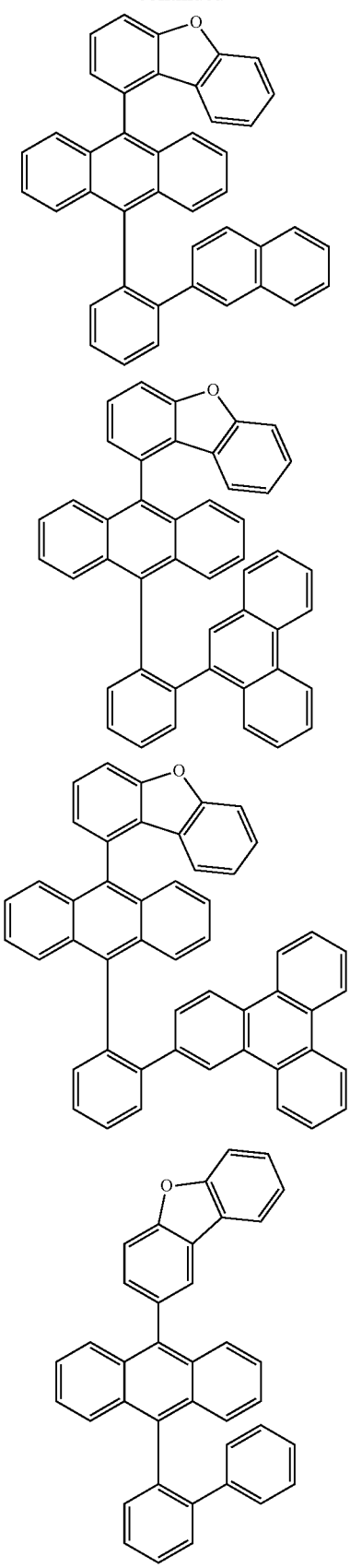

59
-continued
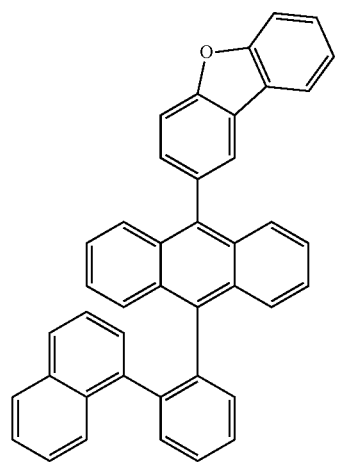
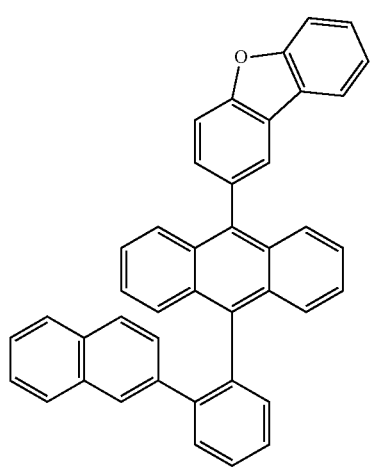
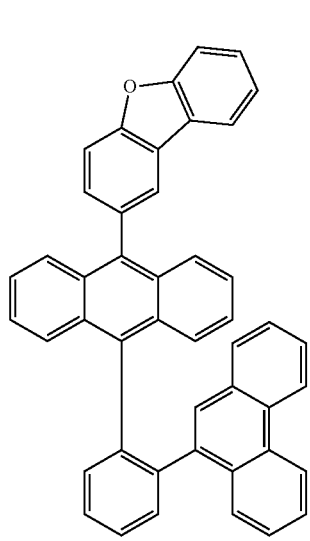
60
-continued
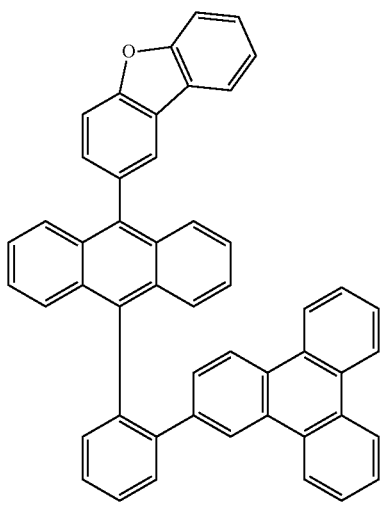
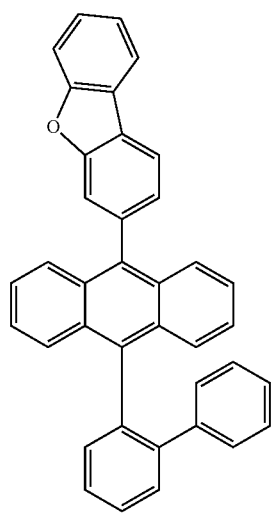
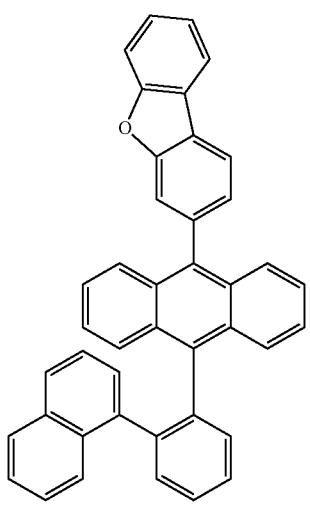

-continued
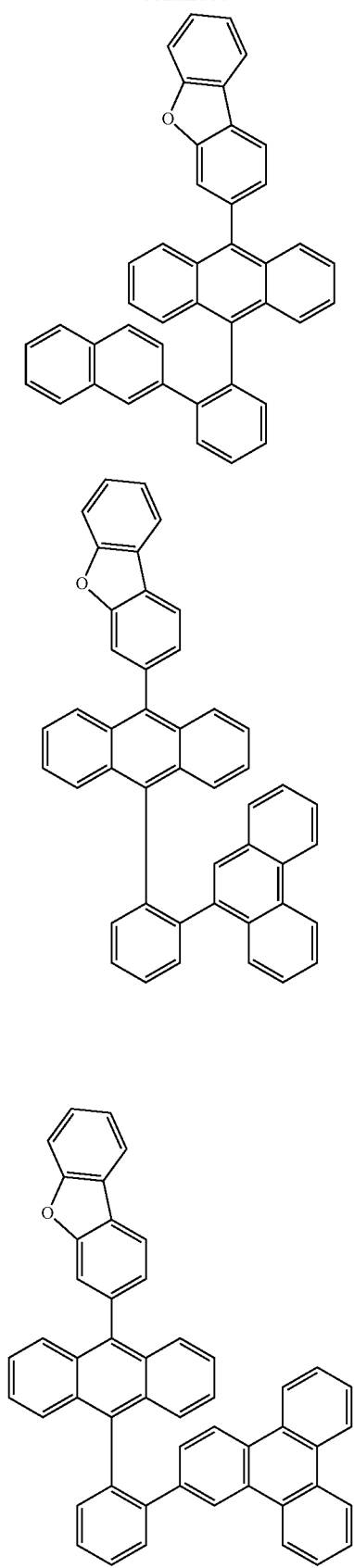
-continued
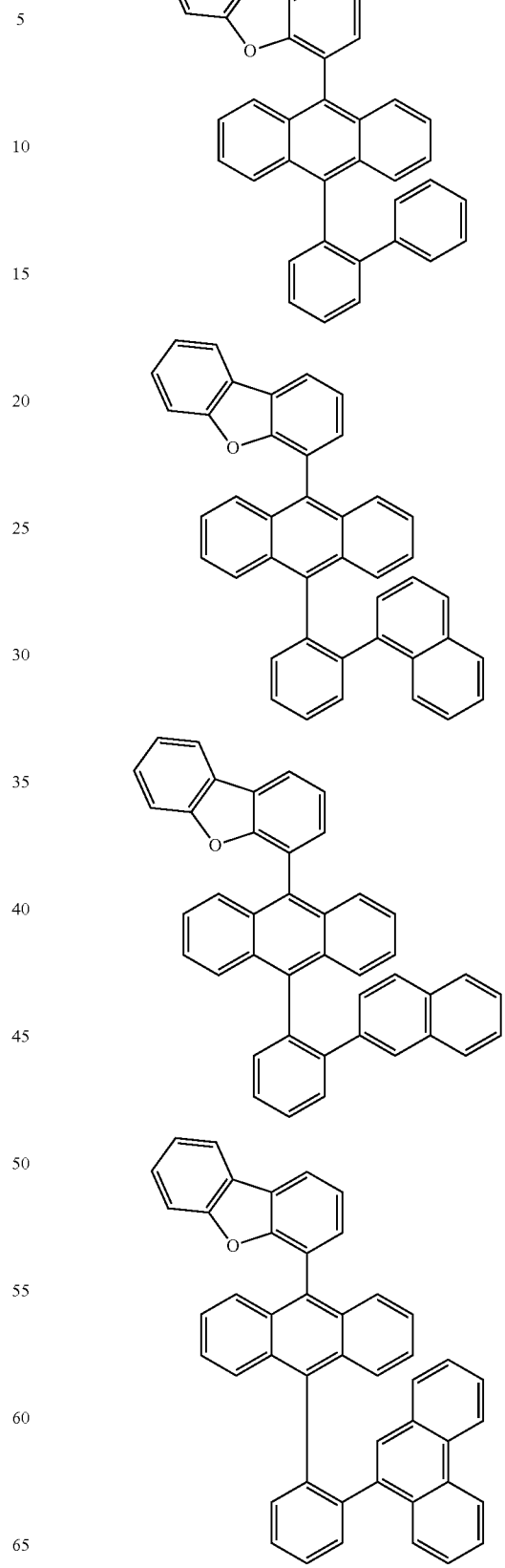

-continued
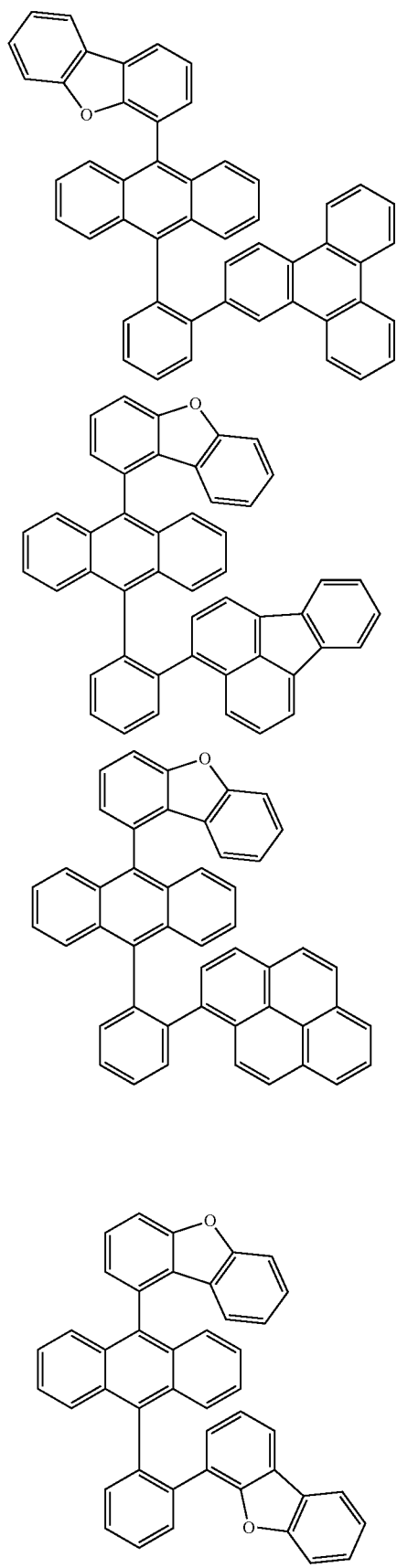
-continued
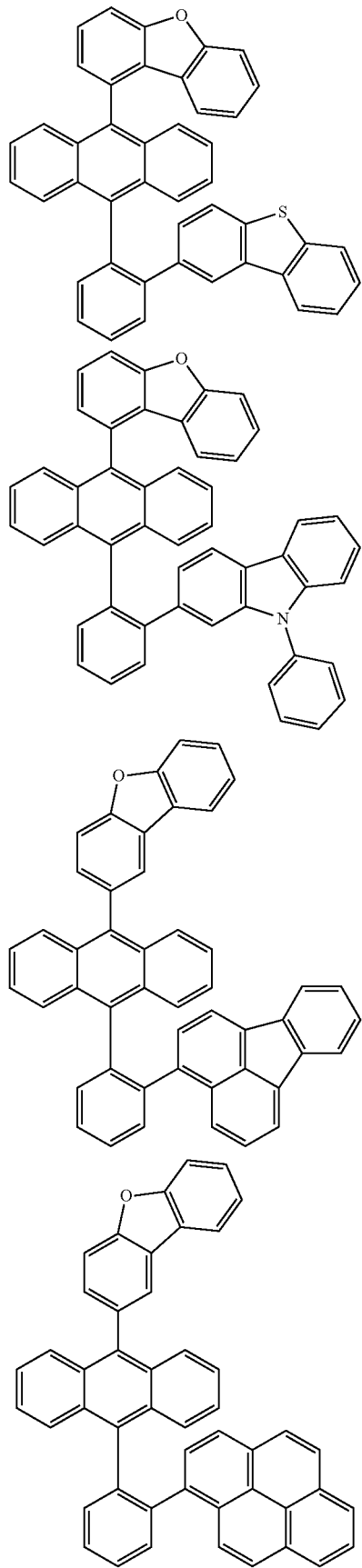

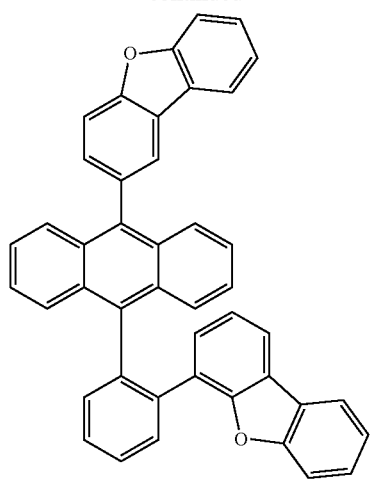
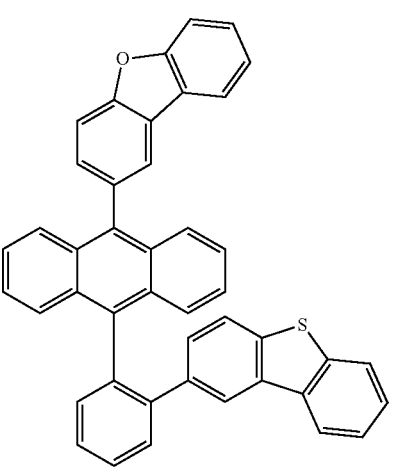
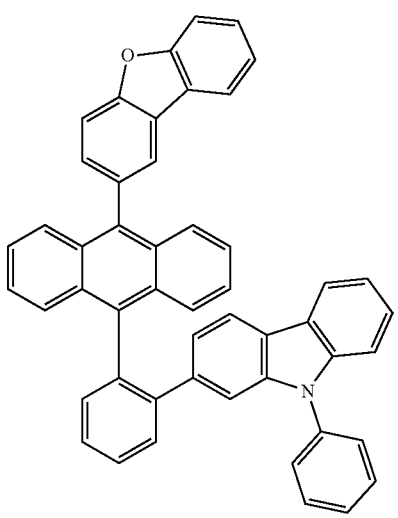
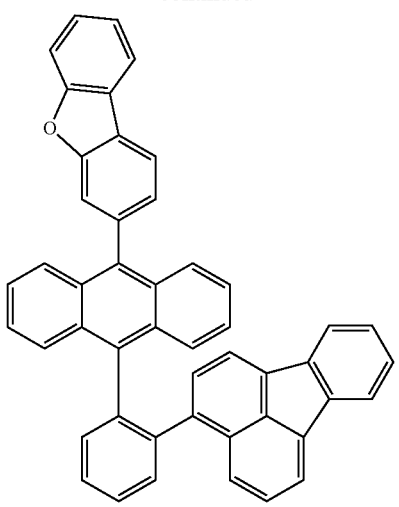
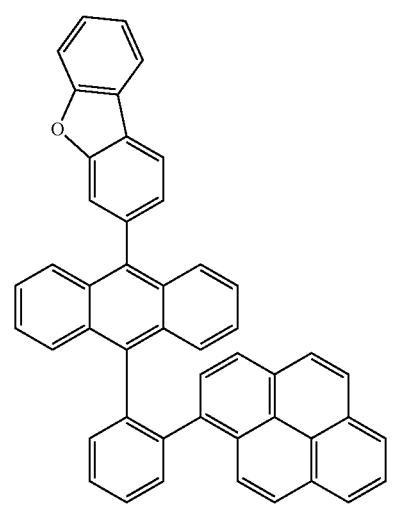
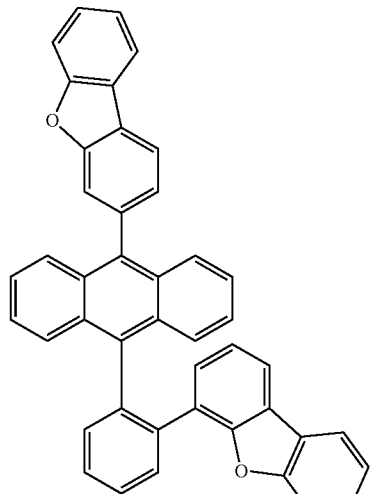

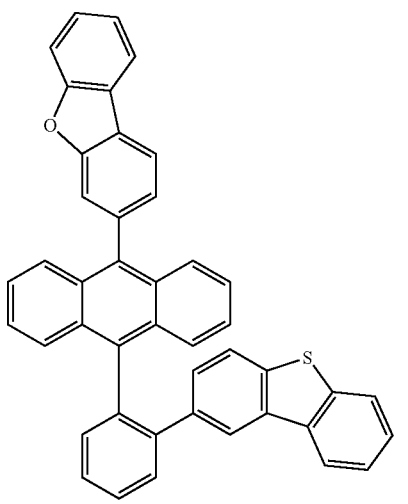
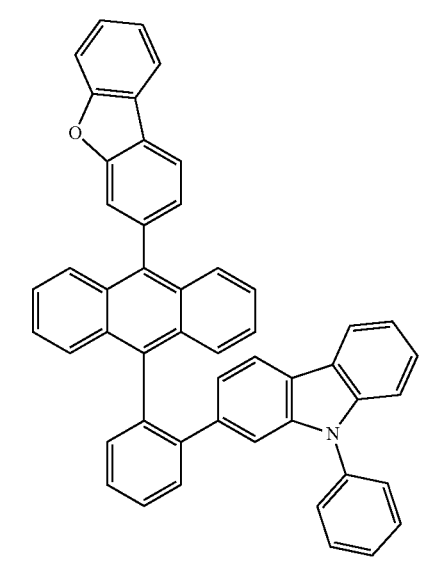
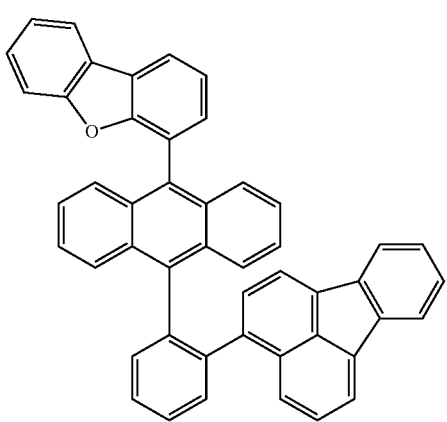
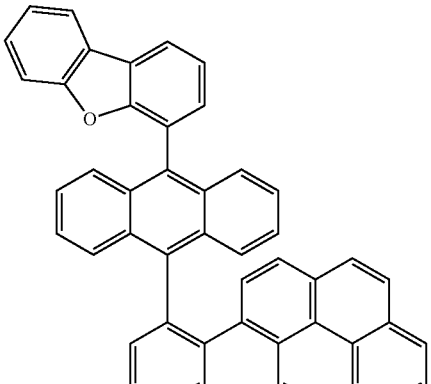
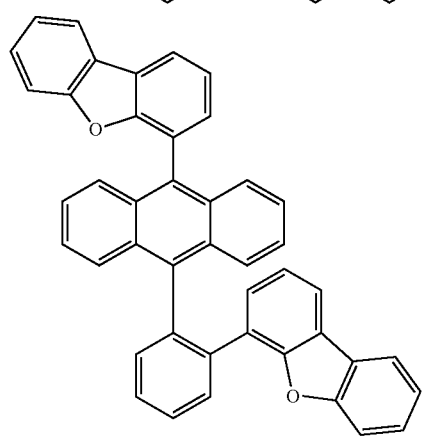
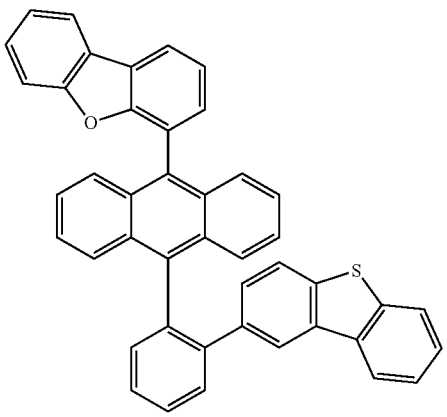
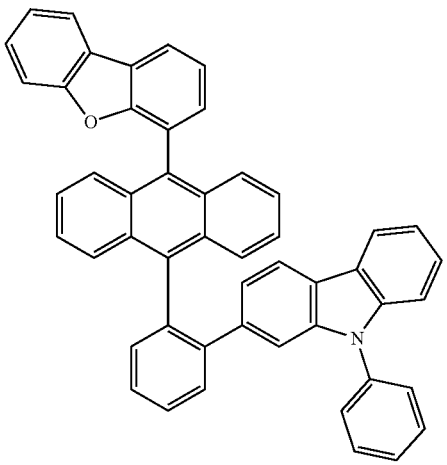 [SMILES: c1ccc(-n2c3ccccc3c3ccc(-c4ccccc4-c4c5ccccc5c(-c5cccc6c5oc5ccccc56)c5ccccc45)cc32)cc1]

69
-continued
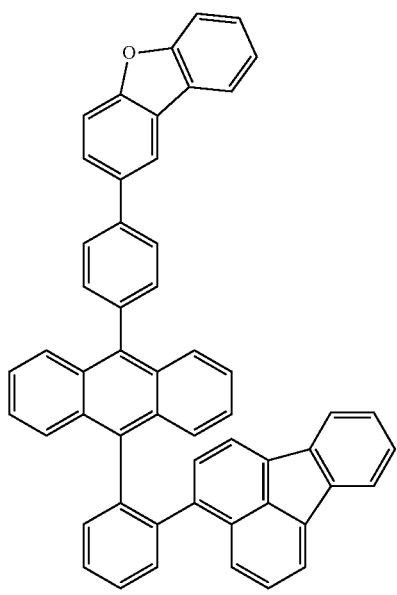
70
-continued
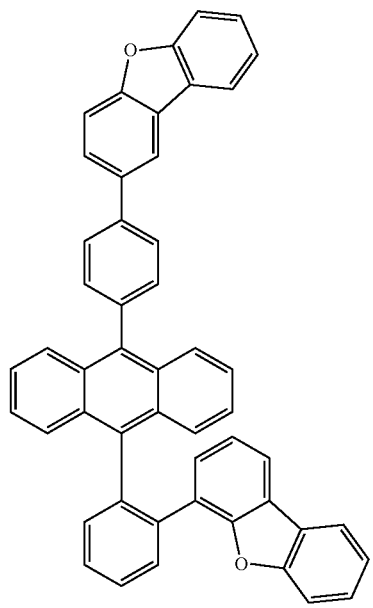
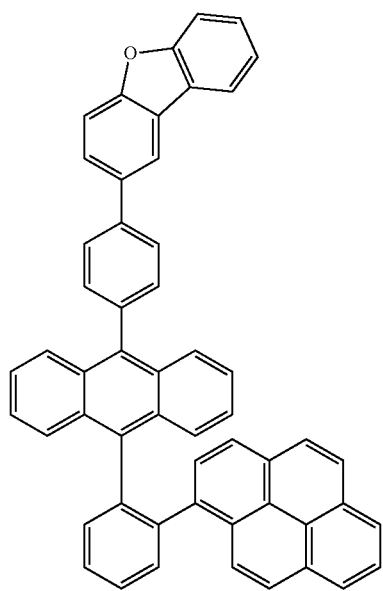
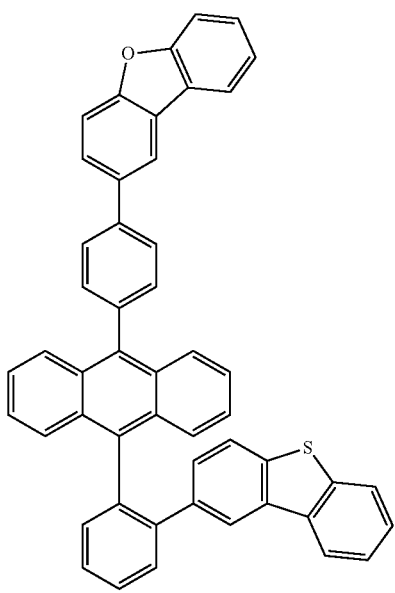

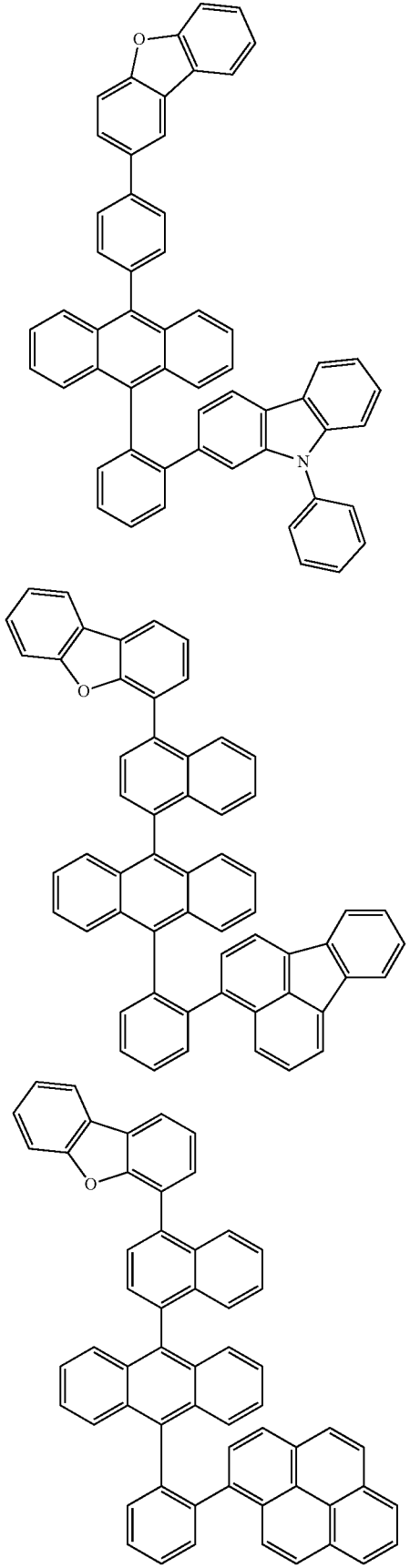

73
-continued
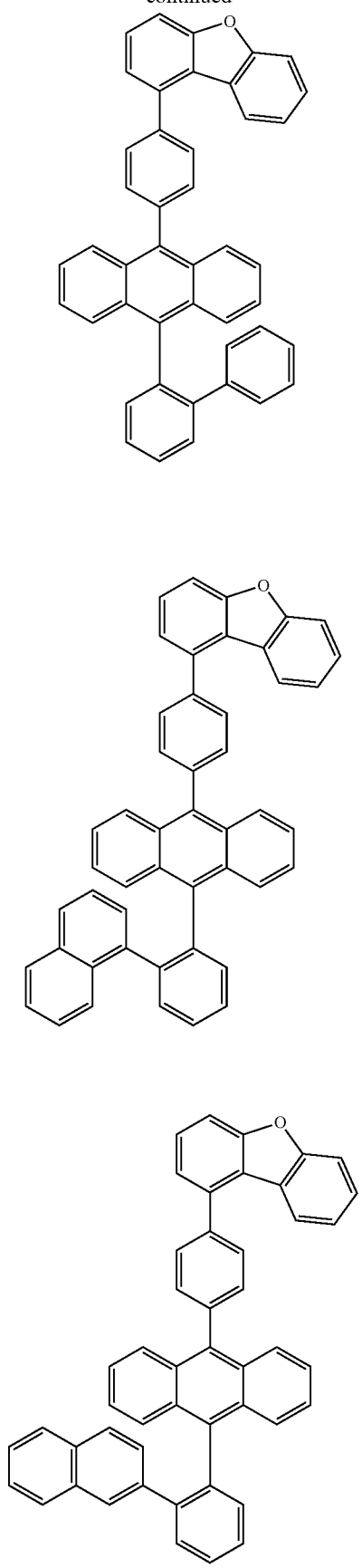
74
-continued
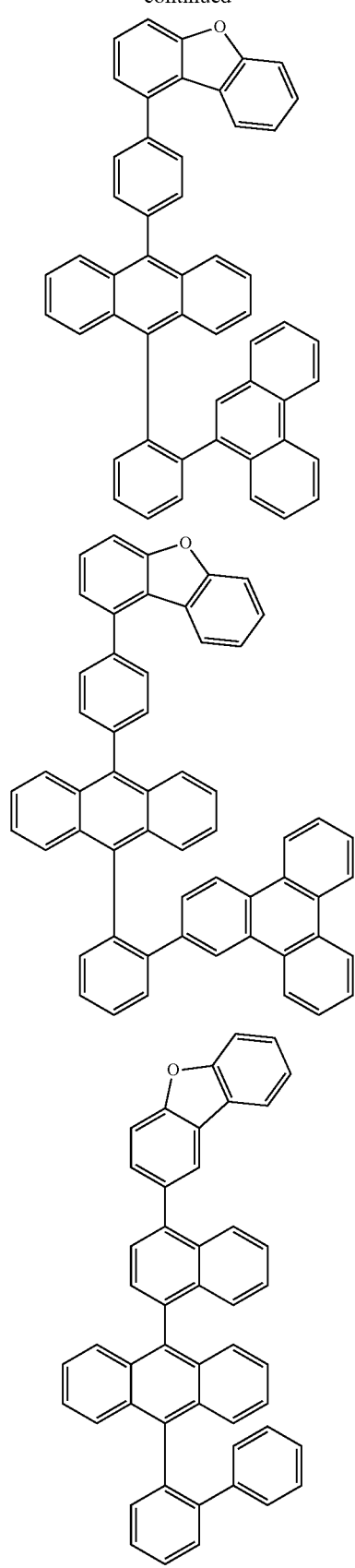

75
-continued
76
-continued
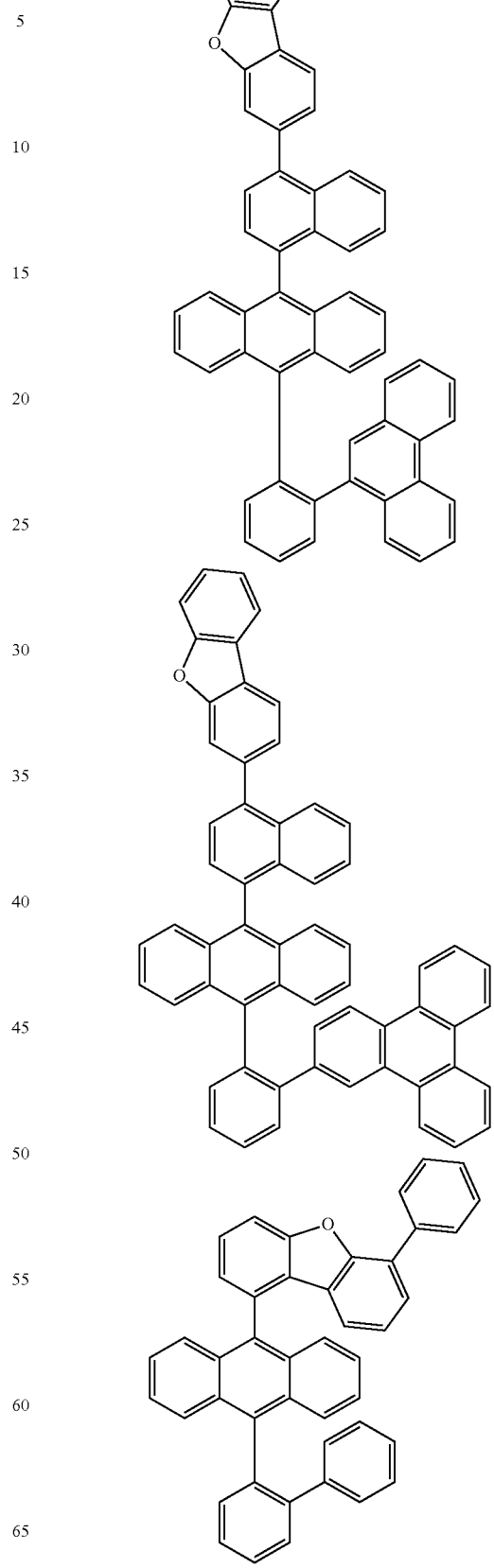

77
-continued
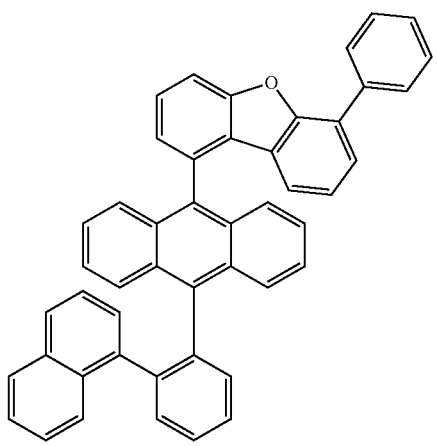
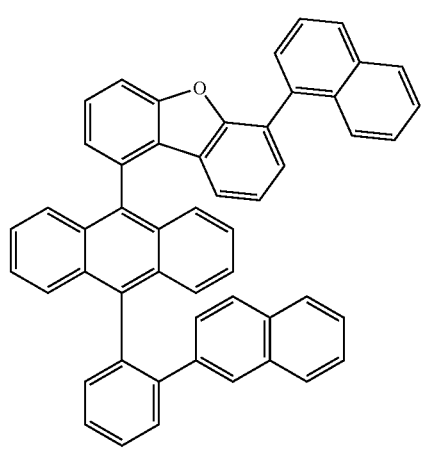
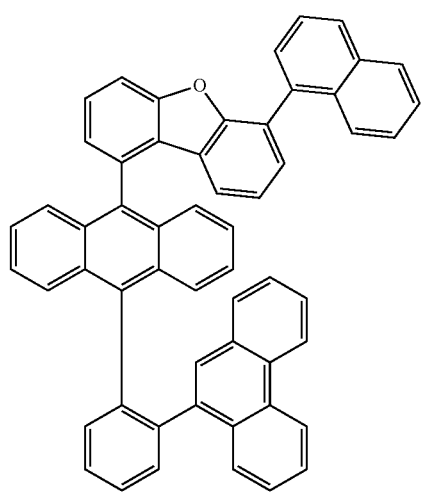
78
-continued
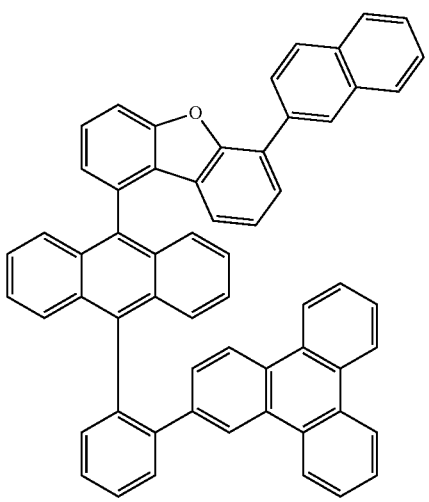
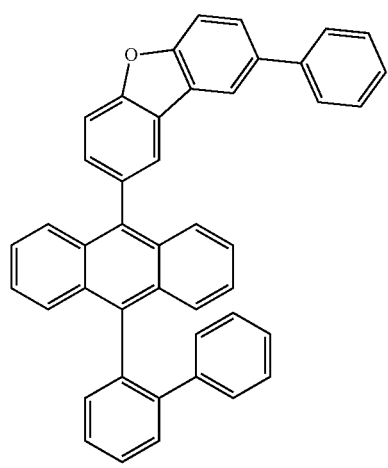
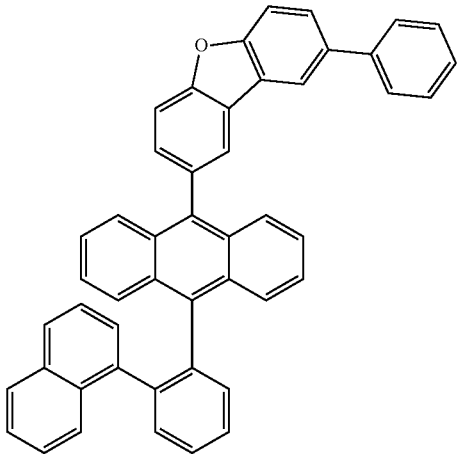

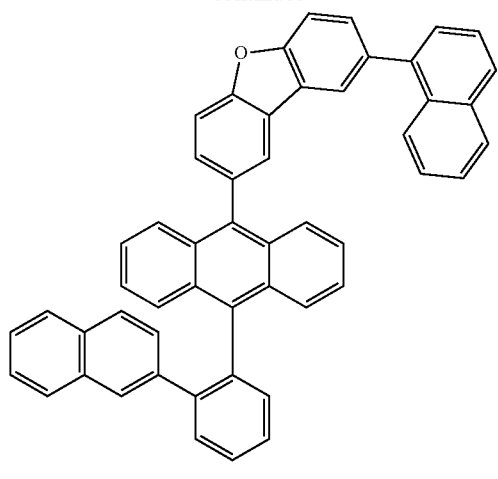
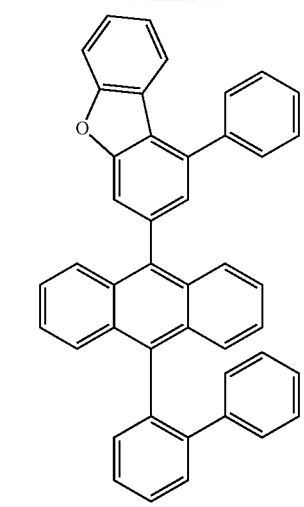
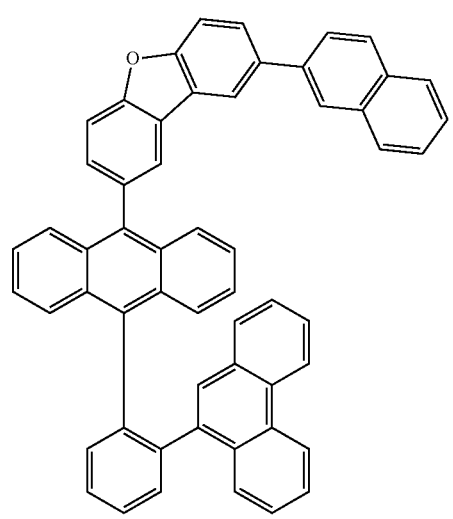
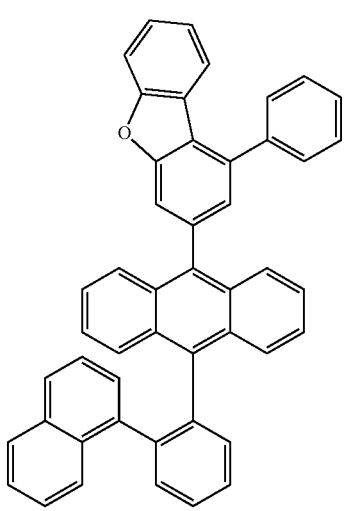
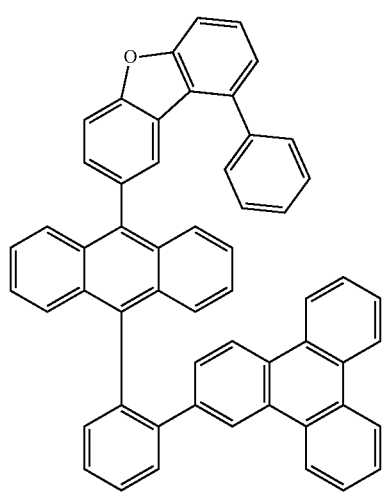

81
-continued
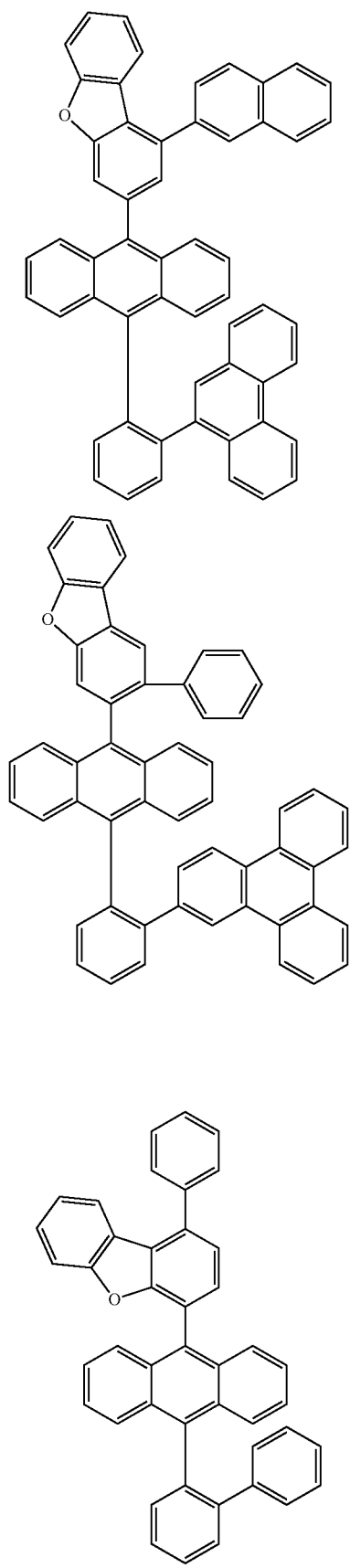
82
-continued
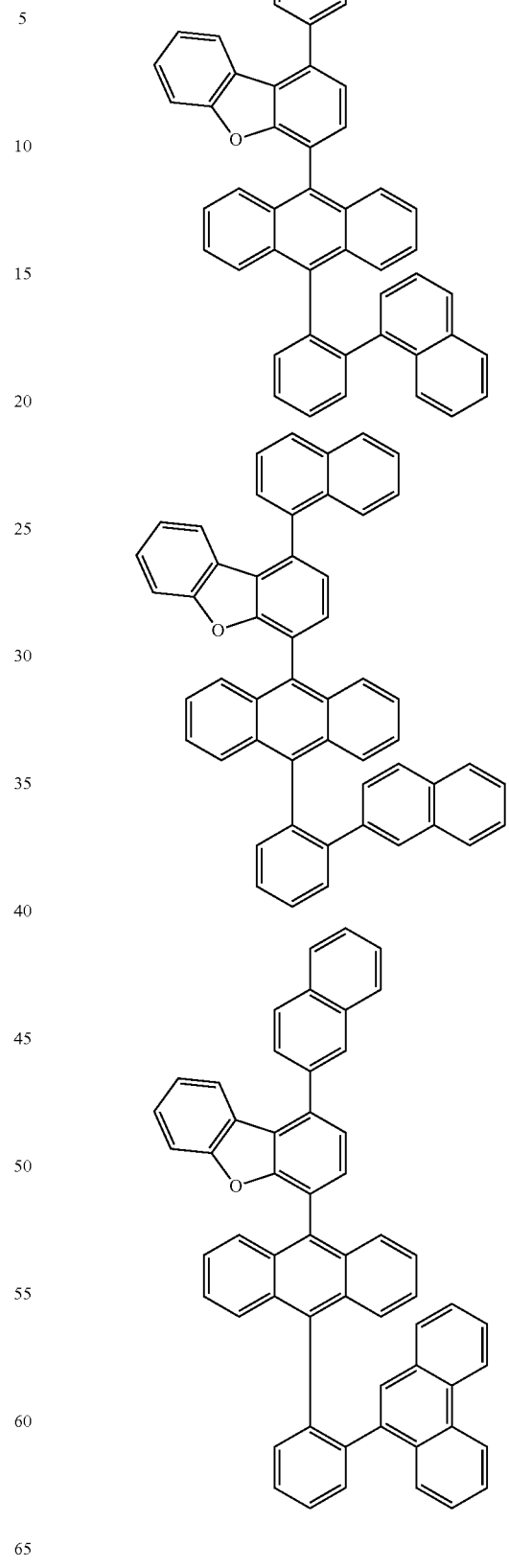

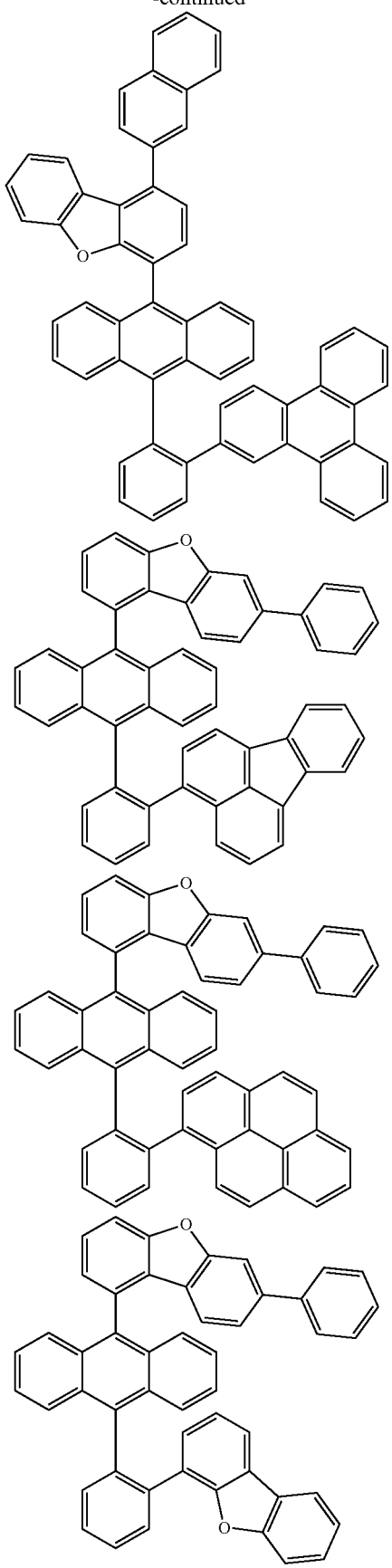
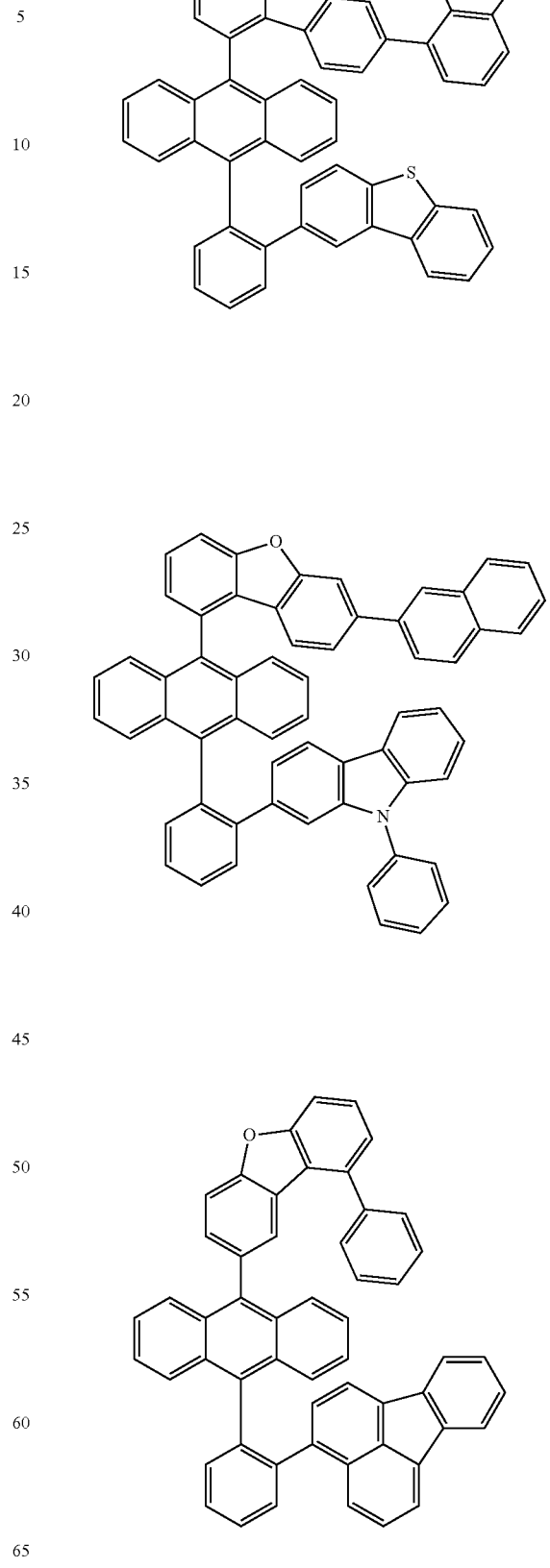

-continued
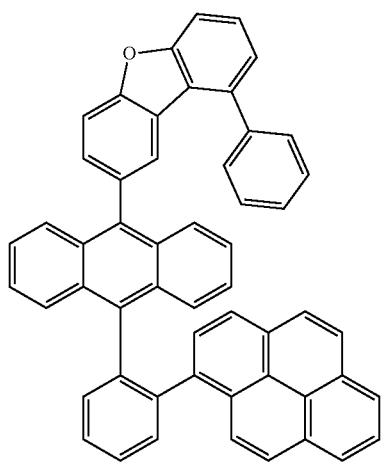
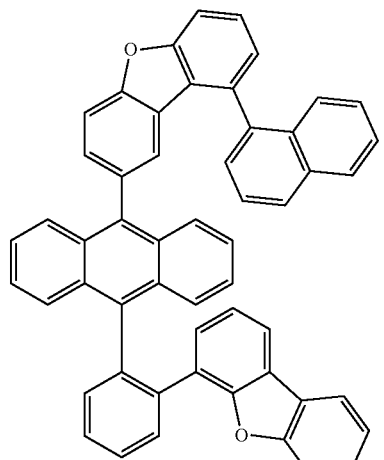
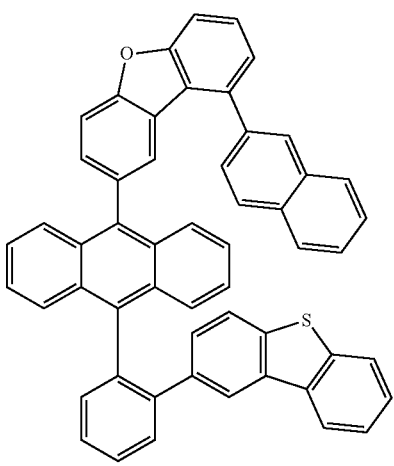
-continued
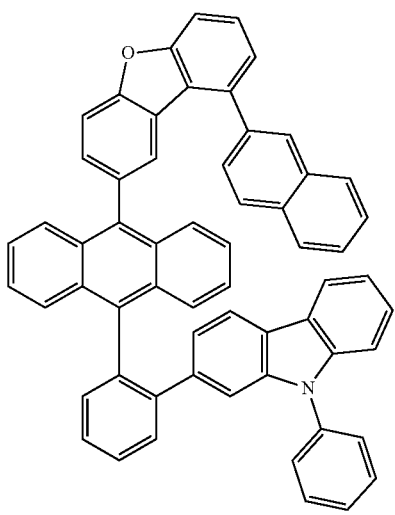
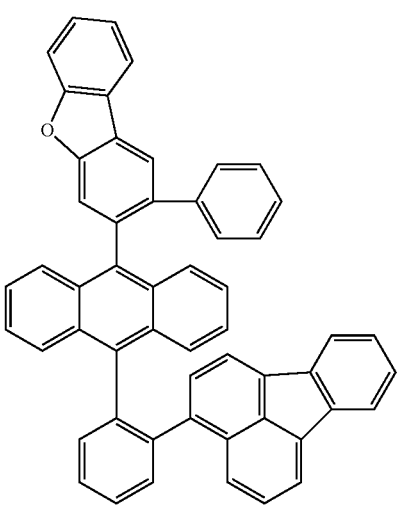
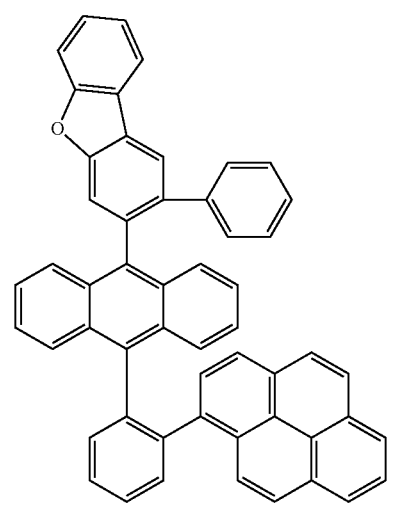

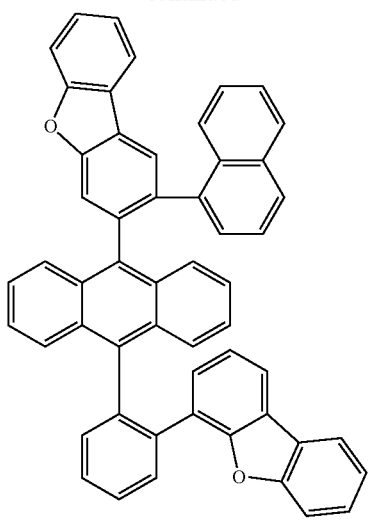
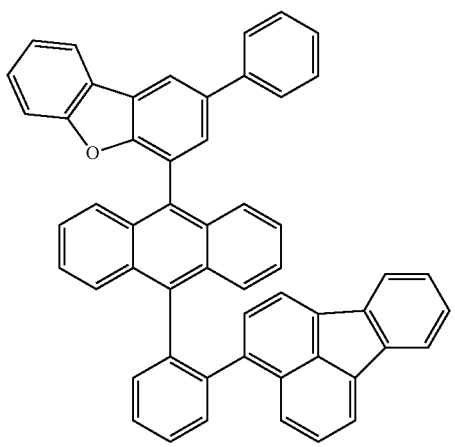
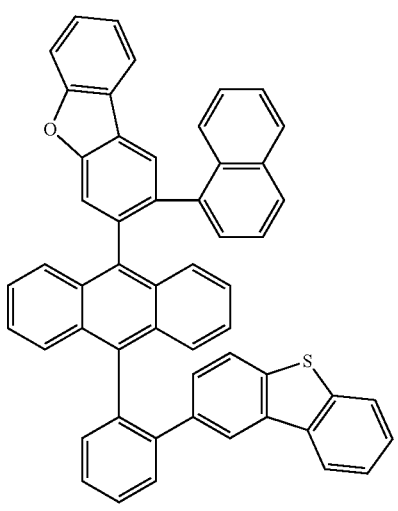
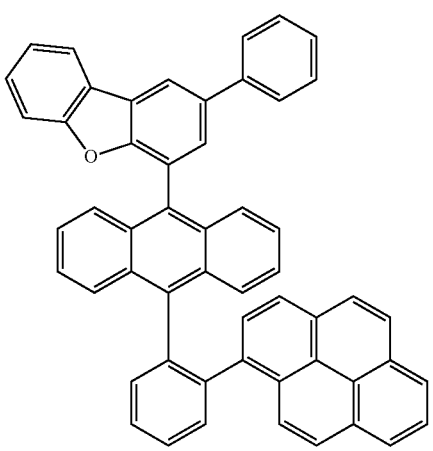
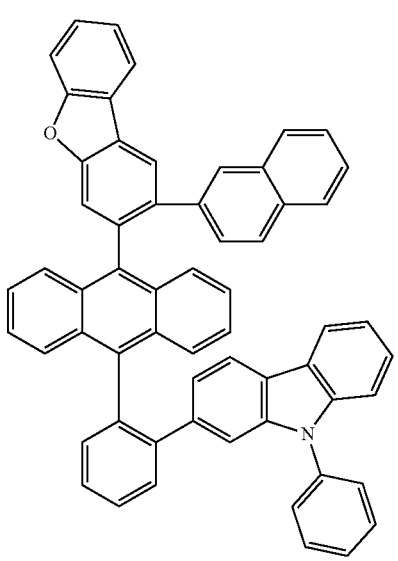
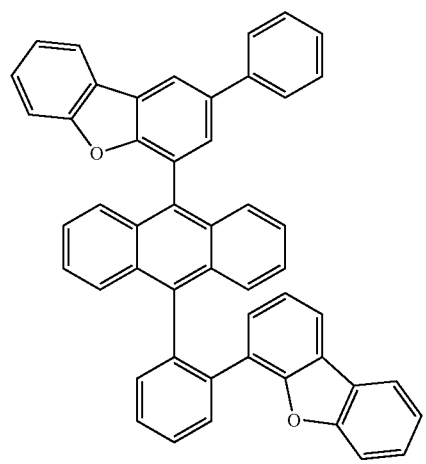

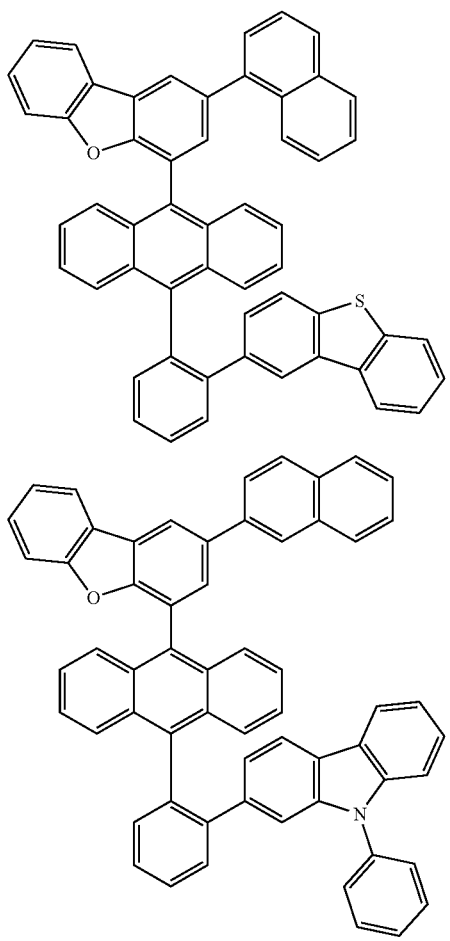
In one embodiment of the present specification, the compound of Chemical Formula 3 is any one selected from among the following compounds.
BD-1
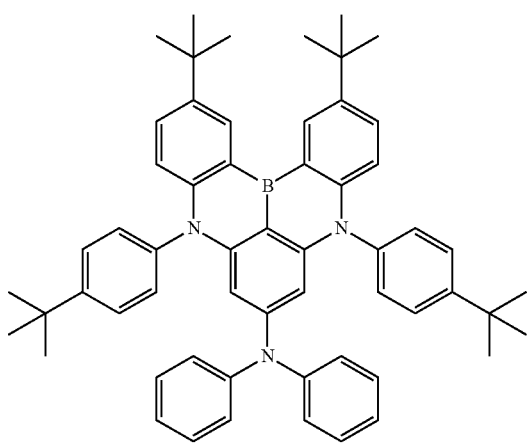
BD-2
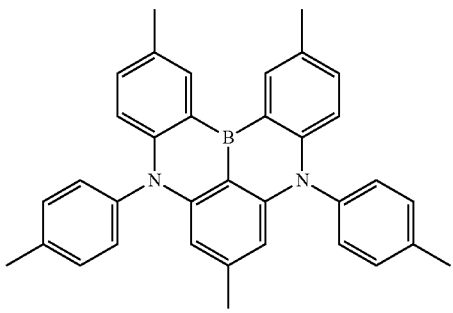
BD-3
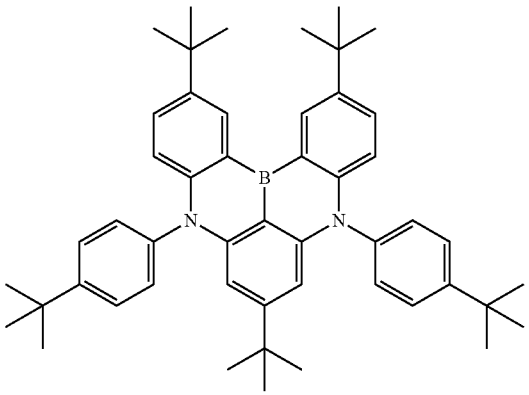
BD-4
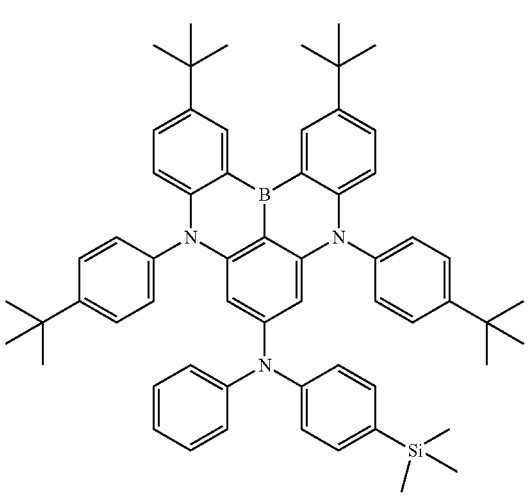
BD-5
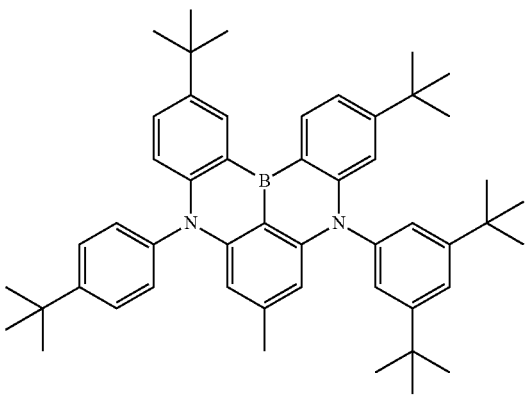

-continued
BD-6
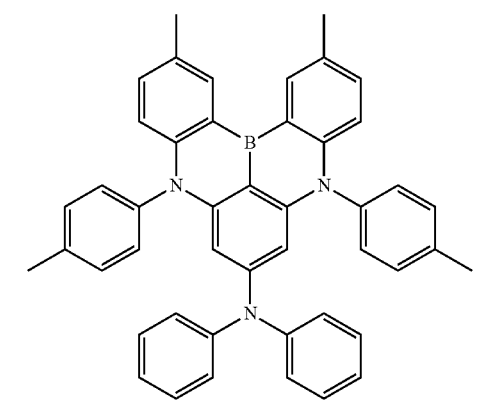
BD-7
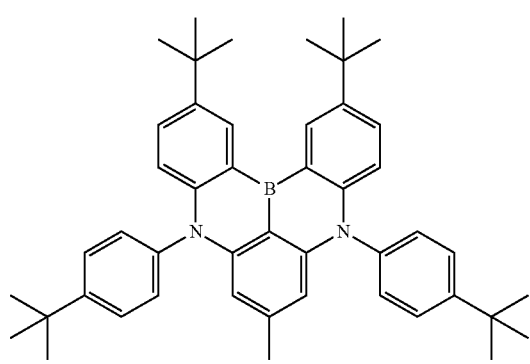
BD-8
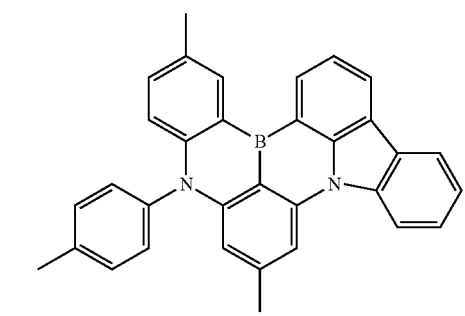
BD-9
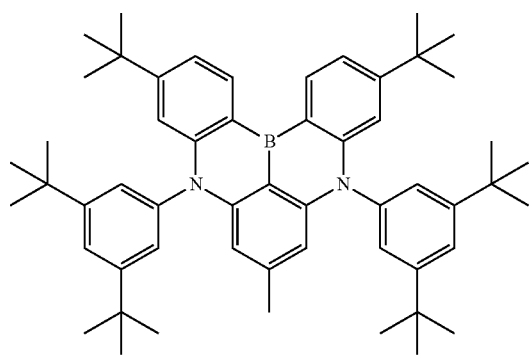
-continued
BD-10
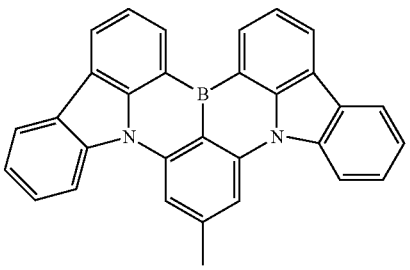
BD-11
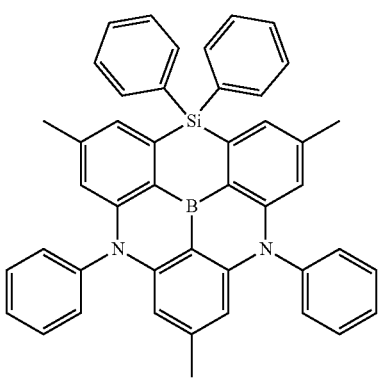
BD-12
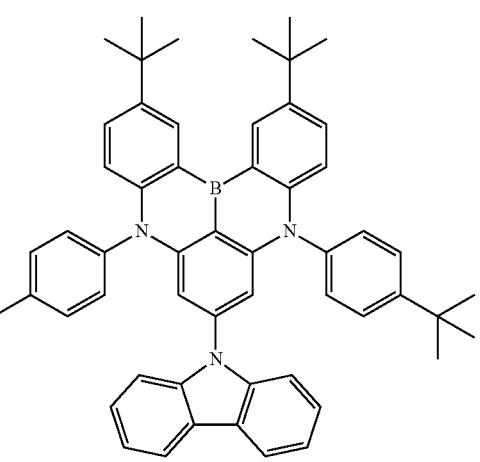
BD-13
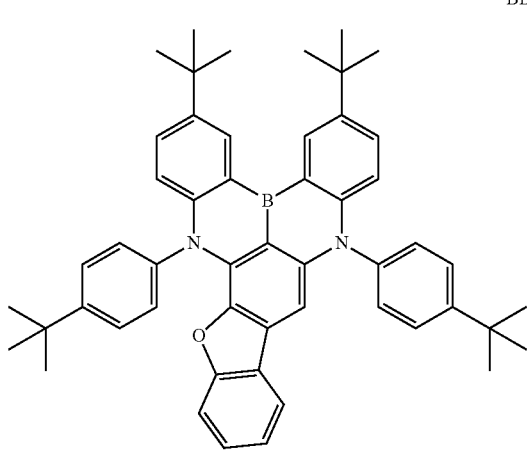

BD-14
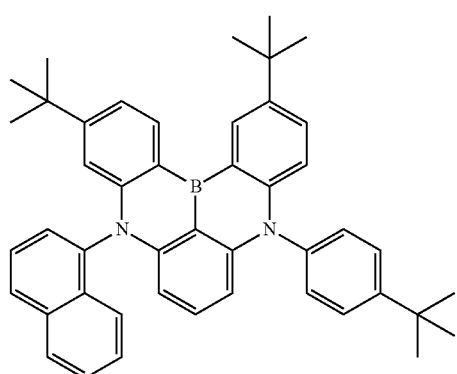
BD-15
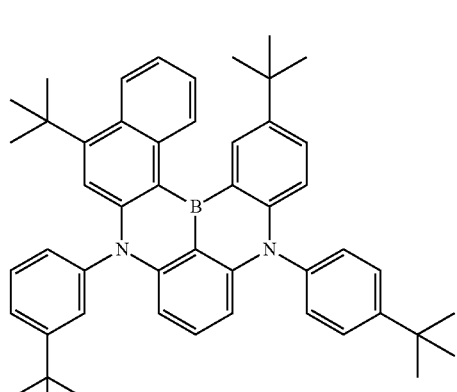
BD-16
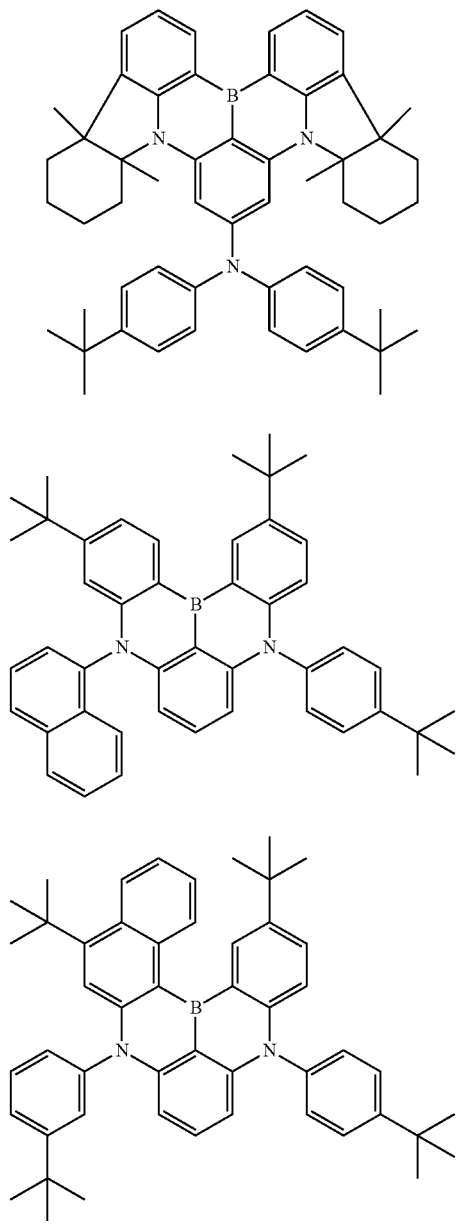
BD-17
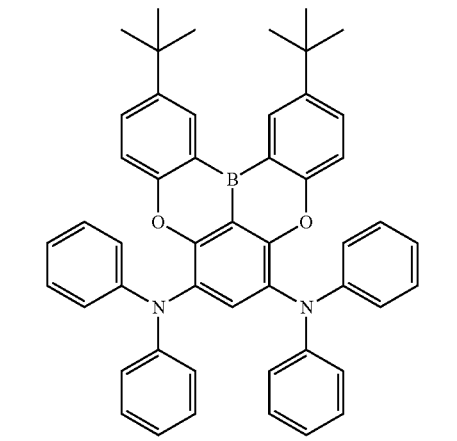
BD-18
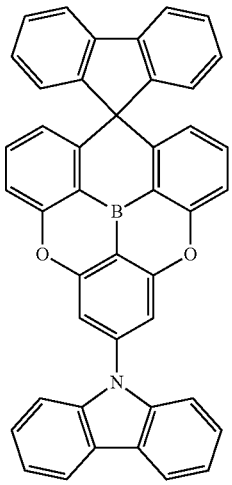
BD-19
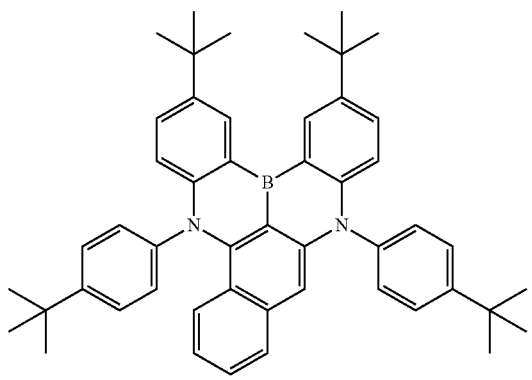
BD-20
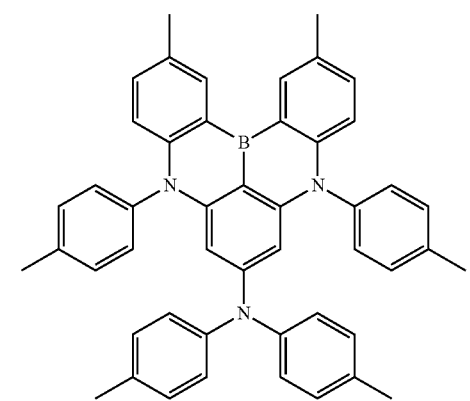
BD-21
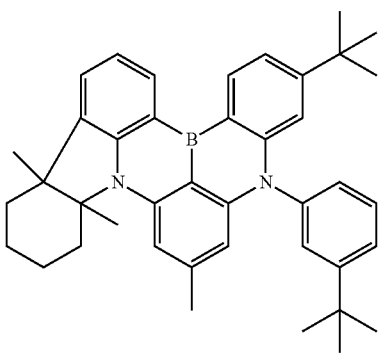

-continued
BD-22
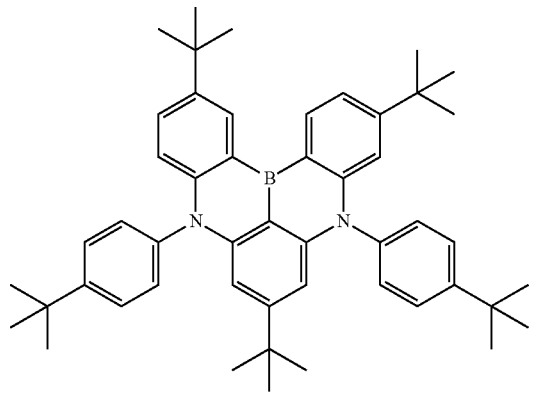
BD-23
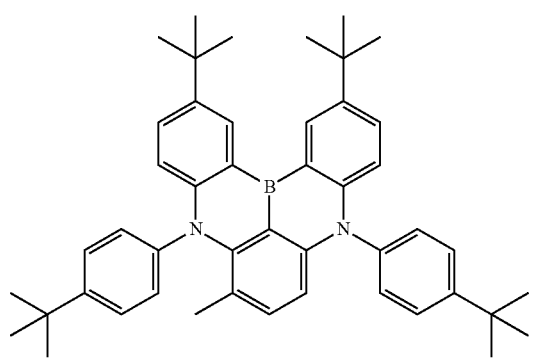
BD-24
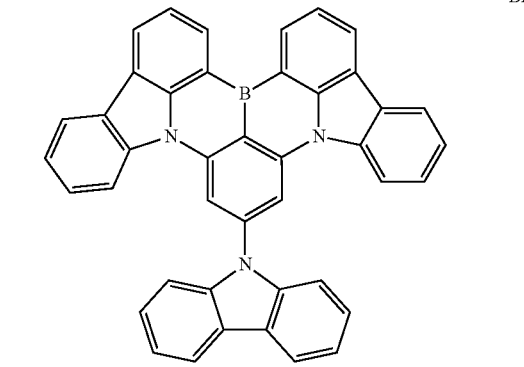
BD-25
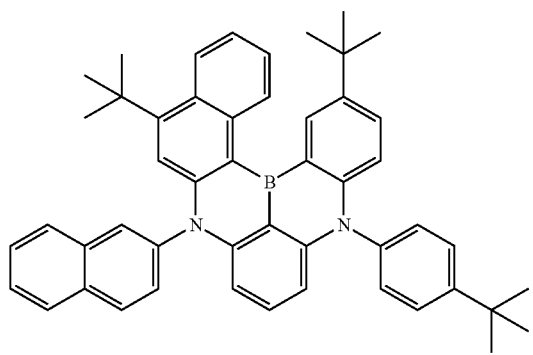
-continued
BD-26
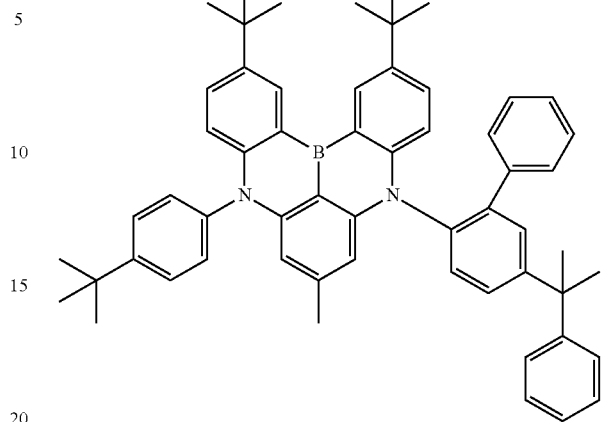
BD-27
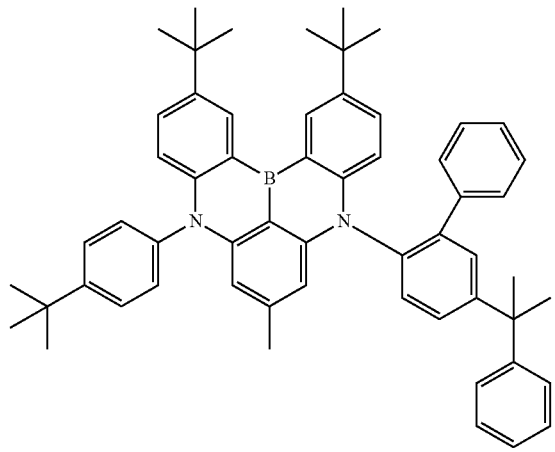
BD-28
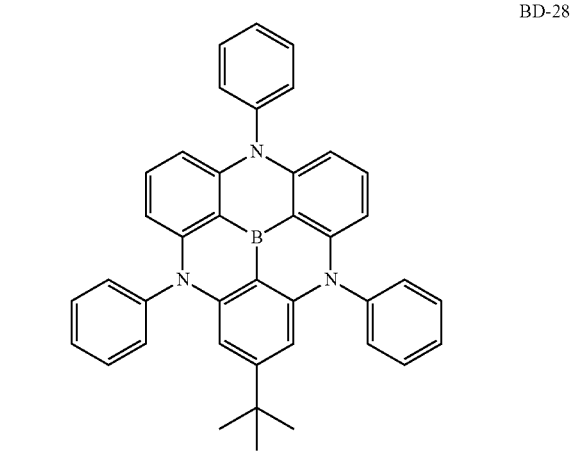

BD-29

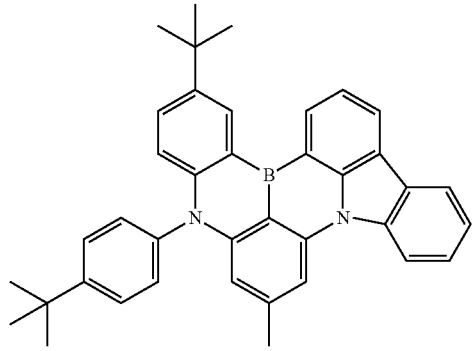

BD-33

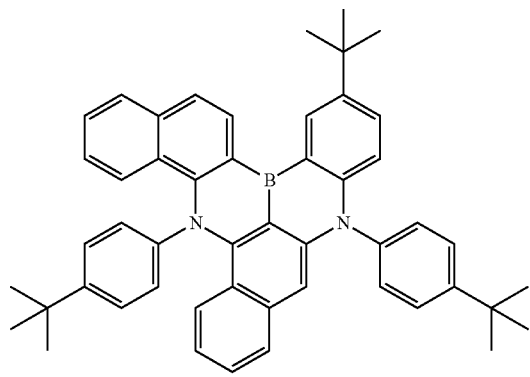

BD-30

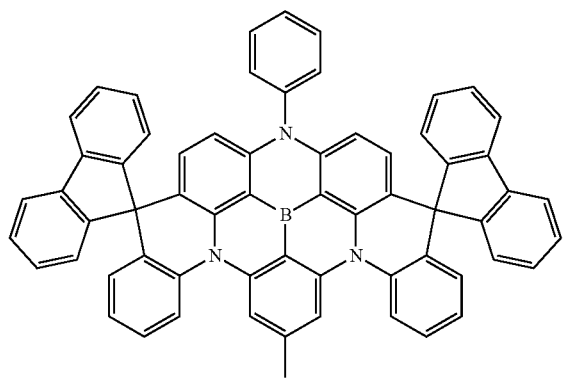

BD-31

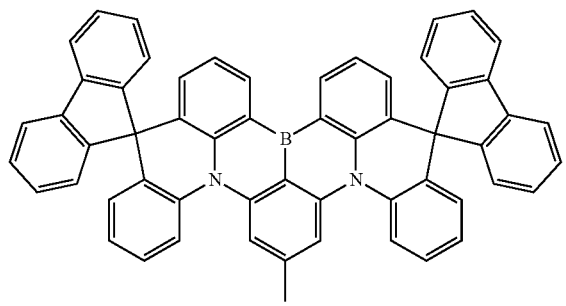

BD-32

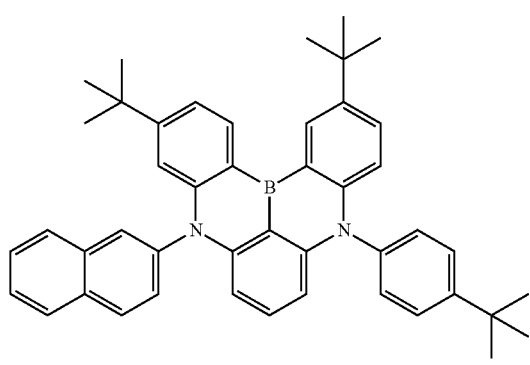

In one embodiment of the present specification, the compound of Chemical Formula 1 may be prepared as in the following General Formula 1.

[General Formula 1]

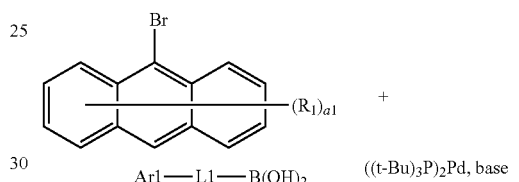
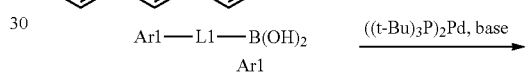
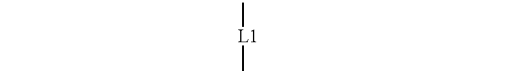
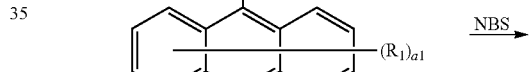
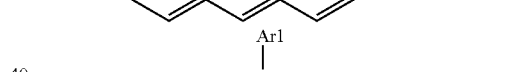
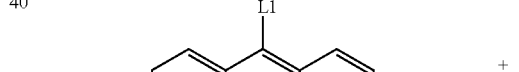
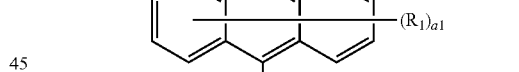
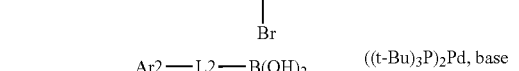
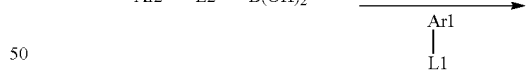

In General Formula 1,

L1, L2, Ar1, Ar2, R$_1$ and a1 have the same definitions as in Chemical Formula 1.

In one embodiment of the present specification, the compound of Chemical Formula 2 may be prepared as in the following General Formula 2.

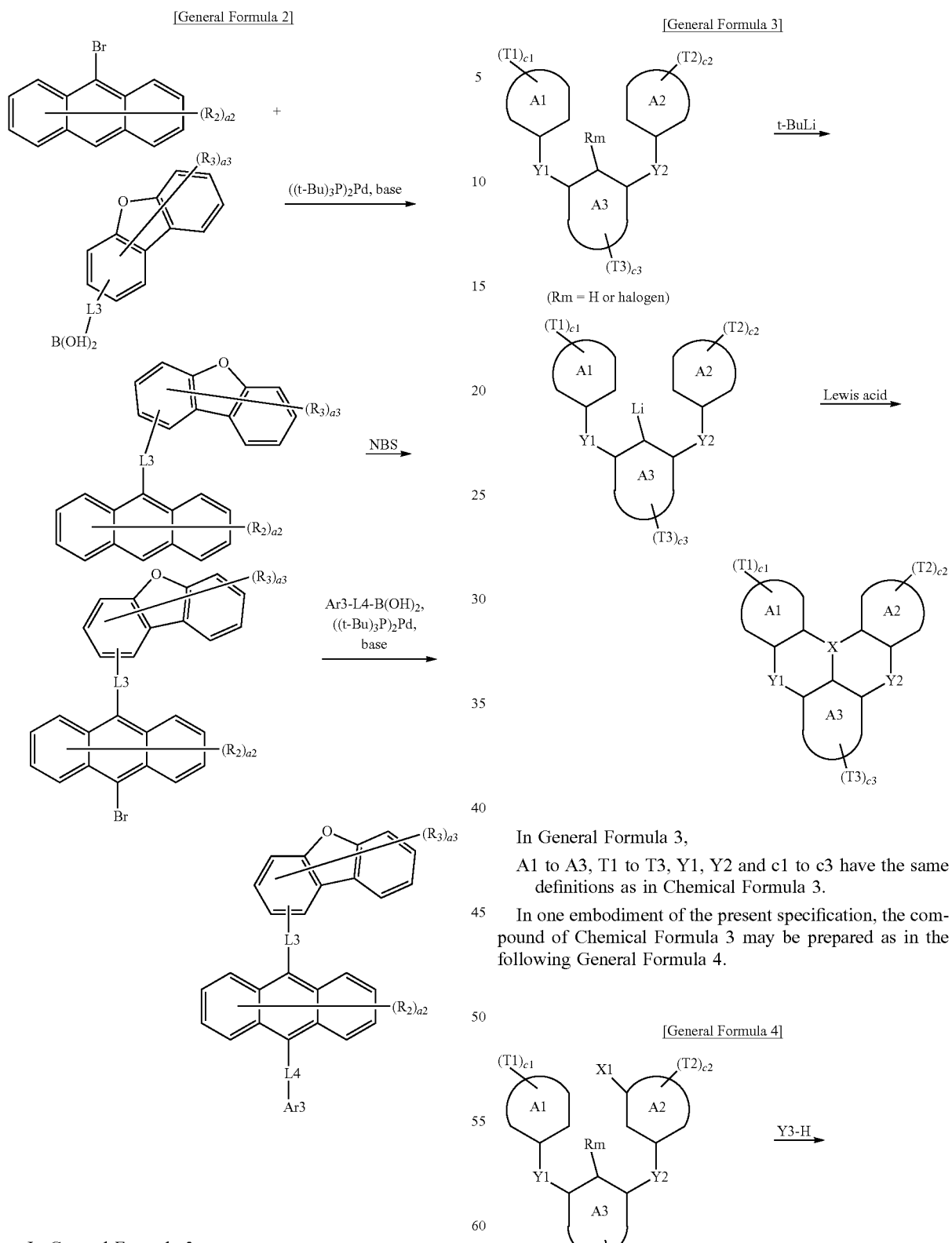

In General Formula 2,

L3, L4, Ar3, $R_2$, $R_3$, Ar3, a2 and a3 have the same definitions as in Chemical Formula 2.

In one embodiment of the present specification, the compound of Chemical Formula 3 may be prepared as in the following General Formula 3.

In General Formula 3,

A1 to A3, T1 to T3, Y1, Y2 and c1 to c3 have the same definitions as in Chemical Formula 3.

In one embodiment of the present specification, the compound of Chemical Formula 3 may be prepared as in the following General Formula 4.

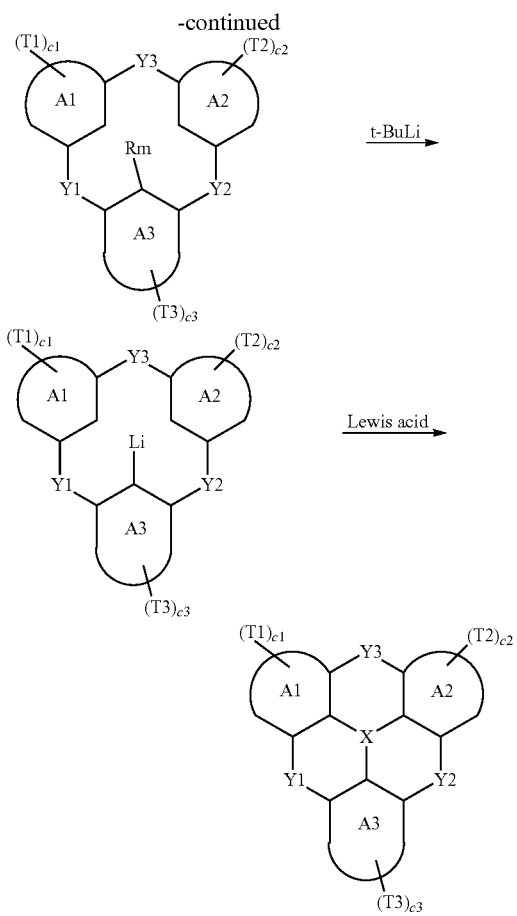

In General Formula 4,

A1 to A3, T1 to T3, Y1, Y2 and c1 to c3 have the same definitions as in Chemical Formula 3, and X1 is a halogen group.

General Formula 1 to General Formula 4 are one example of forming the compounds of Chemical Formulae 1 to 3, and methods for synthesizing the compounds of Chemical Formulae 1 to 3 are not limited to General Formulae 1 to 4, and methods known in the art may be used.

One embodiment of the present specification provides an organic light emitting device including a first electrode, a second electrode, and a light emitting layer provided between the first electrode and the second electrode, wherein the light emitting layer includes the compound of Chemical Formula 1, the compound of Chemical Formula 2 and the compound of Chemical Formula 3.

In the present specification, a certain organic material layer including a certain compound means including one or more types of compounds.

In one embodiment of the present disclosure, the organic light emitting device includes one, two or more light emitting layers. In one embodiment, the light emitting layer including the compounds of Chemical Formula 1 to Chemical Formula 3 is a blue light emitting layer. When the organic light emitting device includes two or more light emitting layers, each of the light emitting layers may be formed with materials the same as or different from each other, and may display colors the same as or different from each other.

One embodiment of the present specification provides an organic light emitting device including a first electrode, a second electrode, and a light emitting layer provided between the first electrode and the second electrode, wherein the light emitting layer includes only the compound of Chemical Formula 1, the compound of Chemical Formula 2 and the compound of Chemical Formula 3.

In one embodiment of the present specification, the light emitting layer of the organic light emitting device includes one or more types of the compound of Chemical Formula 1, one or more types of the compound of Chemical Formula 2 and one or more types of the compound of Chemical Formula 3.

In one embodiment of the present specification, the compound of Chemical Formula 1 and the compound of Chemical Formula 2 are included in the light emitting layer in 5 parts by weight:95 parts by weight to 95 parts by weight:5 parts by weight.

In one embodiment of the present specification, the compound of Chemical Formula 3 is included in the light emitting layer in 1 parts by weight to 50 parts by weight based on 100 parts by weight, a sum of the parts by weight of the compound of Chemical Formula 1 and the compound of Chemical Formula 2.

In one embodiment of the present specification, the compound of Chemical Formula 3 is included in the light emitting layer in 1 parts by weight to 15 parts by weight based on 100 parts by weight, a sum of the parts by weight of the compound of Chemical Formula 1 and the compound of Chemical Formula 2.

In one embodiment of the present specification, when the light emitting layer includes one or more types of the compound of Chemical Formula 1, the parts by weight of the compound of Chemical Formula 1 means a sum of the parts by weight of the one or more types of the compound.

In one embodiment of the present specification, when the light emitting layer includes one or more types of the compound of Chemical Formula 2, the parts by weight of the compound of Chemical Formula 2 means a sum of the parts by weight of the one or more types of the compound of Chemical Formula 2.

In one embodiment of the present specification, when the light emitting layer includes one or more types of the compound of Chemical Formula 3, the parts by weight of the compound of Chemical Formula 3 means a sum of the parts by weight of the one or more types of the compound of Chemical Formula 3.

In one embodiment of the present specification, the light emitting layer included in the organic light emitting device is one layer.

In one embodiment of the present specification, the light emitting layer including the compound of Chemical Formula 1, the compound of Chemical Formula 2 and the compound of Chemical Formula 3 is formed in a single layer.

In one embodiment of the present specification, the organic light emitting device further includes one or more organic material layers.

In one embodiment of the present specification, the organic light emitting device further includes one or more organic material layers between the first electrode and the light emitting layer.

In one embodiment of the present specification, the organic light emitting device further includes one or more organic material layers between the second electrode and the light emitting layer.

In one embodiment of the present specification, the organic light emitting device further includes one or more layers of a hole injection layer, a hole transfer layer, a layer carrying out hole transfer and injection at the same time, a hole control layer, a light emitting layer, an electron control layer, an electron transfer layer, an electron injection layer, a layer carrying out electron transfer and injection at the same time.

In one embodiment of the present specification, the compound of Chemical Formula 1 and the compound of Chemical Formula 2 are included in the light emitting layer as a host.

In one embodiment of the present specification, the compound of Chemical Formula 3 is included in the light emitting layer as a dopant.

In one embodiment of the present specification, the organic light emitting device may be an organic light emitting device having a normal structure in which an anode, one or more organic material layers, and a cathode are consecutively laminated on a substrate (normal type).

In one embodiment of the present specification, the organic light emitting device may be an organic light emitting device having a structure in a reversed direction in which a cathode, one or more organic material layers and an anode are consecutively laminated on a substrate (inverted type).

In one embodiment of the present specification, the first electrode is an anode, and the second electrode is a cathode.

In another embodiment, the first electrode is a cathode, and the second electrode is an anode.

Structures of the organic light emitting device according to one embodiment of the present specification are illustrated in FIGS. 1 to 3.

The organic light emitting device according to one embodiment of the present disclosure may be formed with a substrate (1), an anode (2), a light emitting layer (8) and a cathode (4) as illustrated in FIG. 1. In one embodiment, the compound of Chemical Formula 1, the compound of Chemical Formula 2 and the compound of Chemical Formula 3 are included in the light emitting layer (8).

The organic light emitting device according to one embodiment of the present disclosure may be formed with a substrate (1), an anode (2), a hole injection layer (5), a hole transfer layer (6), a hole control layer (7), a light emitting layer (8), an electron transfer layer (9), an electron injection layer (10) and a cathode (4) as illustrated in FIG. 2. In one embodiment, the compound of Chemical Formula 1, the compound of Chemical Formula 2 and the compound of Chemical Formula 3 are included in the light emitting layer (8).

The organic light emitting device according to one embodiment of the present disclosure may be formed with a substrate (1), an anode (2), a hole injection layer (5), a hole transfer layer (6), a light emitting layer (8), an electron injection and transfer layer (11) and a cathode (4) as illustrated in FIG. 3. In one embodiment, the compound of Chemical Formula 1, the compound of Chemical Formula 2 and the compound of Chemical Formula 3 are included in the light emitting layer (8).

However, the structure of the organic light emitting device according to one embodiment of the present specification is not limited to FIG. 1 to FIG. 3, and may be any one of the following structures.

(1) an anode/a hole transfer layer/a light emitting layer/a cathode (2) an anode/a hole injection layer/a hole transfer layer/a light emitting layer/a cathode (3) an anode/a hole transfer layer/a light emitting layer/an electron transfer layer/a cathode (4) an anode/a hole transfer layer/a light emitting layer/an electron transfer layer/an electron injection layer/a cathode (5) an anode/a hole injection layer/a hole transfer layer/a light emitting layer/an electron transfer layer/a cathode (6) an anode/a hole injection layer/a hole transfer layer/a light emitting layer/an electron transfer layer/an electron injection layer/a cathode (7) an anode/a hole transfer layer/a hole control layer/a light emitting layer/an electron transfer layer/a cathode (8) an anode/a hole transfer layer/a hole control layer/a light emitting layer/an electron transfer layer/an electron injection layer/a cathode (9) an anode/a hole injection layer/a hole transfer layer/a hole control layer/a light emitting layer/an electron transfer layer/a cathode

(10) an anode/a hole transfer layer/a light emitting layer/an electron control layer/an electron transfer layer/a cathode

(11) an anode/a hole transfer layer/a light emitting layer/an electron control layer/an electron transfer layer/an electron injection layer/a cathode

(12) an anode/a hole injection layer/a hole transfer layer/a light emitting layer/an electron control layer/an electron transfer layer/a cathode

(13) an anode/a hole injection layer/a hole transfer layer/a light emitting layer/an electron control layer/an electron transfer layer/an electron injection layer/a cathode When the organic light emitting device includes a plurality of organic material layers, the organic material layers may be formed with materials the same as or different from each other.

For example, the organic light emitting device of the present specification may be manufactured by consecutively laminating a first electrode, an organic material layer and a second electrode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer and an electron transfer layer thereon, and then depositing a material capable of being used as a cathode thereon.

In addition, the compounds of Chemical Formulae 1 to 3 may be formed into an organic material layer using a solution coating method as well as a vacuum deposition method when manufacturing the organic light emitting device. Herein, the solution coating method means spin coating dip coating doctor blading inkjet printing screen printing a spray method, roll coating and the like, but is not limited thereto.

In addition to such a method, the organic light emitting device may also be manufactured by consecutively depositing a cathode material, an organic material layer and an anode material on a substrate (International Patent Application Laid-Open Publication No. 2003/012890). However, the manufacturing method is not limited thereto.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof, metal oxides such as zinc oxide, indium oxide, indium tin oxide (ITO) and indium zinc oxide (IZO); combinations of metals and oxides such as ZnO:Al or SnO$_2$:Sb; conductive polymers such as poly(3-methylthiophene), poly3,4-(ethylene-1,2-dioxy)thiophene (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof, multilayer structure materials such as LiF/Al or LiO$_2$/Al, and the like, but are not limited thereto.

The hole injection layer is a layer injecting holes received from an electrode to a light emitting layer or an adjacent layer provided on a light emitting layer side. As the hole injection material, materials having an ability to transfer holes, therefore, having a hole injection effect in an anode, having an excellent hole injection effect for a light emitting layer or a light emitting material, preventing excitons generated in the light emitting layer from moving to an electron injection layer or an electron injection material, and in addition thereto, having an excellent thin film forming ability are preferably used. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer receiving holes from a hole injection layer and transferring the holes to a light emitting layer. As the hole transfer material, materials capable of receiving holes from an anode or a hole injection layer, moving the holes to a light emitting layer, and having high mobility for the holes are suited. Specific examples of the hole transfer material include arylamine-based organic materials, conductive polymers, block copolymers having conjugated parts and non-conjugated parts together, and the like, but are not limited thereto.

The hole control layer is a layer controlling performance of the whole device by preventing electrons from flowing into an anode from a light emitting layer and controlling flow of holes flowing into the light emitting layer. As the hole control material, compounds having abilities to prevent electrons from flowing into an anode from a light emitting layer, and control flow of injected holes for the light emitting layer or light emitting material are preferred. In one embodiment, arylamine-based organic materials may be used as the hole control layer, however, the hole control layer is not limited thereto.

In one embodiment of the present specification, the light emitting material of the light emitting layer that may be further included in the organic light emitting device is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Other specific examples of the light emitting material include 8-hydroxyquinoline aluminum complexes (Alq$_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

In addition, the light emitting layer that may be further included in the organic light emitting device may include a host material and a dopant material. The host material may include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like may be included, and as the heteroring-containing compound, carbazole derivatives, dibenzofuran derivatives, ladder-type furan compounds, pyrimidine derivatives and the like may be included, however, the host material is not limited thereto.

The dopant material of the light emitting layer may include aromatic amine derivatives, styrylamine compounds, boron complexes, fluoranthene compounds, metal complexes and the like. Specifically, the aromatic amine derivative is a fused aromatic ring derivative having a substituted or unsubstituted arylamine group, and arylamine group-including pyrene, anthracene, chrysene, peryflanthene and the like may be used. As the styrylamine compound, compounds in which substituted or unsubstituted arylamine is substituted with at least one arylvinyl group may be used. Examples of the styrylamine compound may include styrylamine, styryldiamine, styryltriamine, styryltetraamine and the like, but are not limited thereto. As the metal complex, iridium complexes, platinum complexes and the like may be used, however, the metal complex is not limited thereto.

The electron control layer is a layer controlling performance of the whole device by preventing holes from flowing into a cathode from a light emitting layer and controlling flow of electrons flowing into the light emitting layer. As the electron control material, compounds having abilities to prevent holes from flowing into a cathode from a light emitting layer, and control flow of injected electrons for the light emitting layer or light emitting material are preferred. As the electron control material, proper materials may be used depending on the constitution of the organic material layer used in the device. The electron control layer is located between a light emitting layer and a cathode, and is preferably provided in direct contact with a light emitting layer.

The electron transfer layer is a layer receiving electrons from an electron injection layer and transferring the electrons to a light emitting layer. As the electron transfer material, materials capable of favorably receiving electrons from a cathode, moving the electrons to a light emitting layer, and having high mobility for the electrons are suited. Examples of the electron transfer material include Al complexes of 8-hydroxyquinoline; complexes including Alq$_3$; organic radical compounds; hydroxyflavon-metal complexes, and the like, but are not limited thereto. The electron transfer layer may be used together with any desired cathode material as used in the art. In one embodiment, as the cathode material, materials having low work function; and an aluminum layer or a silver layer may be used. Examples of the material having low work function may include cesium, barium, calcium, ytterbium, samarium and the like, and after forming a layer with the above-mentioned material, an aluminum layer or a silver layer may be formed on the layer.

The electron injection layer is a layer injecting electrons received from an electrode. As the electron injection material, compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferably used. Specific examples thereof may include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzohquinolinato)beryllium, bis(10-hydroxybenzohquinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium and the like, but is not limited thereto.

The organic light emitting device according to the present specification may be a top-emission type, a bottom-emission type or a dual-emission type depending on the materials used.

Hereinafter, the present disclosure will be described in more detail through examples following the present disclosure and comparative examples not following the present disclosure, however, the scope of the present disclosure is not limited to the examples provided below.

<Synthesis of Compound H1-1>

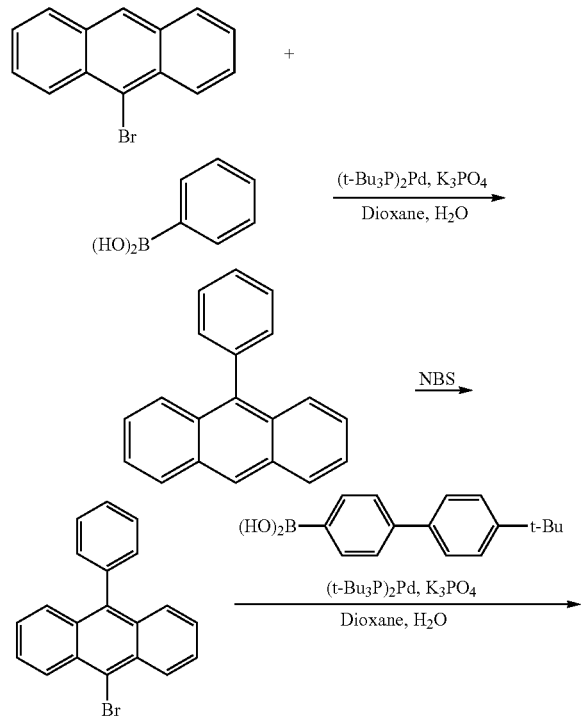

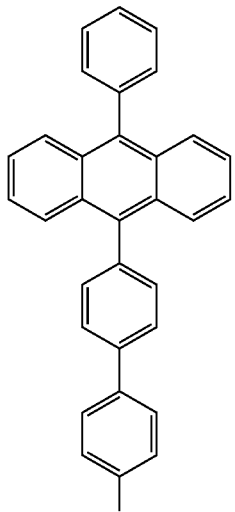

H1-1

9-Bromoanthracene (100 g 388.9 mmol) and phenylboronic acid (51.2 g 427.8 mmol) were introduced to a round bottom flask, and dissolved in dioxane (1500 mL). Potassium phosphate (206.4 g, 972.3 mmol) dissolved in pure water (300 mL) was added thereto, and bis(tri-t-butylphosphine)palladium(0) (398 mg, 0.778 mmol) was added thereto. The result was refluxed for 2 hours, cooled, and then filtered. The filtered solids were recrystallized with toluene to obtain 9-phenylanthracene (86.7 g, 340.9 mmol).

9-Phenylanthracene (80 g, 314.6 mmol) was dissolved in dried dimethylformamide (DMF; 1000 mL), and cooled to 0° C. N-bromosuccinimide (NBS; 58.8 g, 330.3 mmol) was slowly introduced thereto, and the result was stirred for 2 hours. The reaction solution was introduced to excess water (2.5 L), and precipitated solids were filtered. The filtered solids were recrystallized with toluene to obtain 9-bromo-10-phenylanthracene (96.2 g, 288.7 mmol).

9-Bromo-10-phenylanthracene (20 g, 60 mmol) and (4'-(t-butyl)-1,1'-biphenyl-4-yl)boronic acid (16.8 g, 66 mmol) were introduced to a round bottom flask, and dissolved in dioxane (400 mL). Potassium phosphate (31.8 g, 150 mmol) dissolved in pure water (100 mL) was added thereto, and bis(tri-t-butylphosphine)palladium(0) (61 mg, 0.12 mmol) was added thereto. The result was refluxed for 2 hours, cooled, and then filtered. The filtered solids were recrystallized with toluene to obtain Compound H1-1 (19.3 g, 41.7 mmol).

<Syntheses of Compounds H1-2 to H1-5 and H2-1 to H2-12>

Compounds H1-2 to H1-5 and H2-1 to H2-12 were synthesized in the same manner as in the method for synthesizing Compound H1-1 except that compounds of the following Table 1 were used instead of phenylboronic acid and (4'-(t-butyl)-1,1'-biphenyl-4-yl)boronic acid.

TABLE 1

| Compound | phenylboronic acid | (4'-(t-butyl)-[1,1'-biphenyl]-4-yl)boronic acid |
|---|---|---|
| H1-1 | | |
| Compound H1-2 | phenylboronic acid | (4'-(trimethylsilyl)-[1,1'-biphenyl]-4-yl)boronic acid |

TABLE 1-continued

| Compound H1-3 | phenylboronic acid | (8-phenylnaphthalen-2-yl)boronic acid |
| Compound H1-4 | naphthalen-1-ylboronic acid | [1,1'-binaphthalen]-4-ylboronic acid |
| Compound H1-5 | naphthalen-1-ylboronic acid | [1,2'-binaphthalen]-4-ylboronic acid |
| Compound H2-1 | (4-phenyldibenzofuran-1-yl)boronic acid | (1-phenylnaphthalen-2-yl)boronic acid |
| Compound H2-2 | (3-phenyldibenzofuran-1-yl)boronic acid | (4-(naphthalen-1-yl)phenyl)boronic acid |
| Compound H2-3 | dibenzofuran-2-ylboronic acid | [1,1':4',1''-terphenyl]-4-ylboronic acid |
| Compound H2-4 | (1-phenyldibenzofuran-4-yl)boronic acid | (1-phenylnaphthalen-2-yl)boronic acid |
| Compound H2-5 | (7-phenyldibenzofuran-4-yl)boronic acid | (6-phenylnaphthalen-2-yl)boronic acid |
| Compound H2-6 | dibenzofuran-4-ylboronic acid | (2-(phenanthren-9-yl)phenyl)boronic acid |
| Compound H2-7 | dibenzofuran-4-ylboronic acid | (2-(triphenylen-2-yl)phenyl)boronic acid |
| Compound H2-8 | (4-(dibenzofuran-4-yl)naphthalen-1-yl)boronic acid | (2-(fluoranthen-3-yl)phenyl)boronic acid |
| Compound H2-9 | (4-(dibenzofuran-2-yl)phenyl)boronic acid | (2-(pyren-1-yl)phenyl)boronic acid |
| Compound H2-10 | (4-(dibenzofuran-2-yl)phenyl)boronic acid | (2-dibenzofuran-4-yl)phenyl)boronic acid |
| Compound H2-11 | (4-(dibenzofuran-2-yl)phenyl)boronic acid | (2-(dibenzothiophen-2-yl)phenyl)boronic acid |
| Compound H2-12 | (4-(dibenzofuran-2-yl)phenyl)boronic acid | (2-(9-phenyl-9H-carbazol-2-yl)phenyl)boronic acid |

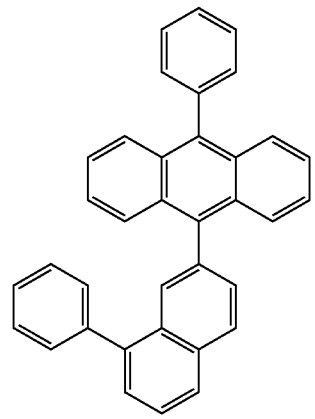

H1-3

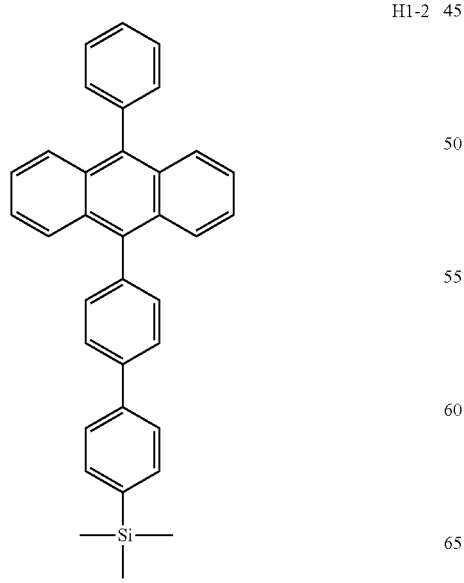

H1-2

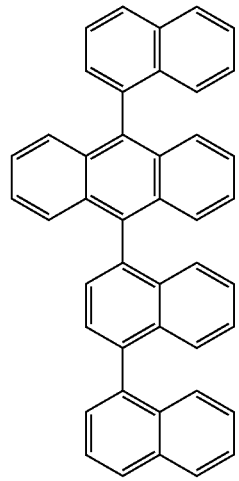

H1-4

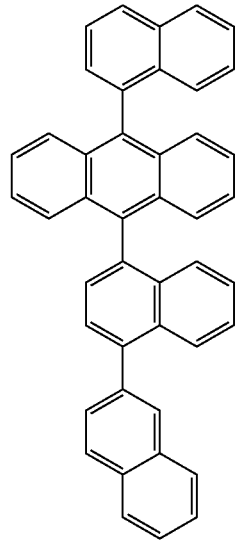

H1-5

H2-1
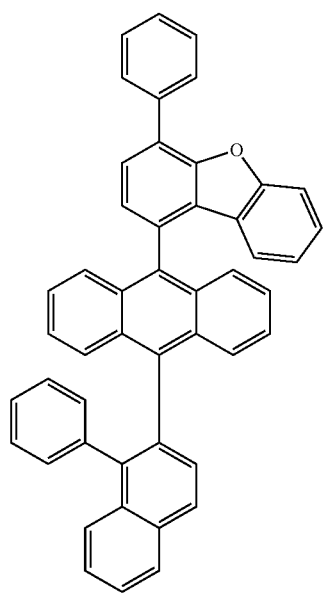
H2-2
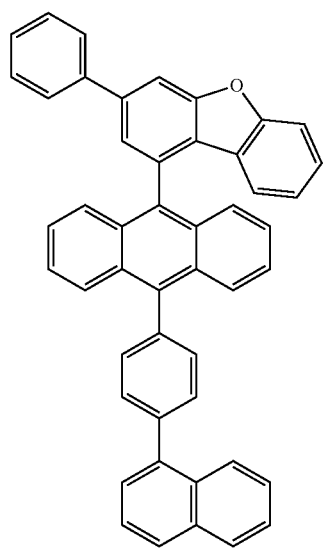
H2-3
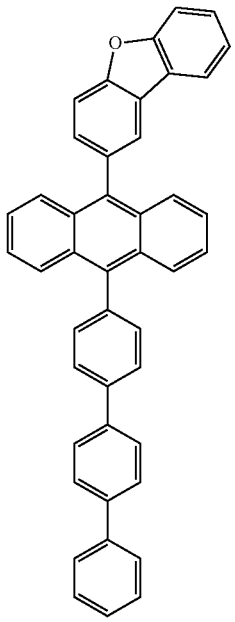
H2-4
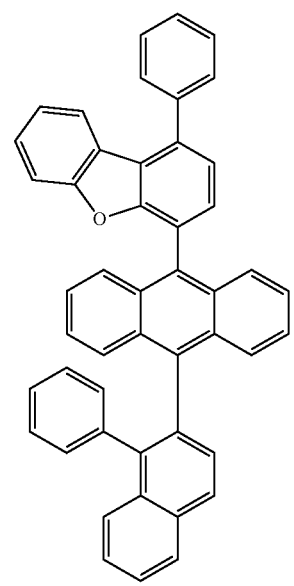

H2-5
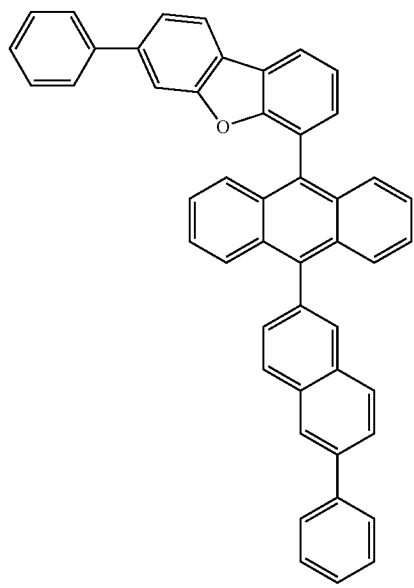
H2-6
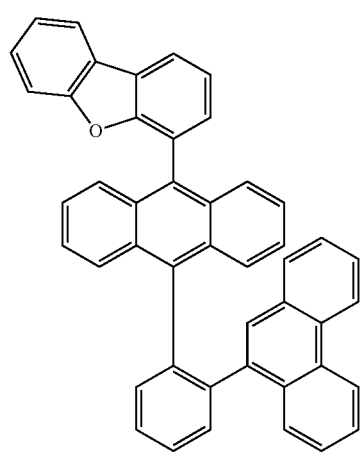
H2-7
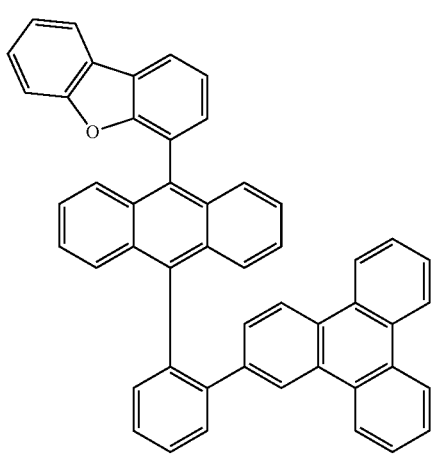
H2-8
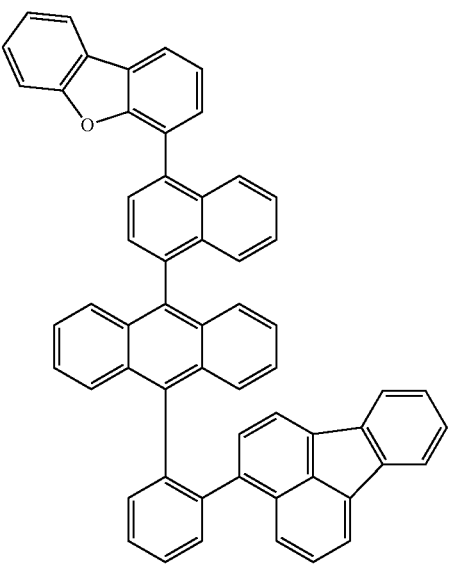
H2-9
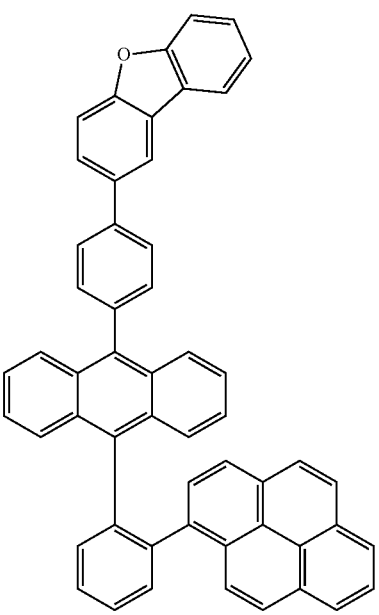

H2-10
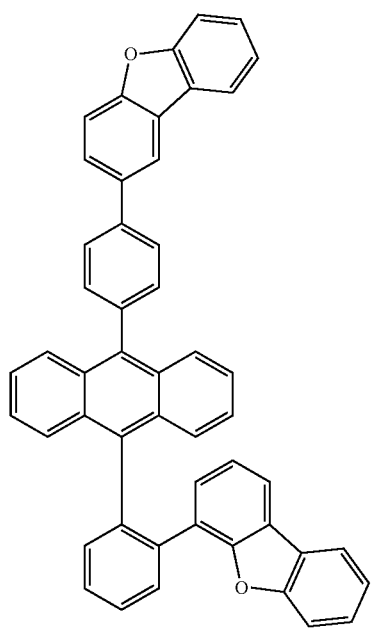
H2-11
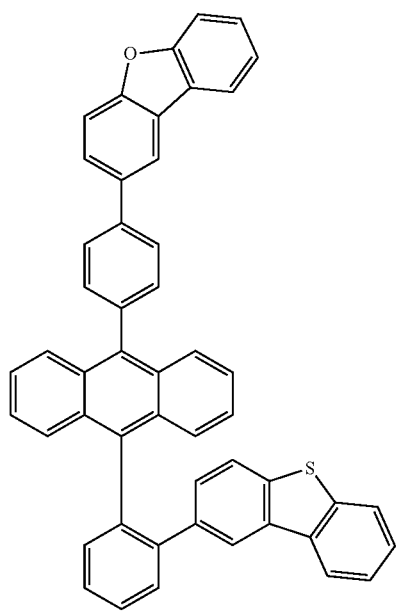
H2-12
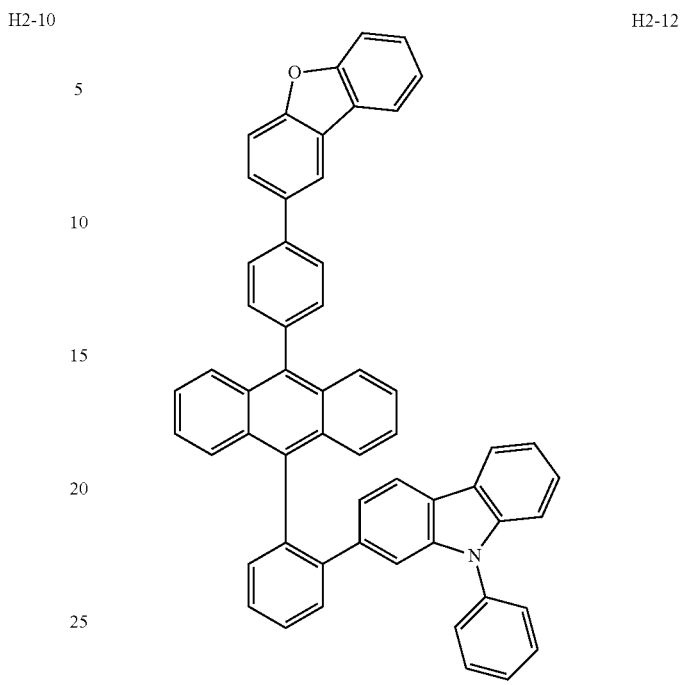
<Synthesis of Compound BD-2>
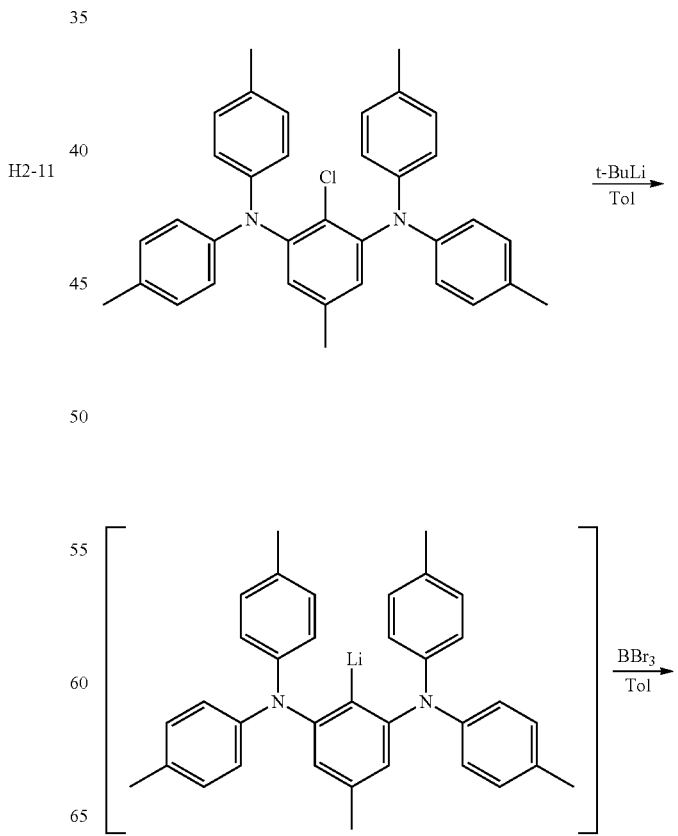

-continued

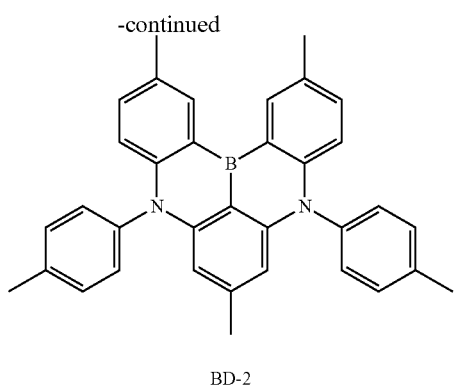

BD-2

Under the nitrogen atmosphere, 2-chloro-5-methyl-N1,N1,N3,N3-tetra-p-tolylbenzene-1,3-diamine (30 g, 58 mmol) was dissolved in anhydrous toluene (500 mL), and cooled to 0° C. t-Butyllithium (1.7 M pentane solution; 232.1 mmol) (137 mL) was slowly added dropwise thereto, and the result was stirred for 3 hours at 60° C. After cooling the result again to 0° C., boron tribromide (29.1 g, 116 mmol) was slowly added dropwise thereto, and the result was stirred for 10 hours at 70° C. After the reaction was finished, the reaction solution was cooled to room temperature, separated by adding a saturated ammonium chloride solution thereto, and the organic layer was dried with anhydrous magnesium sulfate. The obtained solution was vacuum concentrated, and recrystallized with toluene and hexane to obtain Compound BD-2 (5.7 g, 11.6 mmol).

<Syntheses of Compounds BD-4, BD-11 to BD-14, BD-17, BD-18, BD-24, BD-26 and BD-28 to BD-30>

Compounds BD-4, BD-11 to BD-14, BD-17, BD-18, BD-24, BD-26 and BD-28 to BD-were synthesized in the same manner as in the method for synthesizing Compound BD-2 except that compounds of the following Table 2 were used instead of 2-chloro-5-methyl-N1,N1,N3,N3-tetra-p-tolylbenzene-1,3-diamine.

TABLE 2

| Compound | Name |
|---|---|
| Compound BD-2 | 2-chloro-5-methyl-N1,N1,N3,N3-tetra-p-tolylbenzene-1,3-diamine |
| Compound BD-4 | N1,N1,N3,N3-tetrakis(4-(t-butyl)phenyl)-2-chloro-N5-phenyl-N5-(4-(trimethylsilyl)phenyl)benzene-1,3,5-triamine |
| Compound BD-11 | 32-chloro-15,35,55-trimethyl-2,4,6,6-tetraphenyl-2,4-diaza-6-sila-1,3,5(1,3)-tribenzenacyclohexapane |
| Compound BD-12 | N1,N1,N3,N3-tetrakis(4-(t-butyl)phenyl)-5-(9H-carbazol-9-yl)-2-chlorobenzene-1,3-diamine |
| Compound BD-13 | N2,N2,N4,N4-tetrakis(4-(t-butyl)phenyl)-3-chlorodibenzofuran-2,4-diamine |
| Compound BD-14 | N,N-bis(4-(t-butyl)phenyl)-4-chloro-3,5-bis(4a,9a-dimethyl-1,2,3,4,4a,9a-hexahydro-9H-carbazol-9-yl)aniline |
| Compound BD-17 | 4,6-bis(4-(t-butyl)phenoxy)-5-chloro-N1,N1,N3,N3-tetraphenylbenzene-1,3-diamine |
| Compound BD-18 | 9-(2'-chlorospiro[fluorene-9,6'-2,4-dioxa-1,3,5(1,3)-tribenzenacyclohexapan]-5'-yl)-9H-carbazole |
| Compound BD-24 | 9,9',9''-(2-chlorobenzene-1,3,5-triyl)tris(9H-carbazole) |
| Compound BD-26 | N1,N1,N3-tris(4-(t-butyl)phenyl)-2-chloro-5-methyl-N3-(5-(2-phenylpropan-2-yl)-[1,1'-biphenyl]-2-yl)benzene-1,3-diamine |
| Compound BD-28 | 15-(t-butyl)-12-chloro-2,4,6-triphenyl-2,4,6-triaza-1,3,5(1,3)-tribenzenacyclohexapane |
| Compound BD-29 | N1,N3,N3-tris(4-(t-butyl)phenyl)-2-chloro-N1-(naphthalen-1-yl)naphthalene-1,3-diamine |
| Compound BD-30 | 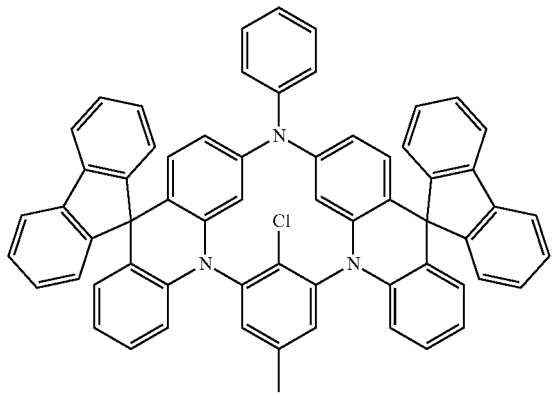 [SMILES: Cc1cc2c(Cl)c(c1)N1c3ccccc3C3(c4ccccc4-c4ccccc43)c3ccc(cc31)N(c1ccccc1)c1ccc3c(c1)N2c1ccccc1C31c2ccccc2-c2ccccc21] |

BD-2
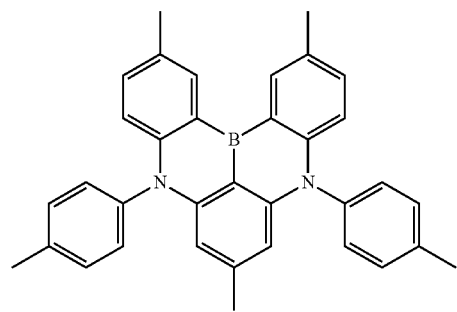
BD-4
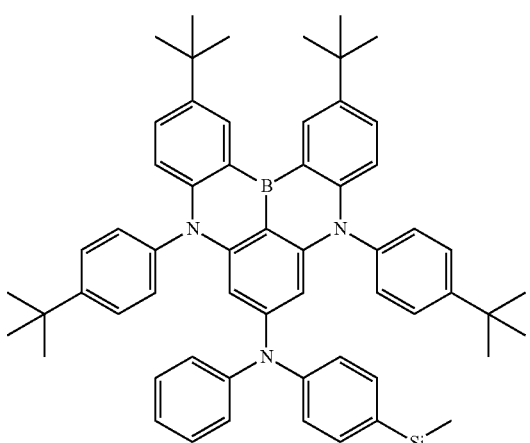
BD-11
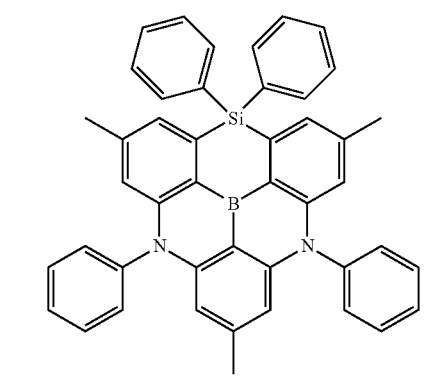
BD-12
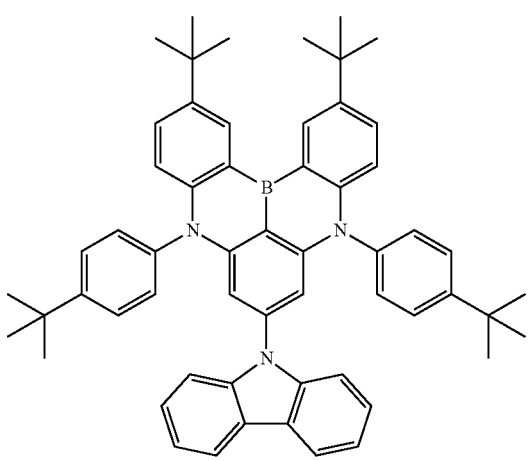
BD-13
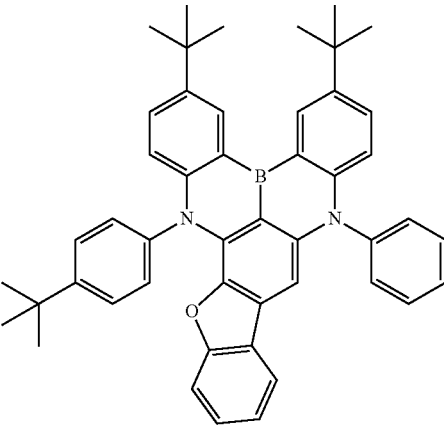
BD-14
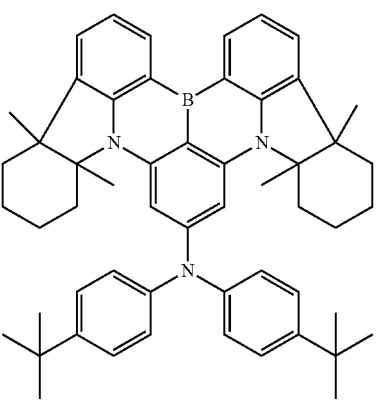
BD-17
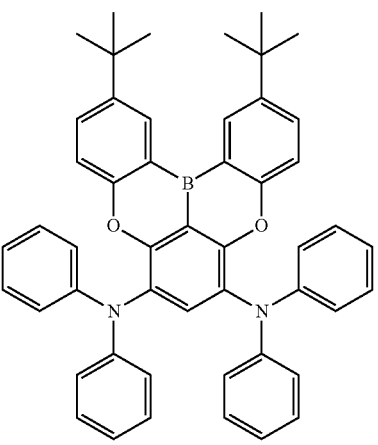

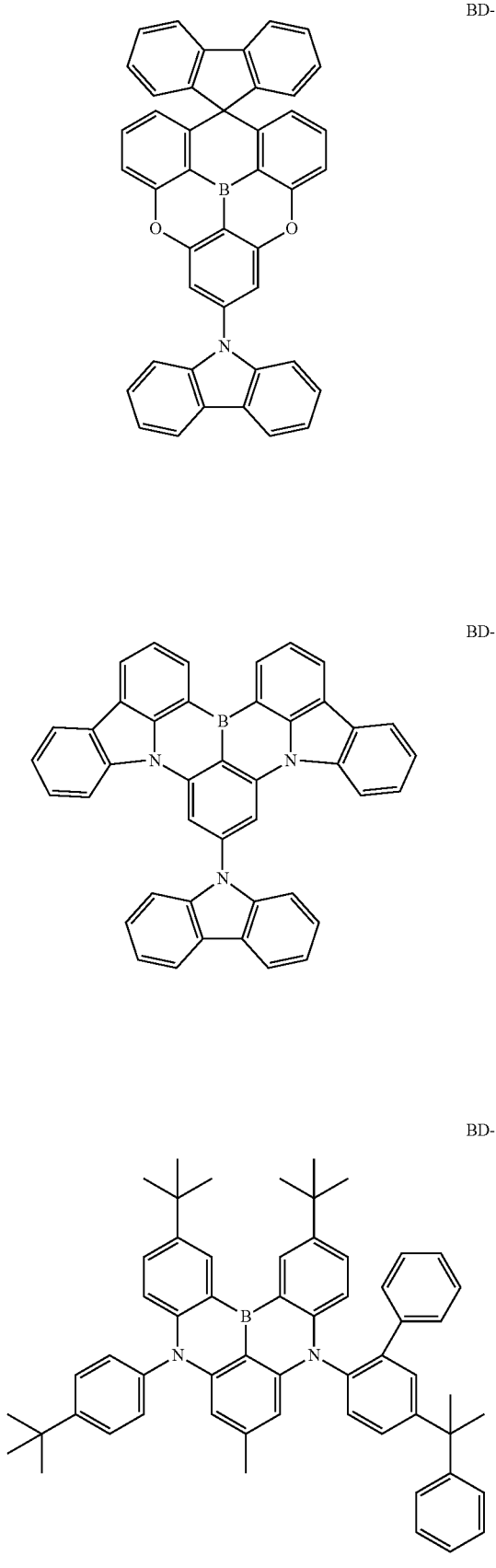
BD-18
BD-24
BD-26
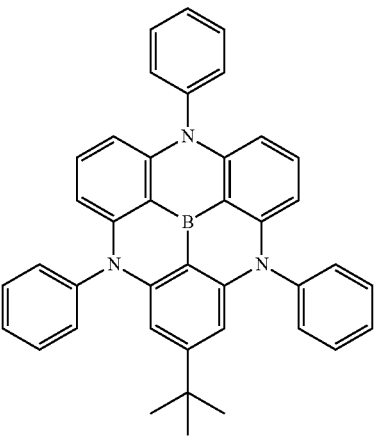
BD-28
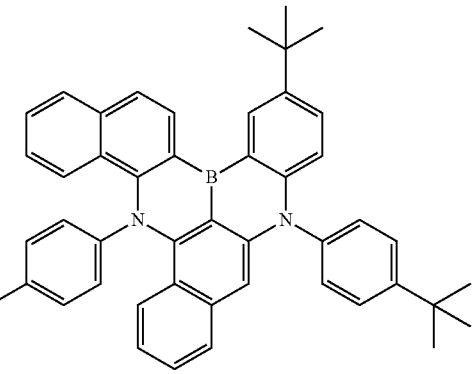
BD-29
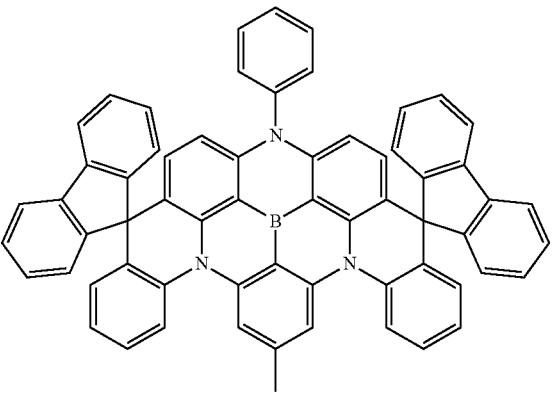
BD-30
Results of mass spectrum analyses for Compounds H1-1 to H1-5, H2-1 to H2-12, BD-2, BD-4, BD-11 to BD-14, BD-17, BD-18, BD-24, BD-26 and BD-28 to BD-30 are as shown in the following Table 3.
TABLE 3
| Compound | Molecular Weight | m/z [M + H]+ |
|---|---|---|
| H1-1 | 462.23 | 463.15 |
| H1-2 | 478.21 | 479.11 |
| H1-3 | 456.19 | 457.01 |
| H1-4 | 556.22 | 556.99 |
| H1-5 | 556.22 | 557.29 |
| H2-1 | 622.23 | 623.35 |
| H2-2 | 622.23 | 623.05 |

TABLE 3-continued

| Compound | Molecular Weight | m/z [M + H]+ |
|---|---|---|
| H2-3 | 572.21 | 573.10 |
| H2-4 | 622.23 | 623.01 |
| H2-5 | 622.23 | 623.22 |
| H2-6 | 596.21 | 597.01 |
| H2-7 | 646.23 | 647.11 |
| H2-8 | 746.26 | 747.41 |
| H2-9 | 696.25 | 697.27 |
| H2-10 | 662.22 | 663.17 |
| H2-11 | 678.20 | 679.30 |
| H2-12 | 737.27 | 738.51 |
| BD-2 | 490.26 | 491.11 |
| BD-4 | 883.54 | 884.70 |
| BD-11 | 642.27 | 643.49 |
| BD-12 | 809.49 | 810.46 |
| BD-13 | 734.44 | 735.40 |
| BD-14 | 763.50 | 764.68 |
| BD-17 | 716.36 | 717.15 |
| BD-18 | 597.19 | 598.09 |
| BD-24 | 581.21 | 582.12 |
| BD-26 | 796.49 | 797.65 |
| BD-28 | 565.27 | 566.38 |
| BD-29 | 688.40 | 689.43 |
| BD-30 | 847.32 | 848.33 |

Example 1

A glass substrate on which indium tin oxide (ITO) was coated as a thin film to a thickness of 150 nm was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a hole injection layer was formed by thermal vacuum depositing hexanitrile hexaazatriphenylene (HAT-CN) to a thickness of 50 nm.

A hole transfer layer was formed on the hole injection layer by vacuum depositing 4,4'-bis N-(1-naphthyl)-N-phenylaminobiphenyl (NPB) (40 nm), a material transferring holes.

Subsequently, a light emitting layer was formed on the hole transfer layer by vacuum depositing Compound H1-1, Compound H2-1 and Compound BD-2 in a weight ratio 50:50:4 to a thickness of 30 nm.

On the light emitting layer, an electron injection and transfer layer was formed by vacuum depositing the following aluminum tris(8-hydroxyquinoline) (Alq$_3$) to a thickness of 20 nm.

A cathode was formed on the electron injection and transfer layer by consecutively depositing lithium fluoride (LiF) and aluminum to a thickness of 1.2 nm and 200 nm, respectively.

In the above-mentioned process, the deposition rates of the organic materials were maintained at 0.04 nm/sec to 0.07 nm/sec, the deposition rates of the lithium fluoride and the aluminum were maintained at 0.03 nm/sec and 0.2 nm/sec, respectively, and the degree of vacuum during the deposition was maintained at $2\times10^{-7}$ torr to $5\times10^{-6}$ torr.

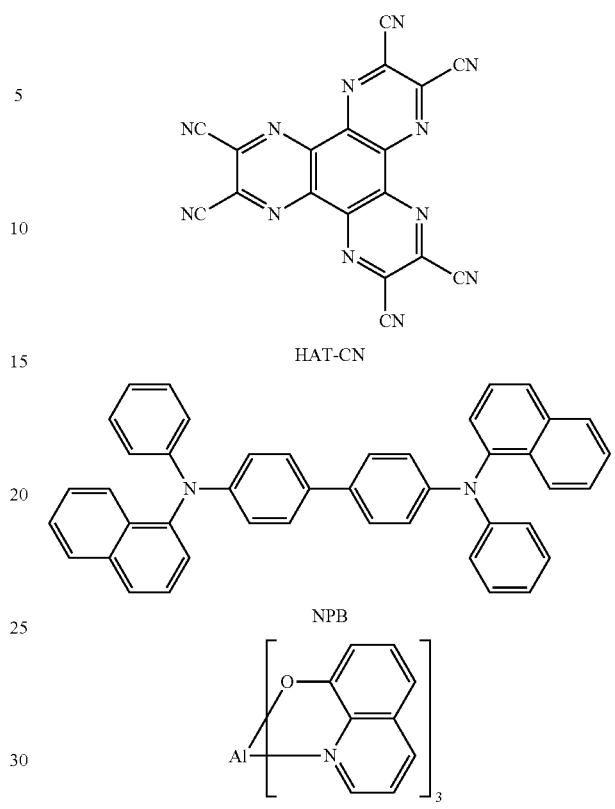

Examples 2 to 28 and Comparative Examples 1 to 3

Devices of Examples 2 to 28 and Comparative Examples 1 to 3 were manufactured in the same manner as in Example 1 except that compounds of the following Table 4 were used instead of Compound H1-1, Compound H2-1 and Compound BD-2.

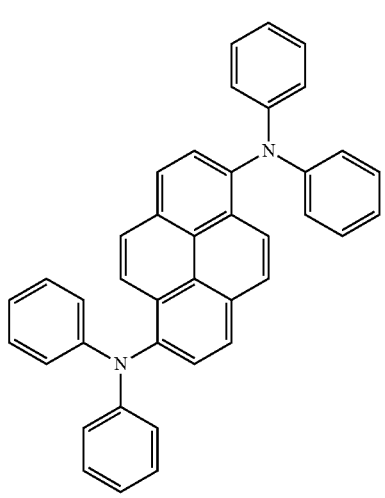

W2

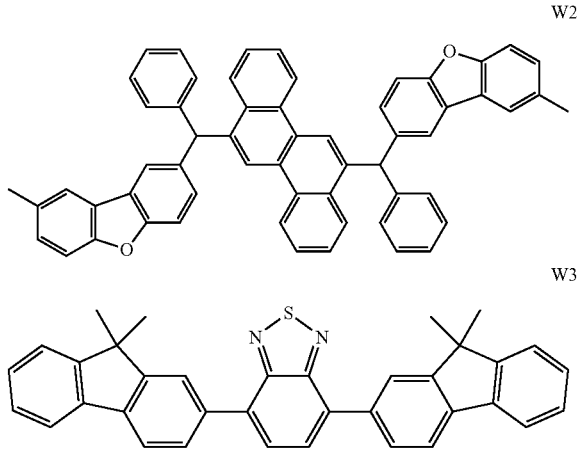

W3

Comparative Example 4

A device of Comparative Example 4 was manufactured in the same manner as in Example 1 except that Compound H1-1 and Compound BD-2 were used in a weight ratio of 100:4 instead of using Compound H1-1, Compound H2-1 and Compound BD-2 in a weight ratio of 50:50:4.

Comparative Example 5

A device of Comparative Example 5 was manufactured in the same manner as in Example 1 except that Compound H2-1 and Compound BD-2 were used in a weight ratio of 100:4 instead of using Compound H1-1, Compound H2-1 and Compound BD-2 in a weight ratio of 50:50:4.

Comparative Example 6

A device of Comparative Example 6 was manufactured in the same manner as in Example 1 except that Compound BD-2 was not used.

TABLE 4

|  | First Host (Light Emitting Layer) | Second Host (Light Emitting Layer) | Dopant (Light Emitting Layer) |
|---|---|---|---|
| Example 1 | H1-1 | H2-1 | BD-2 |
| Example 2 | H1-1 | H2-1 | BD-4 |
| Example 3 | H1-1 | H2-1 | BD-11 |
| Example 4 | H1-1 | H2-1 | BD-12 |
| Example 5 | H1-1 | H2-1 | BD-13 |
| Example 6 | H1-1 | H2-1 | BD-14 |
| Example 7 | H1-1 | H2-1 | BD-17 |
| Example 8 | H1-1 | H2-1 | BD-18 |
| Example 9 | H1-1 | H2-1 | BD-24 |
| Example 10 | H1-1 | H2-1 | BD-26 |
| Example 11 | H1-1 | H2-1 | BD-28 |
| Example 12 | H1-1 | H2-1 | BD-29 |
| Example 13 | H1-1 | H2-1 | BD-30 |
| Example 14 | H1-2 | H2-1 | BD-2 |
| Example 15 | H1-3 | H2-1 | BD-2 |
| Example 16 | H1-4 | H2-1 | BD-2 |
| Example 17 | H1-5 | H2-1 | BD-2 |
| Example 18 | H1-1 | H2-2 | BD-2 |
| Example 19 | H1-1 | H2-3 | BD-2 |
| Example 20 | H1-1 | H2-4 | BD-2 |
| Example 21 | H1-1 | H2-5 | BD-2 |
| Example 22 | H1-1 | H2-6 | BD-2 |

TABLE 4-continued

|  | First Host (Light Emitting Layer) | Second Host (Light Emitting Layer) | Dopant (Light Emitting Layer) |
|---|---|---|---|
| Example 23 | H1-1 | H2-7 | BD-2 |
| Example 24 | H1-1 | H2-8 | BD-2 |
| Example 25 | H1-1 | H2-9 | BD-2 |
| Example 26 | H1-1 | H2-10 | BD-2 |
| Example 27 | H1-1 | H2-11 | BD-2 |
| Example 28 | H1-1 | H2-12 | BD-2 |
| Comparative Example 1 | H1-1 | H2-1 | W1 |
| Comparative Example 2 | H1-1 | H2-1 | W2 |
| Comparative Example 3 | H1-1 | H2-1 | W3 |
| Comparative Example 4 | H1-1 | — | BD-2 |
| Comparative Example 5 | — | H2-1 | BD-2 |
| Comparative Example 6 | H1-1 | H2-1 | — |

For the organic light emitting devices of the examples and the comparative examples, driving voltage, light emission efficiency, color coordinate (CIE_y) and lifetime (T97) were measured at current density of 20 mA/cm$^2$, and the results are shown in Table 5. In the following Table 5, the lifetime (T97) is a value measuring time for luminance becoming 9700 with respect to initial luminance at current density of 20 mA/cm$^2$.

TABLE 5

| Device Example | Driving Voltage (V) | Light Emission Efficiency (Cd/A) | Color Coordinate CIE_y | T97 (h) |
|---|---|---|---|---|
| Example 1 | 5.26 | 6.77 | 0.046 | 130 |
| Example 2 | 5.36 | 6.78 | 0.044 | 125 |
| Example 3 | 5.30 | 6.94 | 0.044 | 118 |
| Example 4 | 5.20 | 6.54 | 0.049 | 132 |
| Example 5 | 5.30 | 6.57 | 0.048 | 142 |
| Example 6 | 5.30 | 6.78 | 0.043 | 112 |
| Example 7 | 5.26 | 6.62 | 0.051 | 123 |
| Example 8 | 5.22 | 6.57 | 0.053 | 139 |
| Example 9 | 5.20 | 6.75 | 0.052 | 131 |
| Example 10 | 5.25 | 6.70 | 0.046 | 120 |
| Example 11 | 5.35 | 6.71 | 0.045 | 146 |
| Example 12 | 5.20 | 6.85 | 0.048 | 136 |
| Example 13 | 5.30 | 6.71 | 0.052 | 136 |
| Example 14 | 5.25 | 6.62 | 0.046 | 131 |
| Example 15 | 5.32 | 6.71 | 0.047 | 150 |
| Example 16 | 5.14 | 6.71 | 0.047 | 138 |
| Example 17 | 5.10 | 6.79 | 0.047 | 121 |
| Example 18 | 5.22 | 6.78 | 0.045 | 117 |
| Example 19 | 5.12 | 6.60 | 0.046 | 110 |
| Example 20 | 5.15 | 6.82 | 0.046 | 147 |
| Example 21 | 5.17 | 6.72 | 0.045 | 125 |
| Example 22 | 5.16 | 6.72 | 0.045 | 118 |
| Example 23 | 5.34 | 6.76 | 0.048 | 129 |
| Example 24 | 5.26 | 6.66 | 0.048 | 120 |
| Example 25 | 5.25 | 6.78 | 0.047 | 154 |
| Example 26 | 5.44 | 6.81 | 0.046 | 140 |
| Example 27 | 5.08 | 6.60 | 0.046 | 151 |
| Example 28 | 5.42 | 6.51 | 0.047 | 127 |
| Comparative Example 1 | 5.27 | 4.89 | 0.058 | 98 |
| Comparative Example 2 | 5.31 | 5.02 | 0.062 | 81 |
| Comparative Example 3 | 5.19 | 4.18 | 0.053 | 62 |
| Comparative Example 4 | 5.52 | 6.23 | 0.046 | 69 |
| Comparative Example 5 | 5.18 | 6.35 | 0.046 | 52 |
| Comparative Example 6 | 5.01 | 0.86 | 0.021 | 2 |

As shown in Table 5, the devices of Examples 1 to 28 co-depositing the compound of Chemical Formula 1 and the compound of Chemical Formula 2 as a light emitting layer host, and using the compound of Chemical Formula 3 as a dopant had properties of low driving voltage and, particularly, high efficiency and long lifetime compared to the devices of Comparative Examples 1 to 6.

The invention claimed is:
1. An organic light emitting device comprising:
a first electrode;
a second electrode; and
a light emitting layer provided between the first electrode and the second electrode,
wherein the light emitting layer includes a compound of Chemical Formula 1, a compound of Chemical Formula 2, and a compound of Chemical Formulae 3-5 or 3-6:

Chemical Formula 1

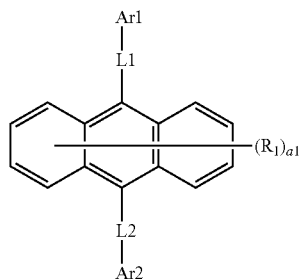

Chemical Formula 2

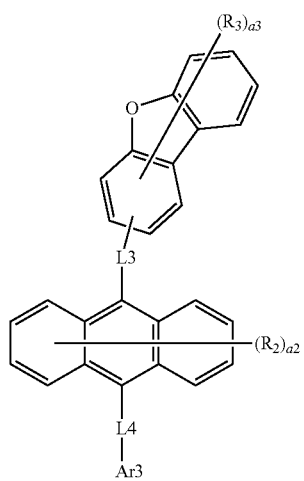

wherein in Chemical Formulae 1 and 2:
L1 to L4 are the same as or different from each other, and each independently a direct bond or a substituted or unsubstituted arylene group;
Ar1 and Ar2 are the same as or different from each other, and each independently a substituted or unsubstituted aryl group;
Ar3 is a substituted or unsubstituted aryl group or a substituted or unsubstituted heteroaryl group;
$R_1$ to $R_3$ are the same as or different from each other, and each independently hydrogen, deuterium, a halogen group, a cyano group, a silyl group, an alkyl group, a cycloalkyl group, an alkenyl group, an alkynyl group, an alkoxy group, an aryloxy group, an amino group, an aryl group, or a heteroaryl group; and
a1 and a2 are each independently an integer of 0 to 8, a3 is an integer of 0 to 7, and when a1 is 2 or greater, the R1s are the same as or different from each other, when a2 is 2 or greater, the R2s are the same as or different from each other, and when a3 is 2 or greater, the R3s are the same as or different from each other:

Chemical Formula 3-5

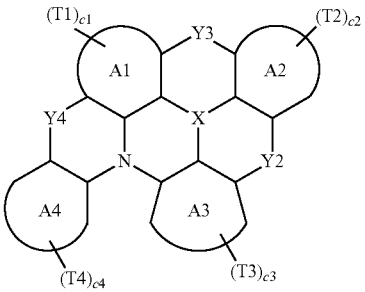

Chemical Formula 3-6

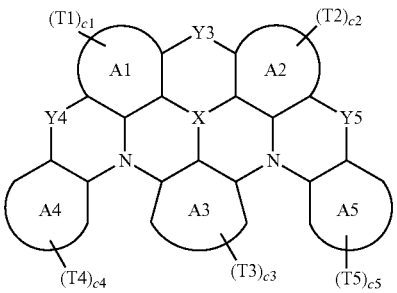

wherein in Chemical Formulae 3-5 and 3-6:
X is B, P=O or P=S;
A1 to A3 are the same as or different from each other, and each independently a monocyclic or polycyclic ring;
A4 and A5 are the same as or different from each other, and each independently a monocyclic or polycyclic ring;
Y2 is O or $NR_{12}$;
Y3 is $CR_{21}R_{22}$ or $SiR_{27}R_{28}$, Y4 is a direct bond, O, $CR_{23}R_{24}$ or $NR_{14}$, and Y5 is a direct bond, O, $CR_{25}R_{26}$ or $NR_{15}$;
$R_{12}$, $R_{14}$, and $R_{15}$ are the same as or different from each other, and each independently hydrogen, deuterium, an alkyl group, a cycloalkyl group, or an aryl group that is unsubstituted or substituted with an alkyl group, an arylalkyl group or an aryl group;
$R_{21}$ and $R_{22}$ are the same as or different from each other, and each independently hydrogen, deuterium, an alkyl group, a cycloalkyl group or an aryl group, or bond to each other to form a ring;
$R_{23}$ and $R_{24}$ are the same as or different from each other, and each independently hydrogen, deuterium, an alkyl group, a cycloalkyl group or an aryl group, or bond to each other to form a ring;
$R_{25}$ and $R_{26}$ are the same as or different from each other, and each independently hydrogen, deuterium, an alkyl group, a cycloalkyl group or an aryl group, or bond to each other to form a ring;
$R_{27}$ and $R_{28}$ are the same as or different from each other, and each independently hydrogen, deuterium, an alkyl group, a cycloalkyl group or an aryl group;
T1 to T5 are the same as or different from each other, and each independently hydrogen, deuterium, a hydroxyl group, an alkyl group, a cycloalkyl group, an alkoxy group, an aryloxy group, an aryl group, a heteroaryl group, or —$NR_{41}R_{42}$, and $R_{41}$ and $R_{42}$ are the same as or different from each other and each independently hydrogen, an alkyl group, a heteroaryl group, or an aryl group that unsubstituted or substituted with an alkyl group or a silyl group; and c1 to c5 are each independently an integer of 0 or greater, and when c1 is 2 or greater, the T1s are the same as or different from each other, when c2 is 2 or greater, the T2s are the same as or different from each other, when c3 is 2 or greater, the T3s are the same as or different from each other, when c4 is 2 or greater, the T4s are the same as or different from each other, and when c5 is 2 or greater, the T5s are the same as or different from each other.

2. The organic light emitting device of claim 1, wherein L1 to L4 are the same as or different from each other, and each independently a direct bond; a phenylene group; a biphenylene group; or a naphthalene group.

3. The organic light emitting device of claim 1, wherein Ar1 and Ar2 are the same as or different from each other, and each independently a phenyl group; a biphenyl group; a terphenyl group; or a naphthyl group.

4. The organic light emitting device of claim 1, wherein Ar3 is a substituted or unsubstituted phenyl group; a substituted or unsubstituted biphenyl group; a substituted or unsubstituted terphenyl group; a substituted or unsubstituted naphthyl group; a substituted or unsubstituted phenanthrenyl group; a substituted or unsubstituted triphenylenyl group; a substituted or unsubstituted fluoranthenyl group; a substituted or unsubstituted pyrenyl group; a substituted or unsubstituted dibenzofuranyl group; a substituted or unsubstituted dibenzothiophenyl group; or a substituted or unsubstituted carbazolyl group.

5. The organic light emitting device of claim 1, wherein A1 to A3 are the same as or different from each other, and each independently benzene, naphthalene, triphenylene, 9,9'-spirobifluorene, dibenzofuran, dibenzothiophene, dibenzoselenophene, carbazole, indolocarbazole, naphthobenzofuran,

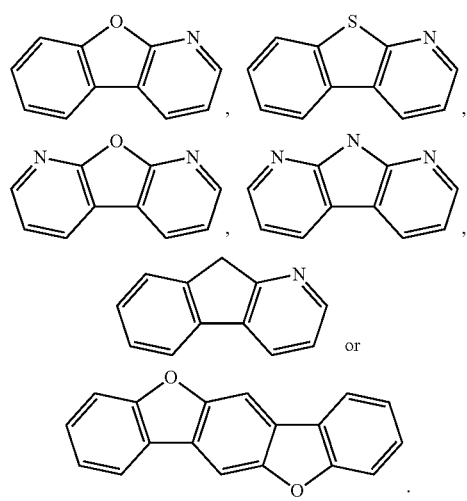

or

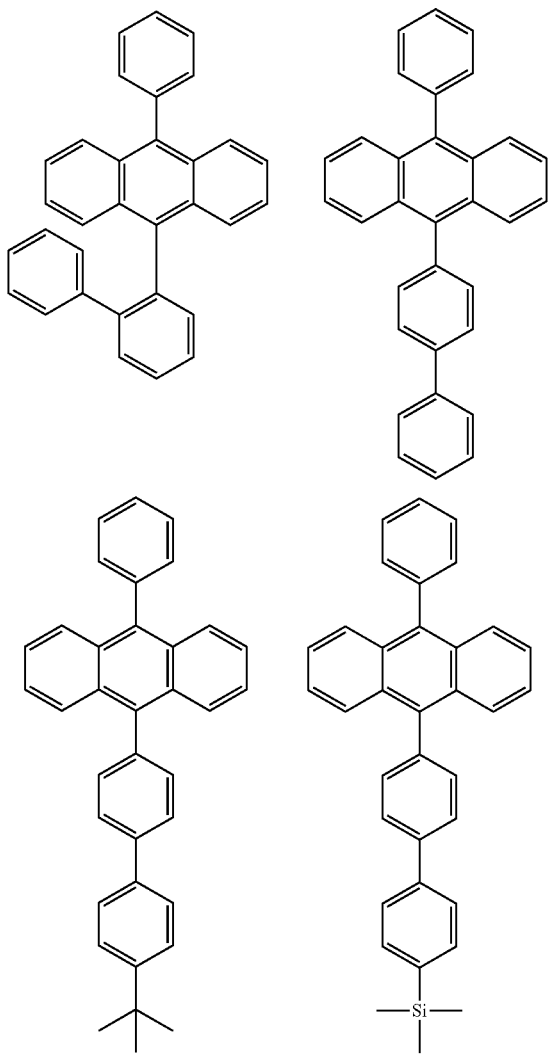

6. The organic light emitting device of claim 1, wherein the compound of Chemical Formula 1 is one selected from among the following compounds:

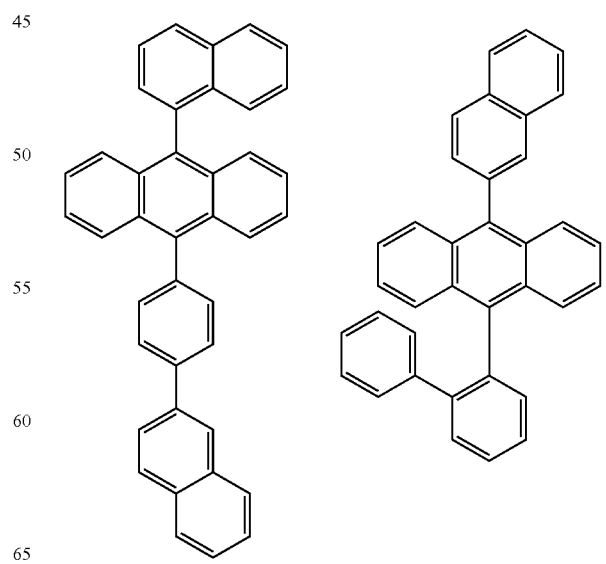

131
-continued
132
-continued
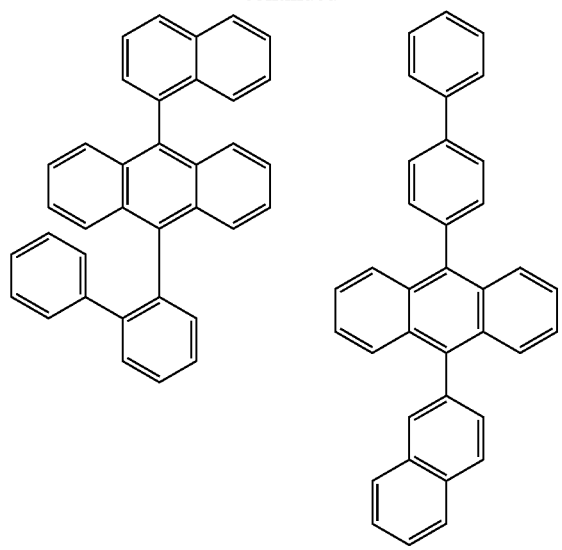
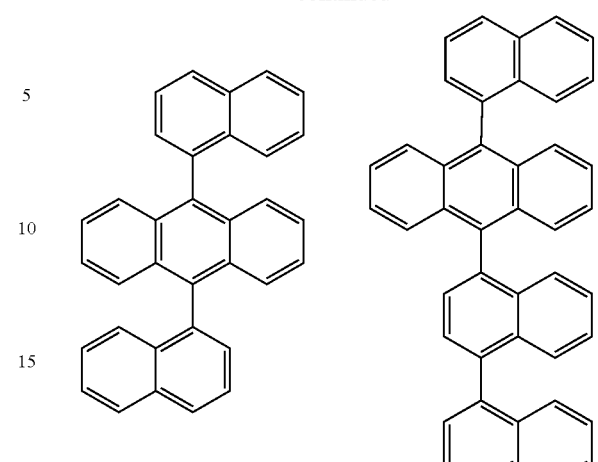
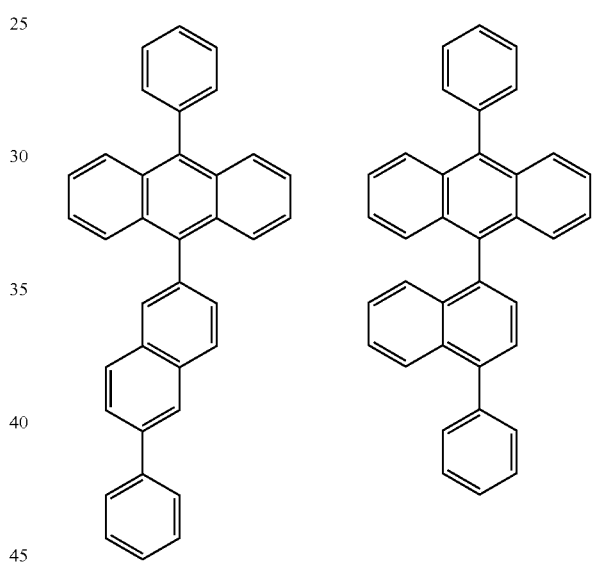
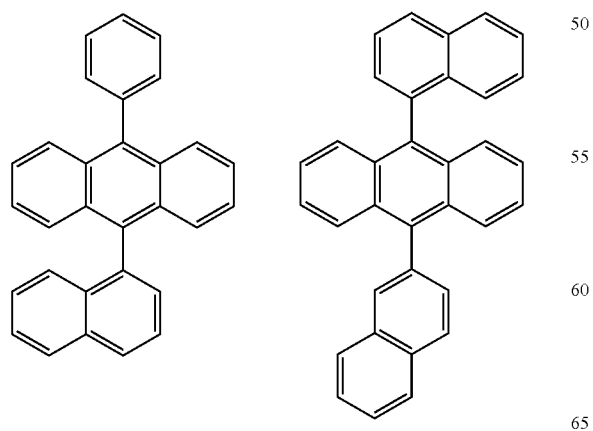

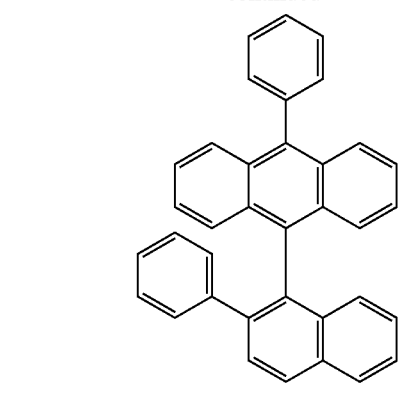 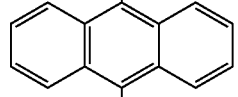 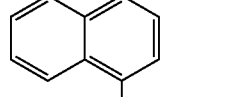 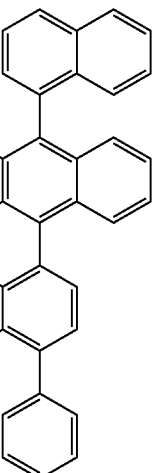 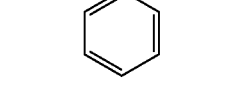 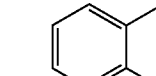 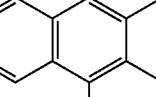 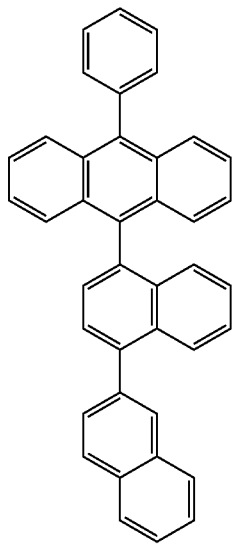 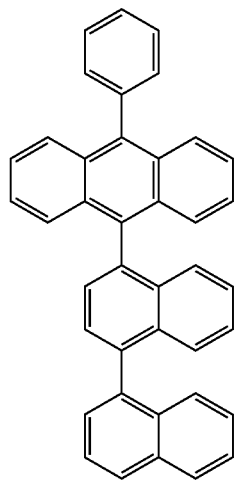 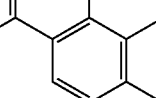   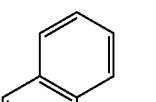 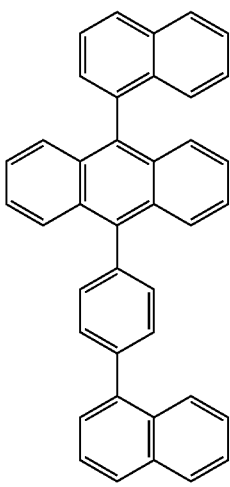 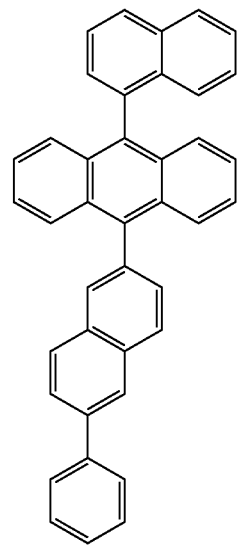 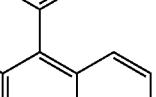 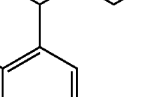 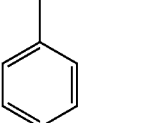

135
-continued
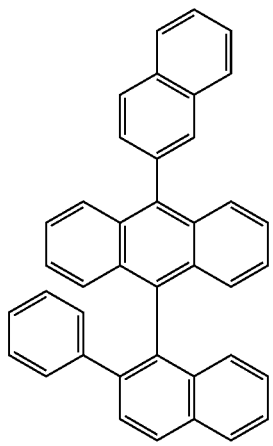
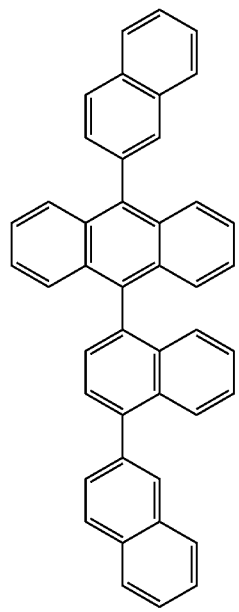
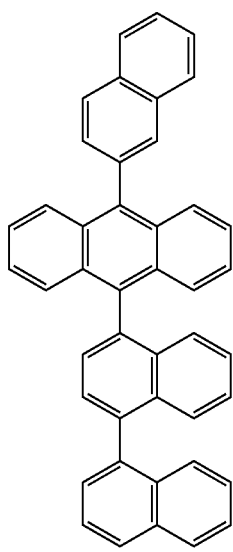
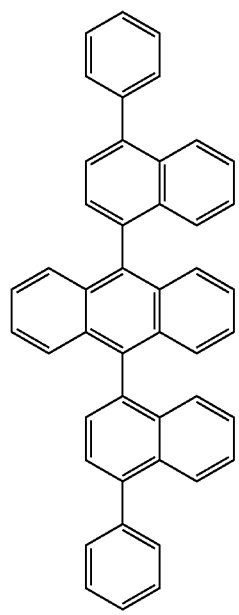
136
-continued
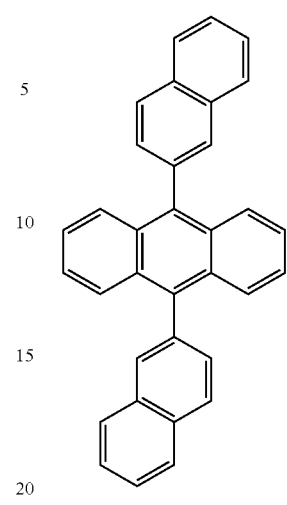
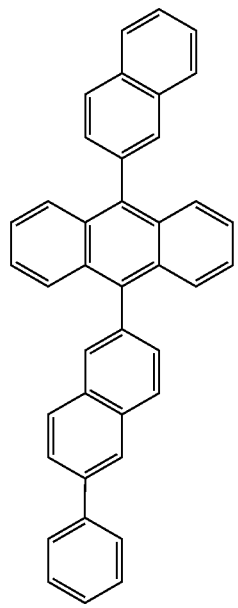
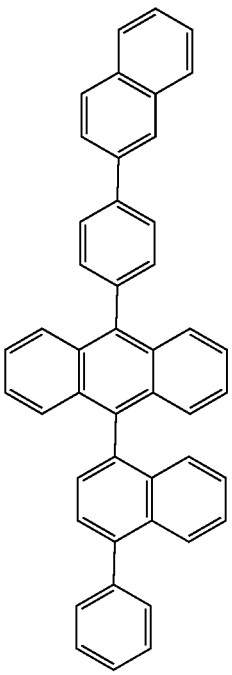

-continued
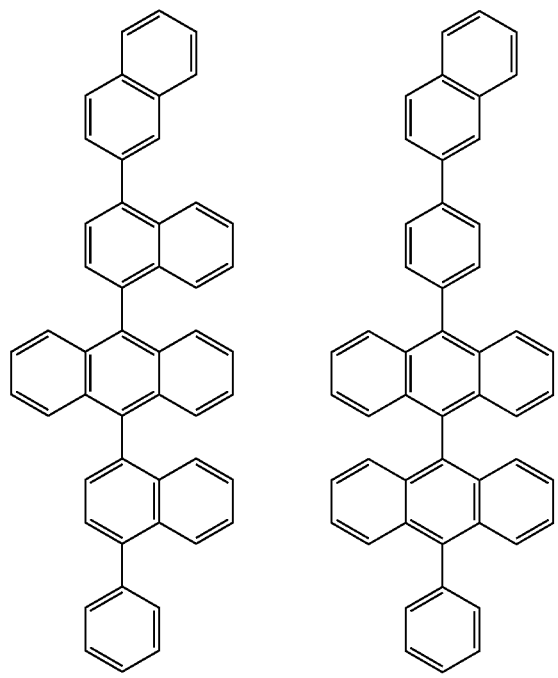
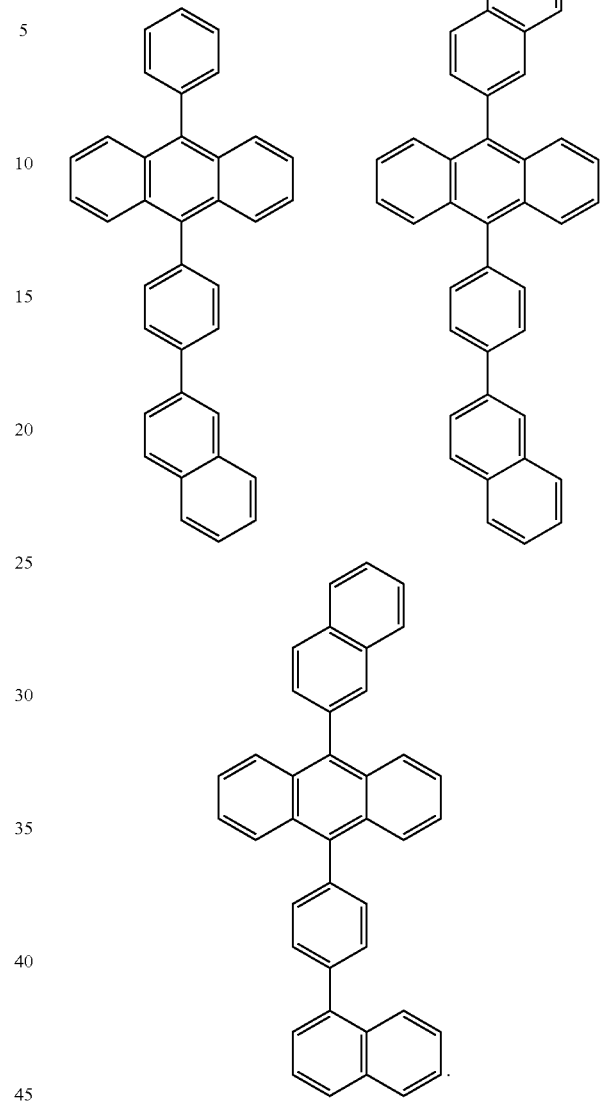
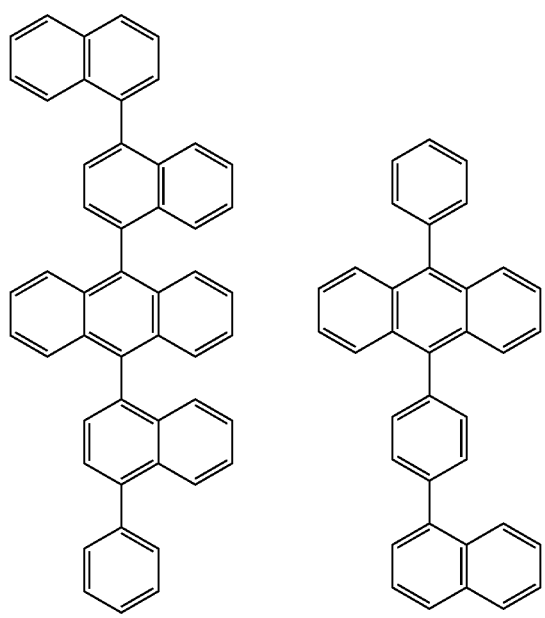
7. The organic light emitting device of claim 1, wherein the compound of Chemical Formula 2 is one selected from among the following compounds:
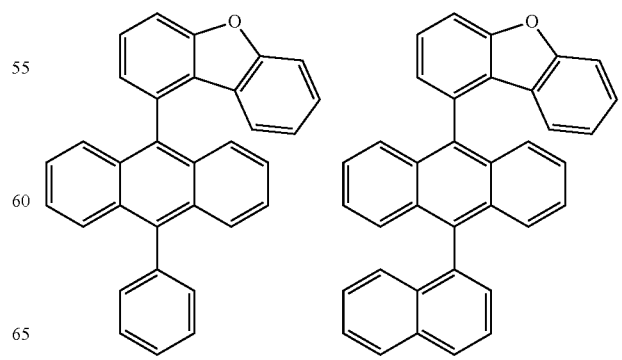

139
-continued
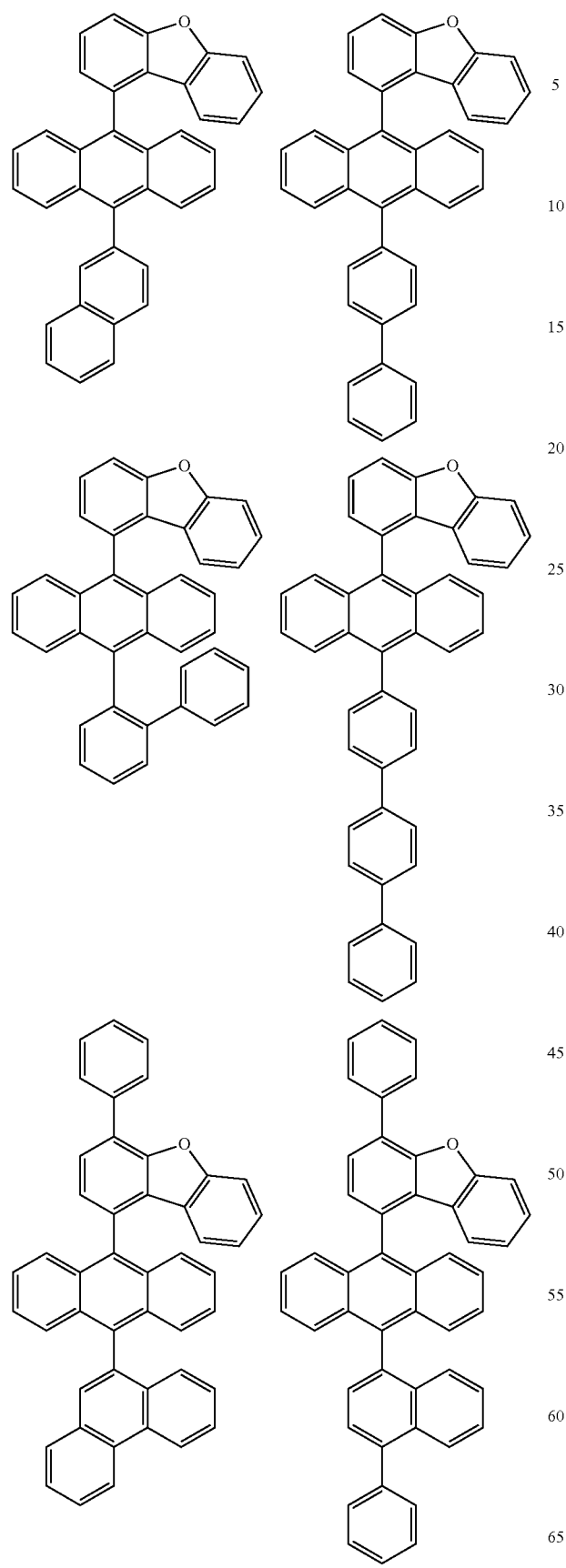
140
-continued
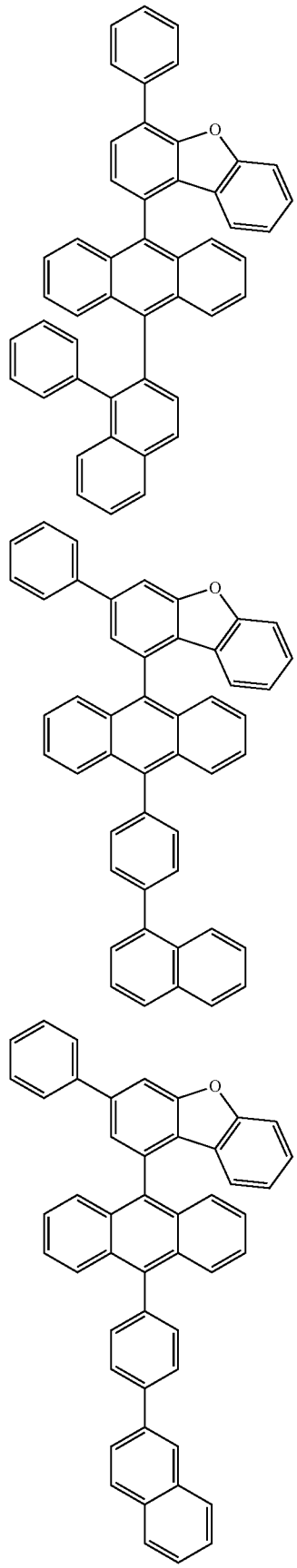

141
-continued
142
-continued
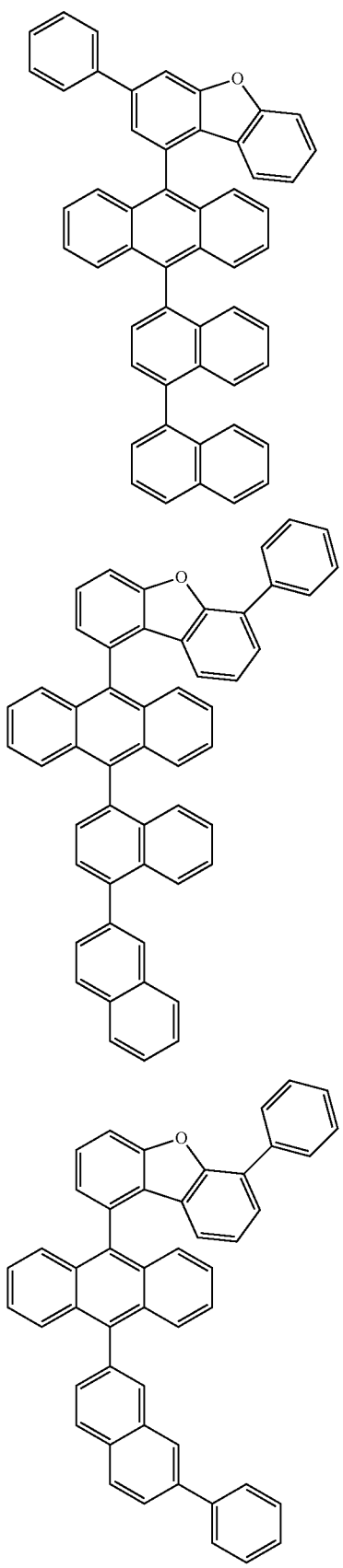
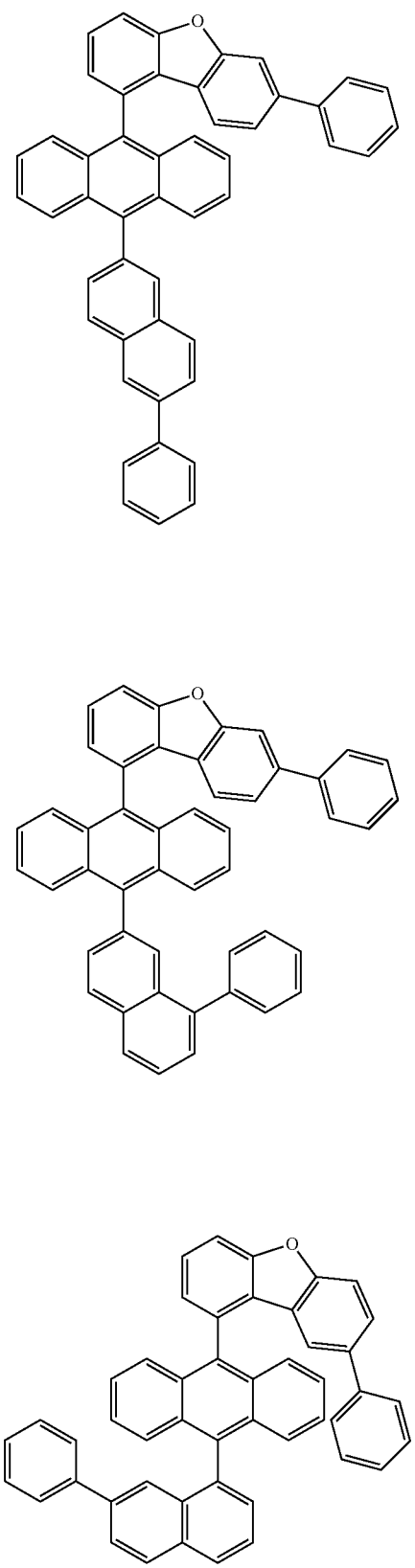

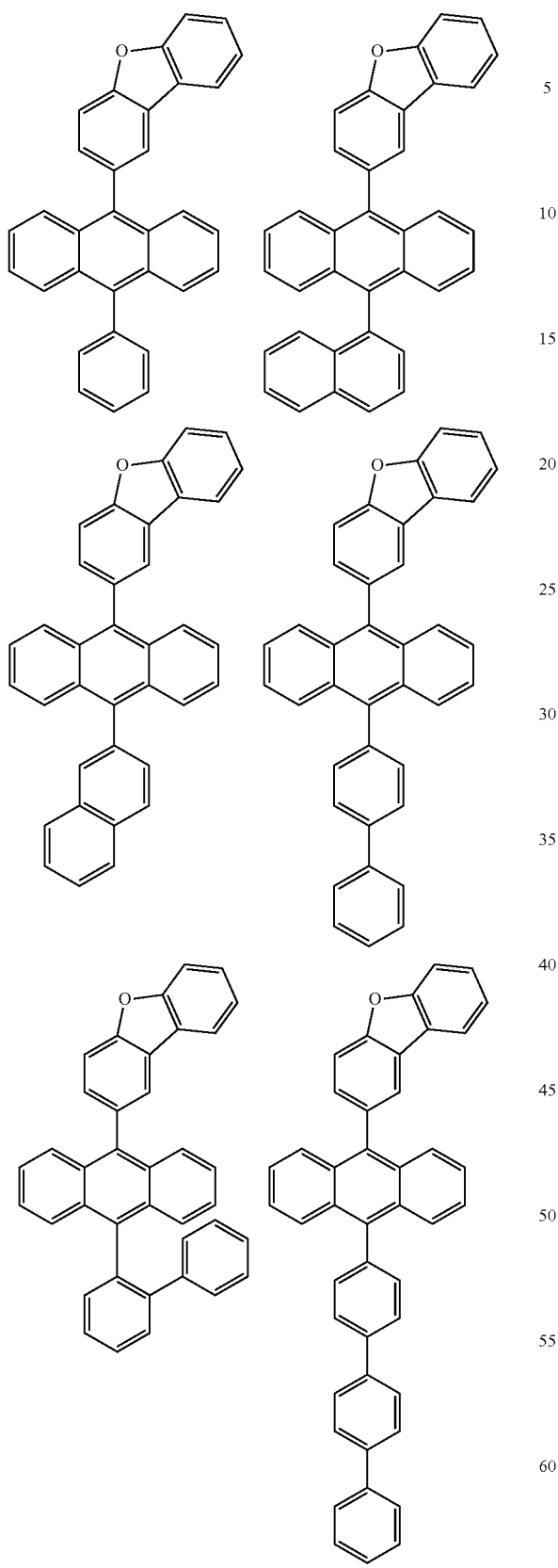
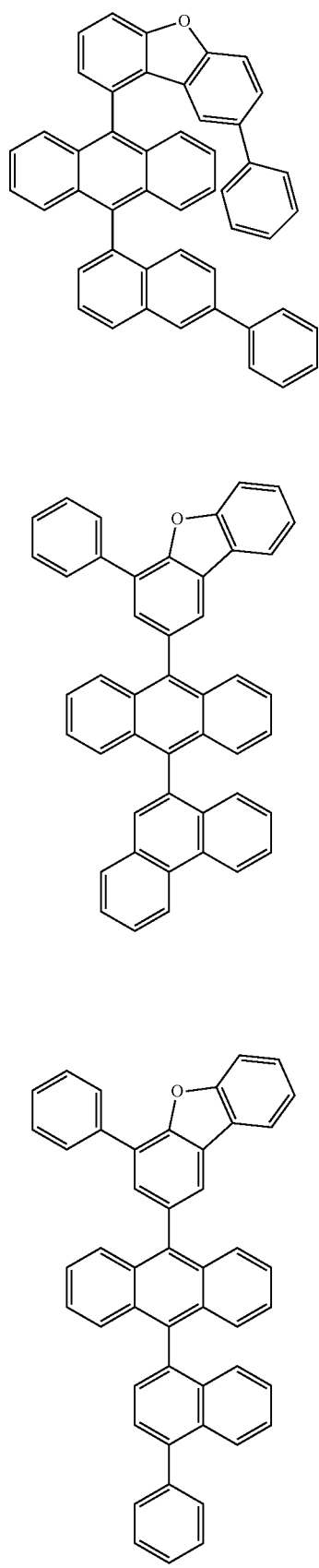

145
-continued
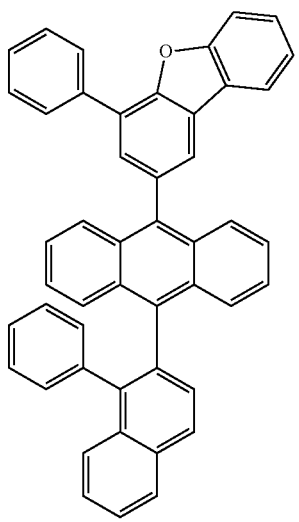
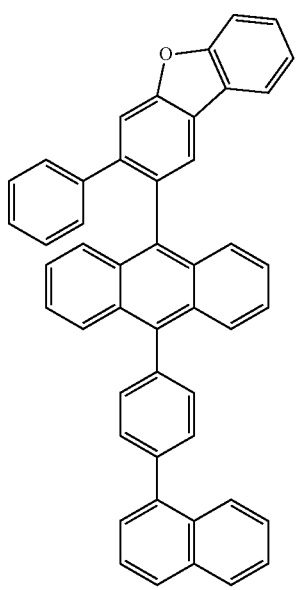
146
-continued
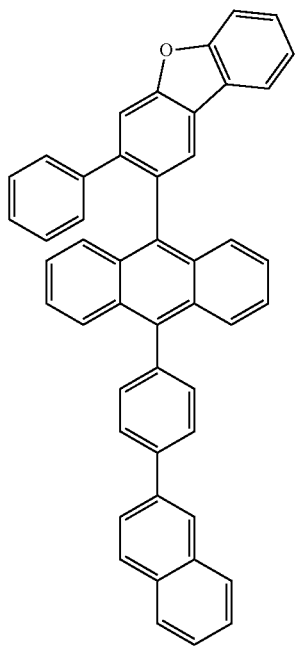
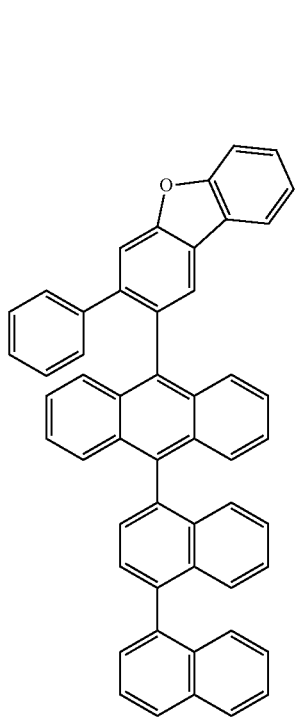

147
-continued
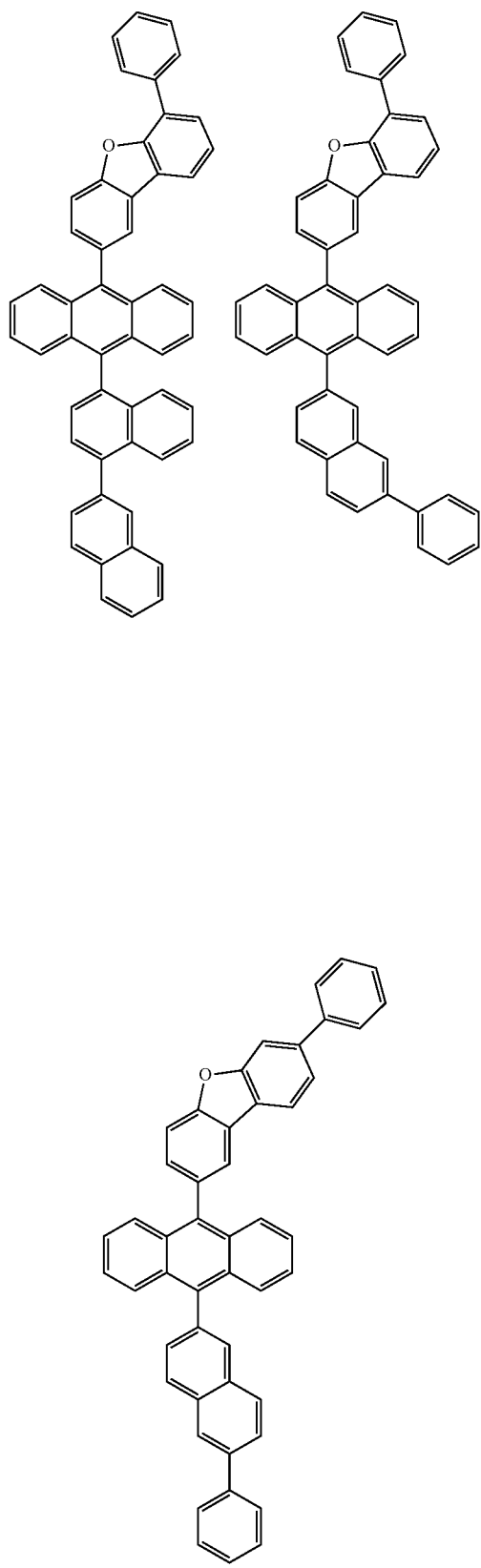
148
-continued
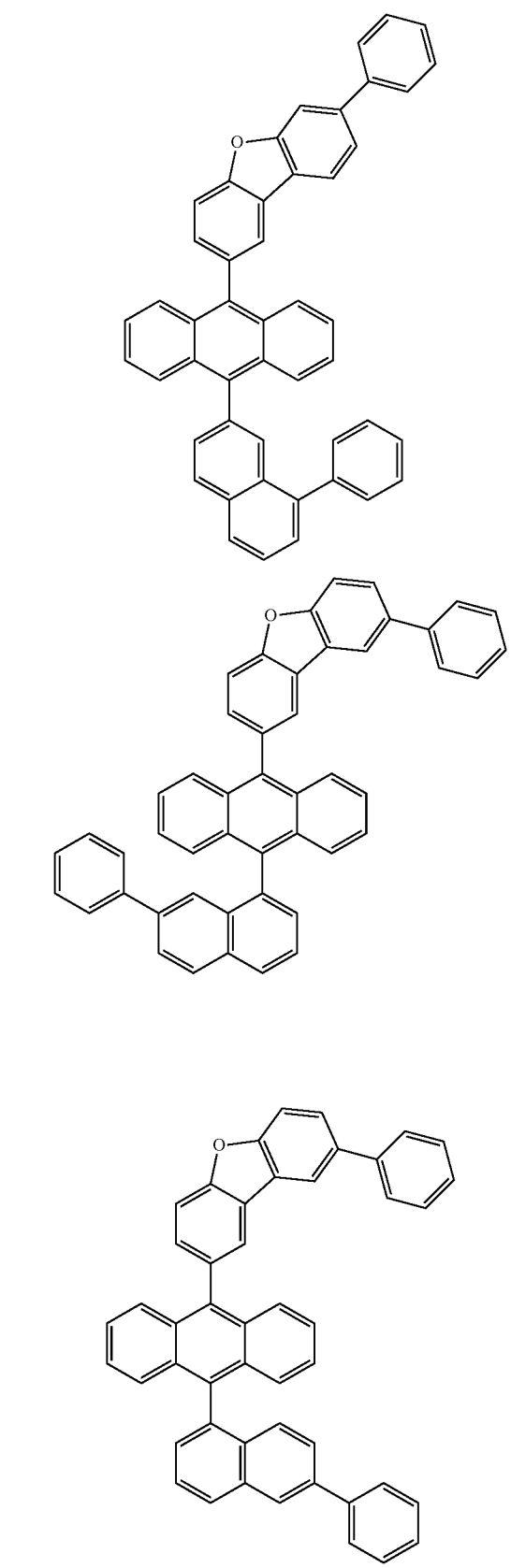

149
-continued
150
-continued
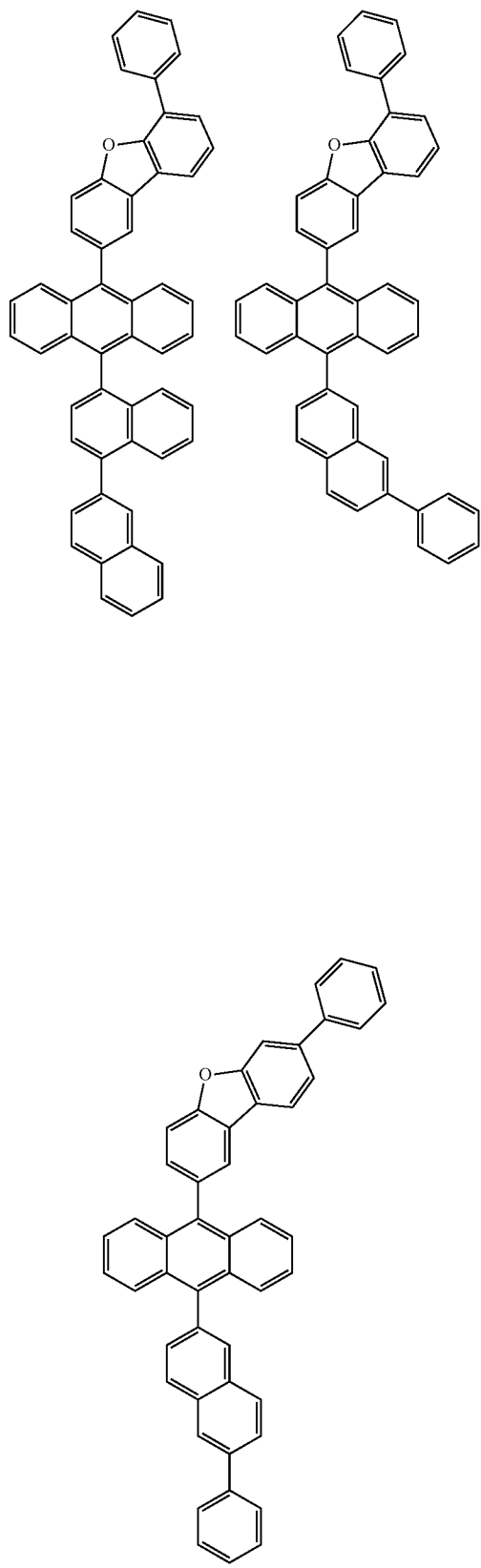
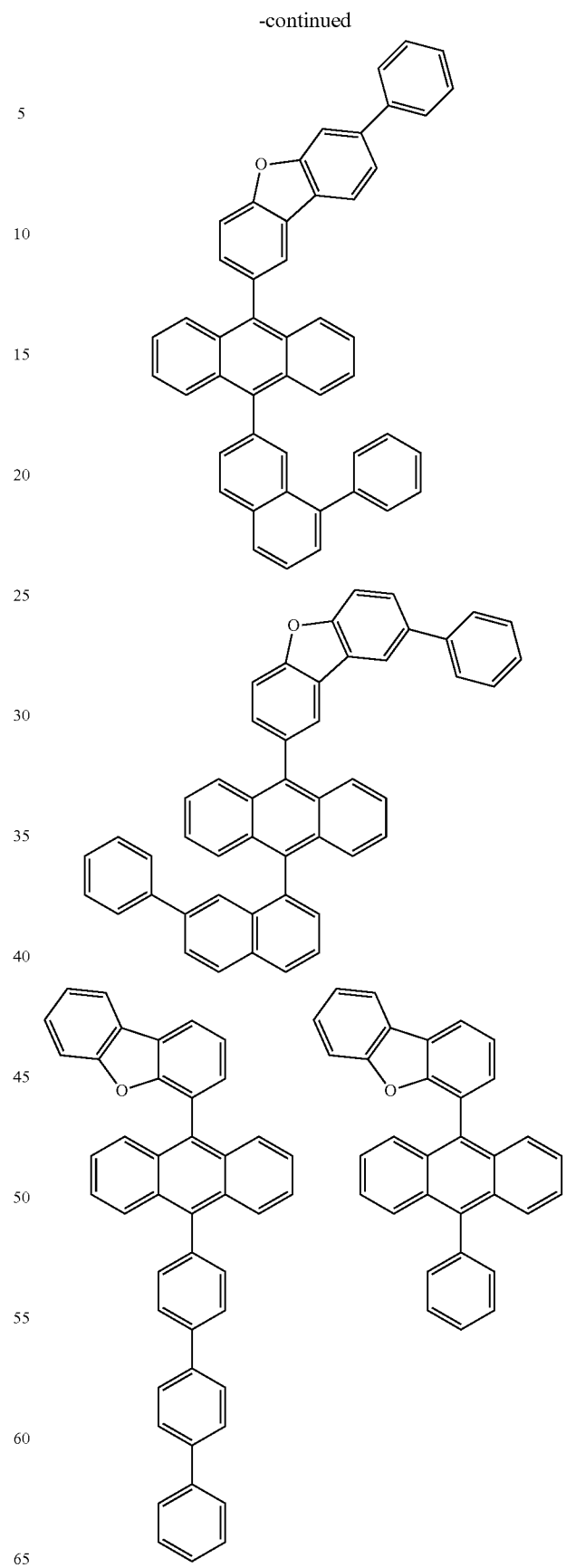

-continued
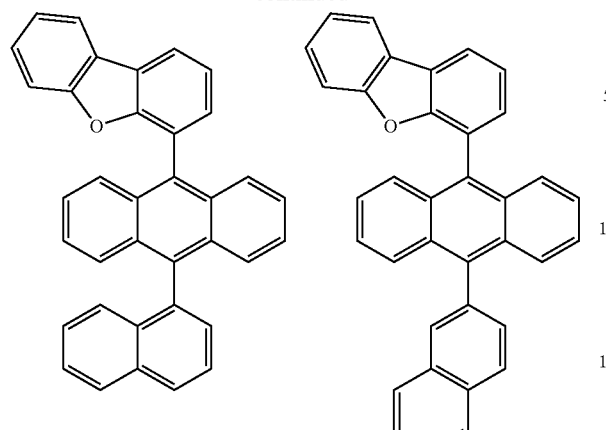
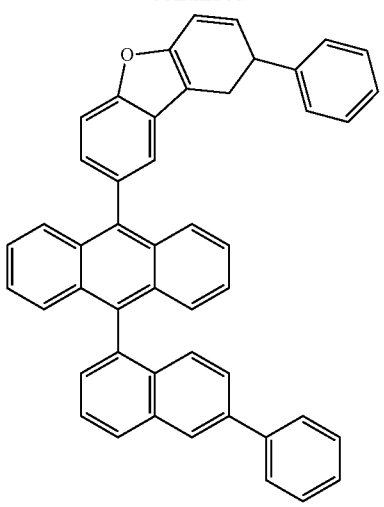

153
-continued
154
-continued
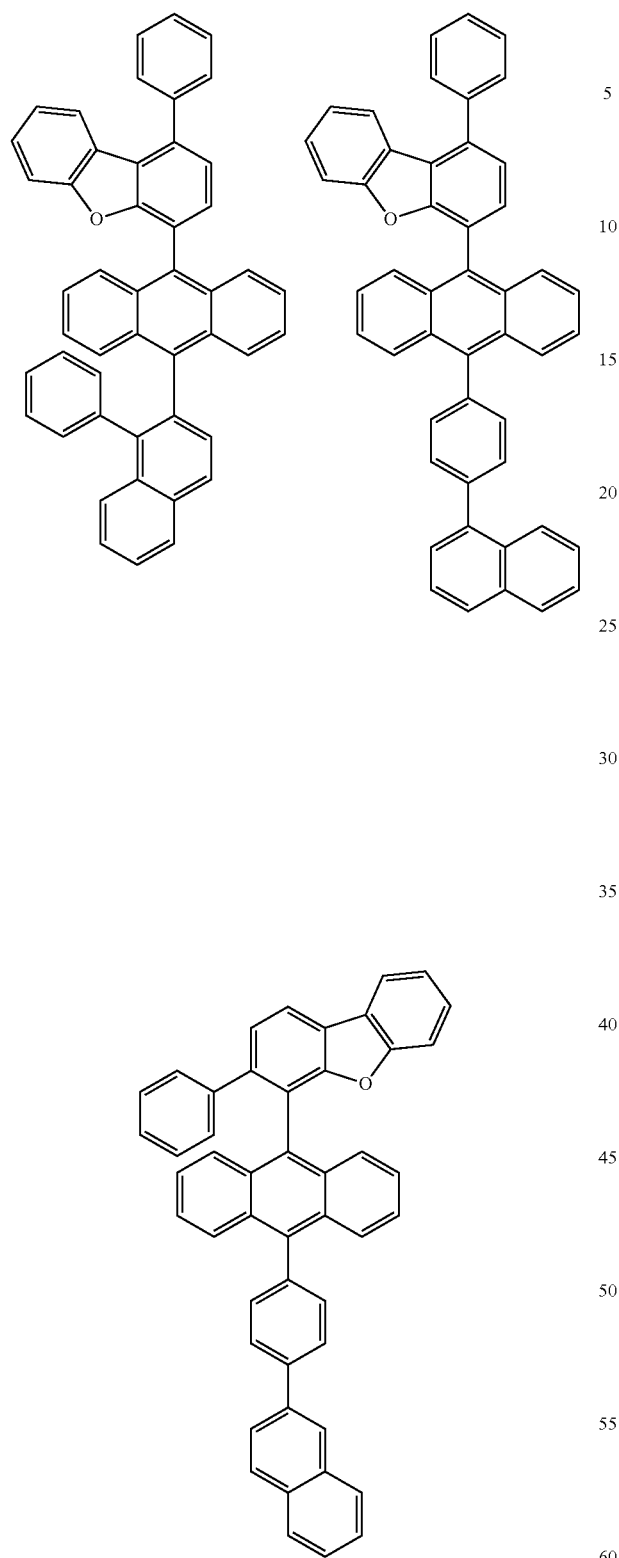
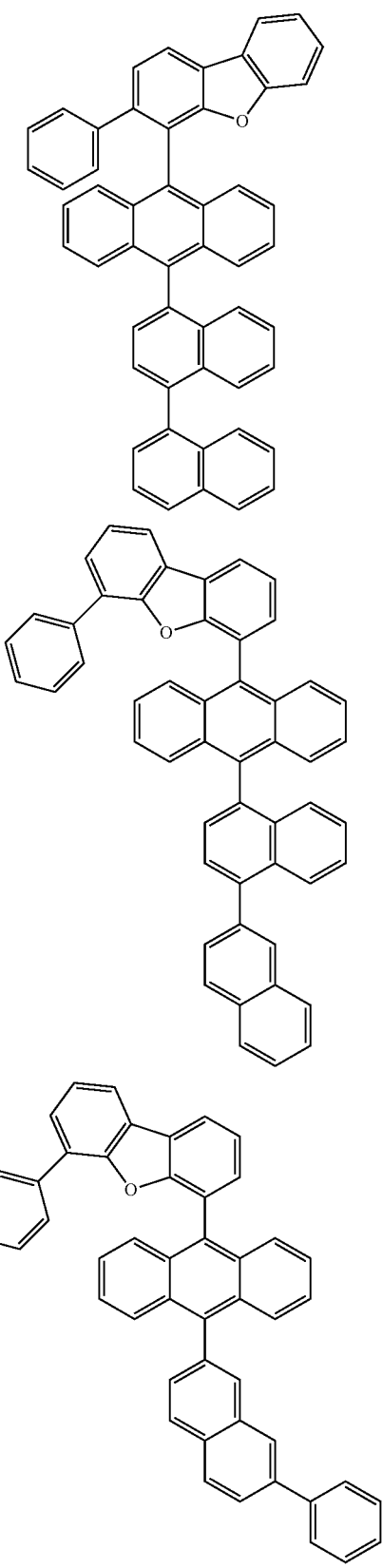

155
-continued
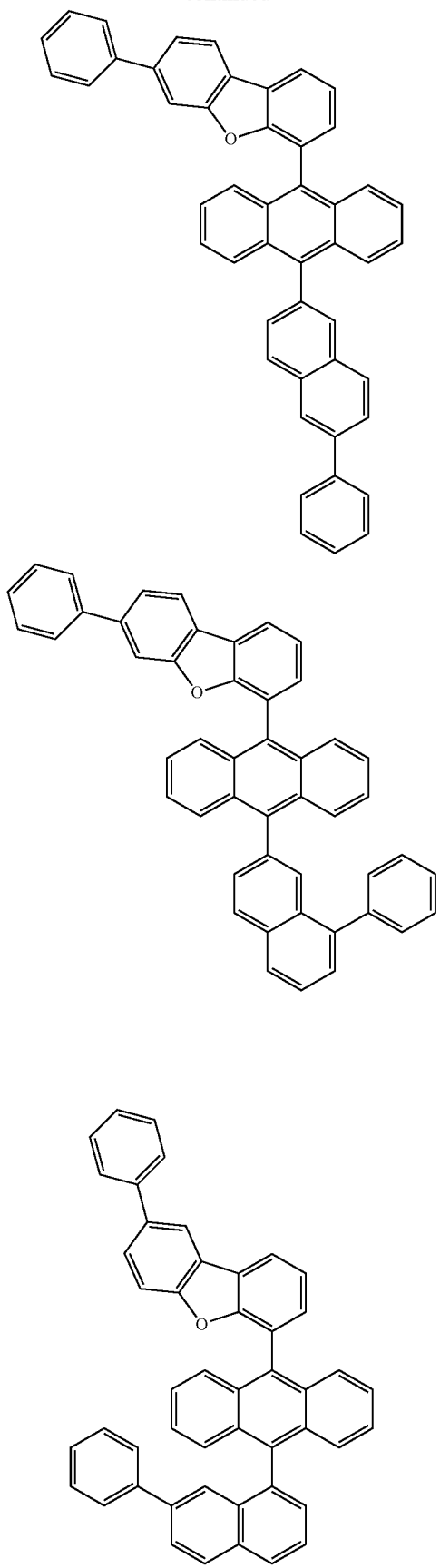
156
-continued
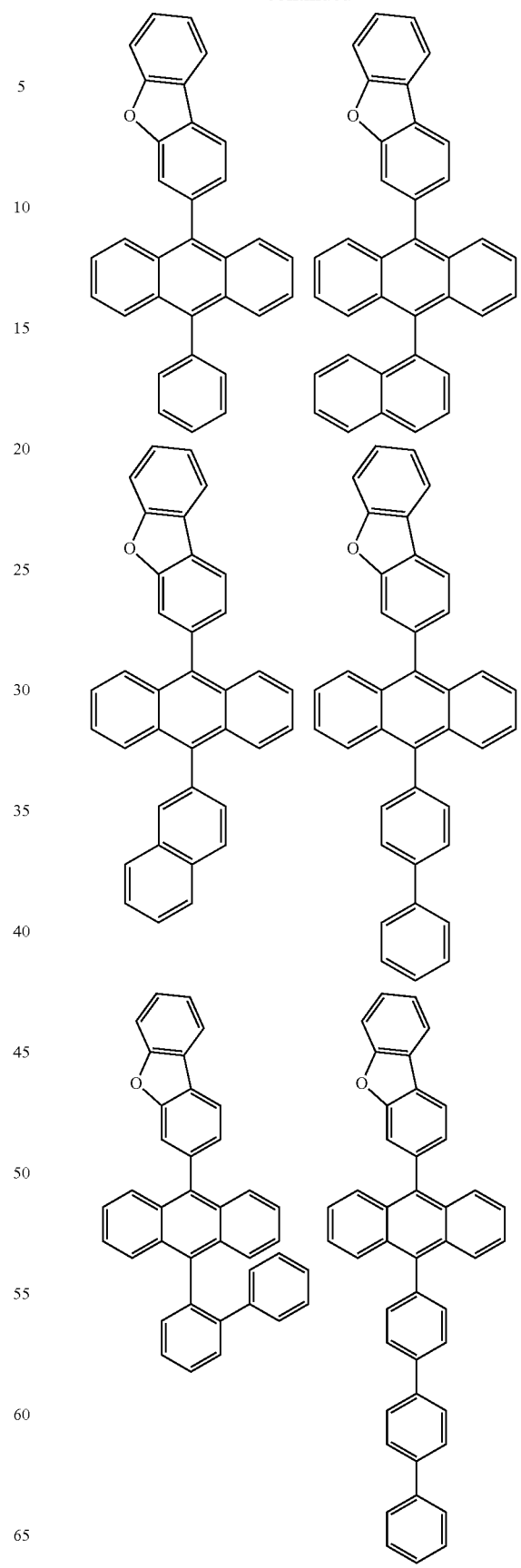

157
-continued
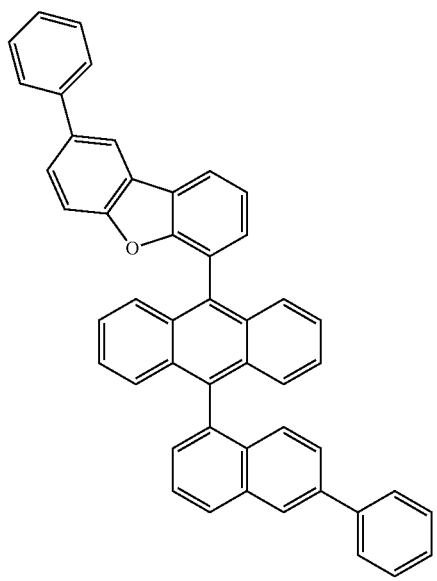
158
-continued
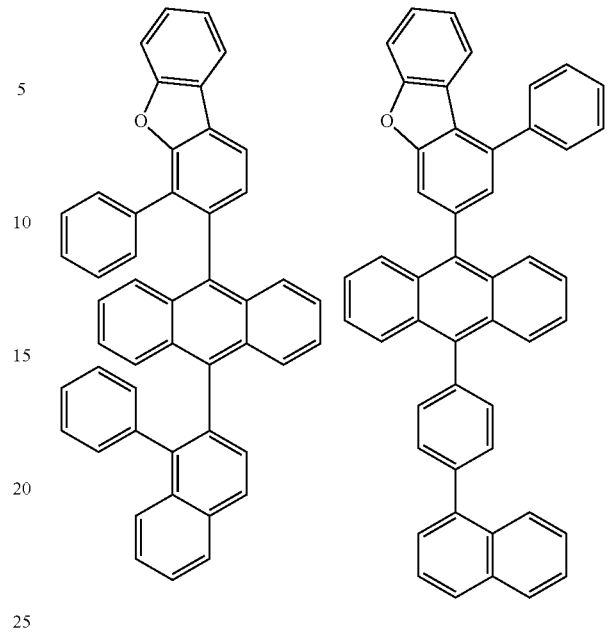
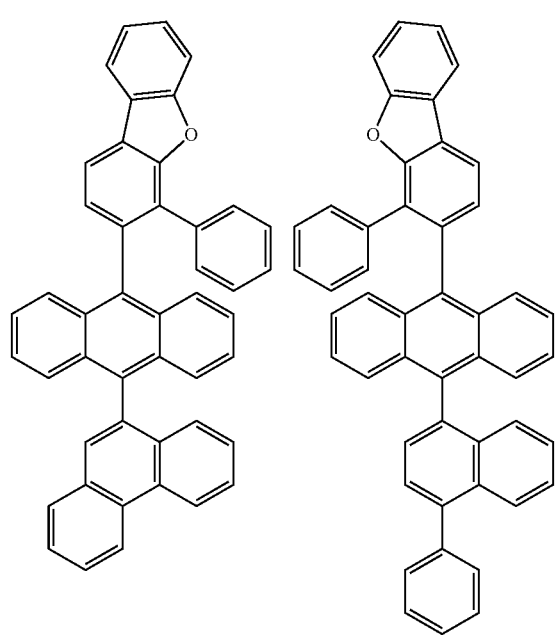
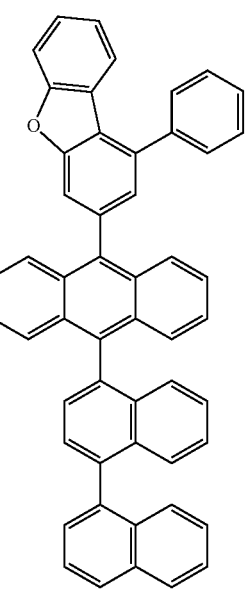

159
-continued
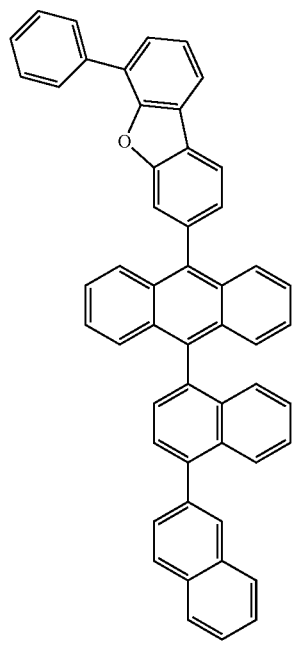
160
-continued
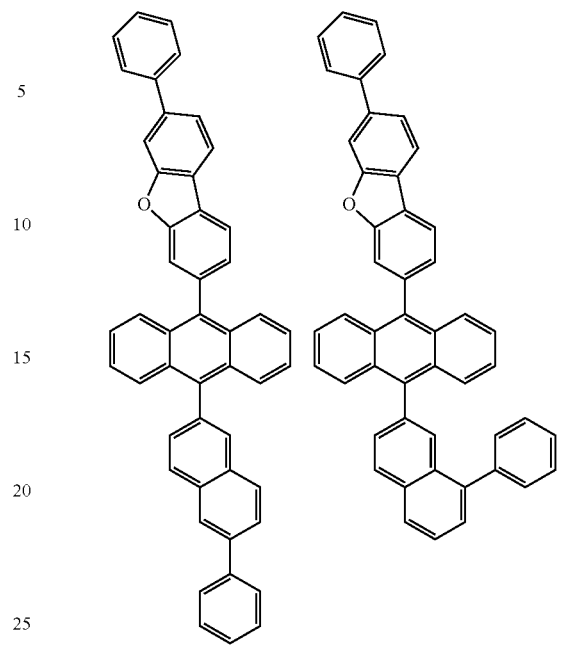
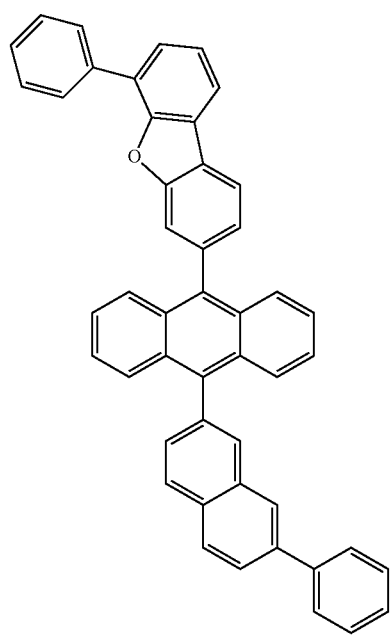
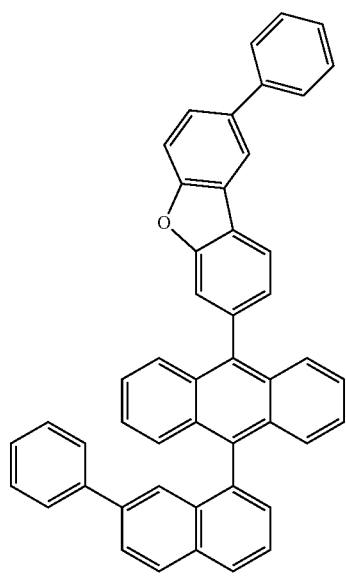

-continued
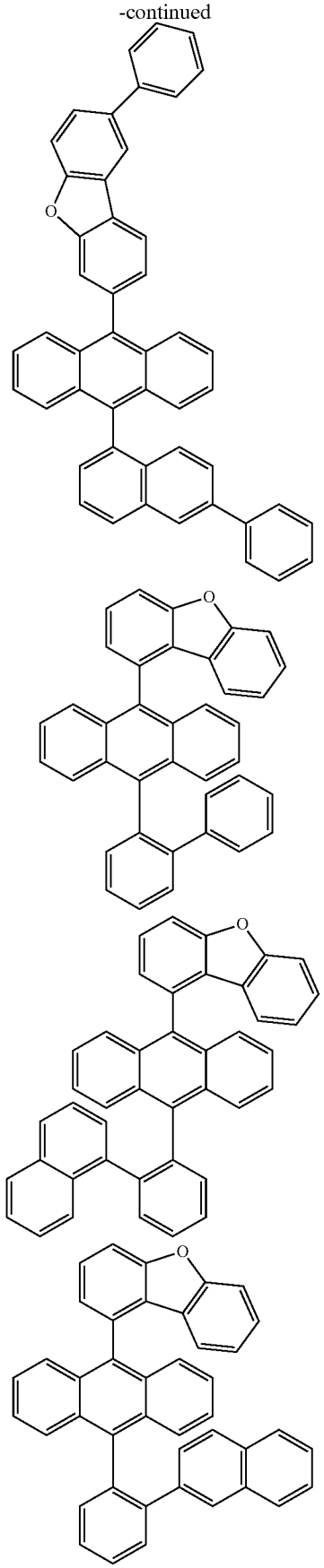
-continued
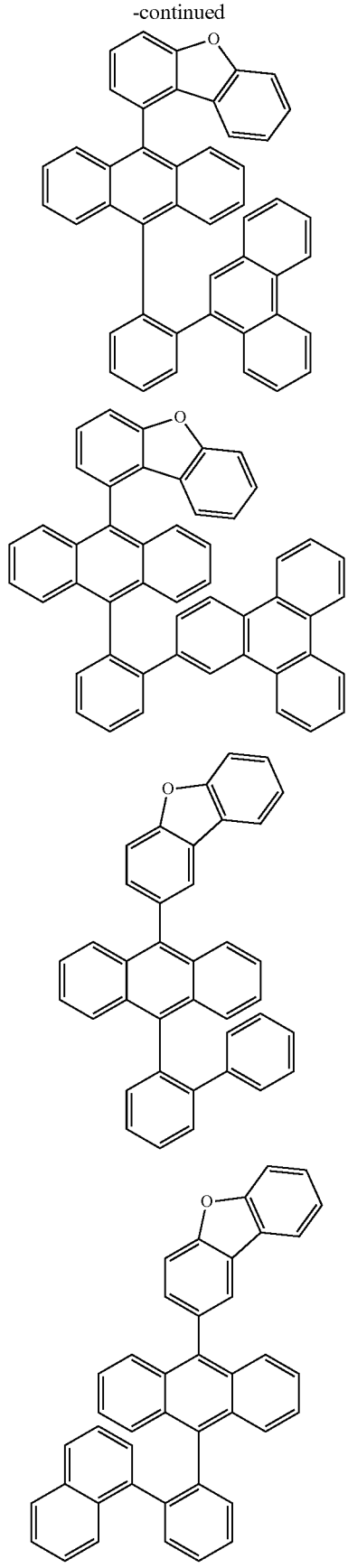

163
-continued
164
-continued
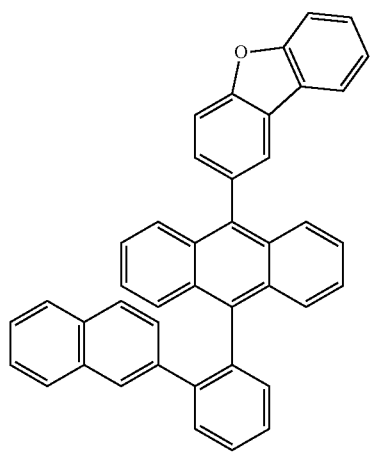
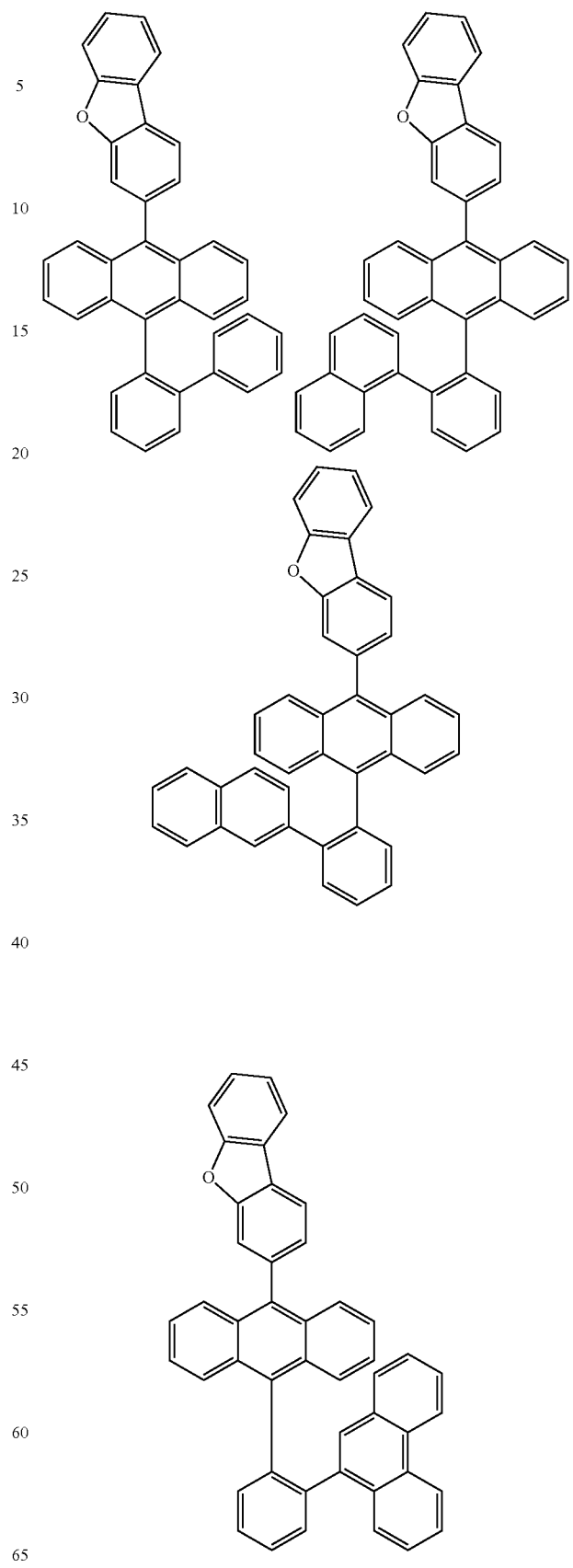

-continued
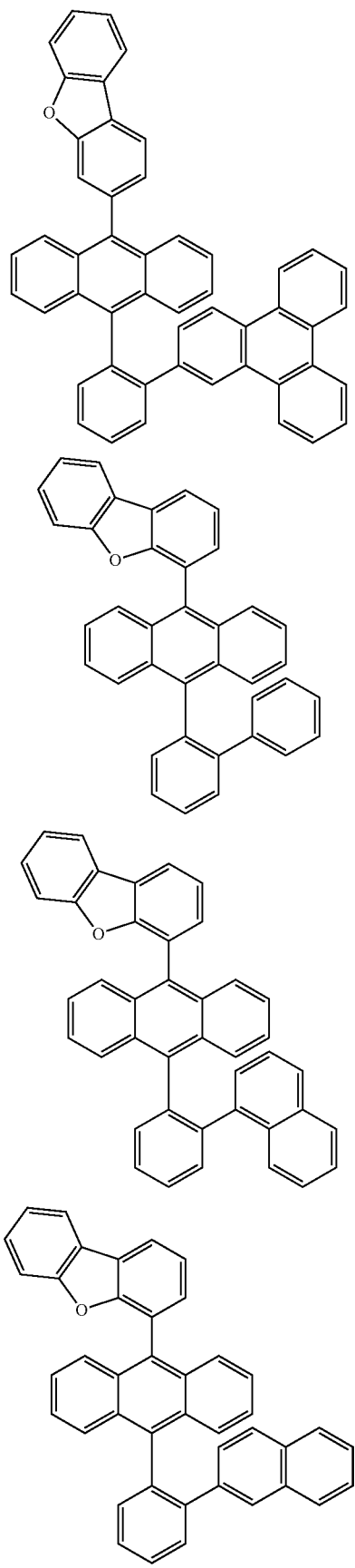
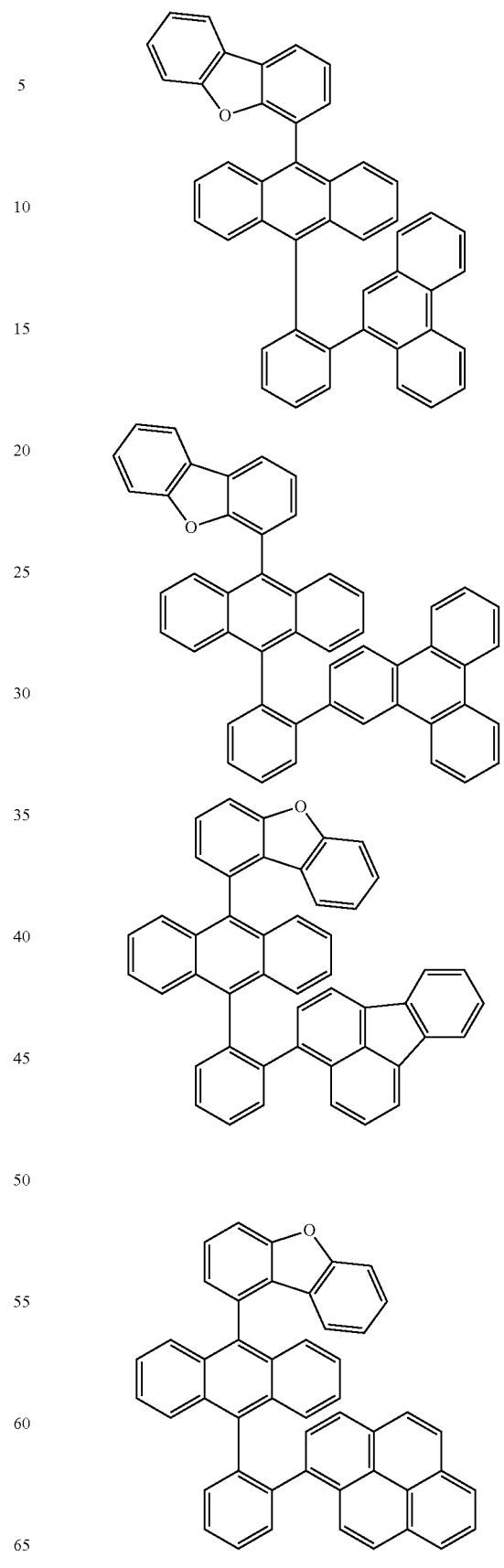

167
-continued
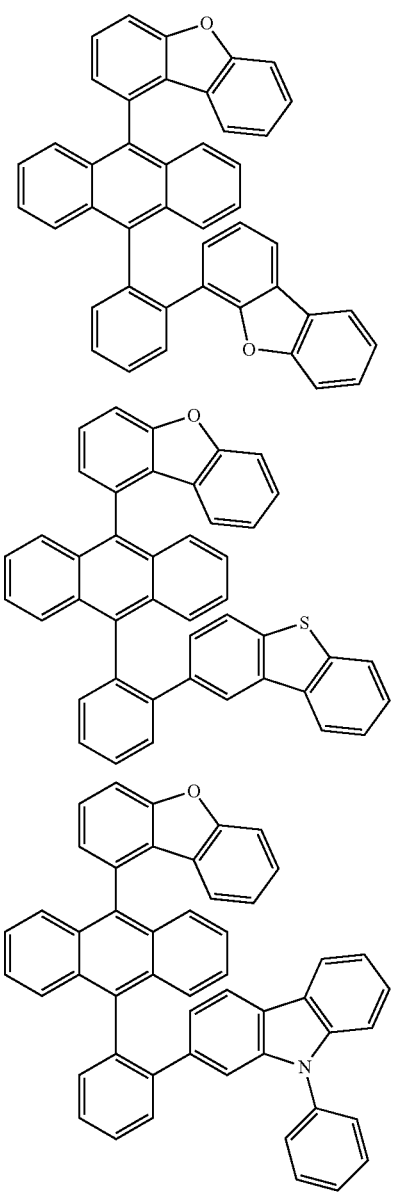
168
-continued
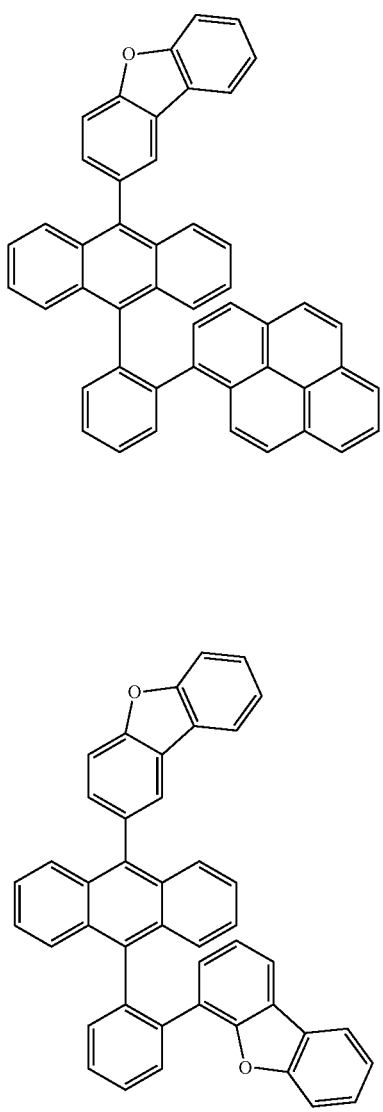
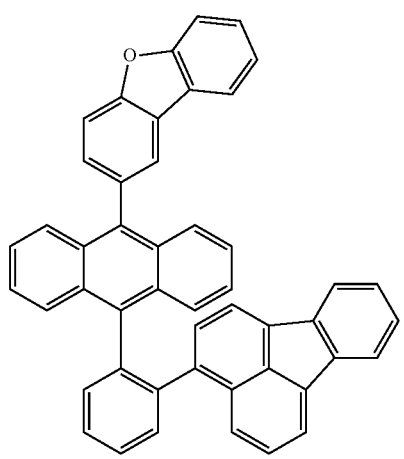
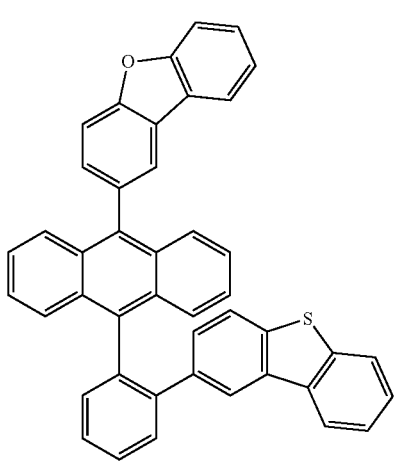

169
-continued
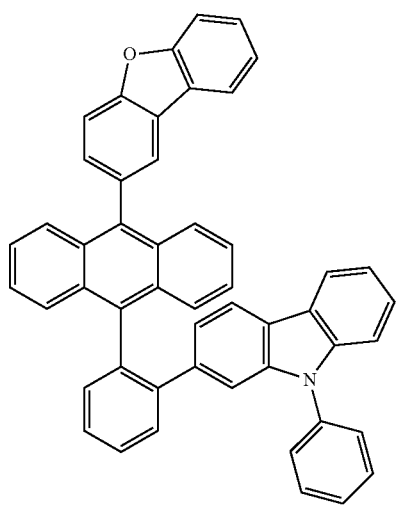
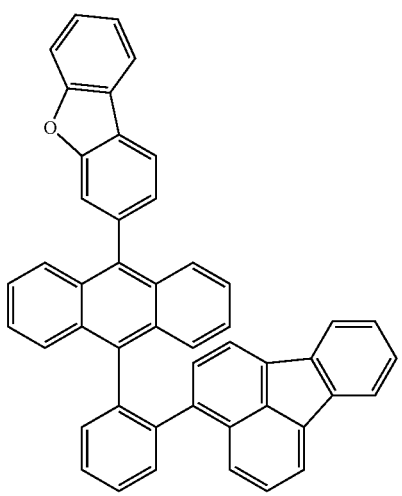
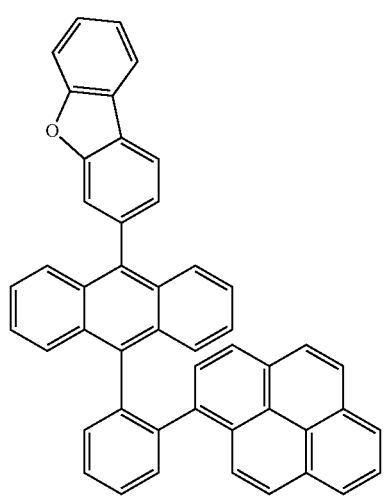
170
-continued
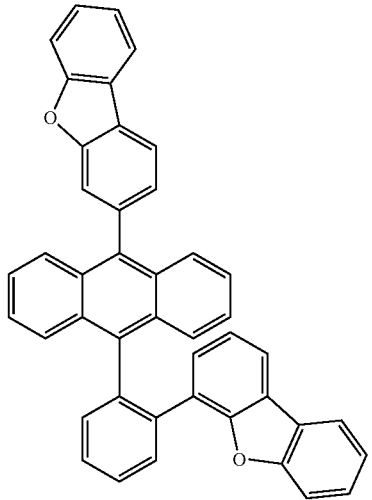
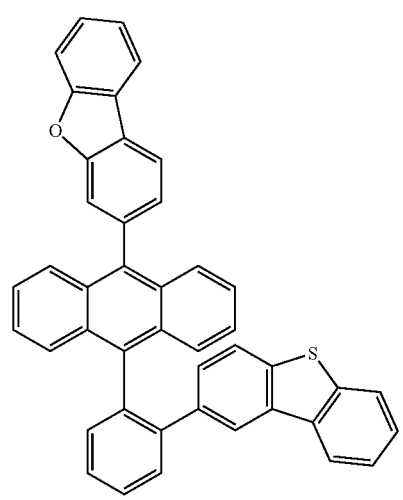
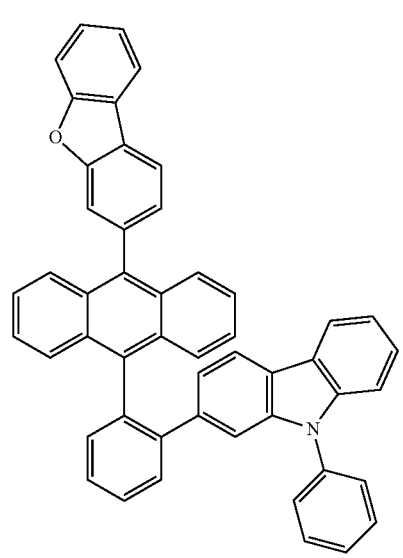

171
-continued
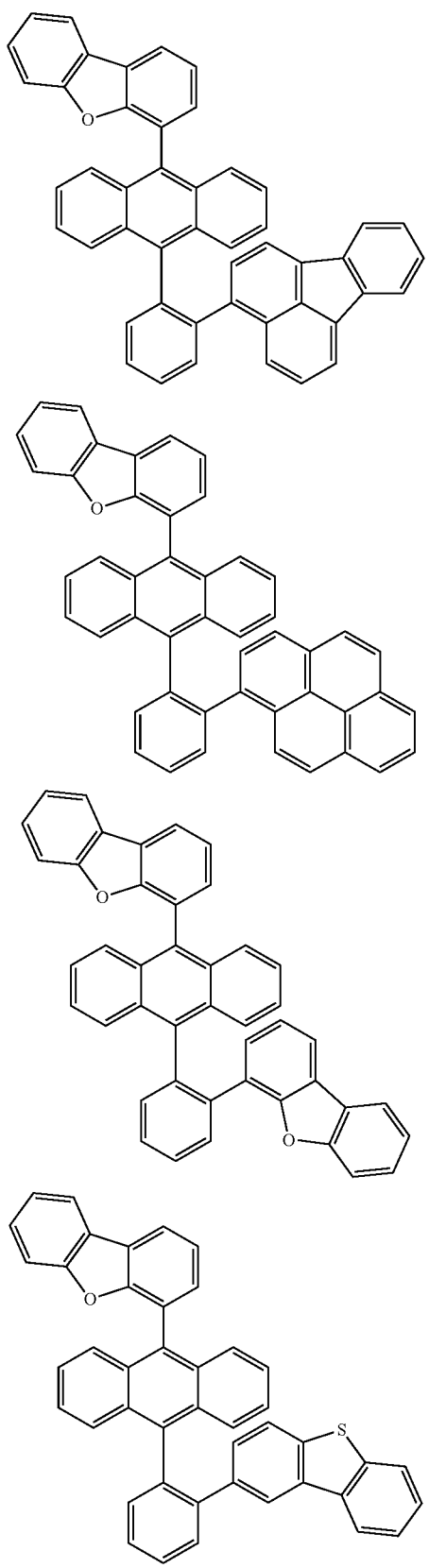 [SMILES: c1ccc(-c2ccc3c4c(cccc24)-c2ccccc2-3)c(-c2c3ccccc3c(-c3cccc4c3oc3ccccc34)c3ccccc23)c1 ; c1ccc(-c2ccc3ccc4cccc5ccc2c3c45)c(-c2c3ccccc3c(-c3cccc4c3oc3ccccc34)c3ccccc23)c1 ; c1ccc(-c2cccc3c2oc2ccccc23)c(-c2c3ccccc3c(-c3cccc4c3oc3ccccc34)c3ccccc23)c1 ; c1ccc(-c2c3ccccc3c(-c3cccc4c3oc3ccccc34)c3ccccc23)c(-c2ccc3sc4ccccc4c3c2)c1]
172
-continued
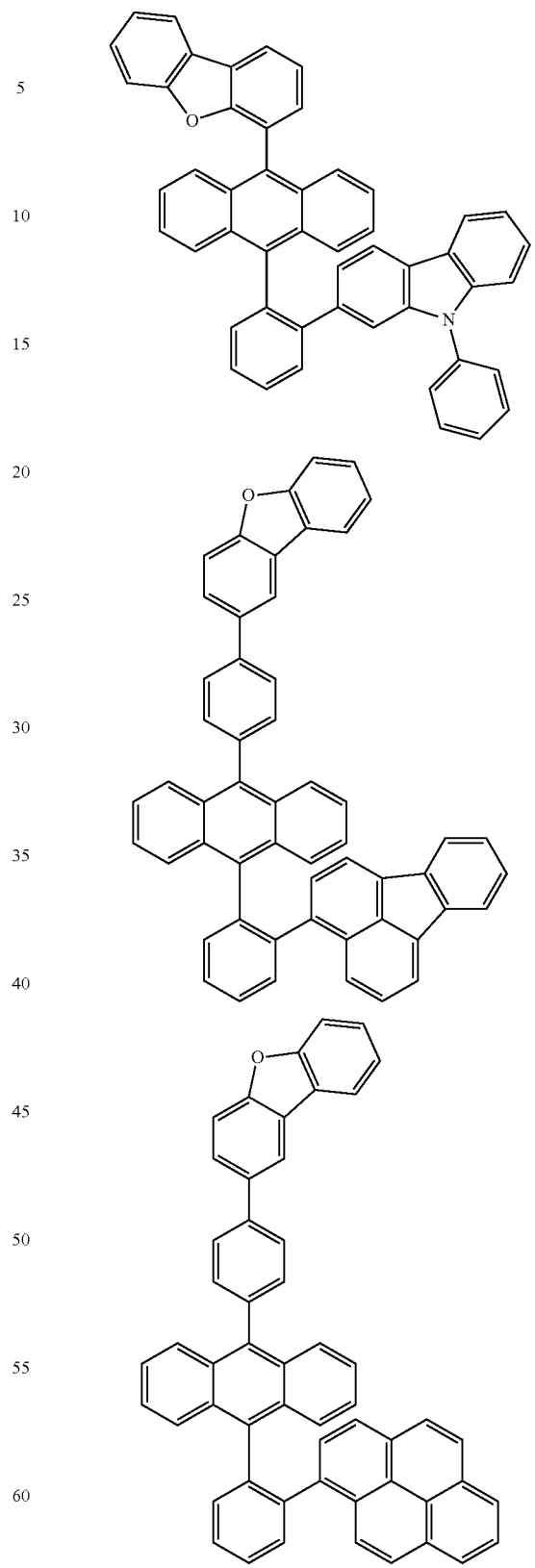

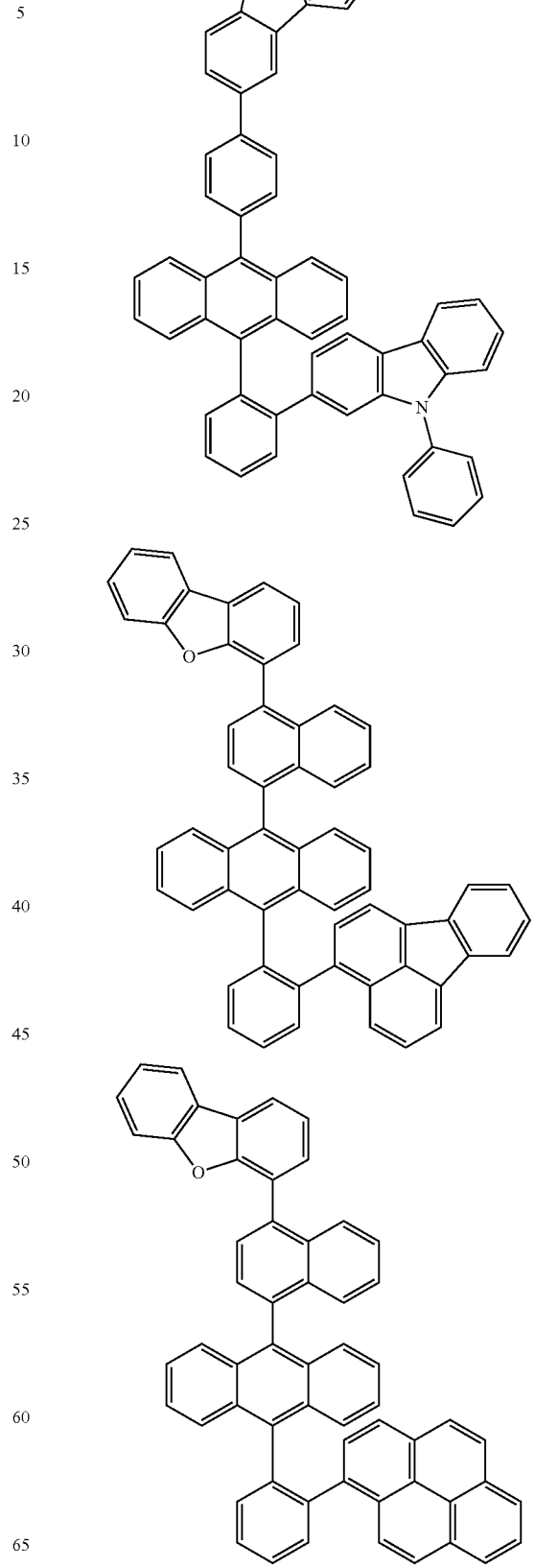

175
-continued
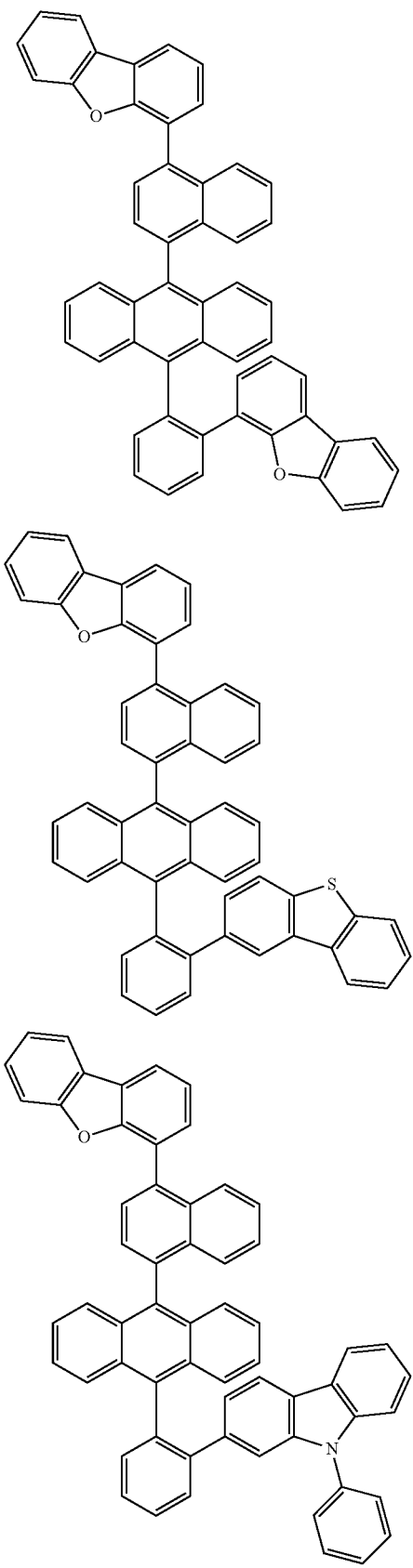
176
-continued
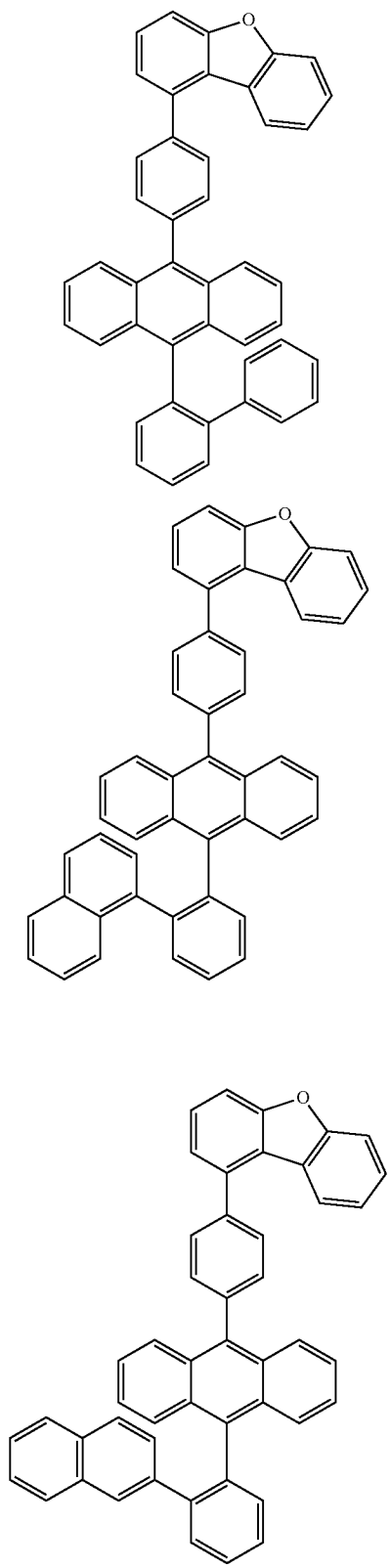

177
-continued
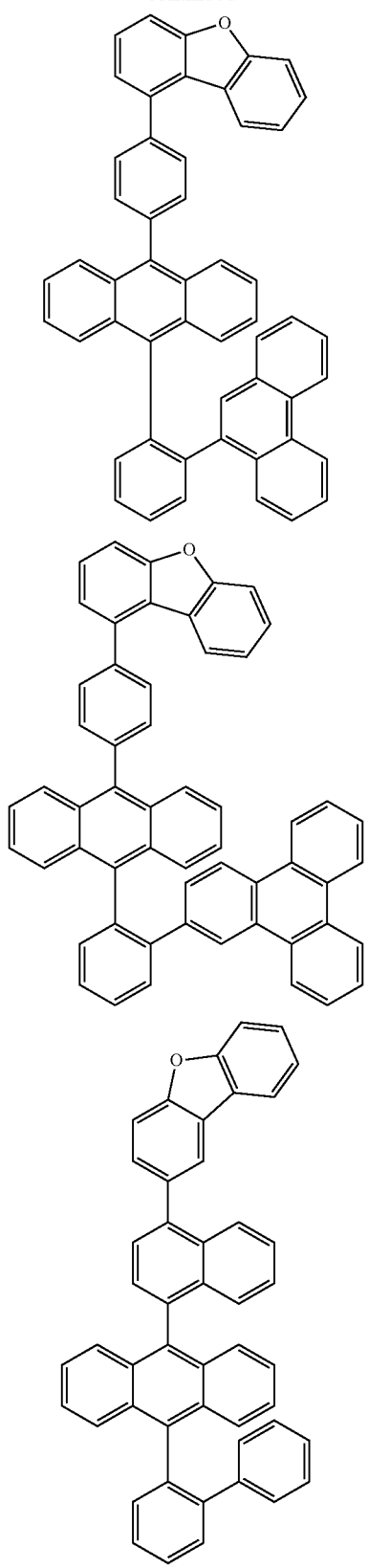
178
-continued

179
-continued
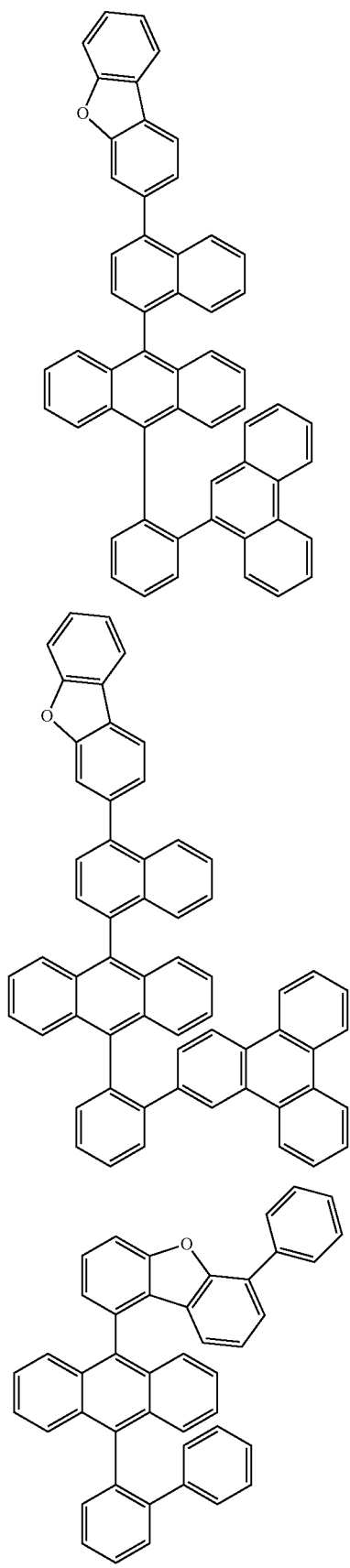
180
-continued
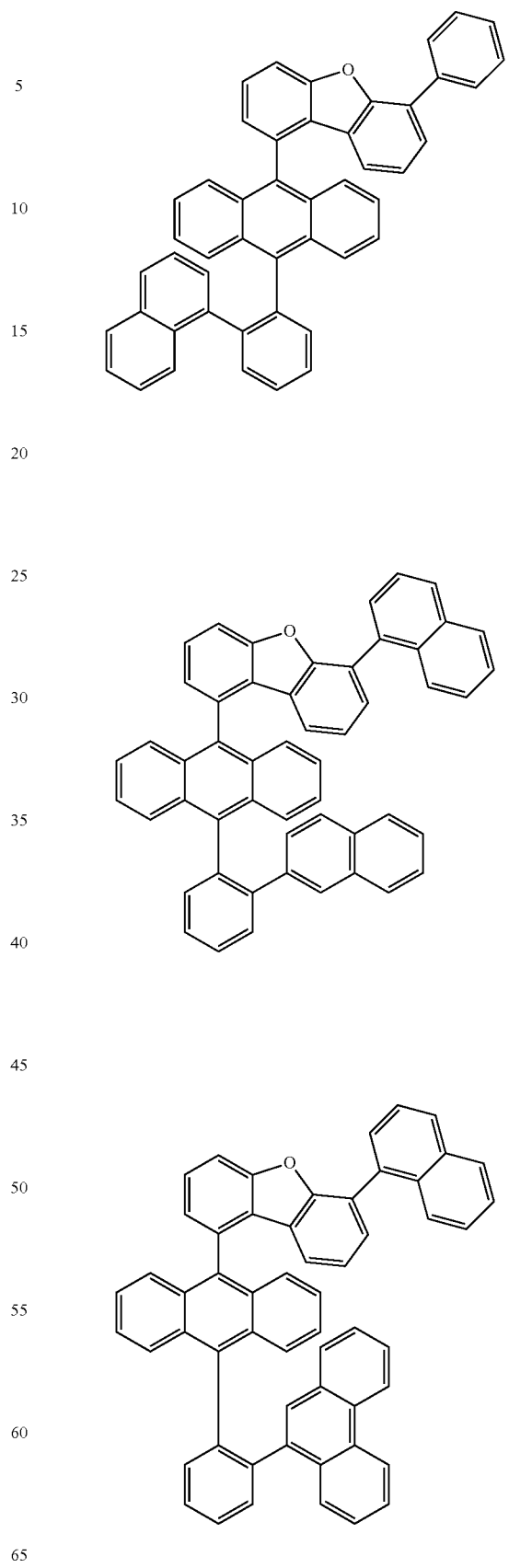

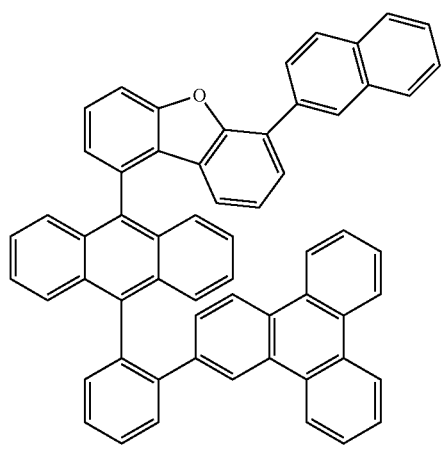
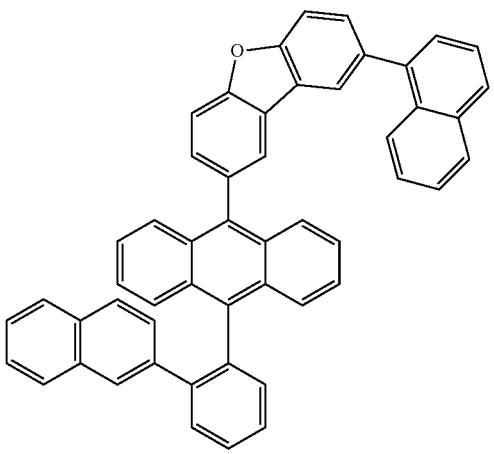
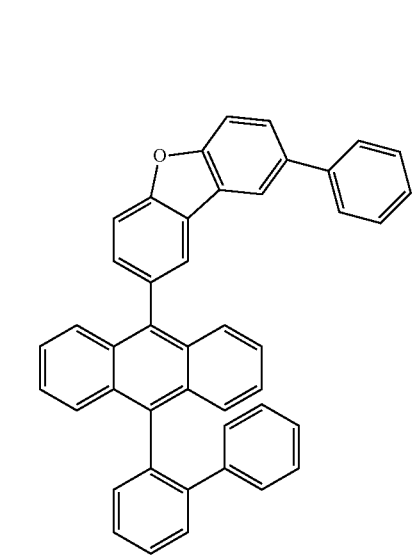
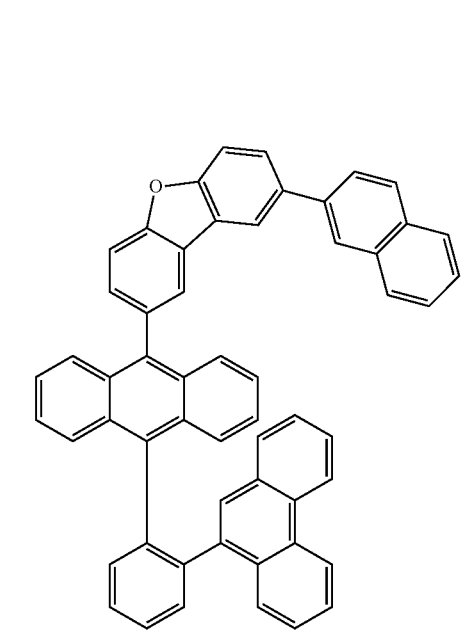
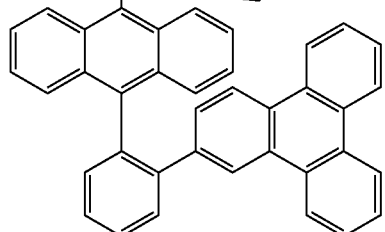
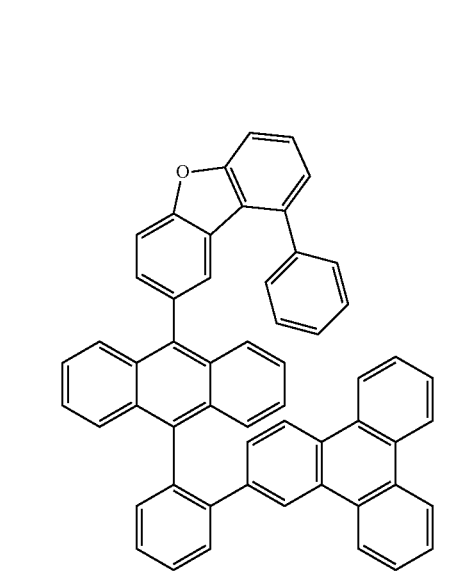

183
-continued
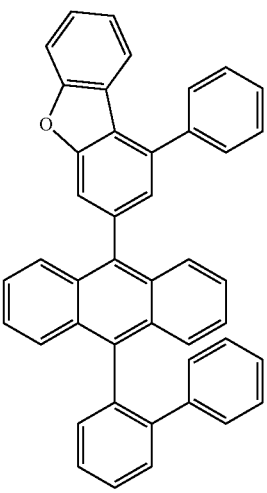
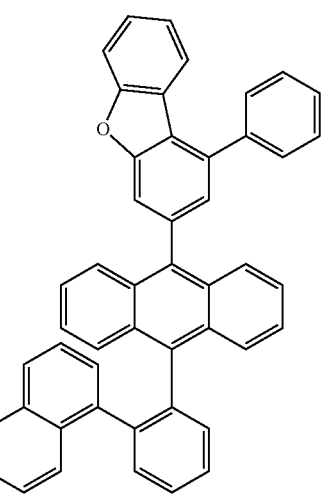
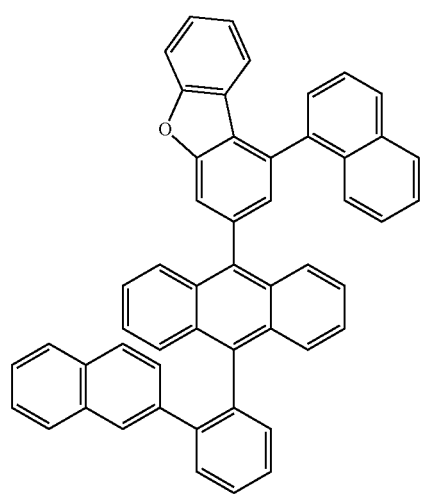
184
-continued
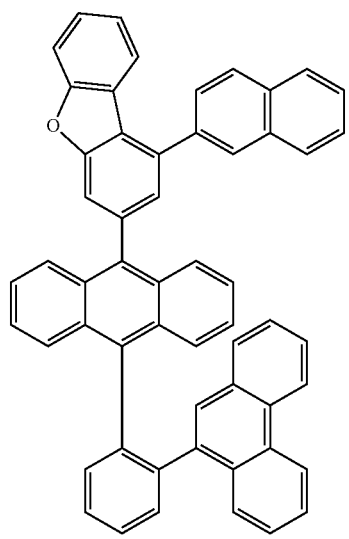
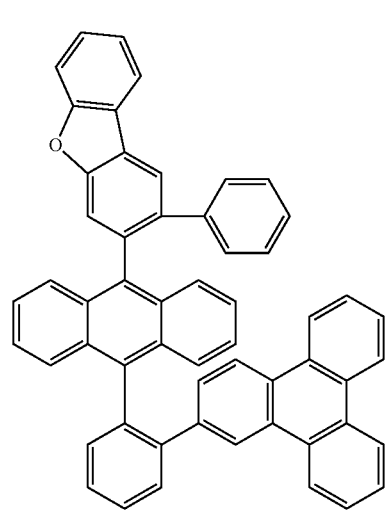
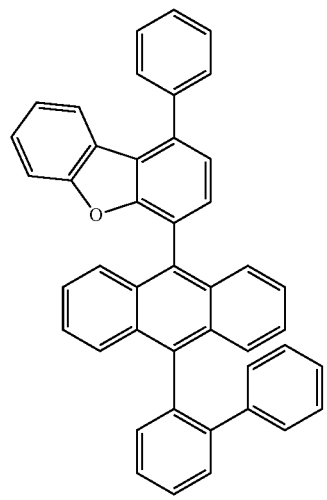

185
-continued
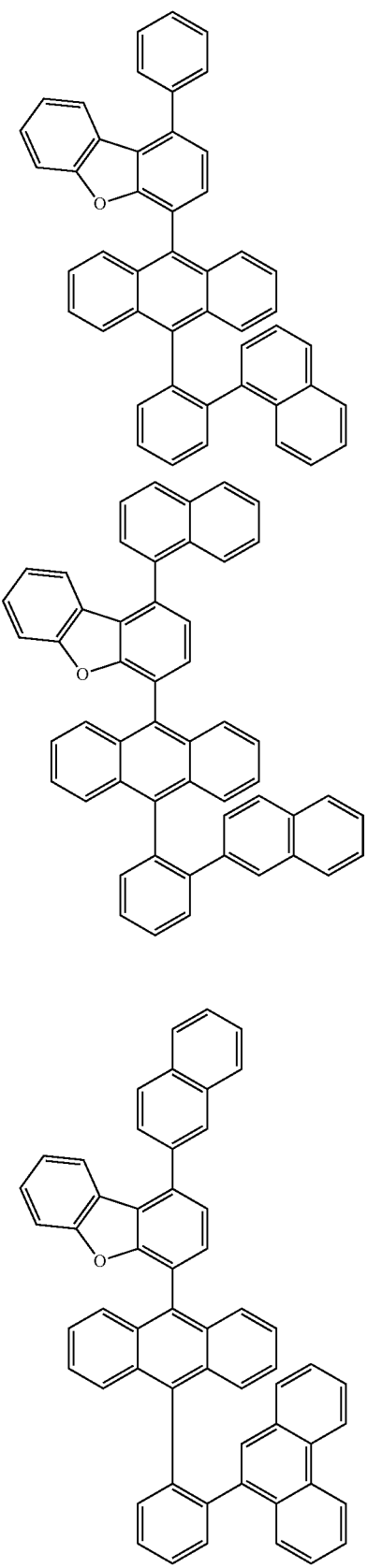
186
-continued
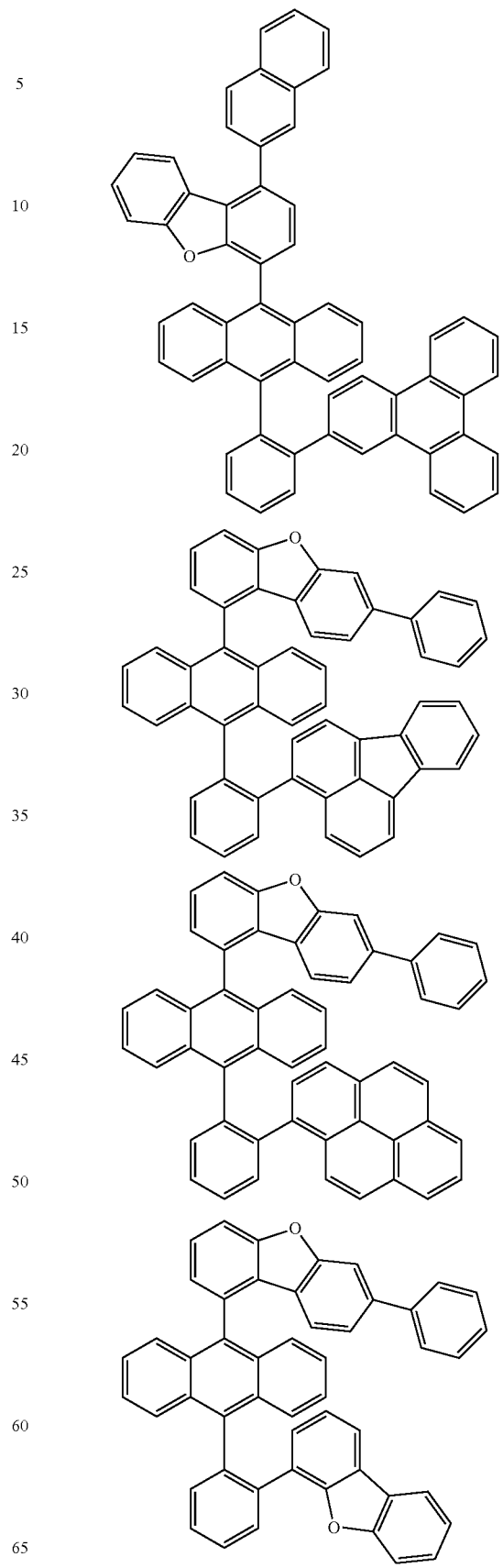

187
-continued
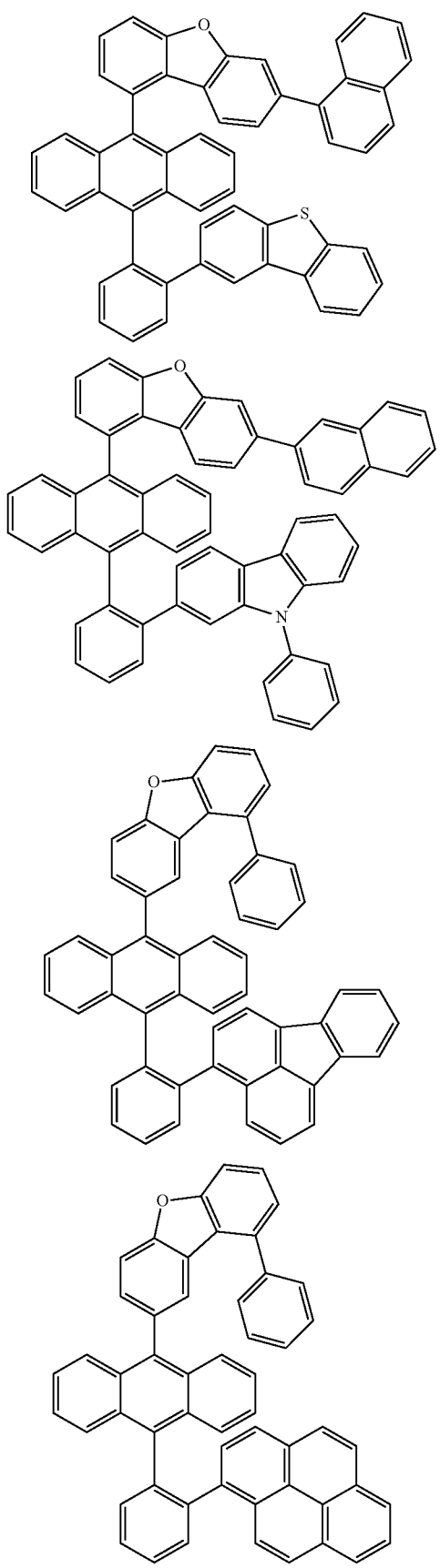
188
-continued
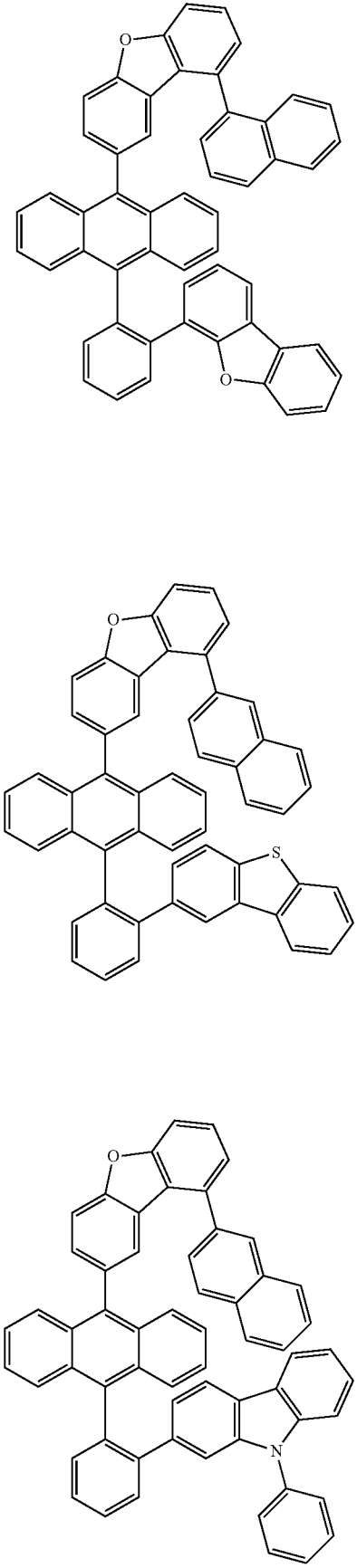

189
-continued
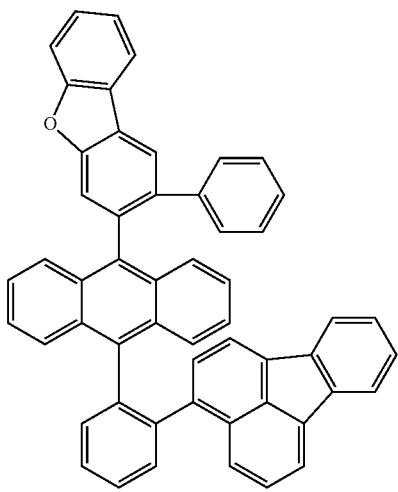
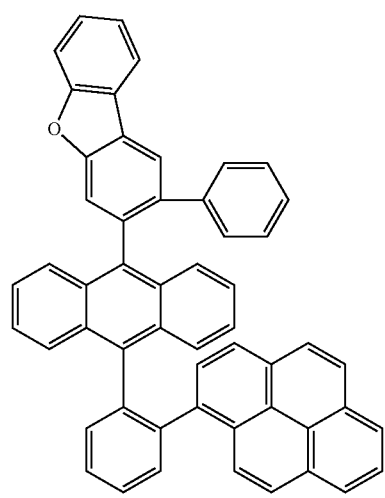
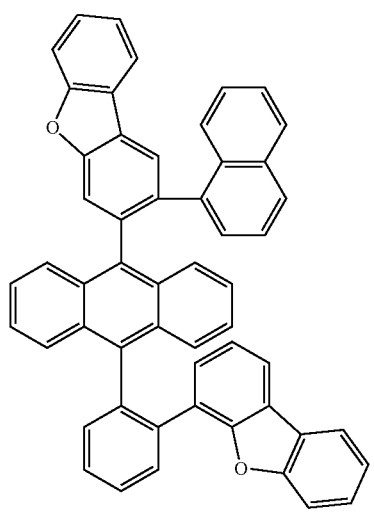
190
-continued
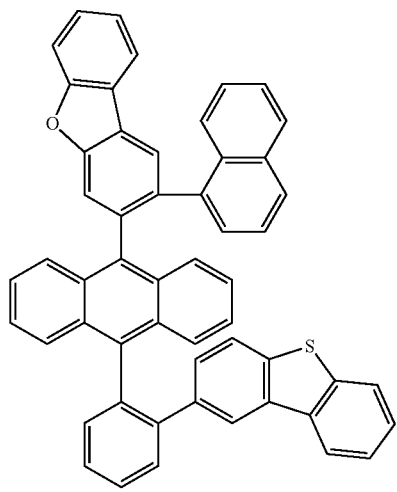
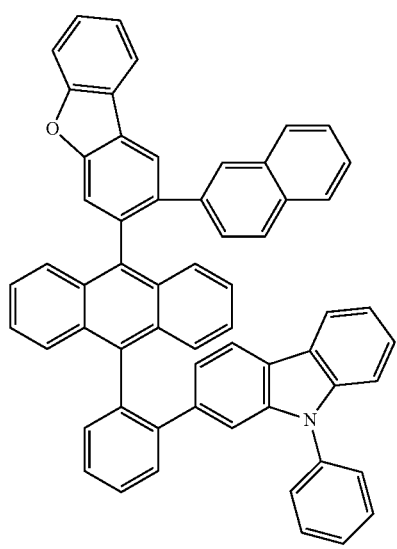
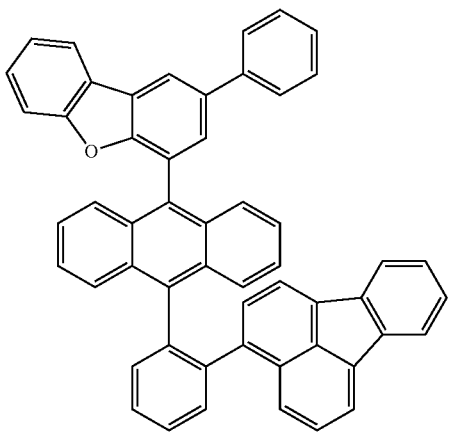

191
-continued

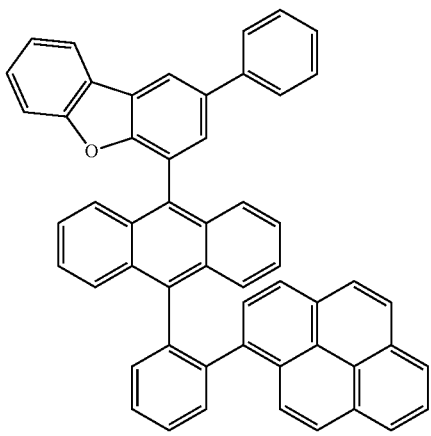

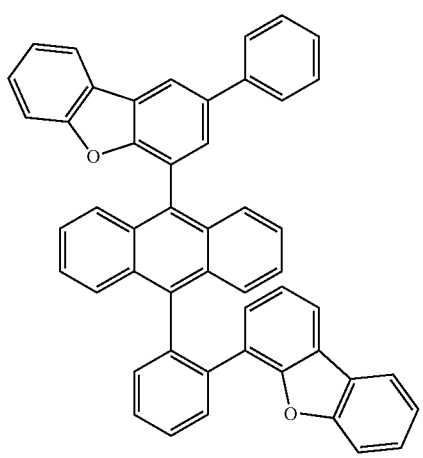

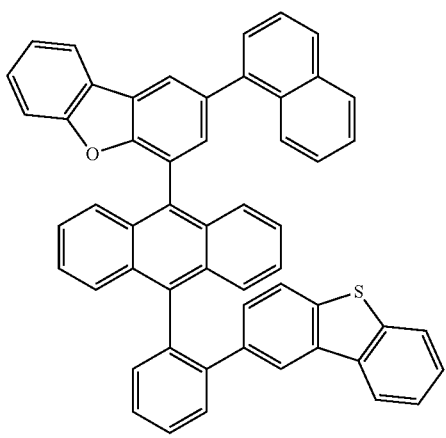

192
-continued

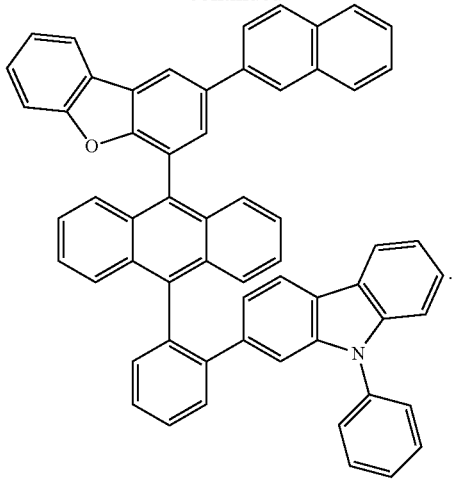

8. An organic light emitting device comprising:
a first electrode;
a second electrode; and
a light emitting layer provided between the first electrode and the second electrode,
wherein the light emitting layer includes a compound of Chemical Formula 1, a compound of Chemical Formula 2, and a compound BD-11 or BD-18:

Chemical Formula 1

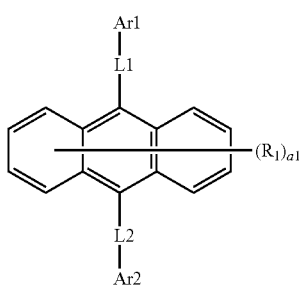

Chemical Formula 2

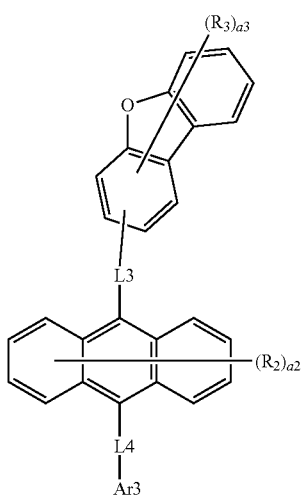

wherein in Chemical Formulae 1 and 2:
L1 to L4 are the same as or different from each other, and each independently a direct bond; or a substituted or unsubstituted arylene group;

Ar1 and Ar2 are the same as or different from each other, and each independently a substituted or unsubstituted aryl group;

Ar3 is a substituted or unsubstituted aryl group; or a substituted or unsubstituted heteroaryl group;

$R_1$ to $R_3$ are the same as or different from each other, and each independently hydrogen; deuterium; a halogen group; a cyano group; a silyl group; an alkyl group; a cycloalkyl group; an alkenyl group; an alkynyl group; an alkoxy group; an aryloxy group; an amino group; an aryl group; or a heteroaryl group; and a1 and a2 are each independently an integer of 0 to 8, a3 is an integer of 0 to 7, and when a1 is 2 or greater, R1s are the same as or different from each other, when a2 is 2 or greater, R2s are the same as or different from each other, and when a3 is 2 or greater, R3s are the same as or different from each other;

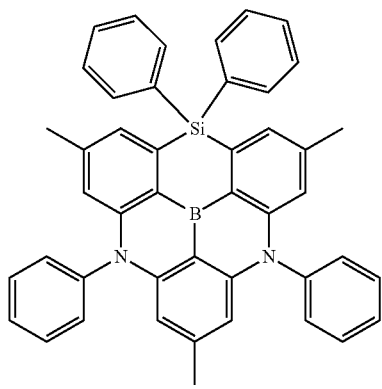

BD-11 or

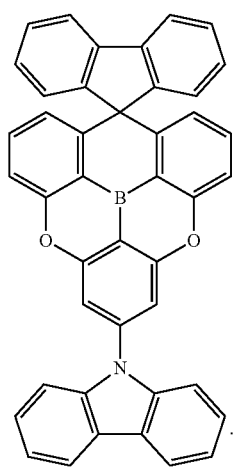

BD-18

9. The organic light emitting device of claim 8, wherein:

L1 to L4 are the same as or different from each other, and each independently a direct bond; a phenylene group; a biphenylene group; or a naphthalene group; and Ar1 and Ar2 are the same as or different from each other, and each independently a phenyl group; a biphenyl group; a terphenyl group; or a naphthyl group.

10. The organic light emitting device of claim 8, wherein Ar3 is a substituted or unsubstituted phenyl group; a substituted or unsubstituted biphenyl group; a substituted or unsubstituted terphenyl group; a substituted or unsubstituted naphthyl group; a substituted or unsubstituted phenanthrenyl group; a substituted or unsubstituted triphenylenyl group; a substituted or unsubstituted fluoranthenyl group; a substituted or unsubstituted pyrenyl group; a substituted or unsubstituted dibenzofuranyl group; a substituted or unsubstituted dibenzothiophenyl group; or a substituted or unsubstituted carbazolyl group.

11. The organic light emitting device of claim 8, wherein the compound of Chemical Formula 1 is one selected from among the following compounds:

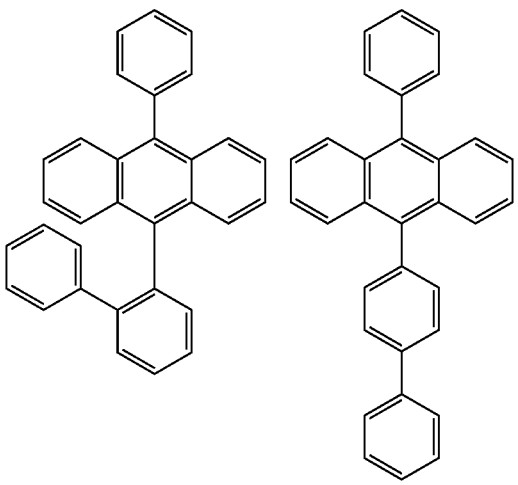

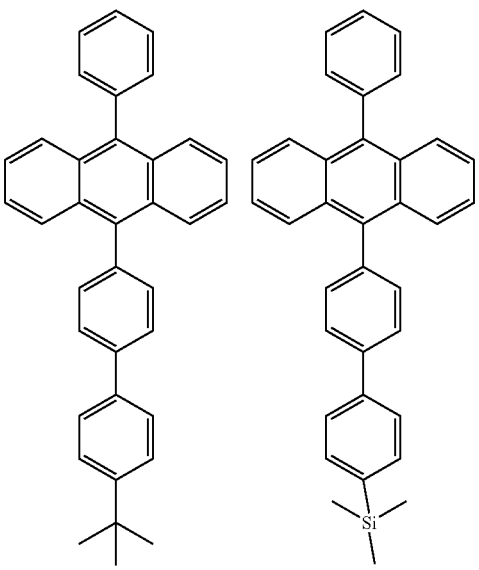

195
-continued
196
-continued
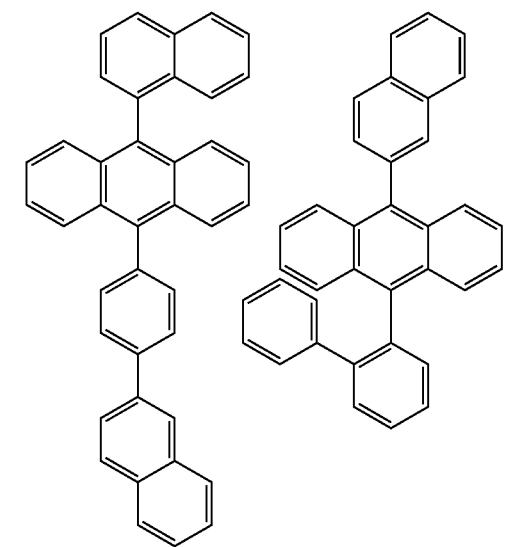
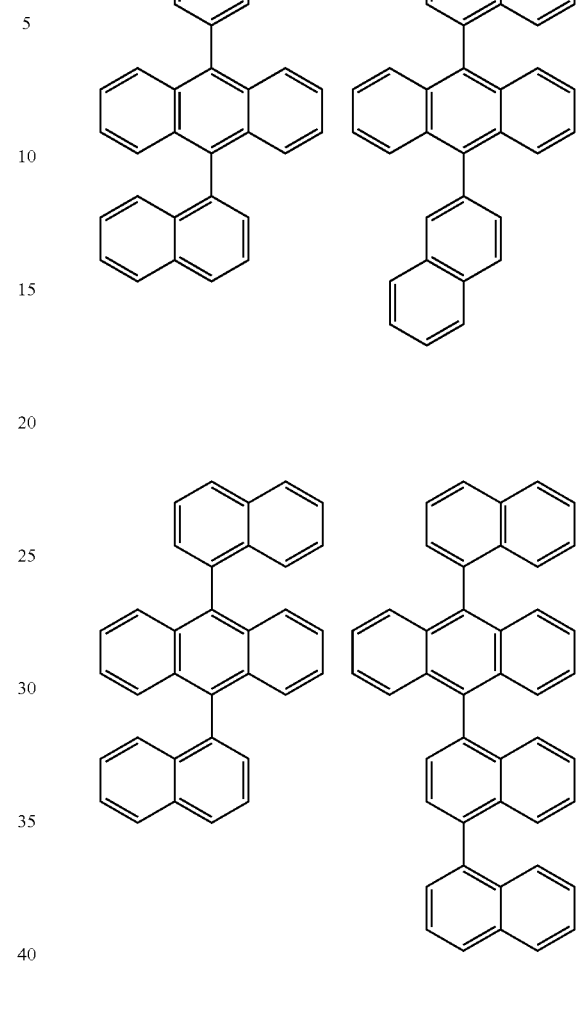
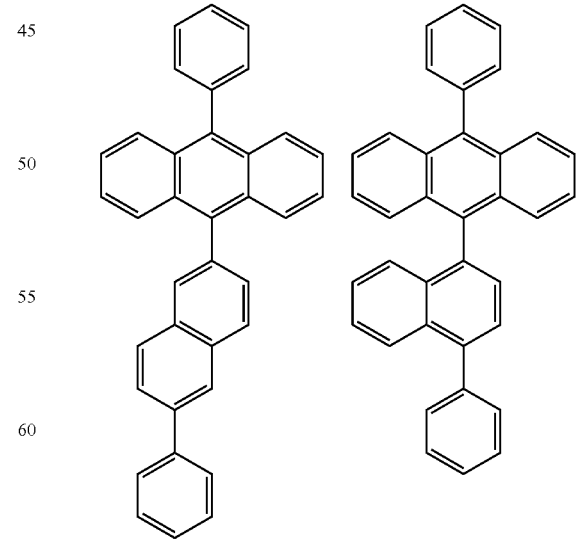

197
-continued
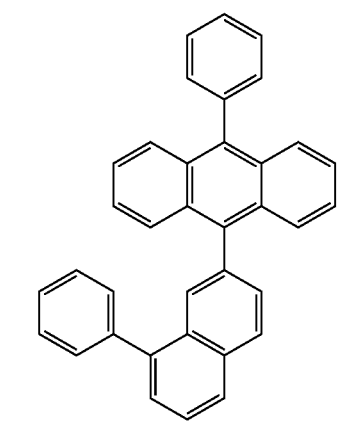
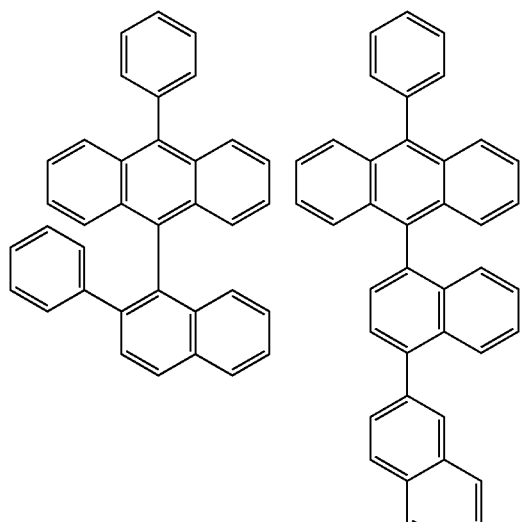
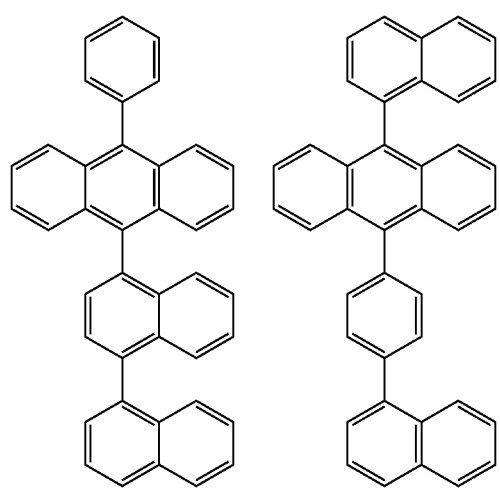
198
-continued
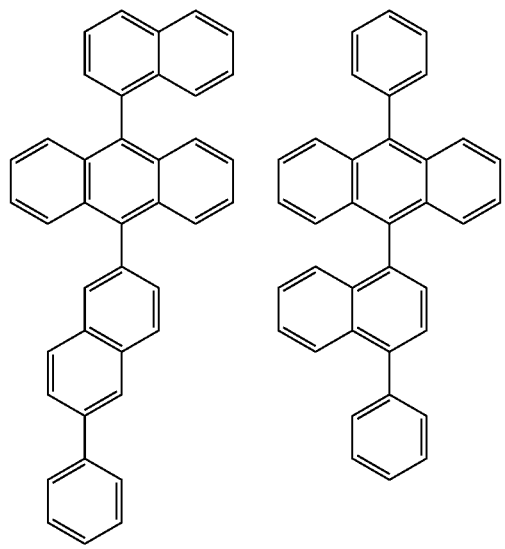
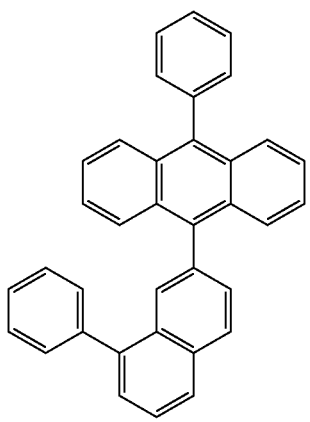
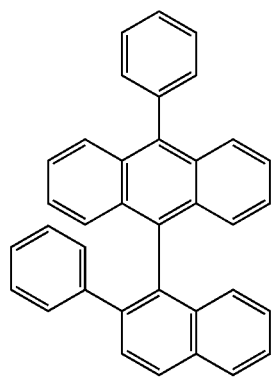

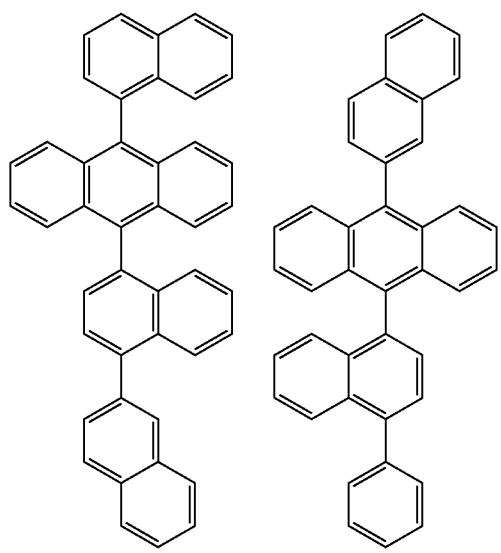
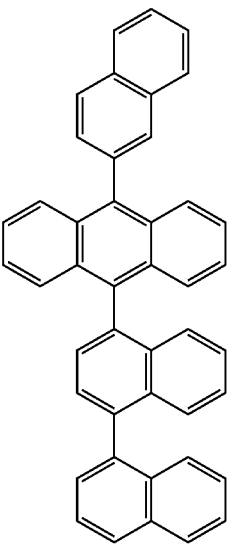
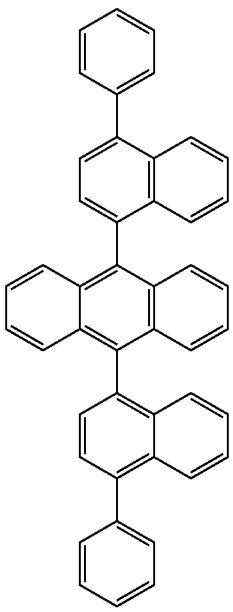
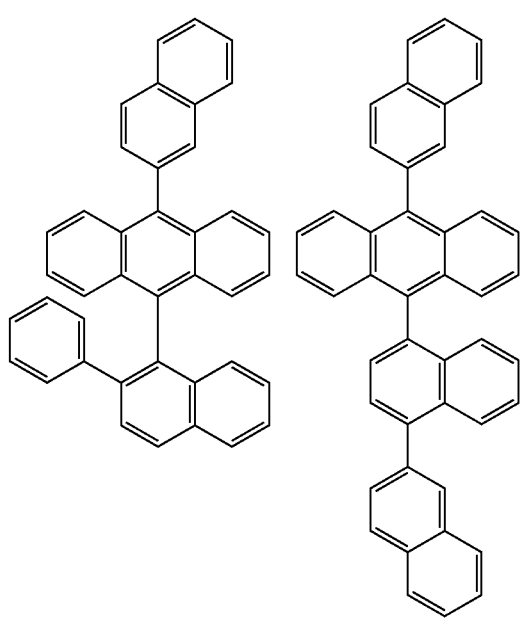
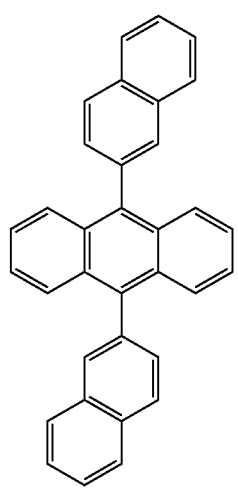
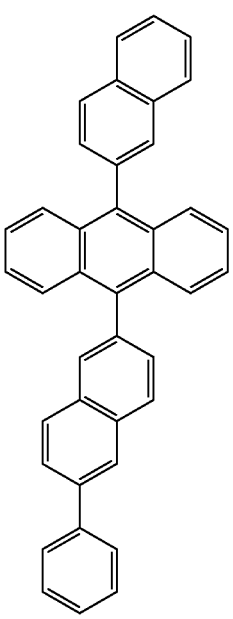

201
-continued
202
-continued
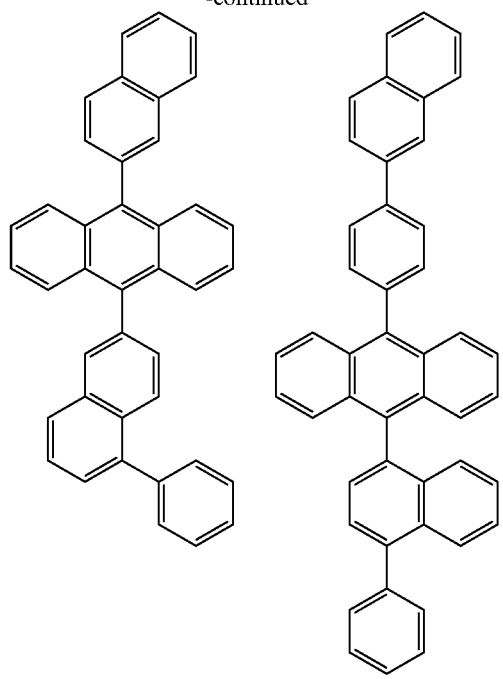
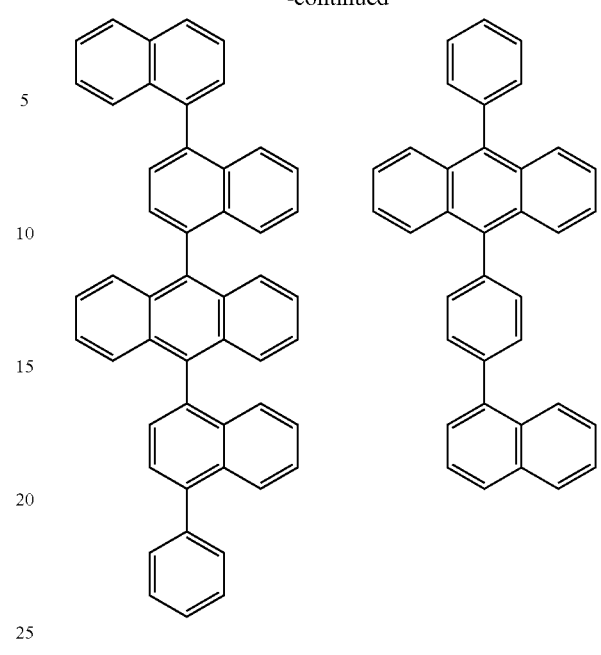
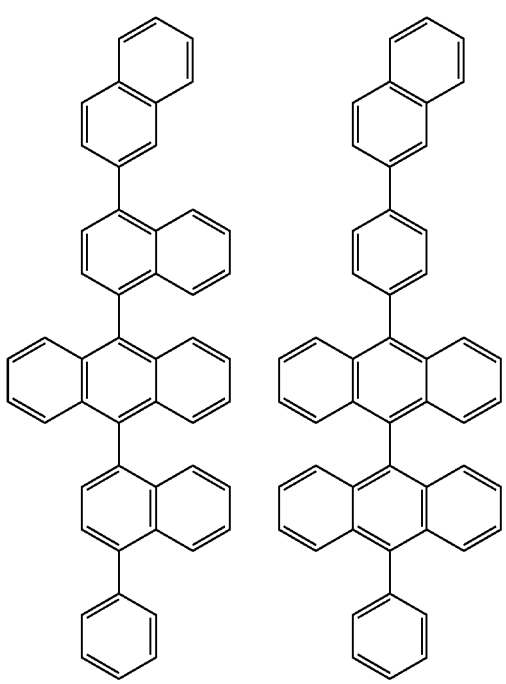

203
-continued
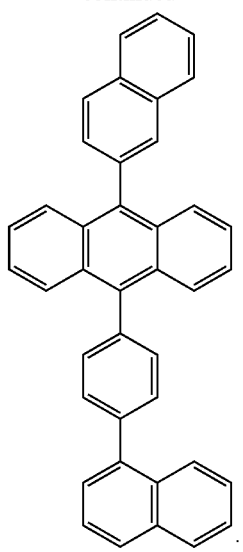
12. The organic light emitting device of claim 8, wherein the compound of Chemical Formula 2 is one selected from among the following compounds:
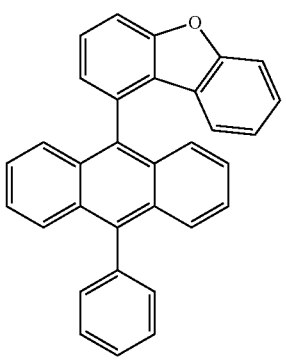
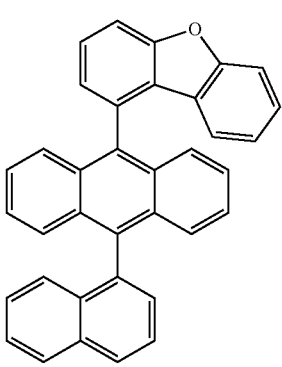
204
-continued
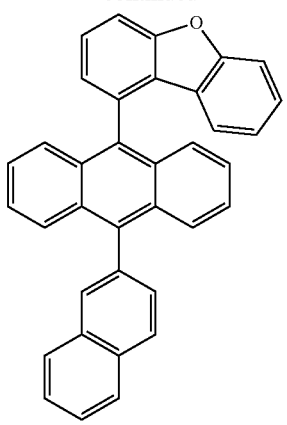
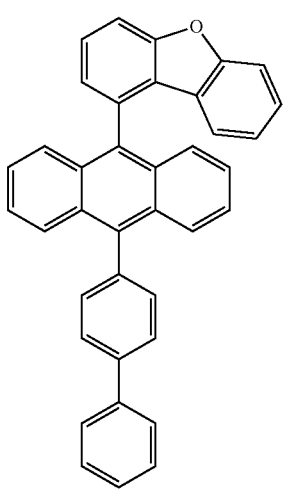
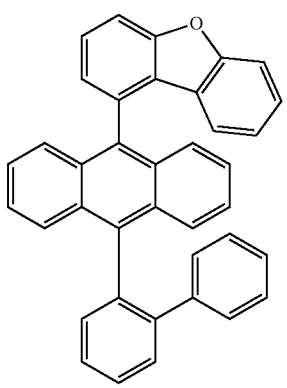

205
-continued
206
-continued
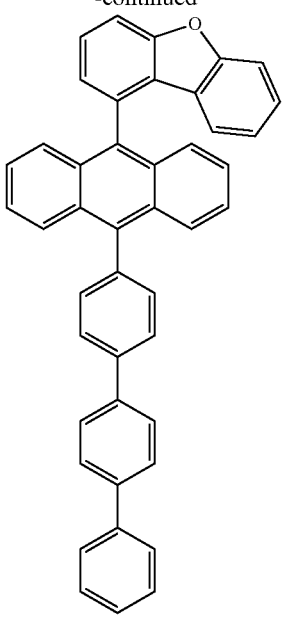
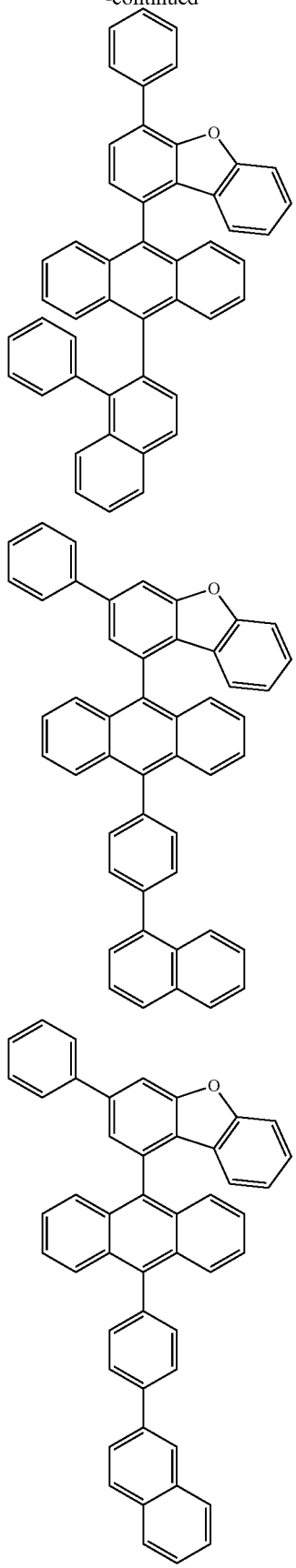

207
-continued
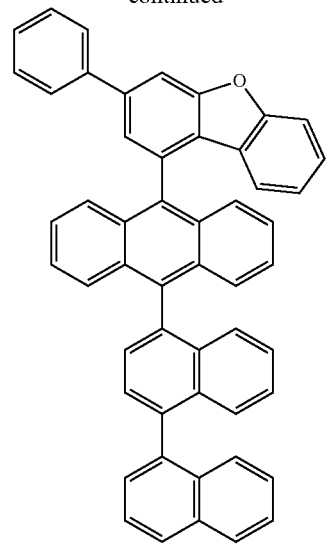
208
-continued
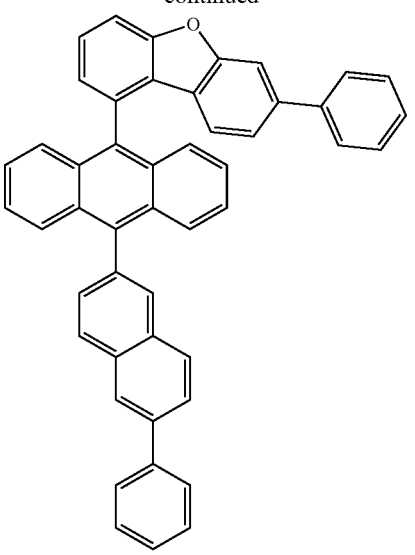
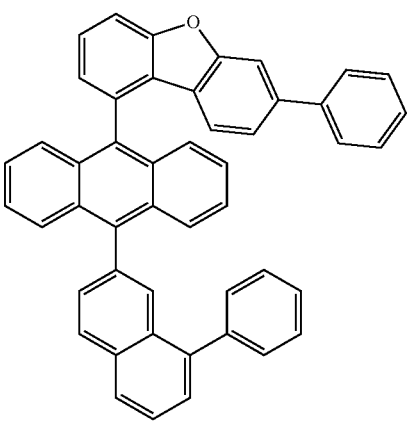
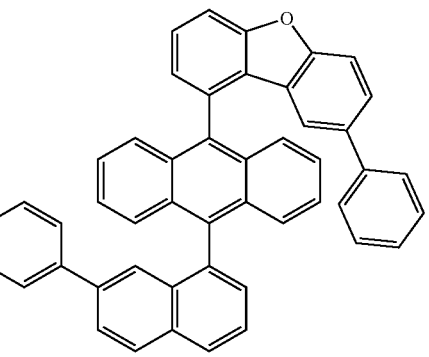

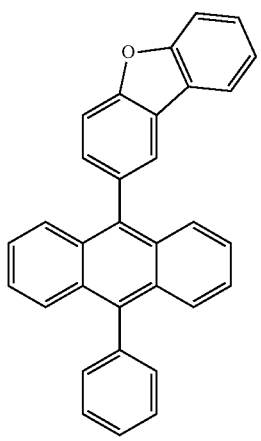
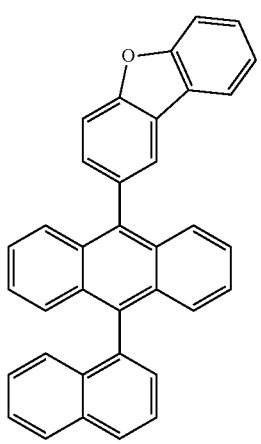
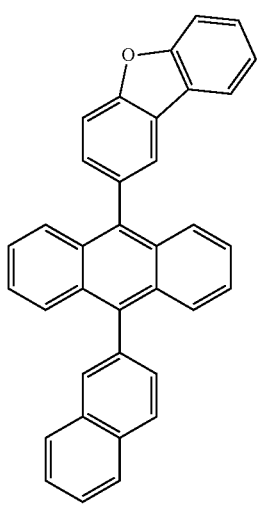
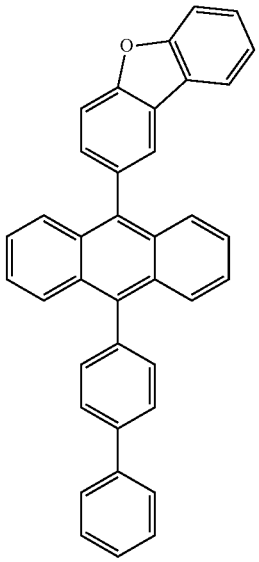
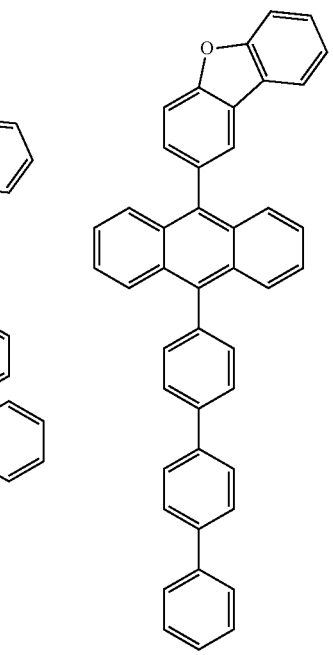

211
-continued
212
-continued
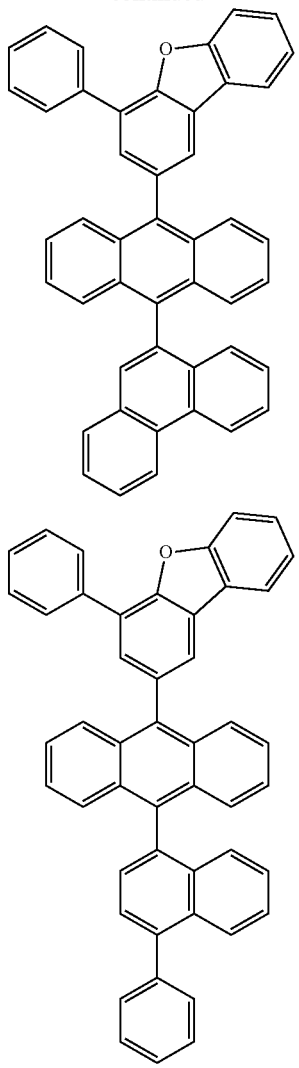

213
-continued
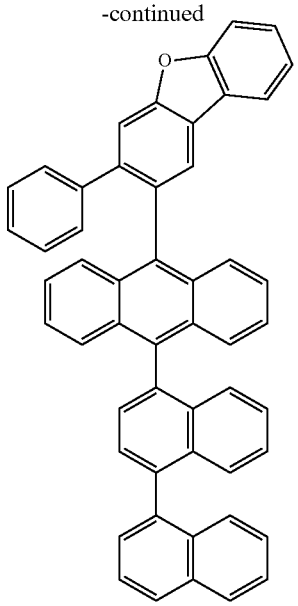
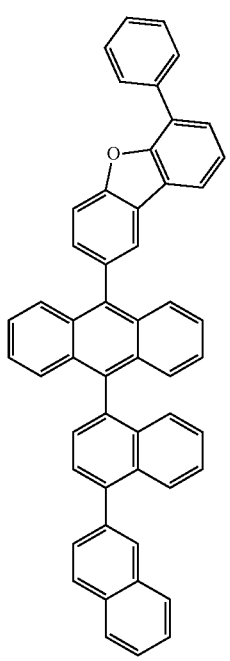
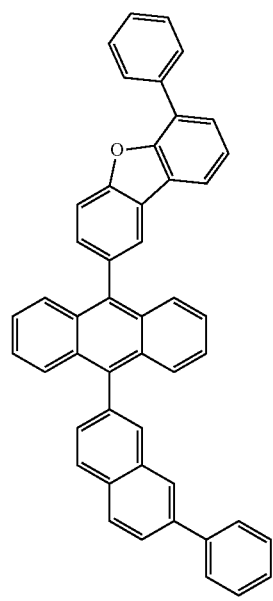
214
-continued
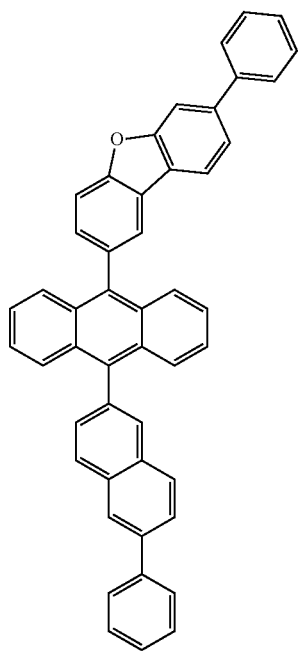
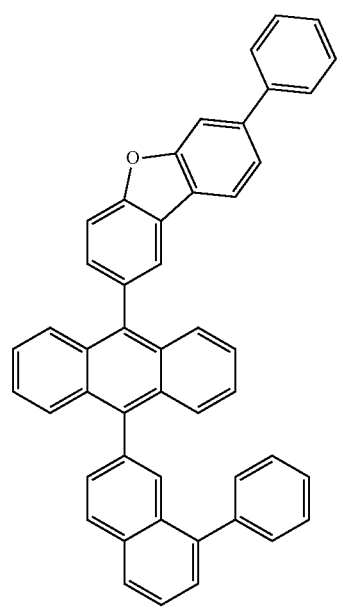
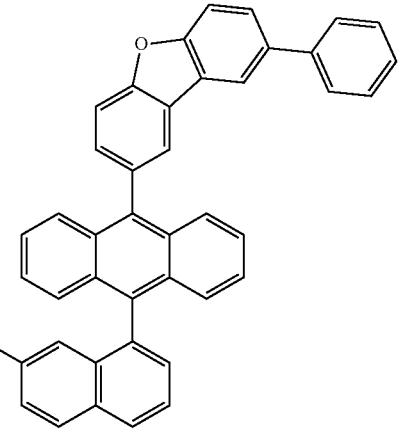

215
-continued
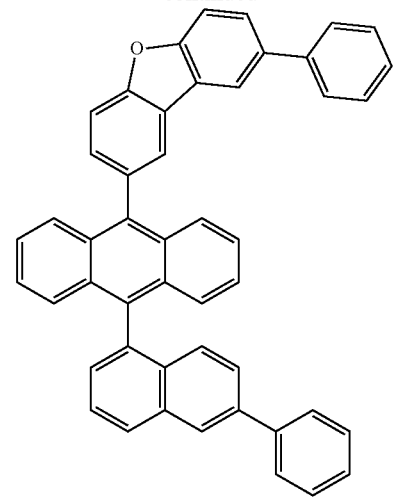
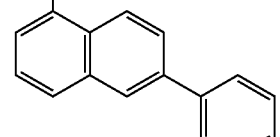
216
-continued
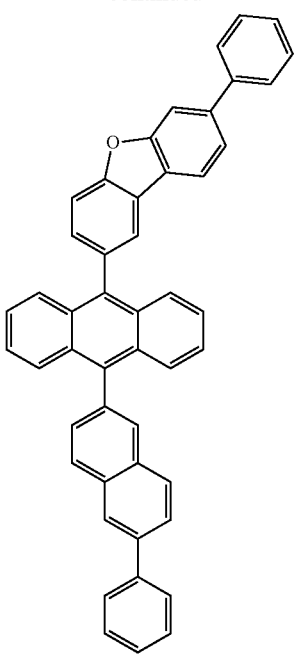
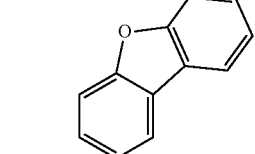
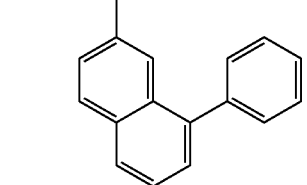
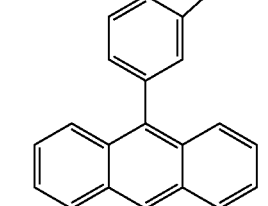

217
-continued
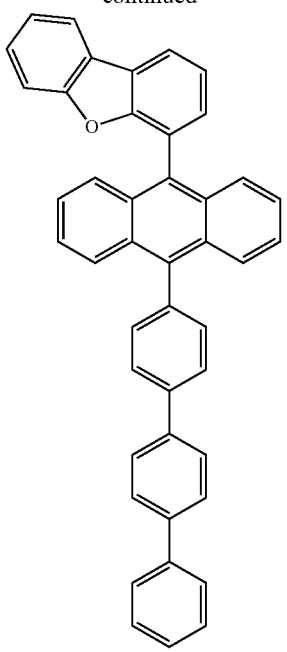
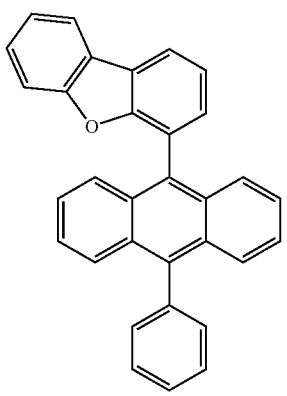
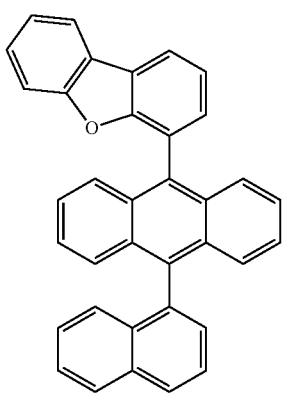
218
-continued
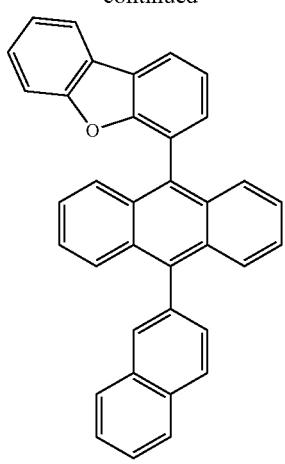
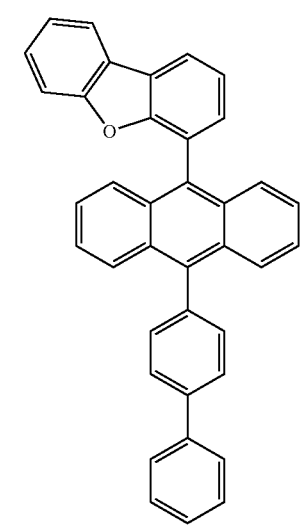
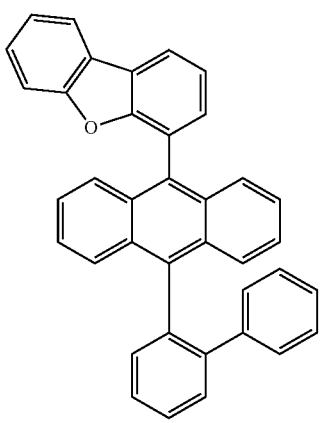

219
-continued
220
-continued
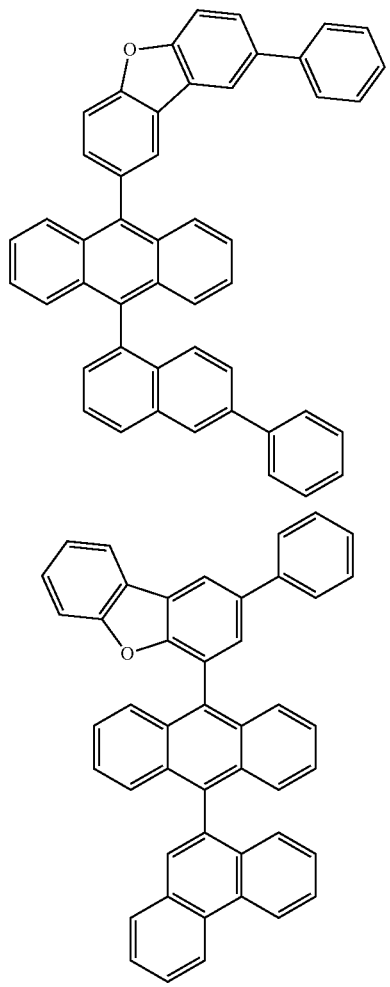
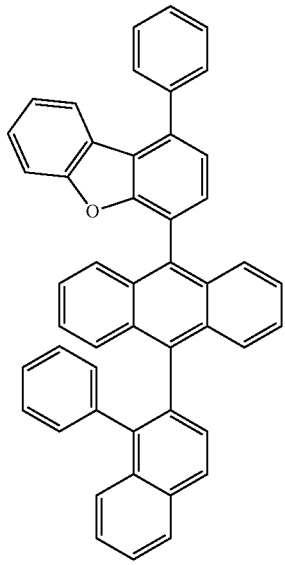

221
-continued
222
-continued
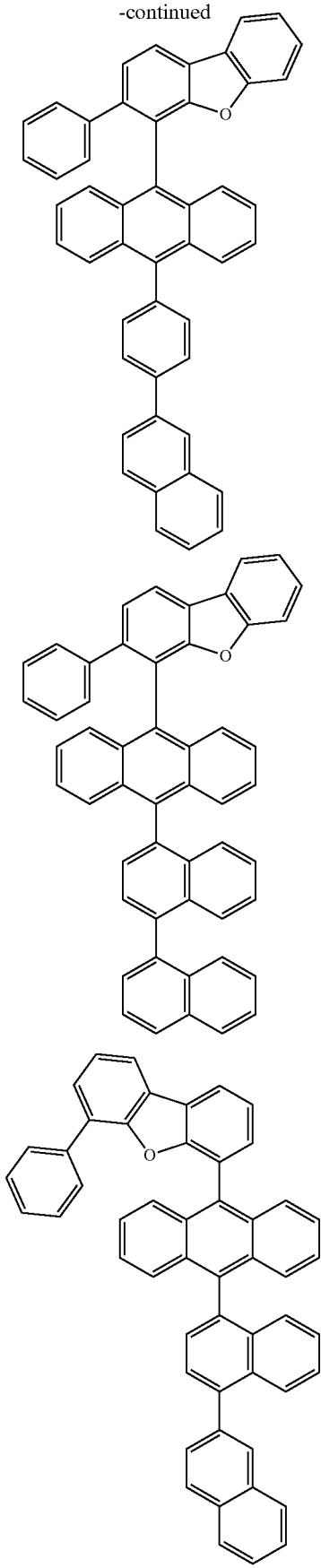
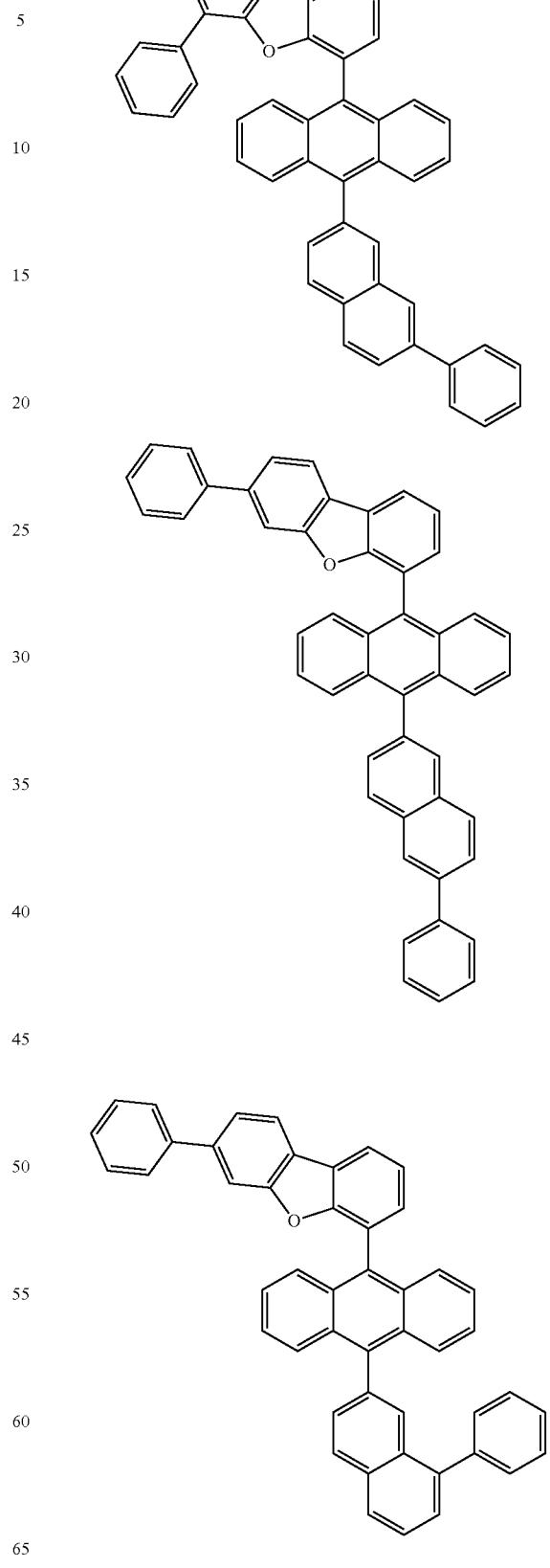

223
-continued
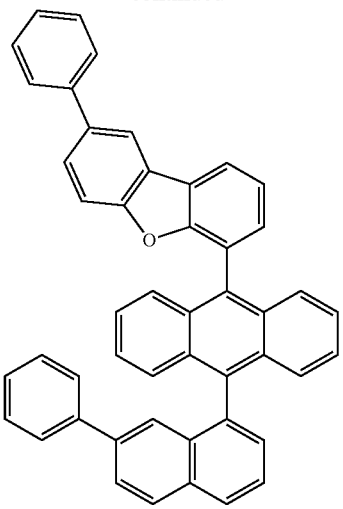
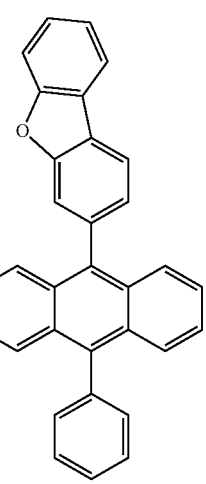
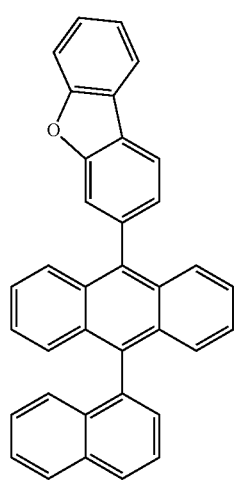
224
-continued
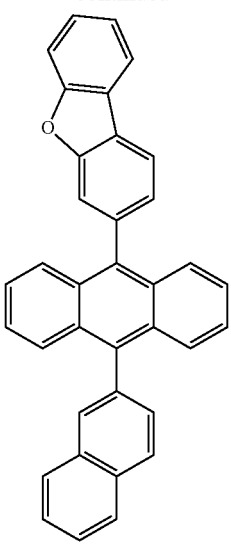
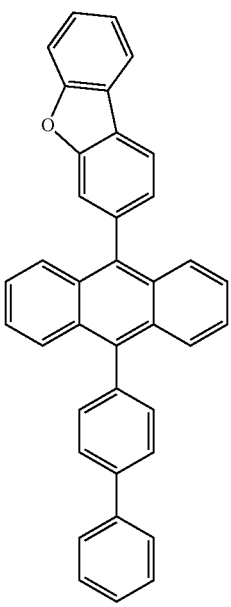

-continued
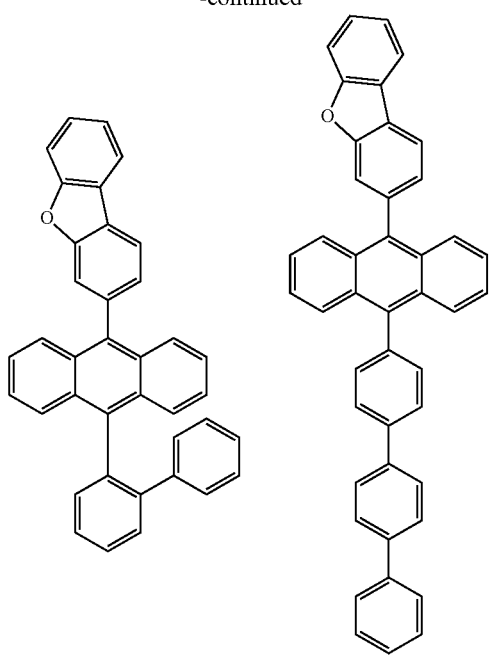
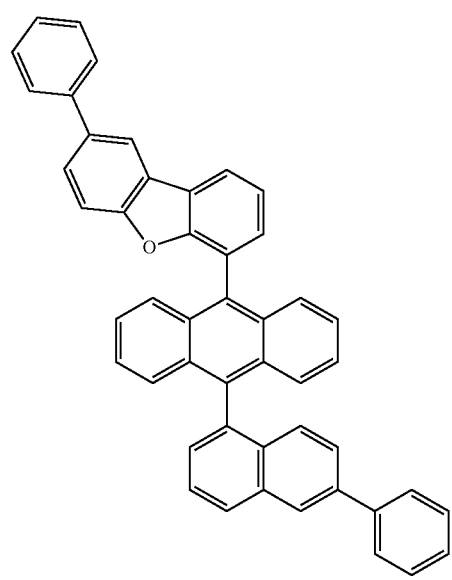
-continued
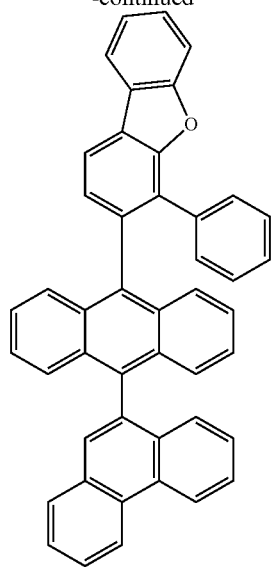
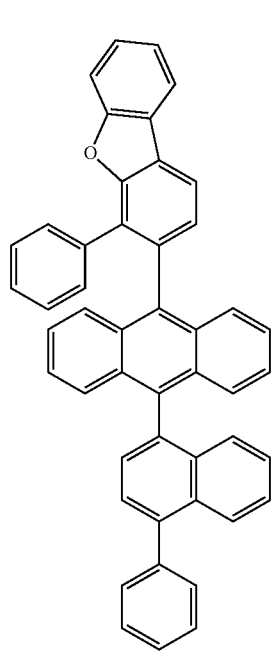

227
-continued
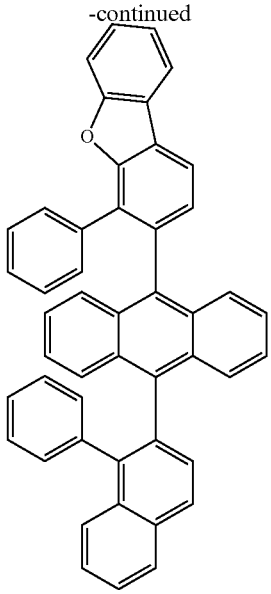
228
-continued
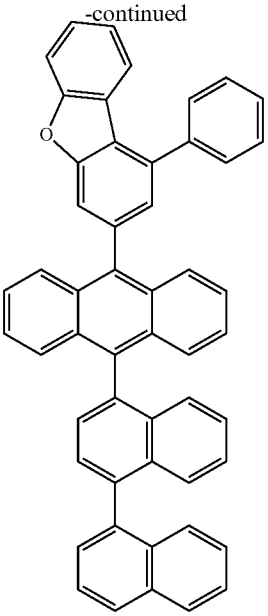
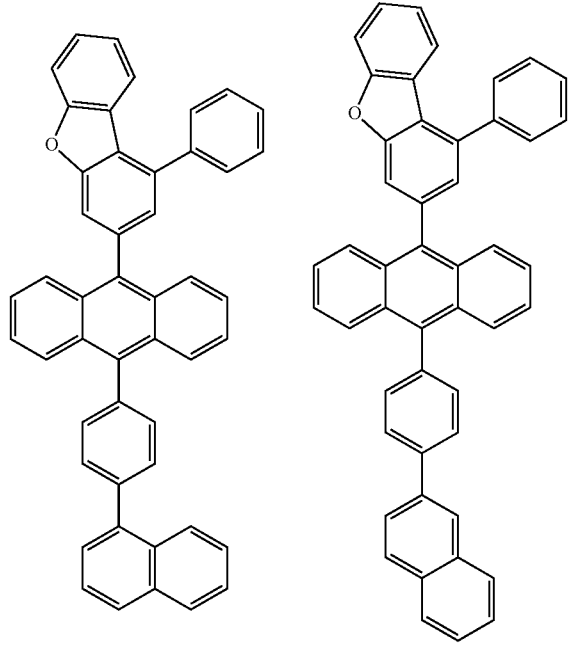
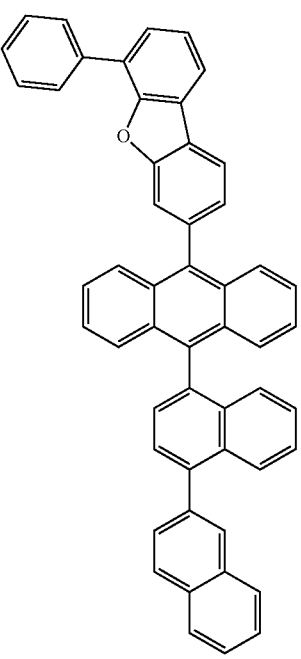

229
-continued
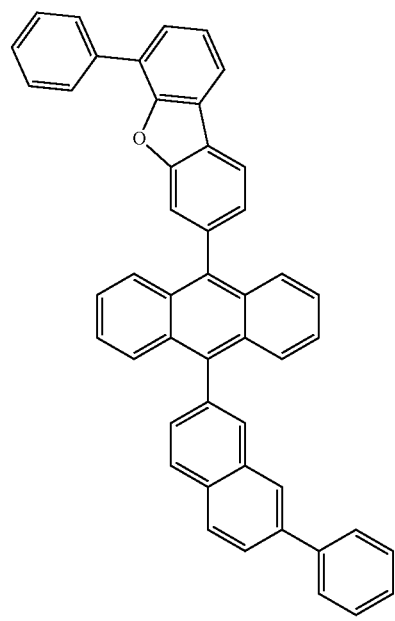
230
-continued
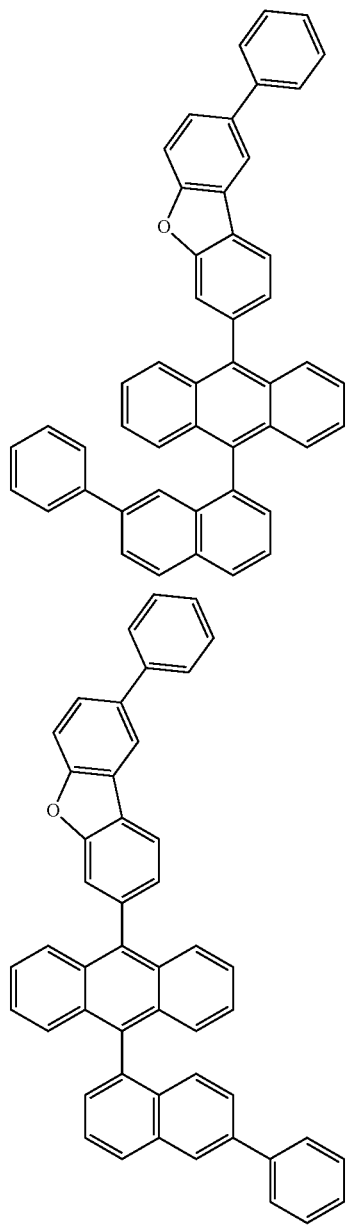
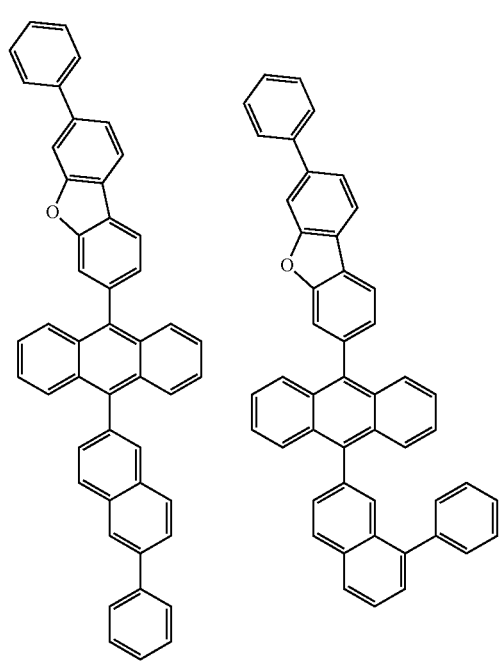
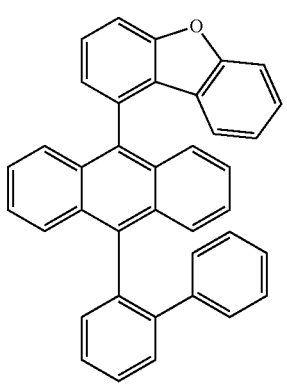

231
-continued
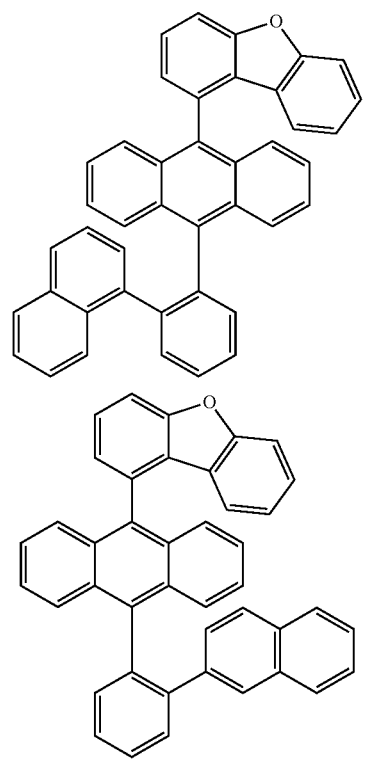
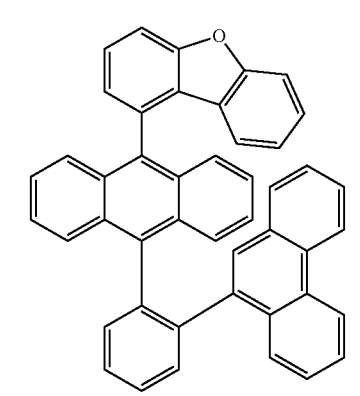
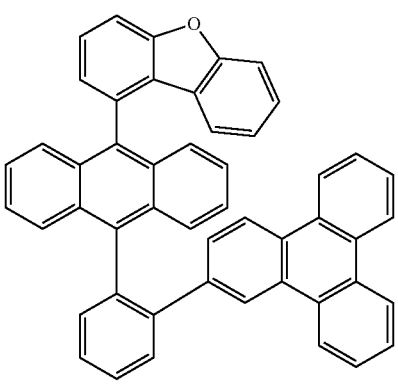
232
-continued
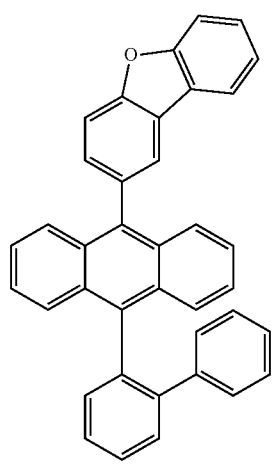
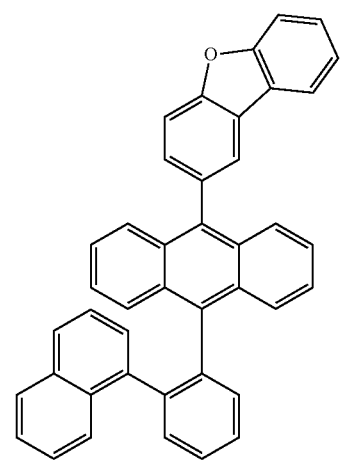
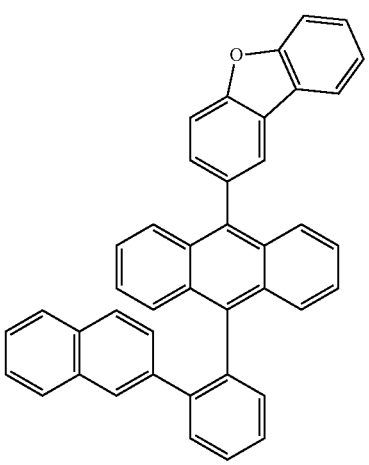

233
-continued
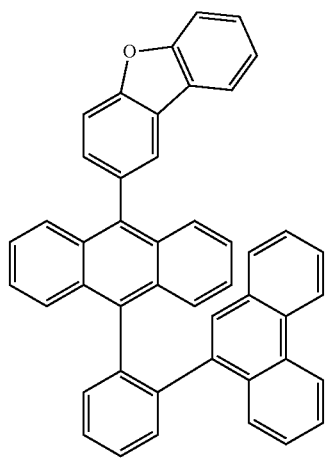
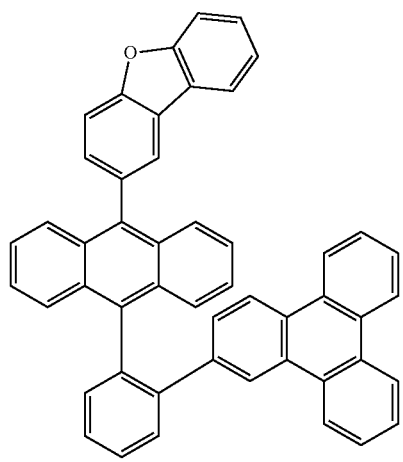
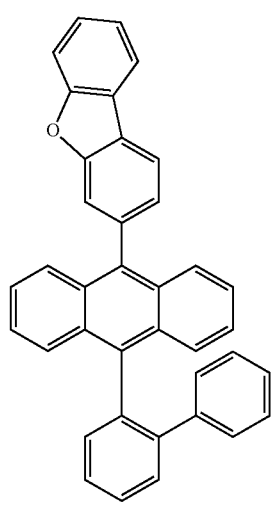
234
-continued
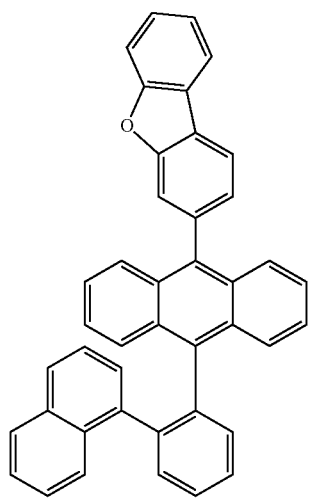
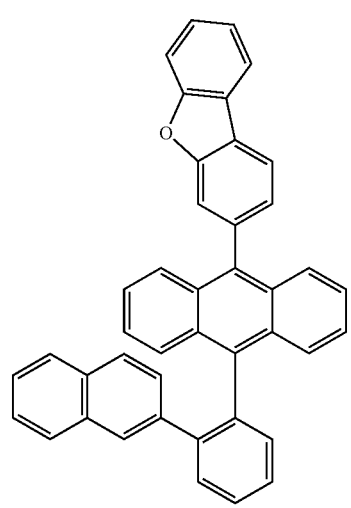
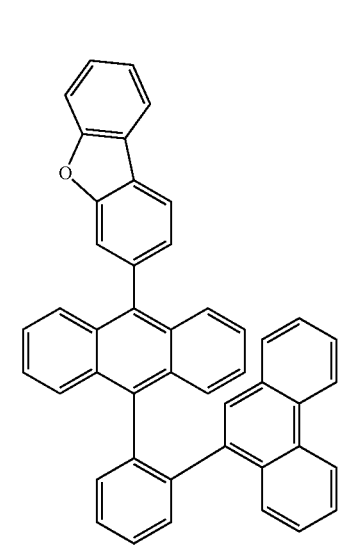

235
-continued
236
-continued
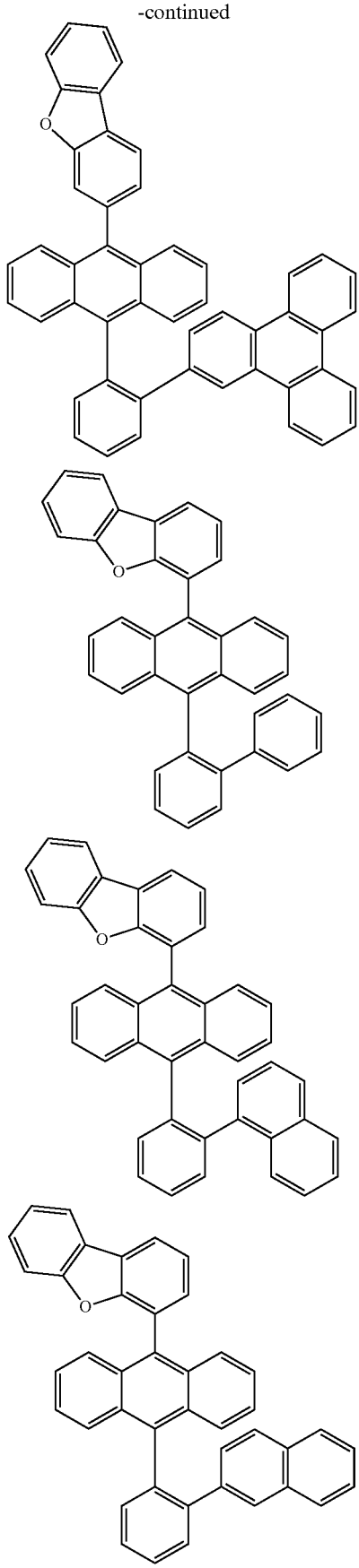
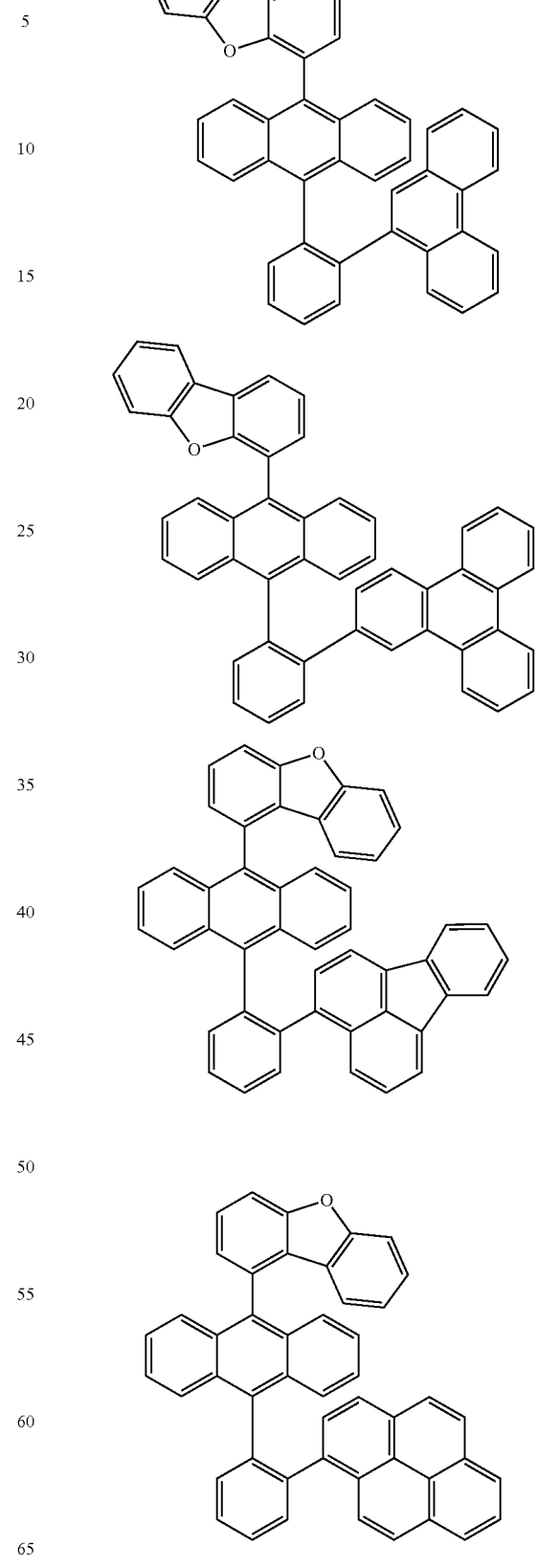

237
-continued
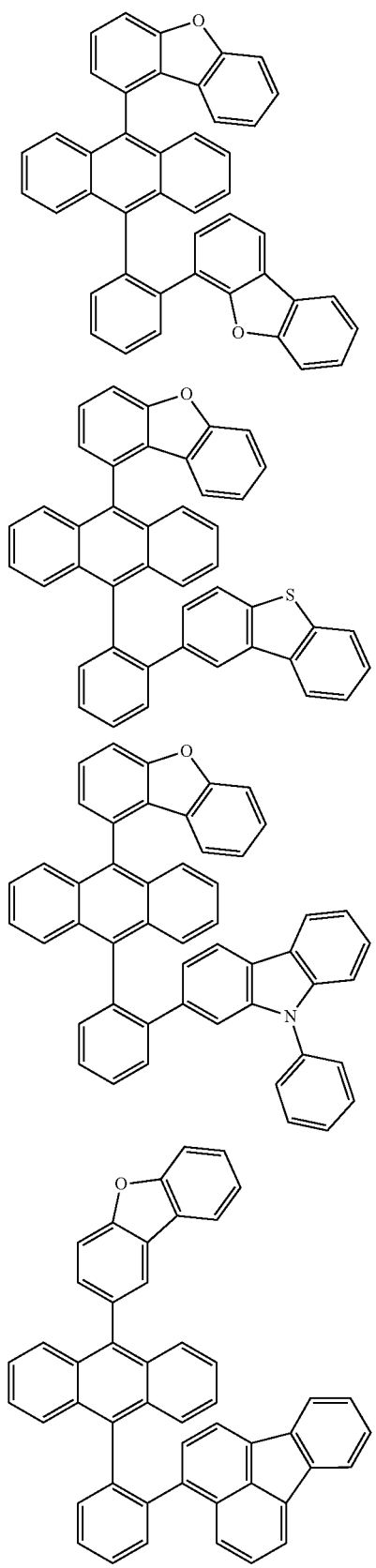
238
-continued
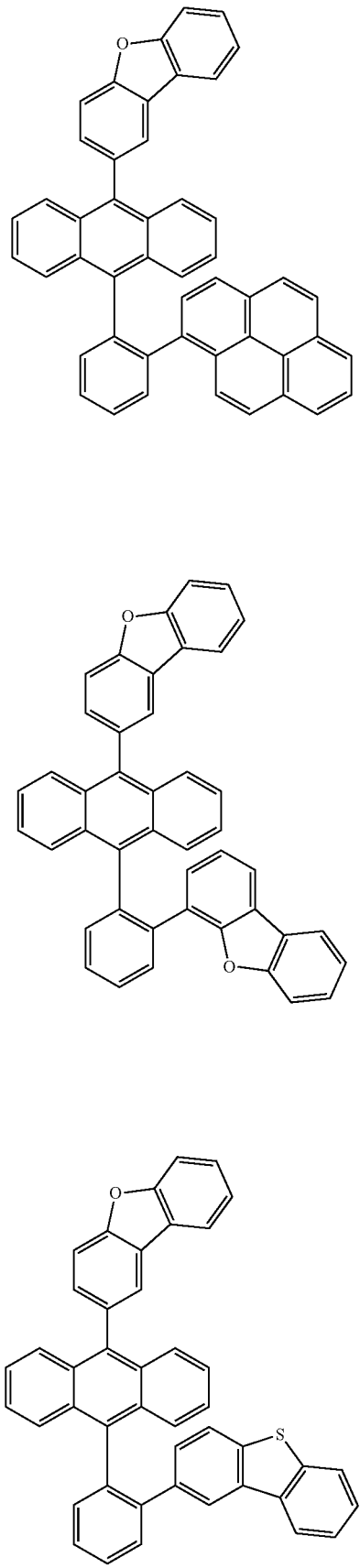

239
-continued
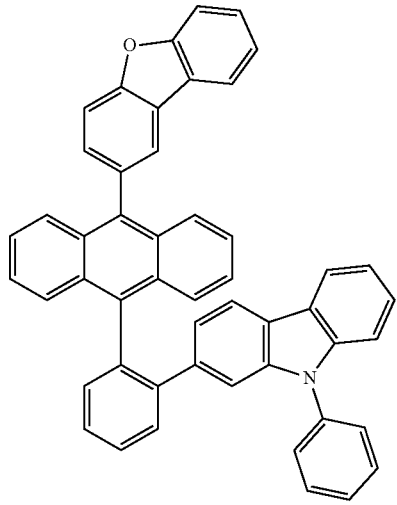
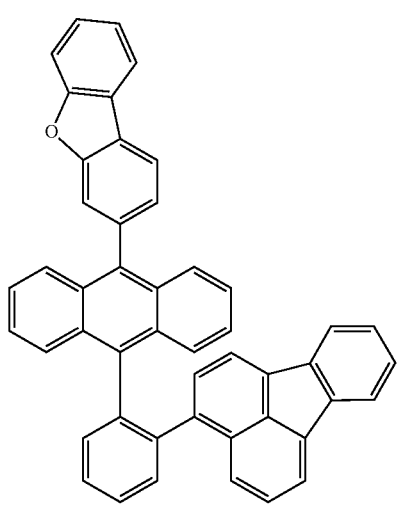
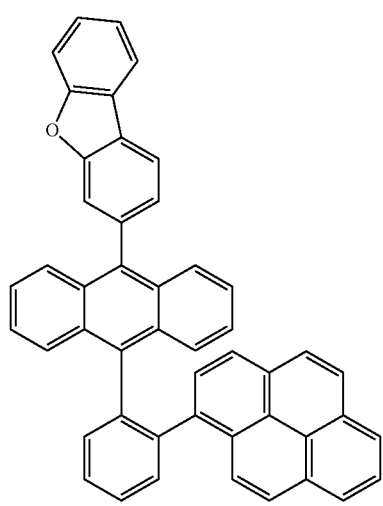
240
-continued
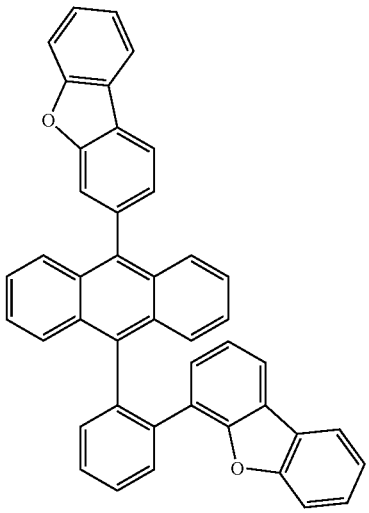
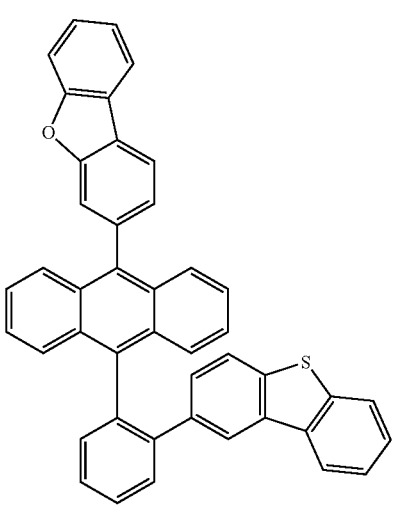
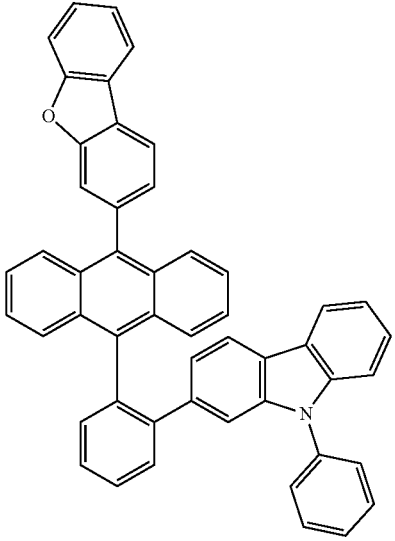

241
-continued
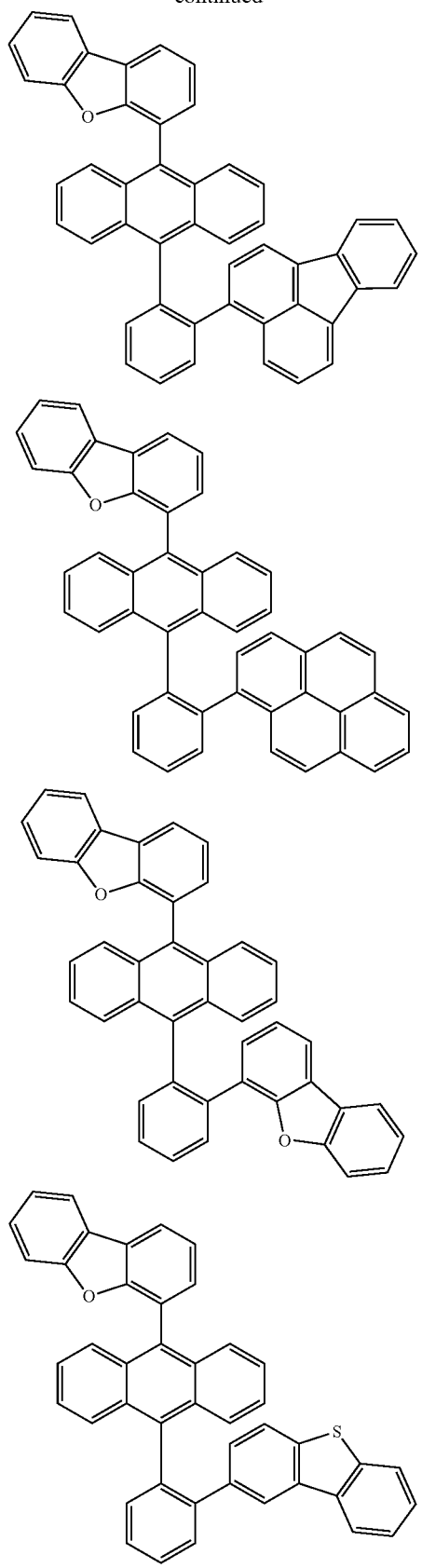
242
-continued
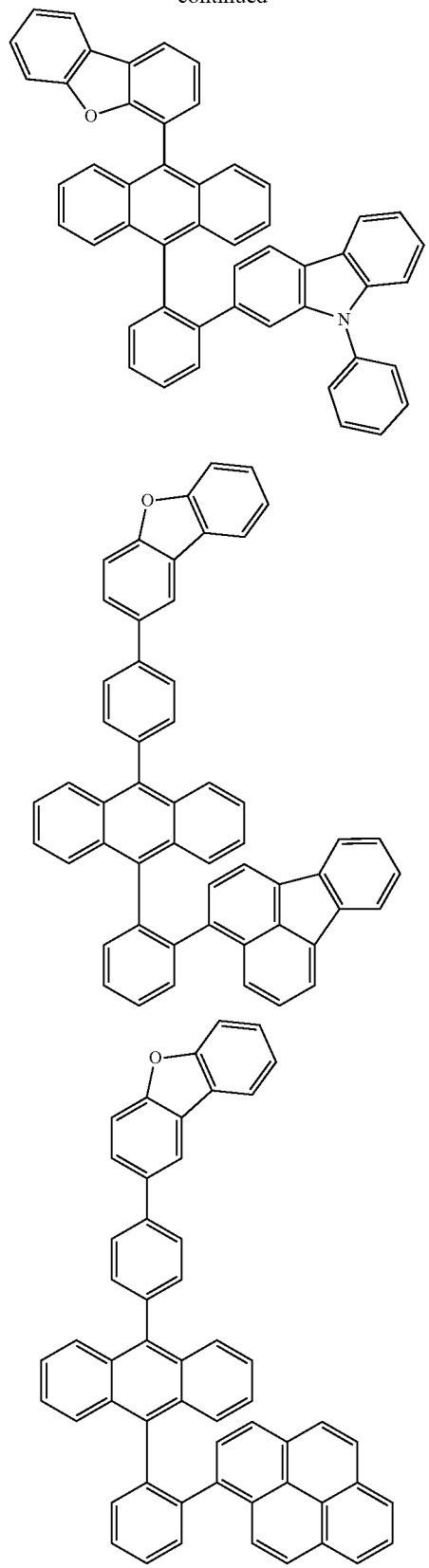

243
-continued
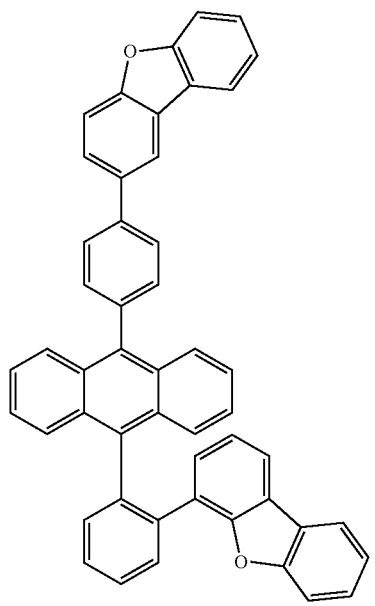
244
-continued
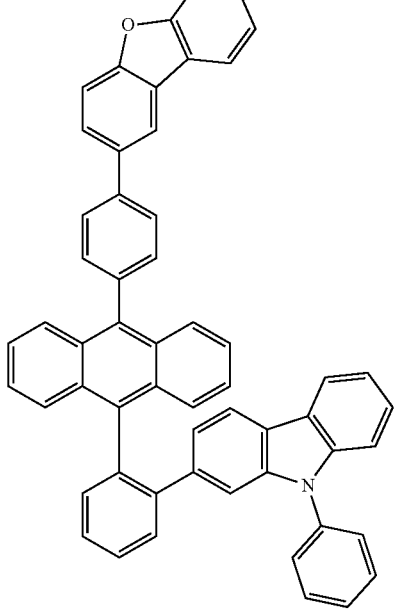
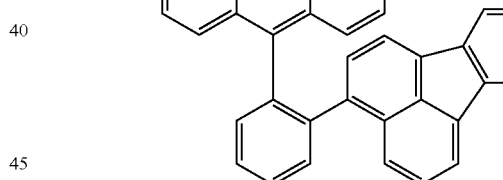
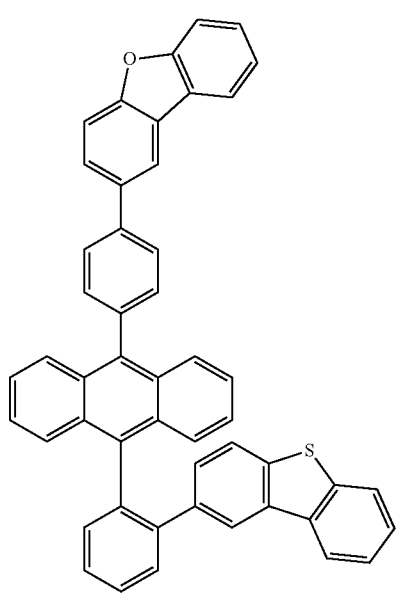
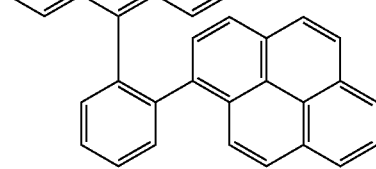

245
-continued
246
-continued
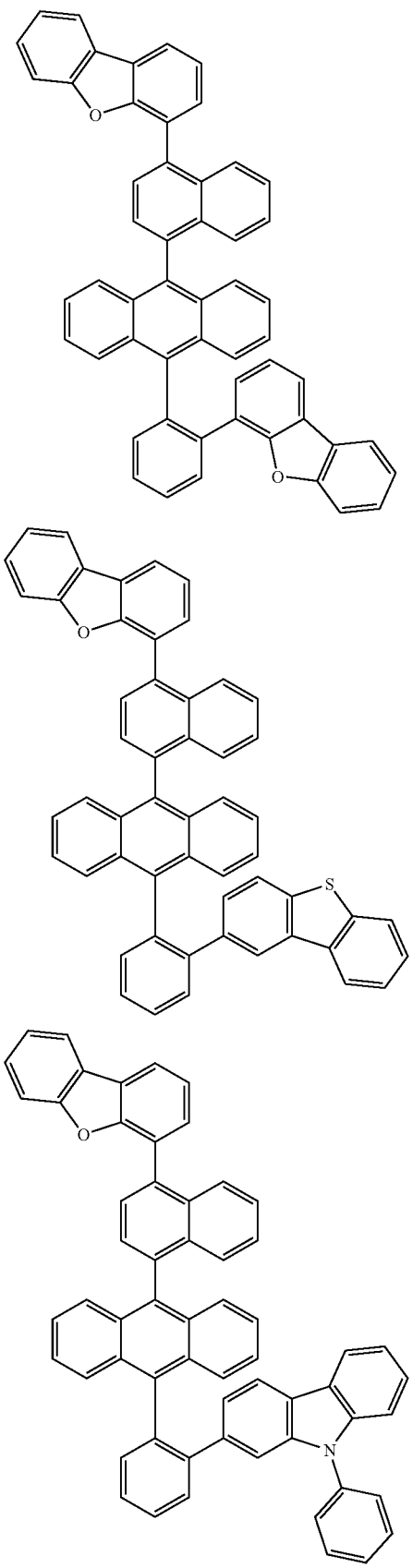
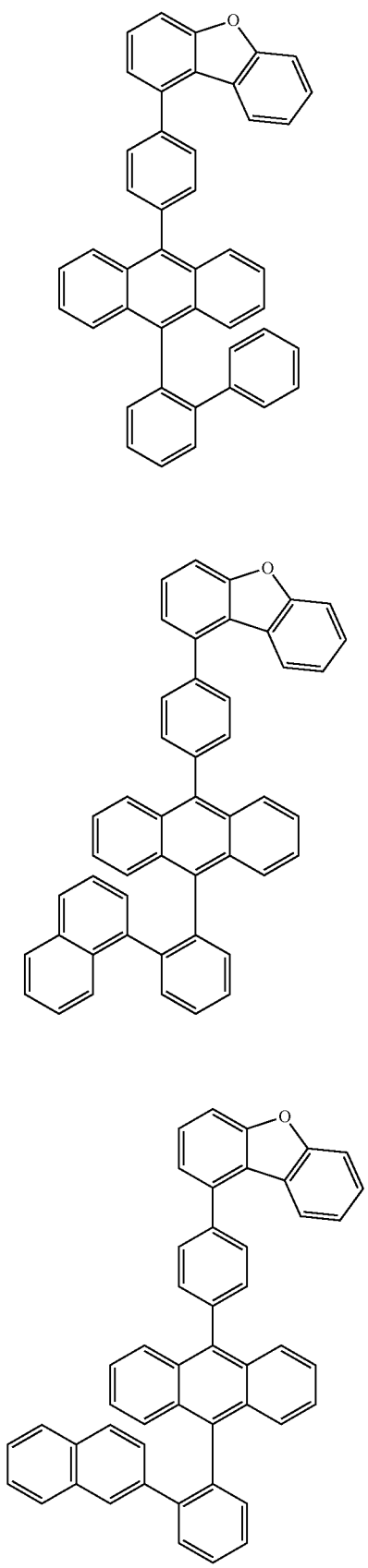

247
-continued
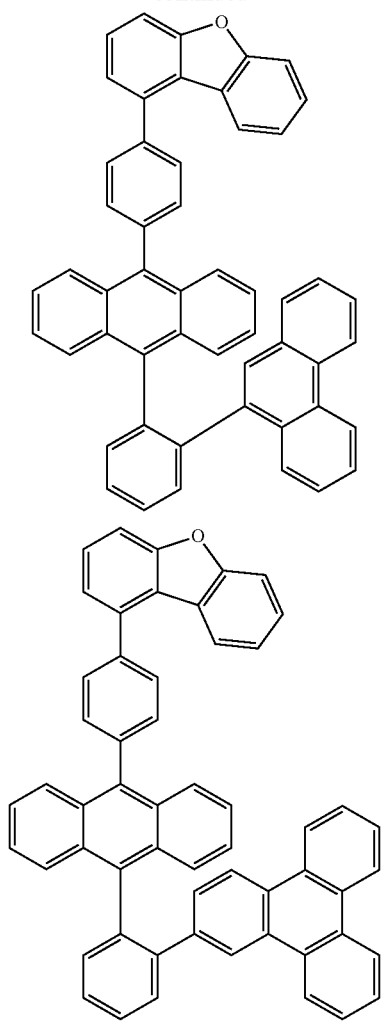
248
-continued
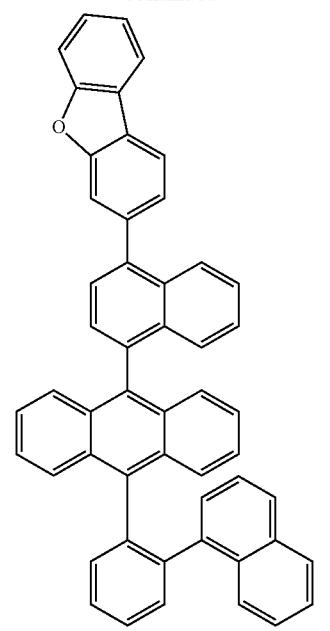
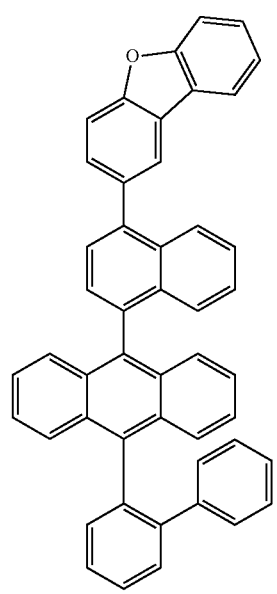
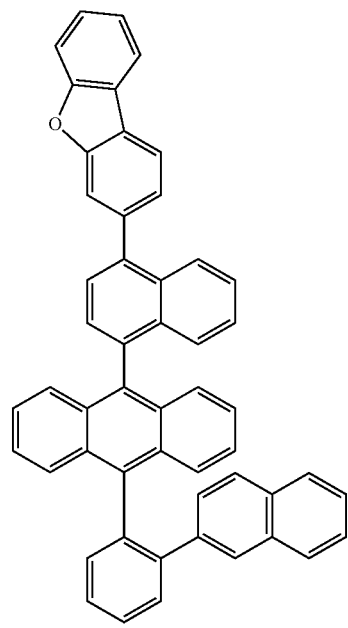

249
-continued
250
-continued
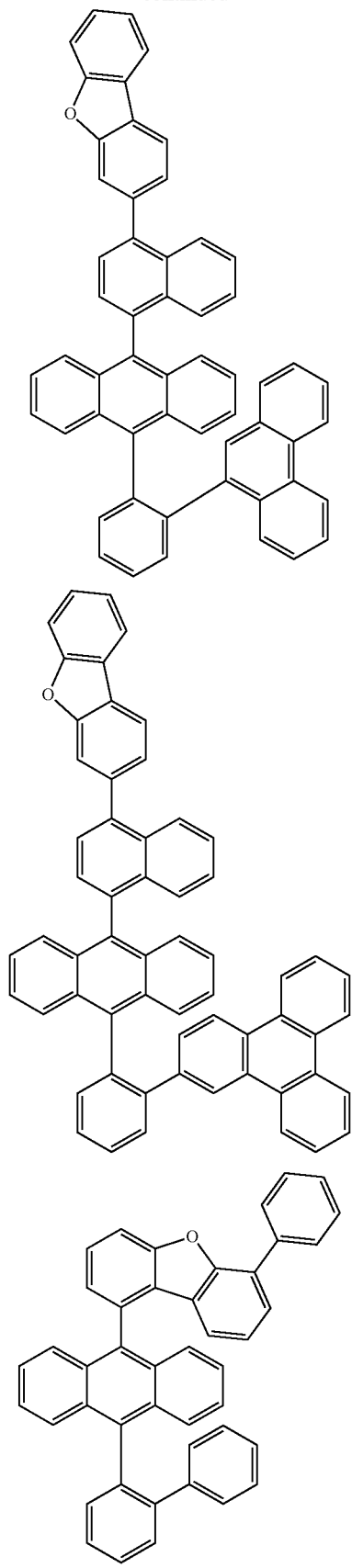
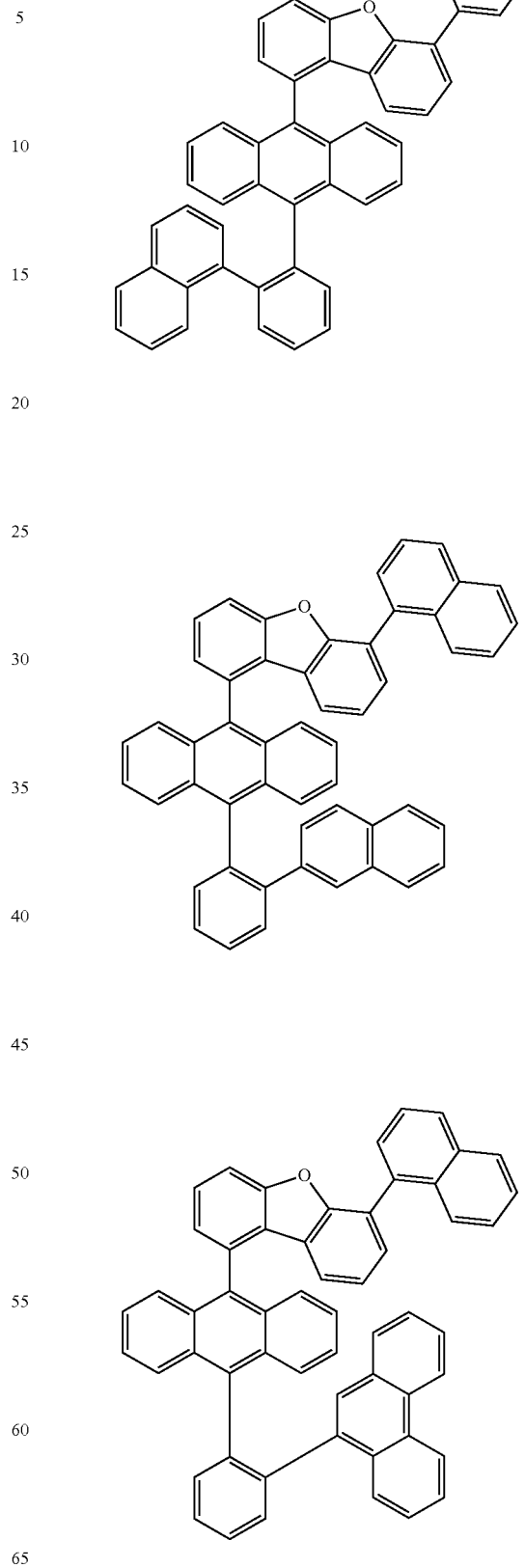

251
-continued
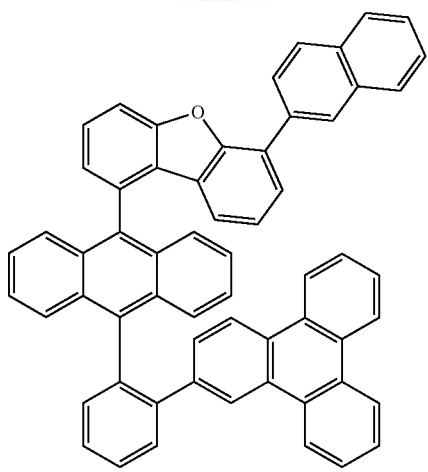
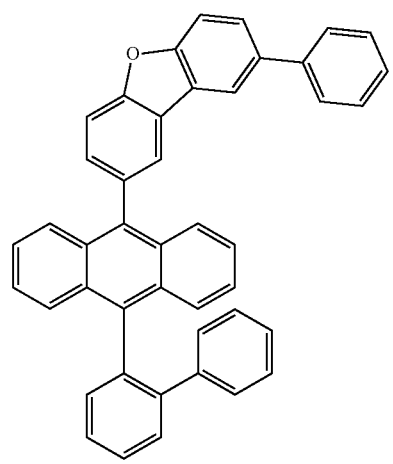
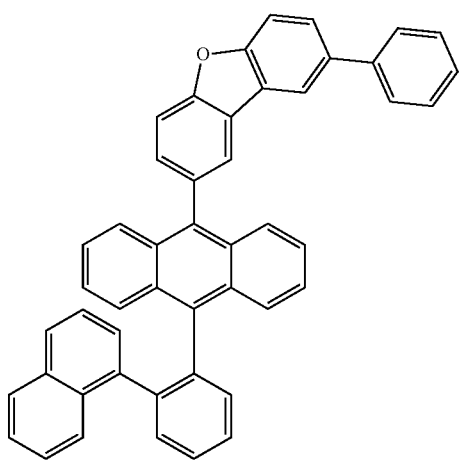
252
-continued
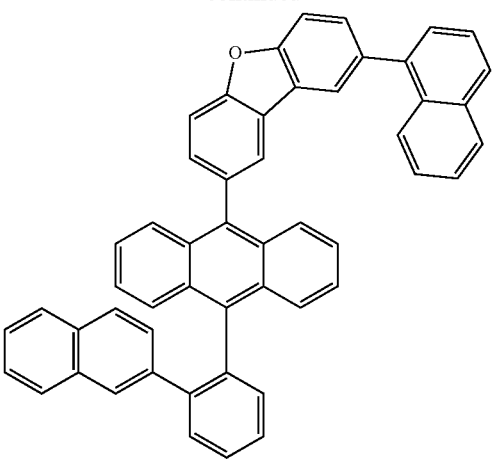
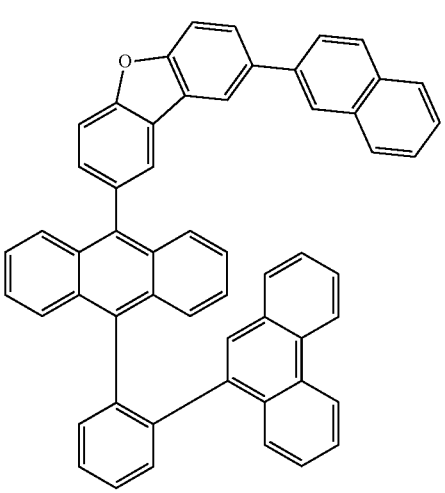
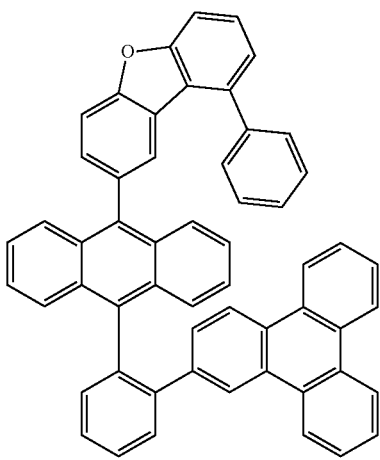

253
-continued
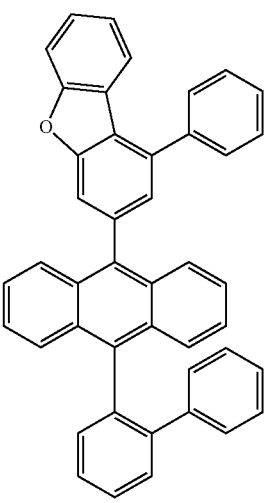
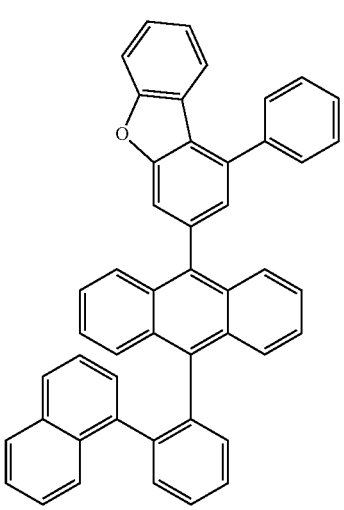
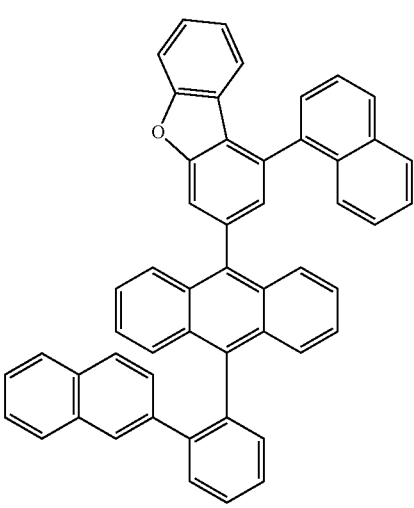
254
-continued
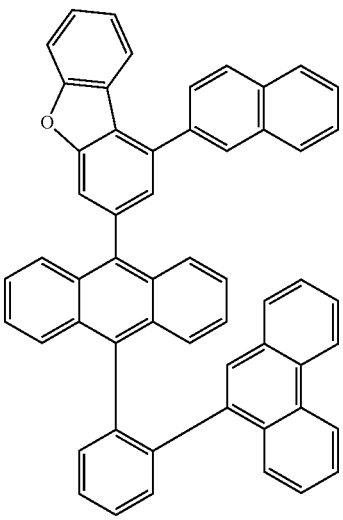
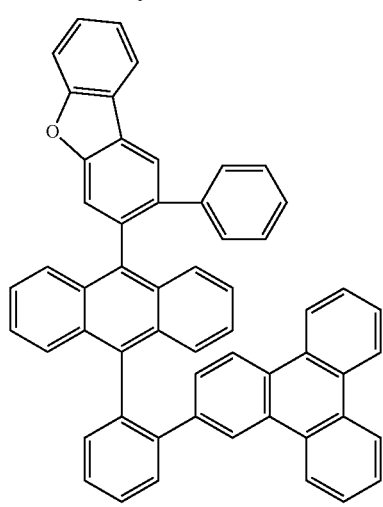
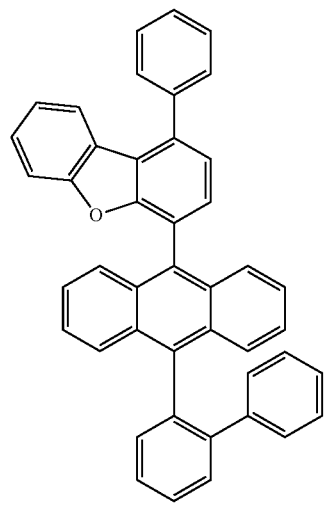

255
-continued
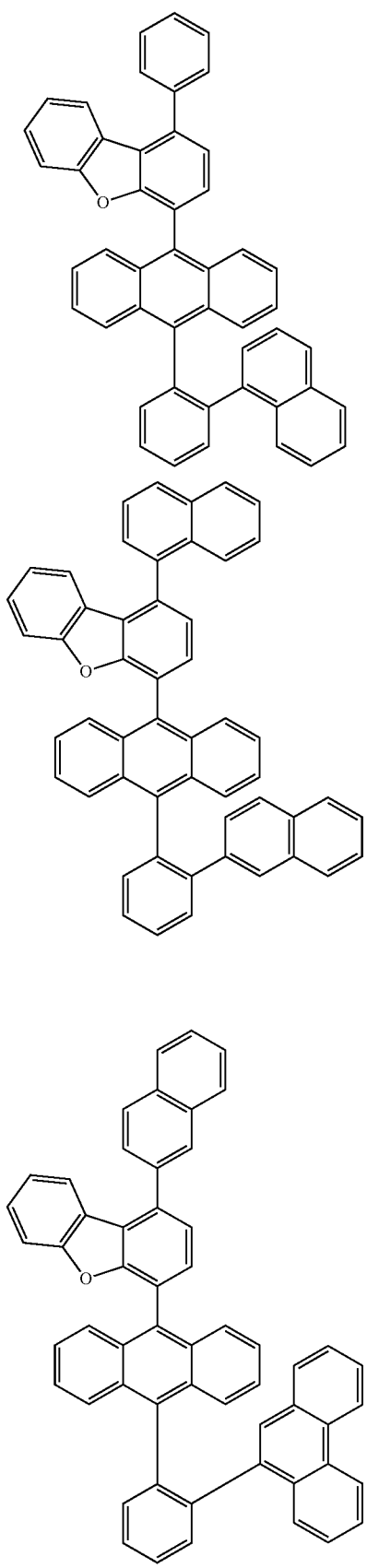
256
-continued
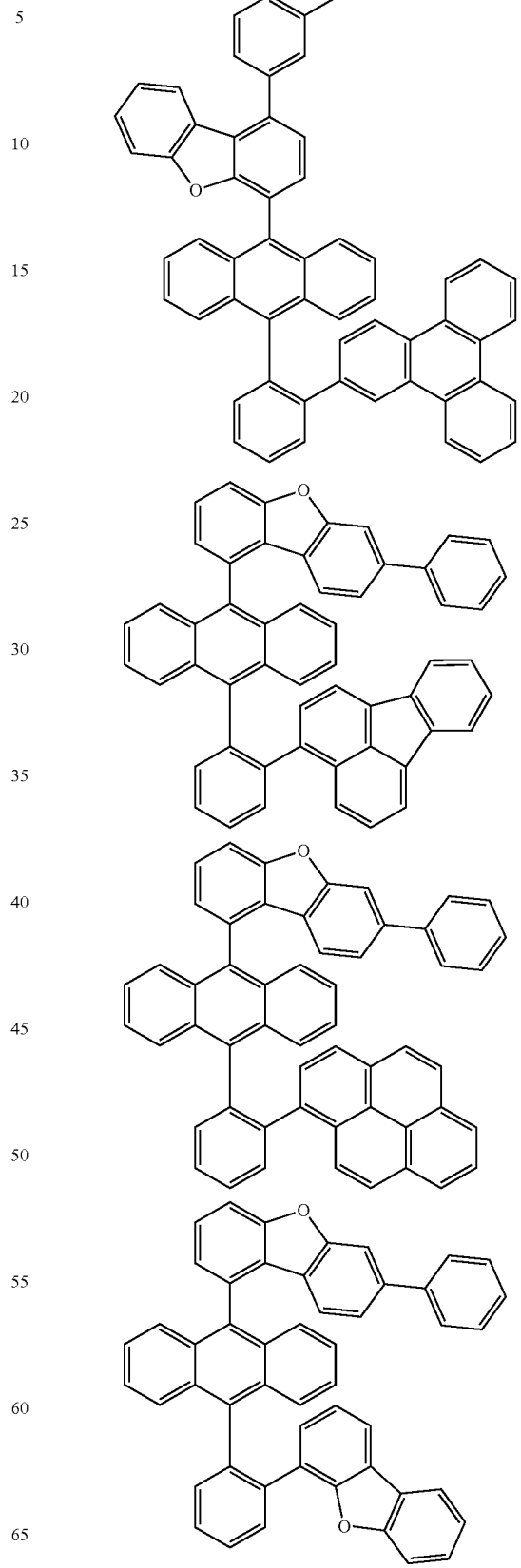

257
-continued
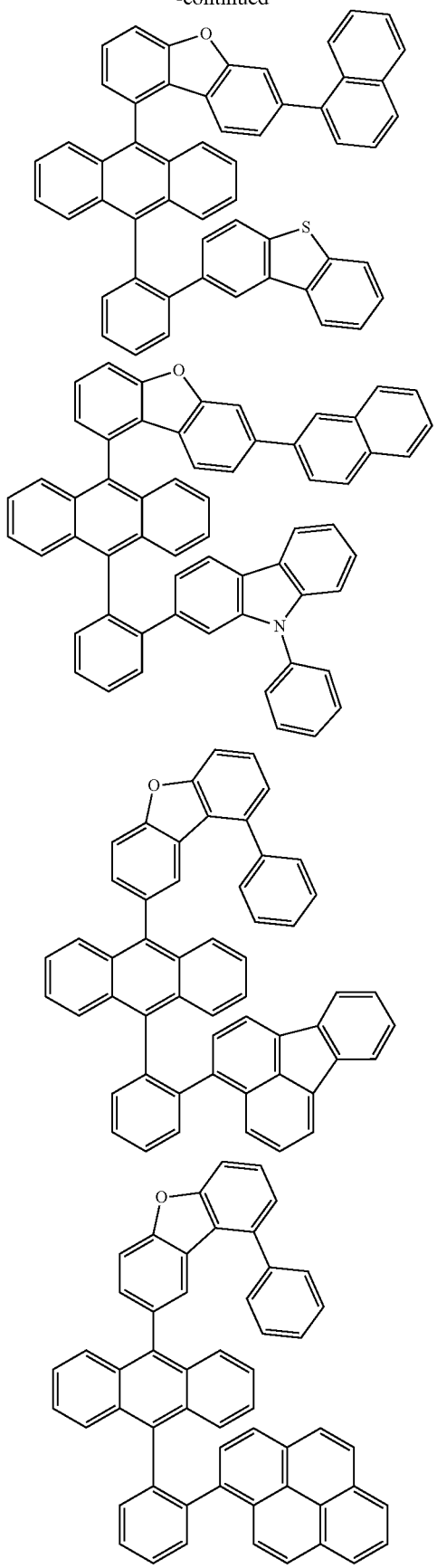
258
-continued
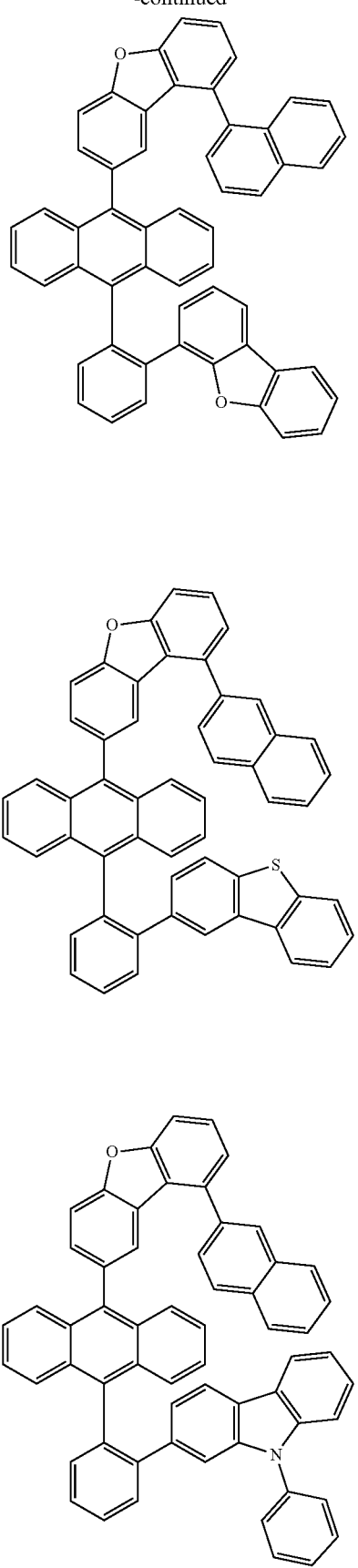

259
-continued
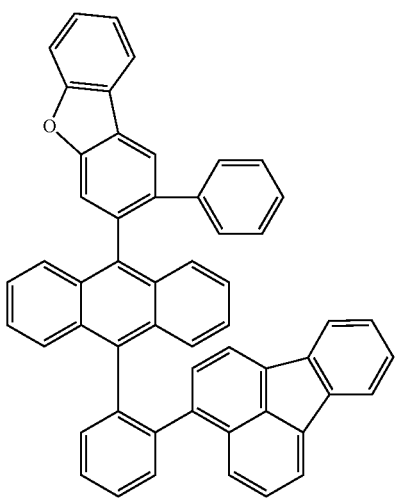
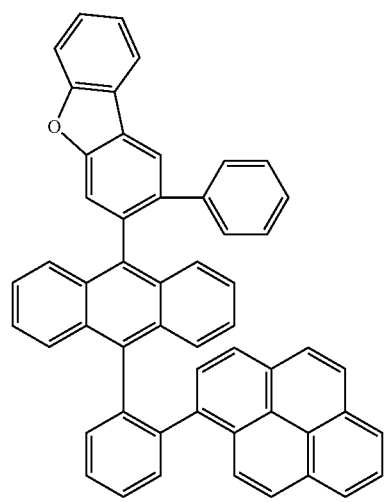
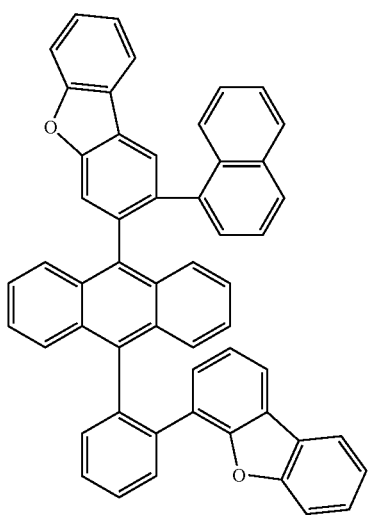
260
-continued
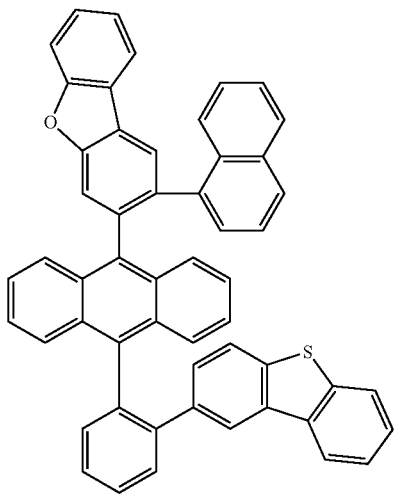
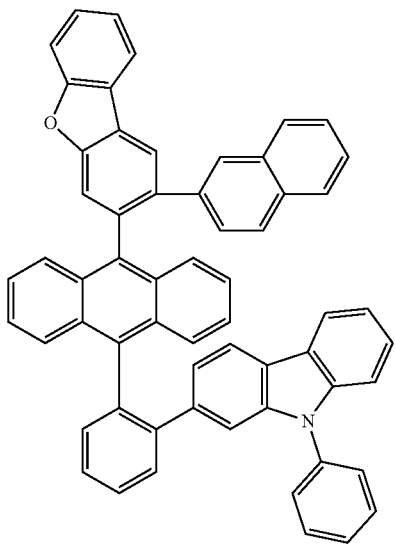
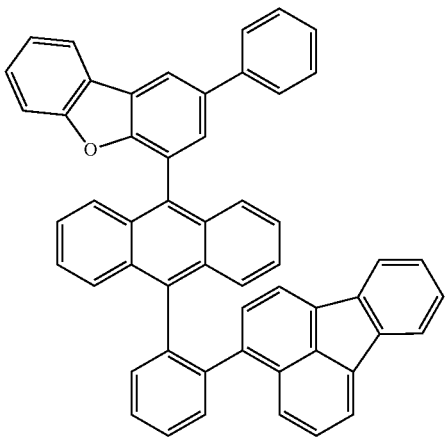

-continued

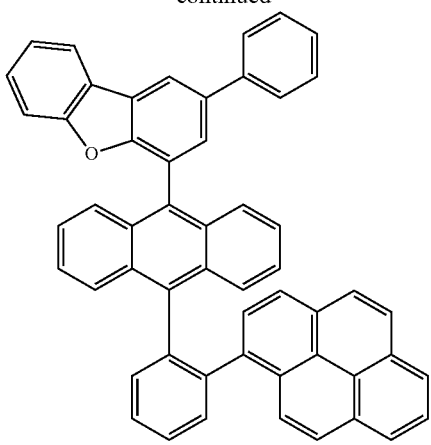

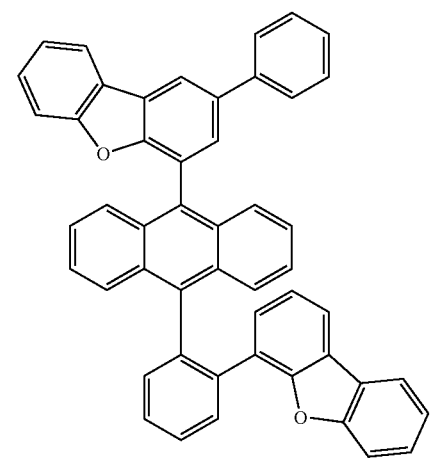

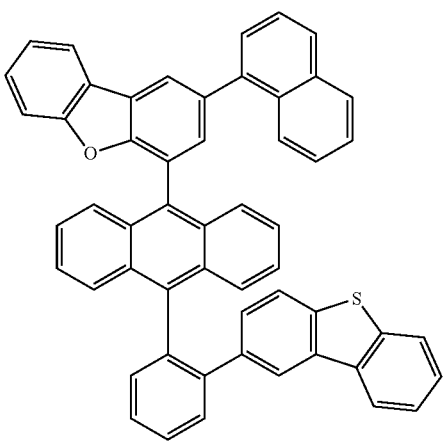

-continued

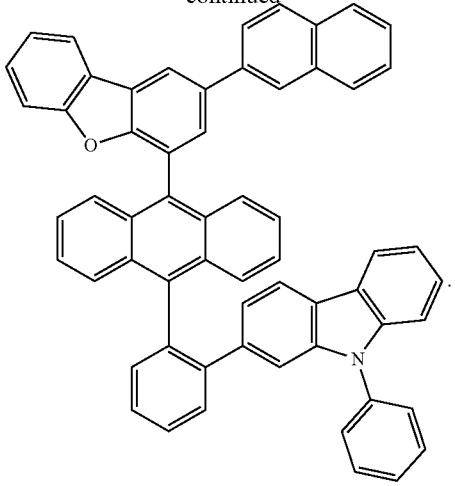

13. An organic light emitting device comprising:
a first electrode;
a second electrode; and
a light emitting layer provided between the first electrode and the second electrode,
wherein the light emitting layer includes a compound of Chemical Formula 1, a compound of Chemical Formula 2, and a compound of Chemical Formula 3-2:

Chemical Formula 1

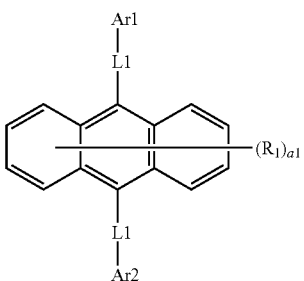

Chemical Formula 2

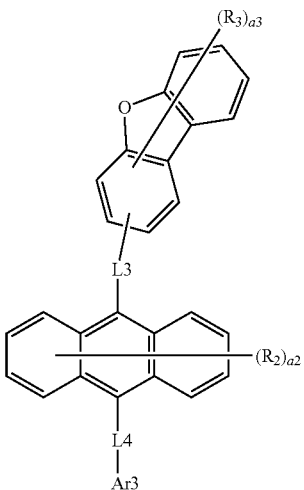

wherein in Chemical Formulae 1 and 2:

L1 to L4 are the same as or different from each other, and each independently a direct bond; or a substituted or unsubstituted arylene group;

Ar1 and Ar2 are the same as or different from each other, and each independently a substituted or unsubstituted aryl group;

Ar3 is a substituted or unsubstituted aryl group; or a substituted or unsubstituted heteroaryl group;

$R_1$ to $R_3$ are the same as or different from each other, and each independently hydrogen; deuterium; a halogen group; a cyano group; a silyl group; an alkyl group; a cycloalkyl group; an alkenyl group; an alkynyl group; an alkoxy group; an aryloxy group; an amino group; an aryl group; or a heteroaryl group; and a1 and a2 are each independently an integer of 0 to 8, a3 is an integer of 0 to 7, and when a1 is 2 or greater, R1s are the same as or different from each other, when a2 is 2 or greater, R2s are the same as or different from each other, and when a3 is 2 or greater, R3s are the same as or different from each other,

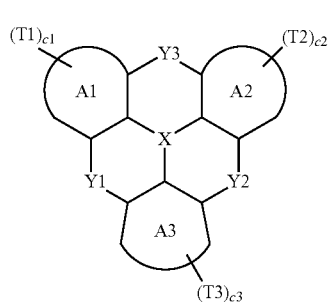

Chemical Formula 3-2 wherein in Chemical Formulae 3-2:

X is B;

A1 to A3 are the same as or different from each other, and each independently a monocyclic or polycyclic ring;

Y1 is O or $NR_{11}$, and Y2 is O or $NR_{12}$;

Y3 is $SiR_{27}R_{28}$;

$R_{11}$ and $R_{12}$ are the same as or different from each other, and each independently hydrogen; deuterium; an alkyl group; a cycloalkyl group; or an aryl group unsubstituted or substituted with an alkyl group, an arylalkyl group or an aryl group;

$R_{27}$ and $R_{28}$ are the same as or different from each other, and each independently hydrogen, deuterium, an alkyl group, a cycloalkyl group or an aryl group;

T1 to T3 are the same as or different from each other, and each independently hydrogen; deuterium; a hydroxyl group; an alkyl group; a cycloalkyl group; an alkoxy group; an aryloxy group; an aryl group; a heteroaryl group; or —$NR_{41}R_{42}$, and $R_{41}$ and $R_{42}$ are the same as or different from each other and each independently hydrogen; an alkyl group; an aryl group unsubstituted or substituted with an alkyl group or a silyl group; or a heteroaryl group; and c1 to c3 are each independently an integer of 0 or greater, and when c1 is 2 or greater, T1s are the same as or different from each other, when c2 is 2 or greater, T2s are the same as or different from each other, when c3 is 2 or greater, T3s are the same as or different from each other.

14. The organic light emitting device of claim 13, wherein:

L1 to L4 are the same as or different from each other, and each independently a direct bond; a phenylene group; a biphenylene group; or a naphthalene group; and Ar1 and Ar2 are the same as or different from each other, and each independently a phenyl group; a biphenyl group; a terphenyl group; or a naphthyl group.

15. The organic light emitting device of claim 13, wherein Ar3 is a substituted or unsubstituted phenyl group; a substituted or unsubstituted biphenyl group; a substituted or unsubstituted terphenyl group; a substituted or unsubstituted naphthyl group; a substituted or unsubstituted phenanthrenyl group; a substituted or unsubstituted triphenylenyl group; a substituted or unsubstituted fluoranthenyl group; a substituted or unsubstituted pyrenyl group; a substituted or unsubstituted dibenzofuranyl group; a substituted or unsubstituted dibenzothiophenyl group; or a substituted or unsubstituted carbazolyl group.

16. The organic light emitting device of claim 13, wherein A1 to A3 are the same as or different from each other, and each independently benzene, naphthalene, triphenylene, 9,9'-spirobifluorene, dibenzofuran, dibenzothiophene, dibenzoselenophene, carbazole, indolocarbazole, naphthobenzofuran,

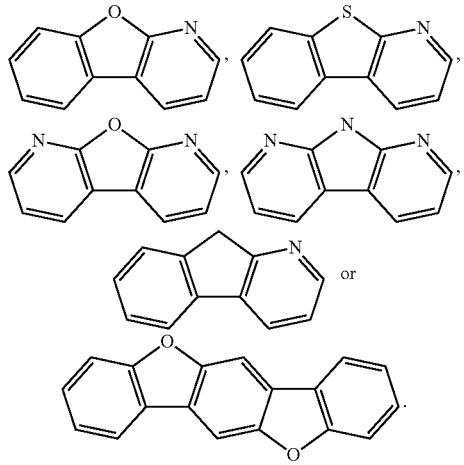

17. The organic light emitting device of claim 13, wherein Chemical Formula 3-2 is Chemical Formula 4-9:

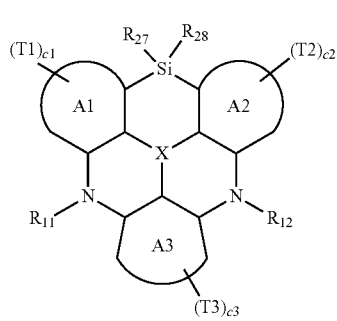

Chemical Formula 4-9 wherein in Chemical Formula 4-9:

X and A1 to A3 have the same definitions as in Chemical Formula 3-2;

$R_{11}$ and $R_{12}$ are the same as or different from each other, and each independently hydrogen; deuterium; an alkyl group; a cycloalkyl group; or an aryl group unsubstituted or substituted with an alkyl group, an arylalkyl group or an aryl group;

$R_{27}$ and $R_{28}$ are the same as or different from each other, and each independently hydrogen, deuterium, an alkyl group, a cycloalkyl group or an aryl group;

T1 to T3 are the same as or different from each other, and each independently hydrogen; deuterium; a hydroxyl group; an alkyl group; a cycloalkyl group; an alkoxy group; an aryloxy group; an aryl group; a heteroaryl group; or —$NR_{41}R_{42}$, and $R_{41}$ and $R_{42}$ are the same as or different from each other and each independently hydrogen; an alkyl group; a cycloalkyl group; an aryl group unsubstituted or substituted with an alkyl group or a silyl group; or a heteroaryl group; and c1 to c3 are each independently an integer of 0 or greater, and when c1 is 2 or greater, T1s are the same as or different from each other, when c2 is 2 or greater, T2s are the same as or different from each other, when c3 is 2 or greater, T3s are the same as or different from each other, when c4 is 2 or greater, T4s are the same as or different from each other, and when c5 is 2 or greater, T5s are the same as or different from each other.

18. The organic light emitting device of claim 13, wherein the compound of Chemical Formula 1 is one selected from among the following compounds:

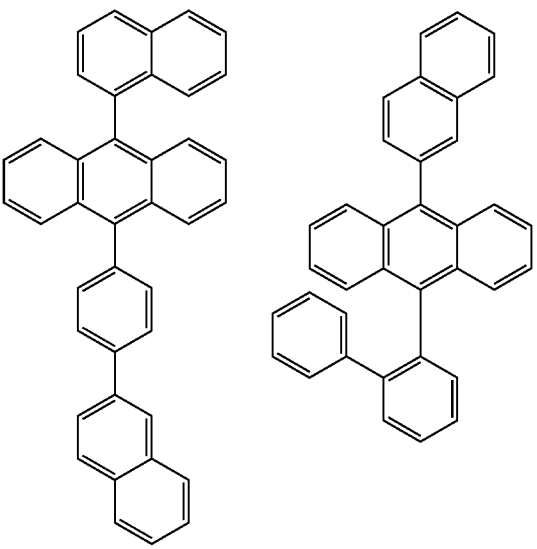
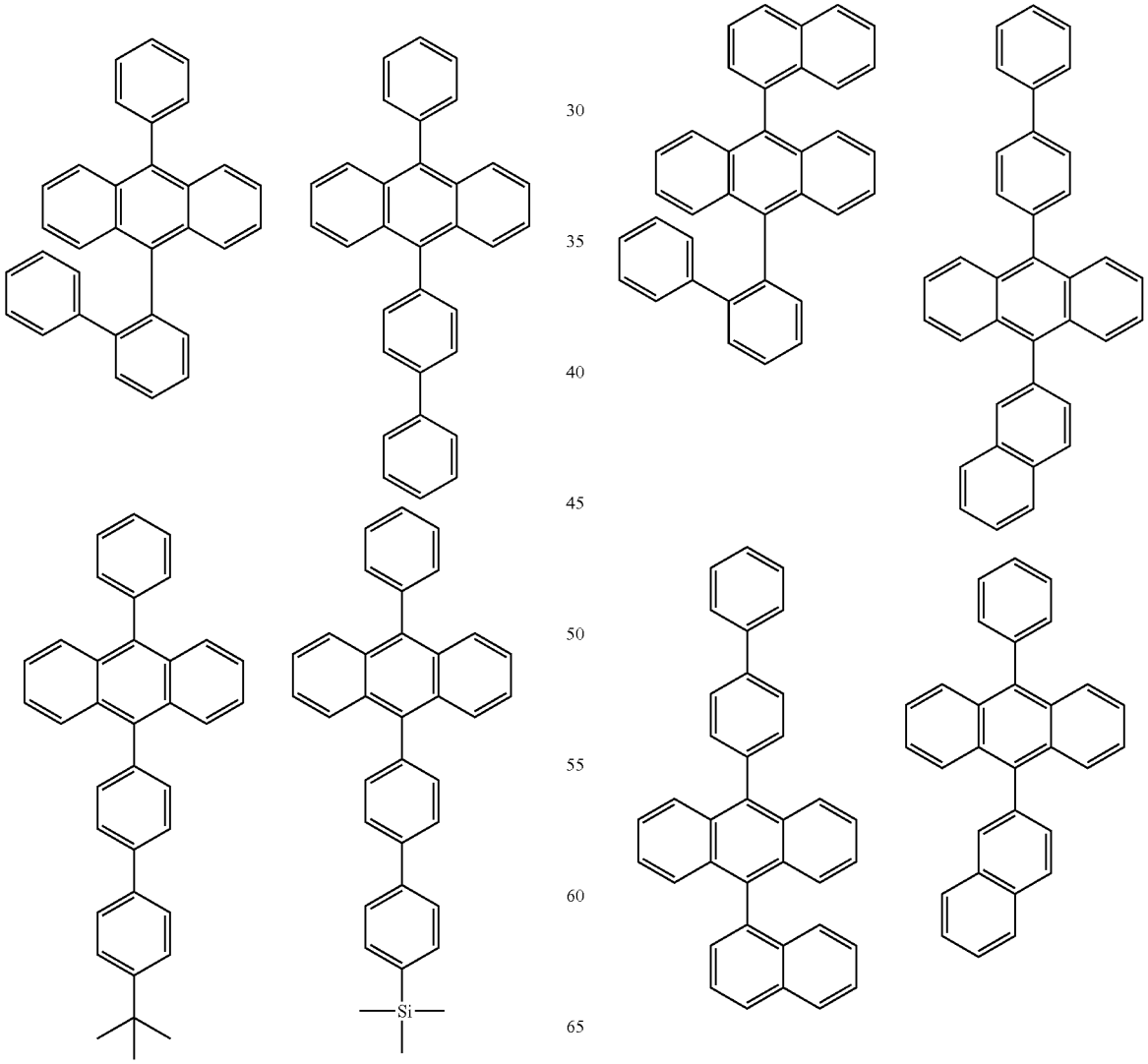

267
-continued
268
-continued
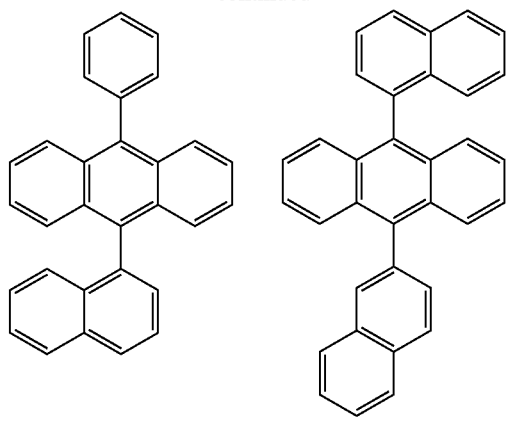
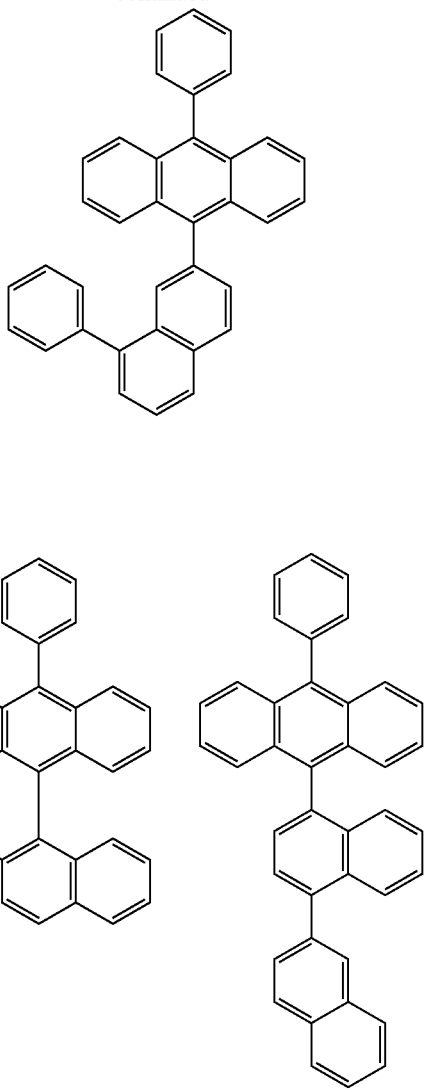

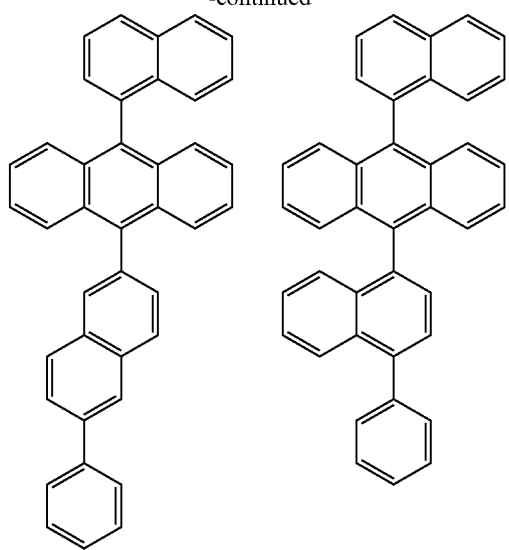
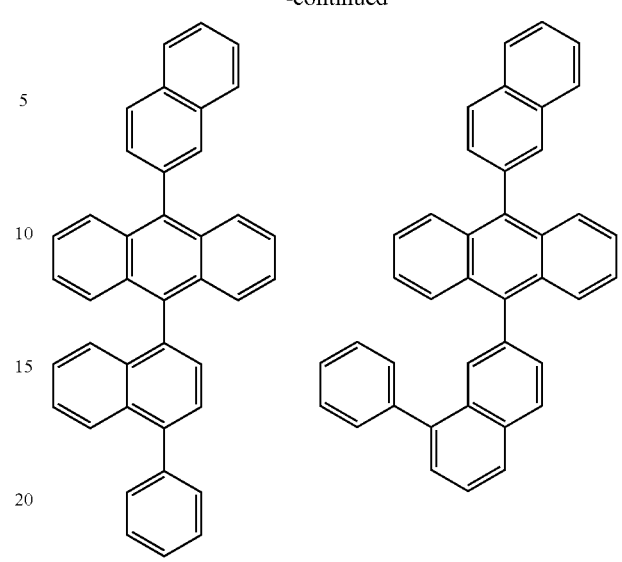
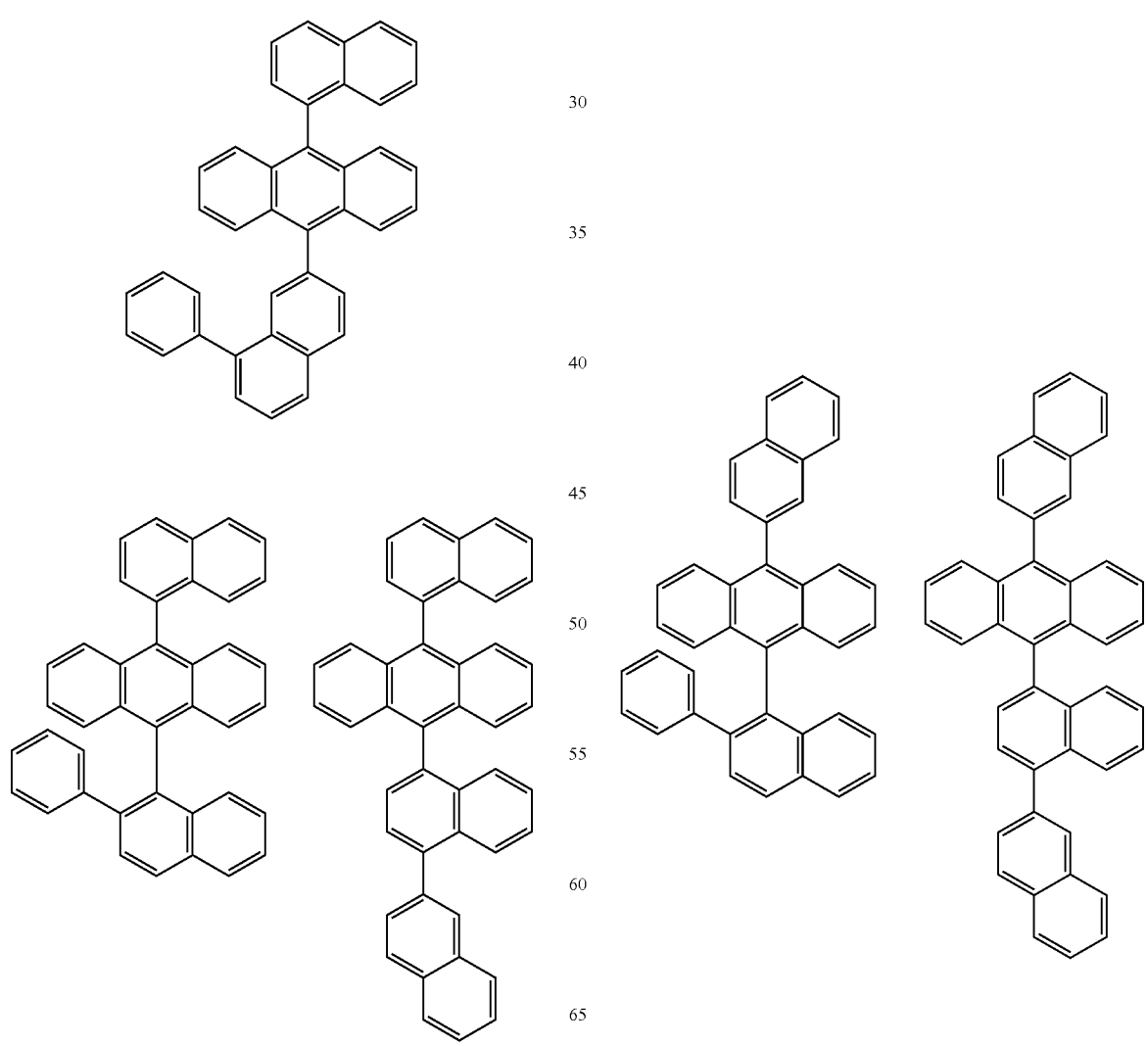

271
-continued
272
-continued
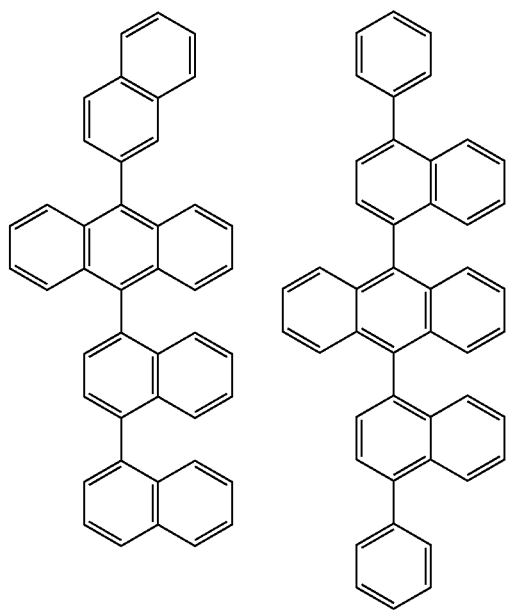
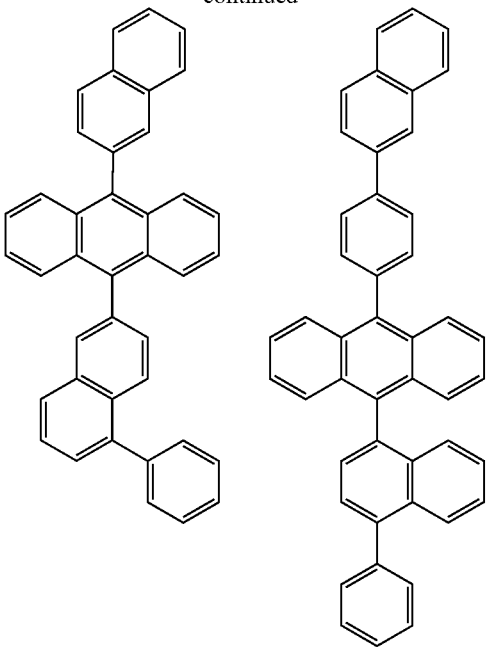
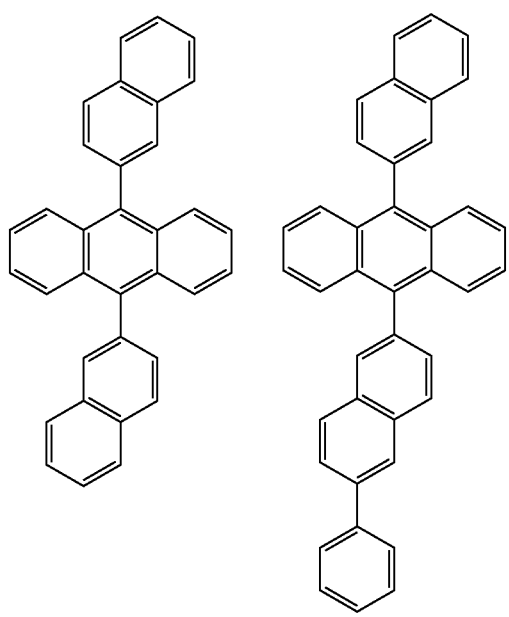

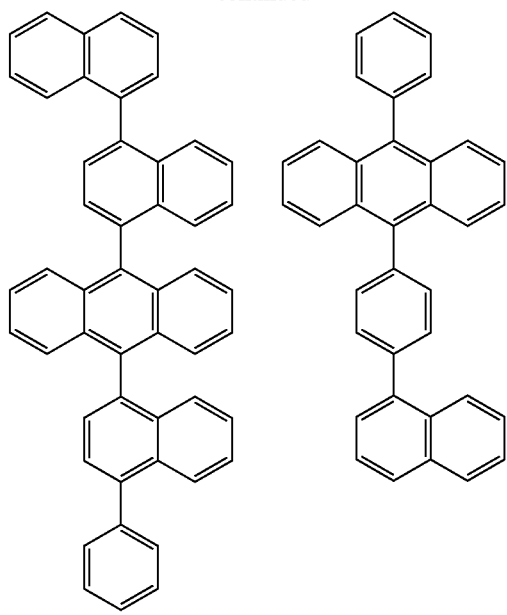
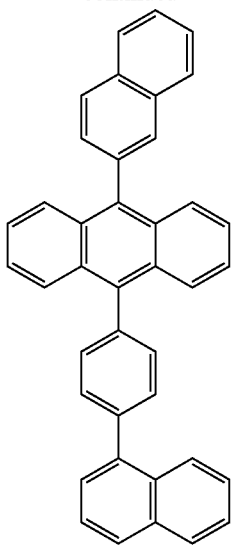
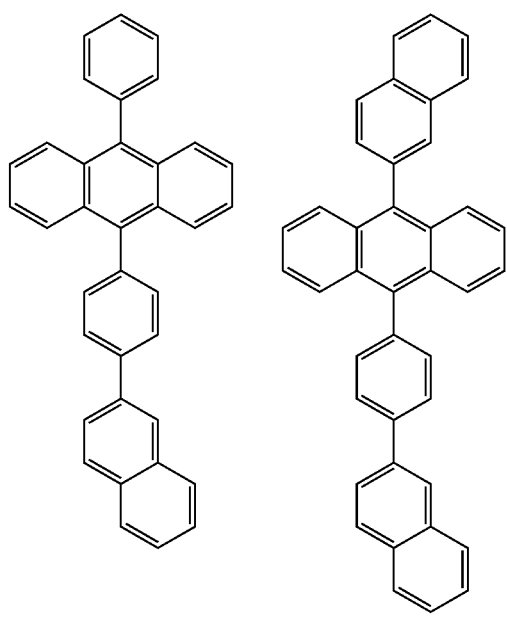
19. The organic light emitting device of claim 13, wherein the compound of Chemical Formula 2 is one selected from among the following compounds:
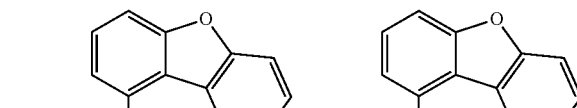
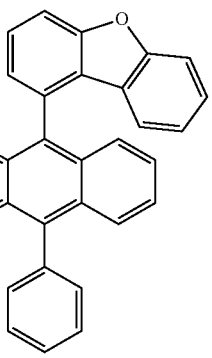
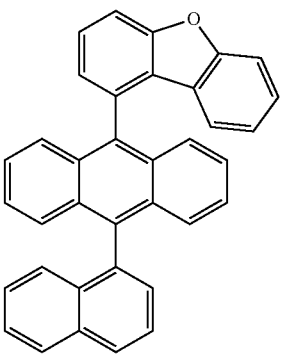
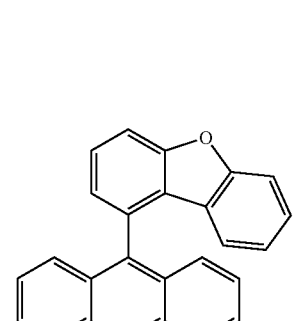
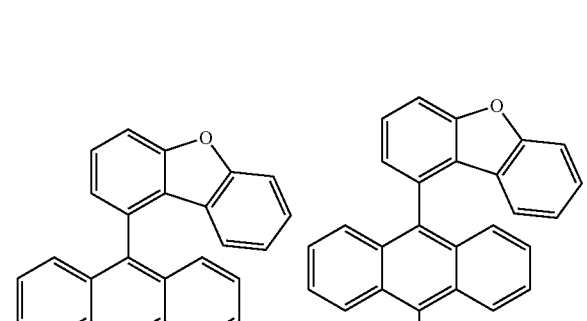
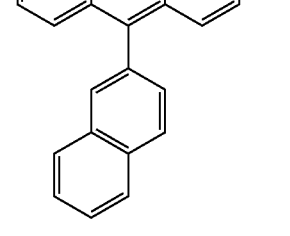

275
-continued
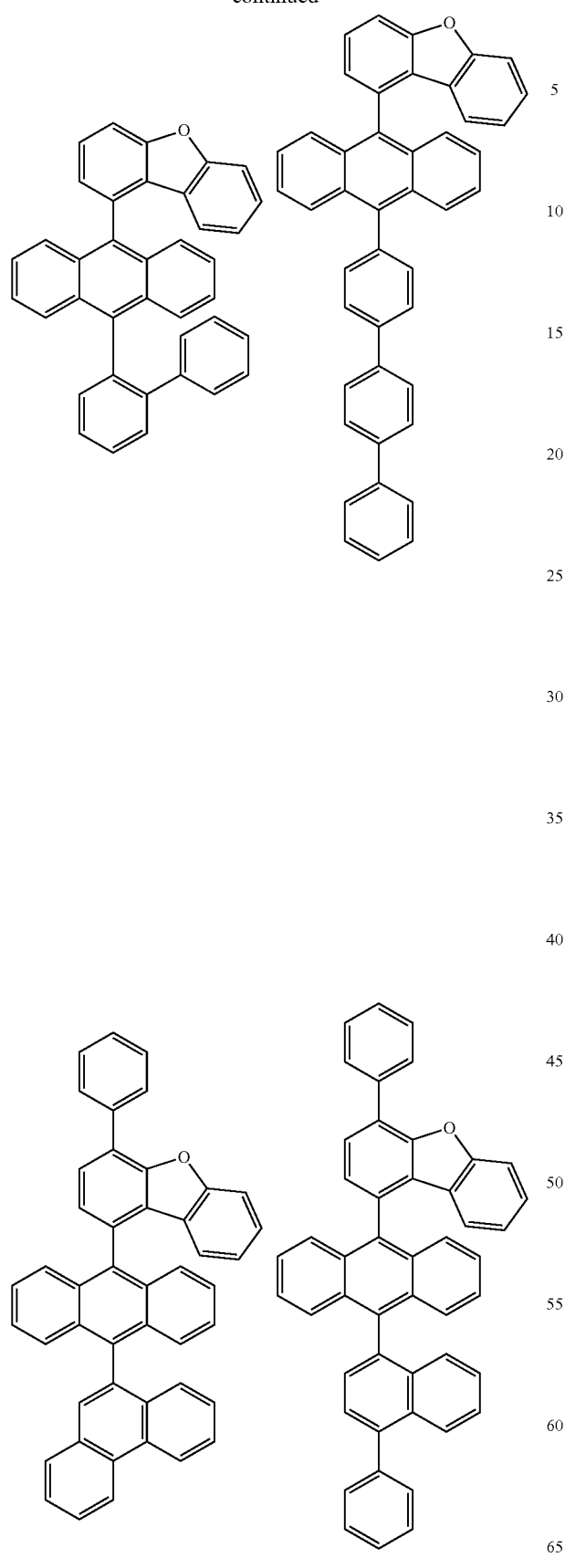
276
-continued
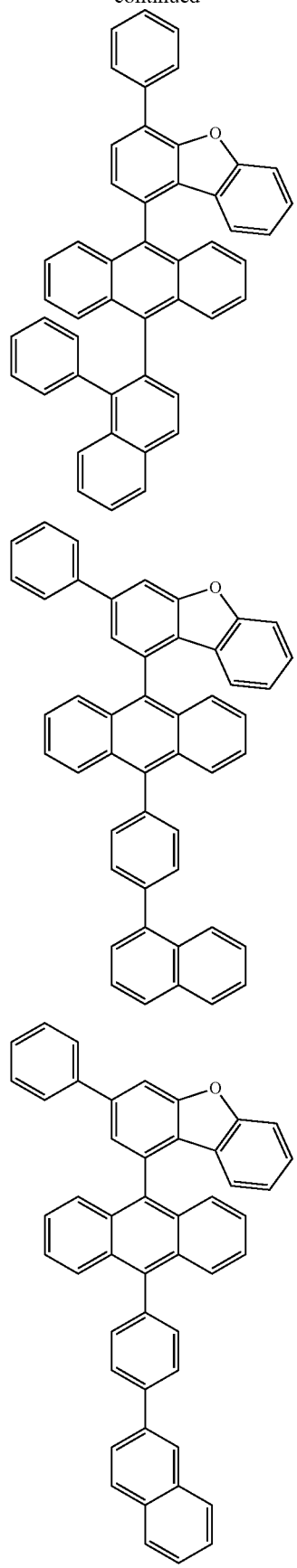

277
-continued
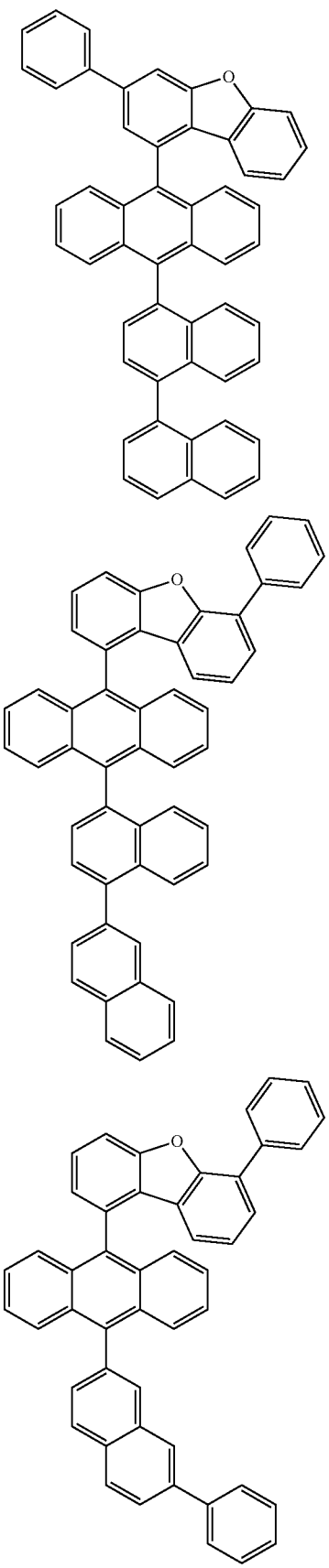
278
-continued
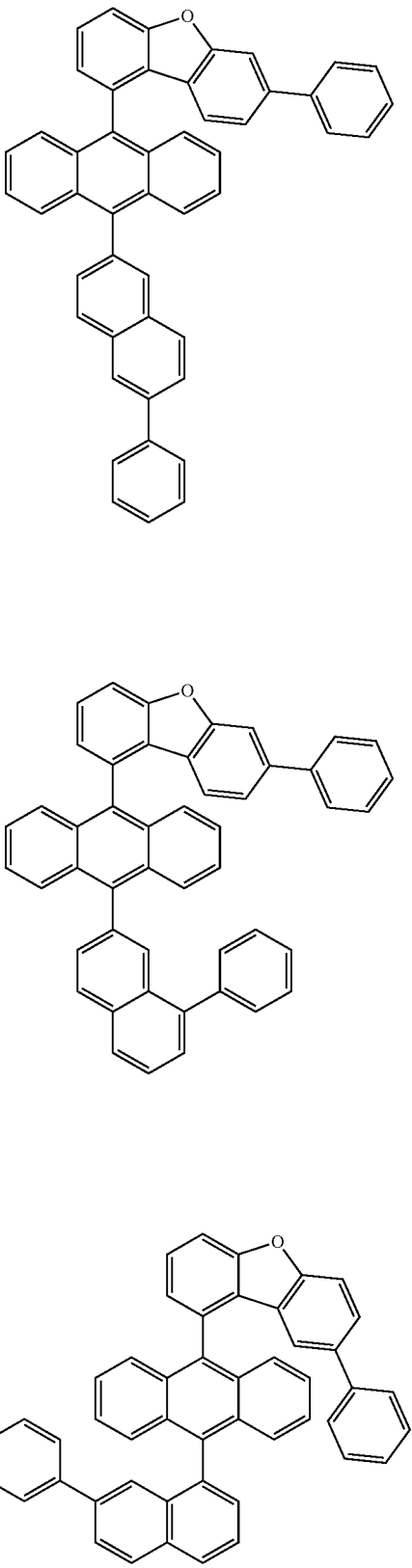

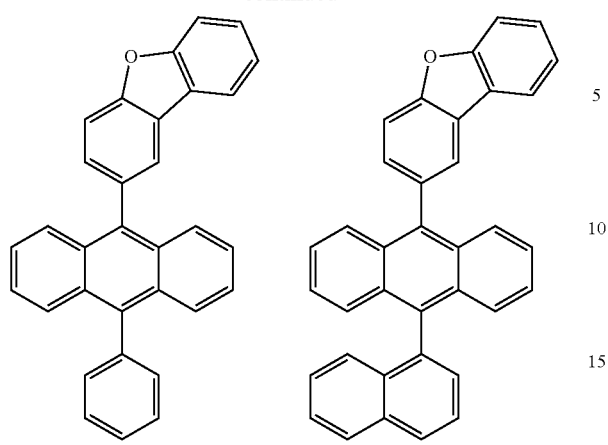
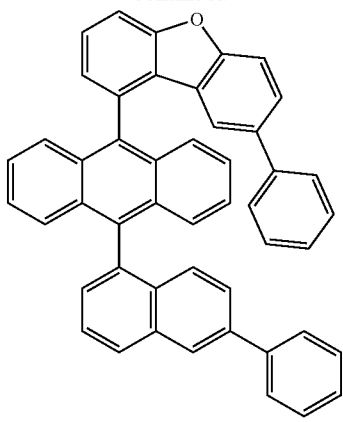
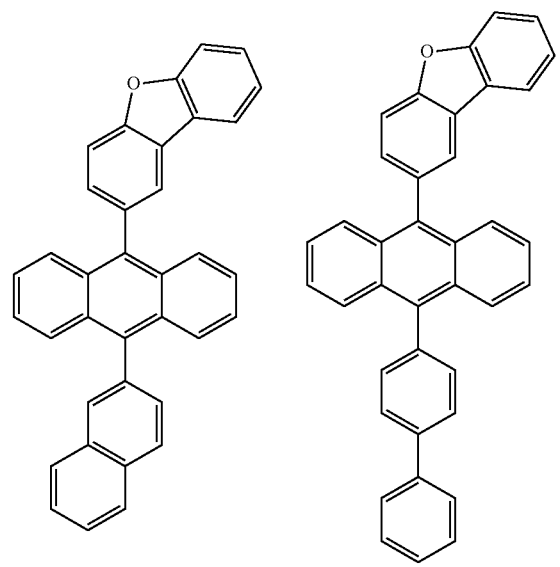
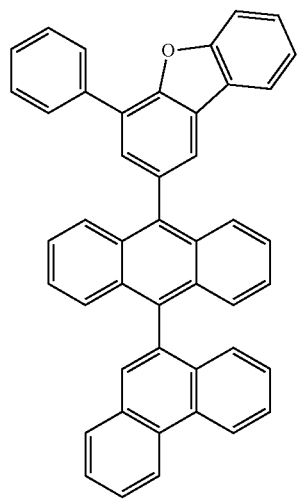
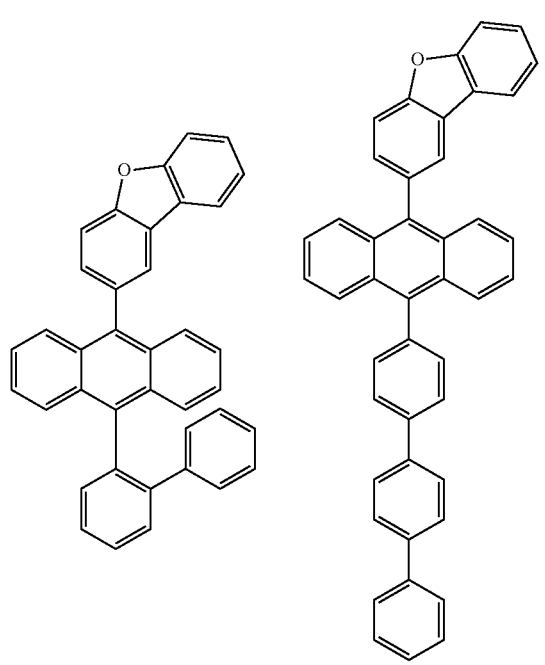
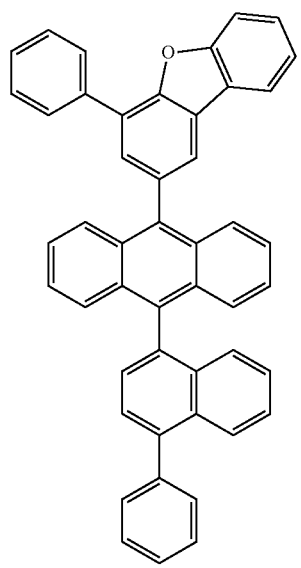

281
-continued
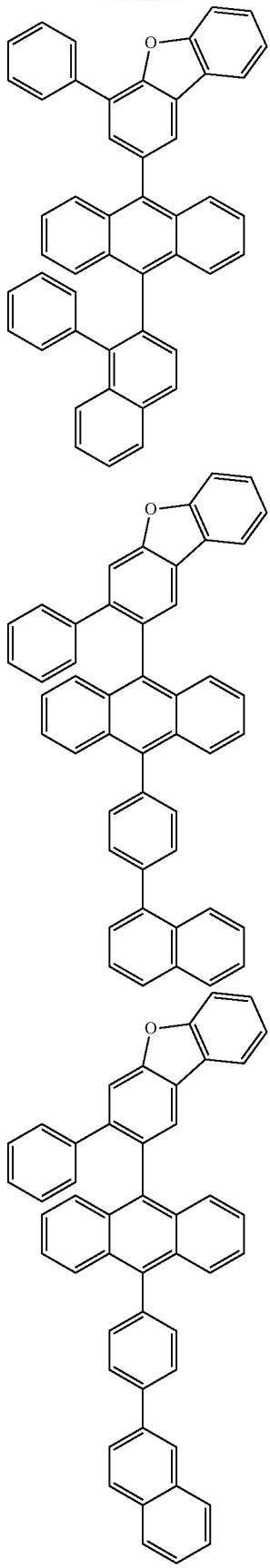
282
-continued
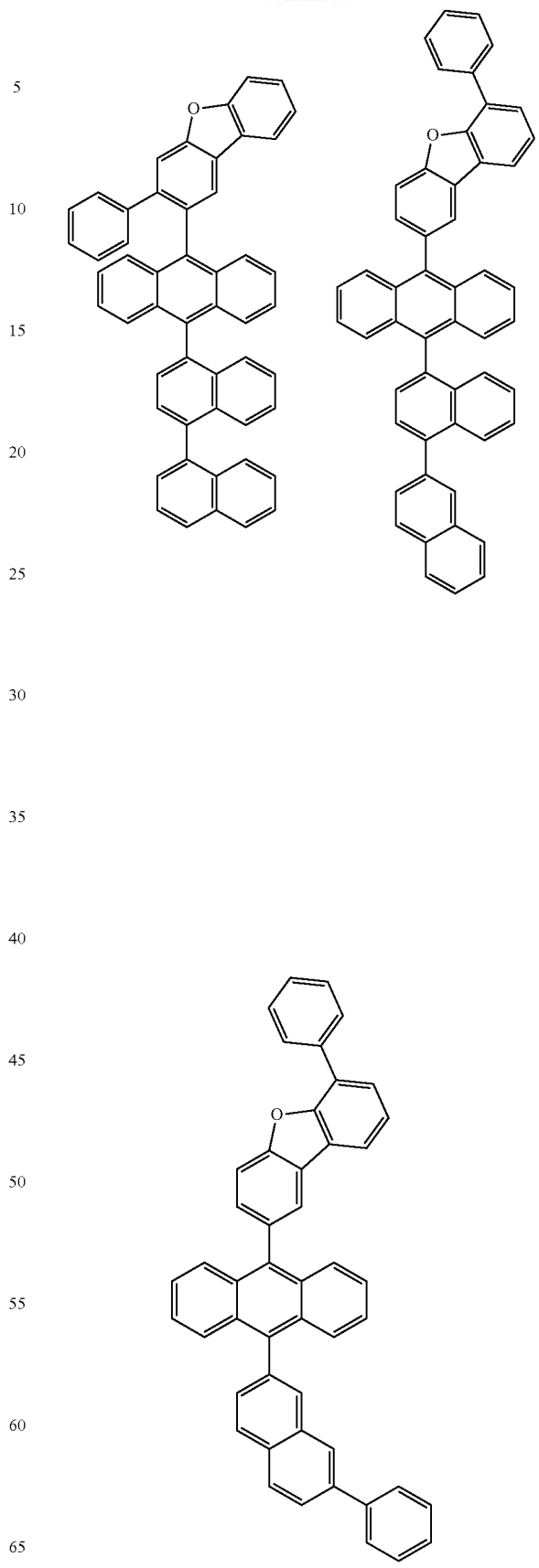

283
-continued
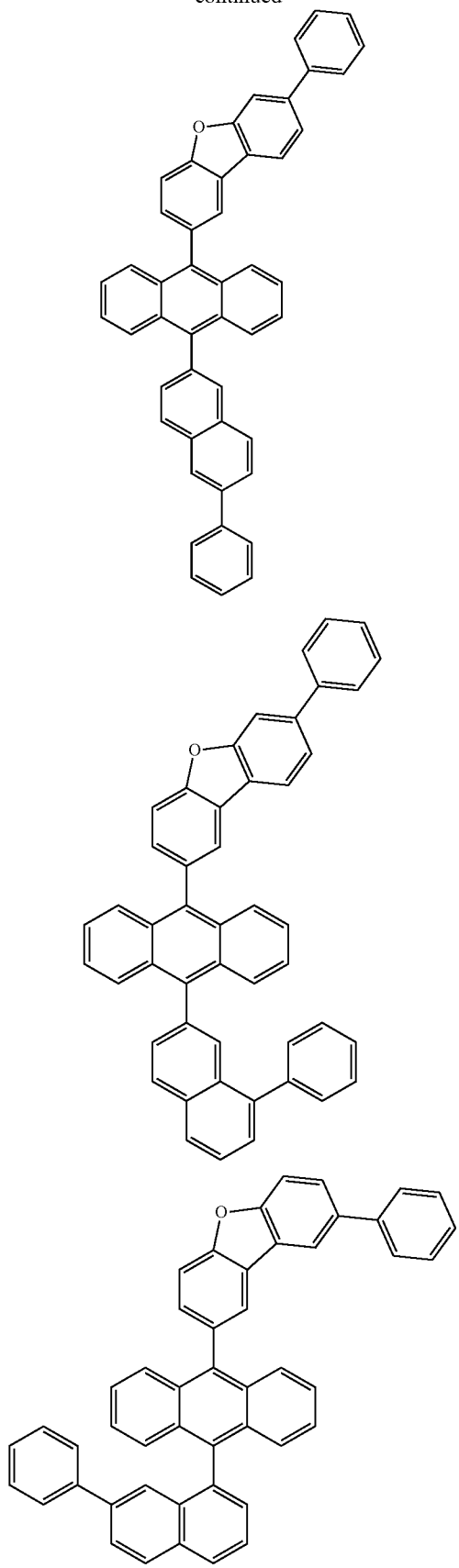
284
-continued
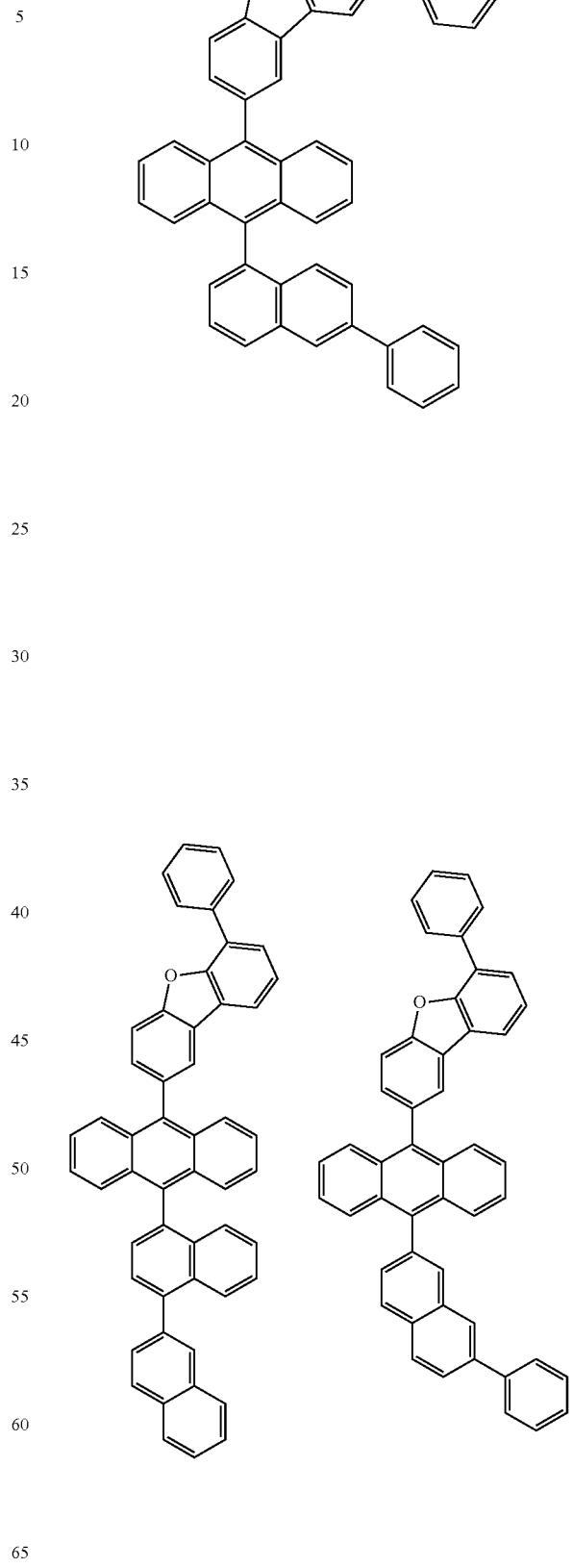

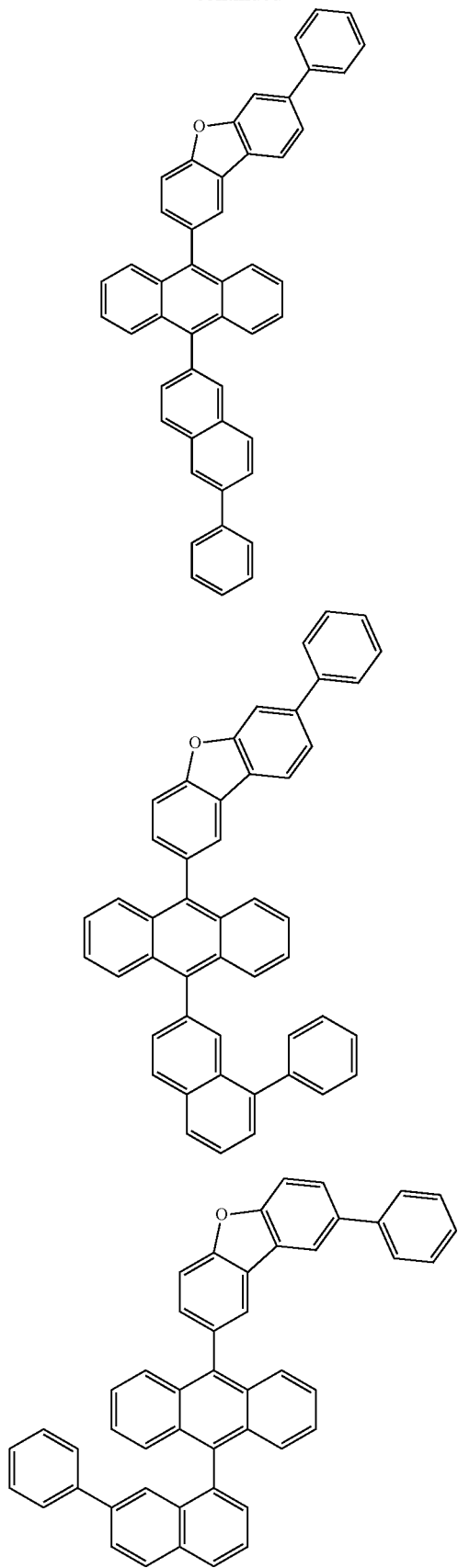
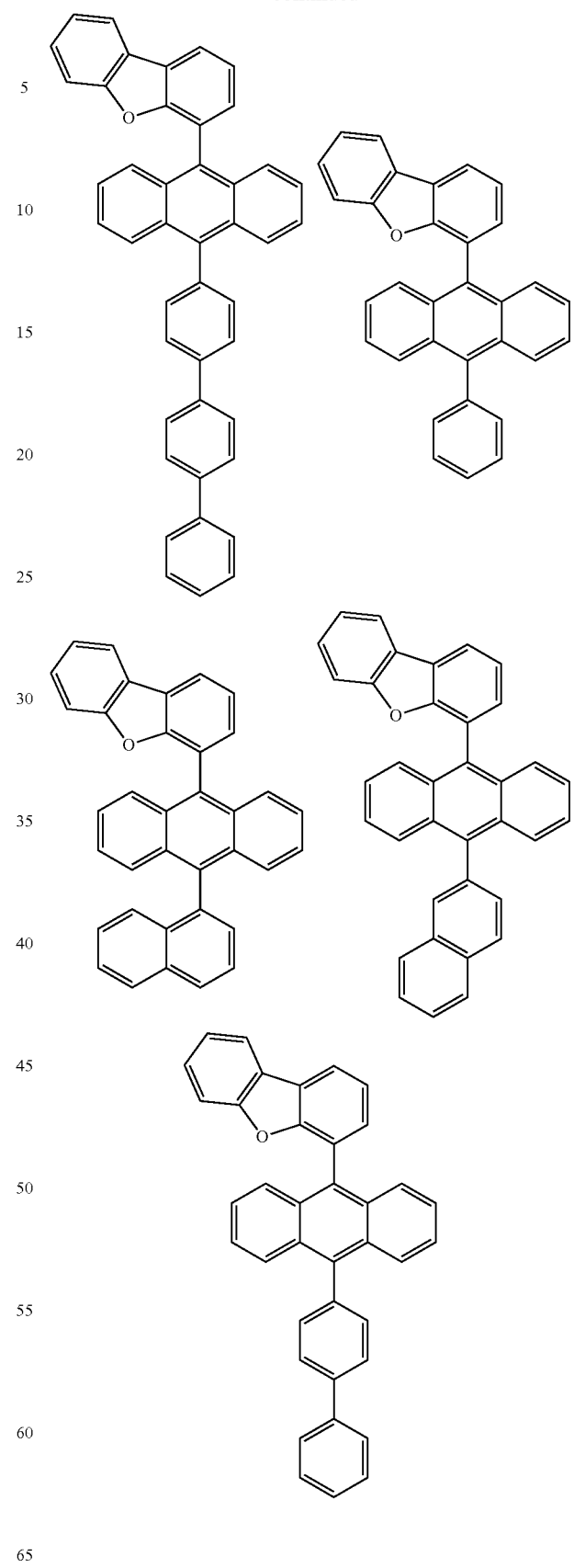

287
-continued
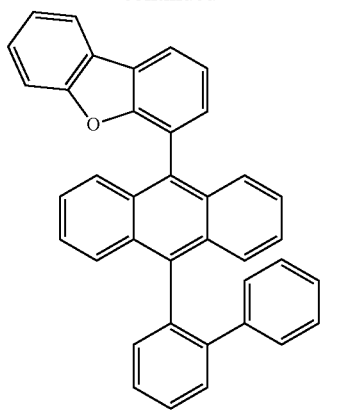
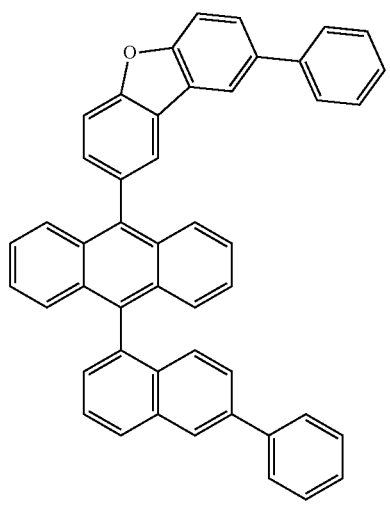
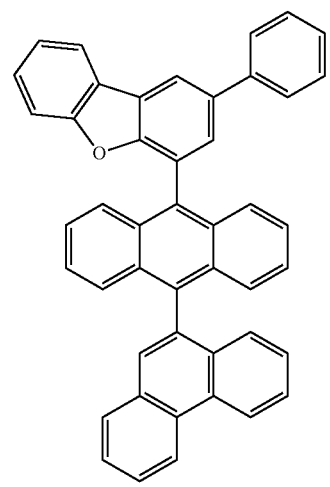
288
-continued
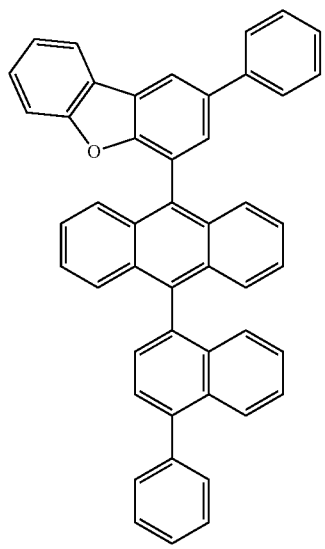
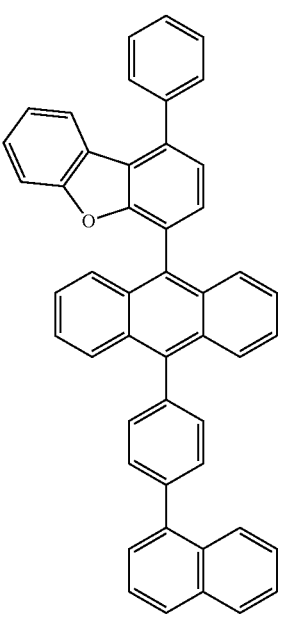

289
-continued
290
-continued
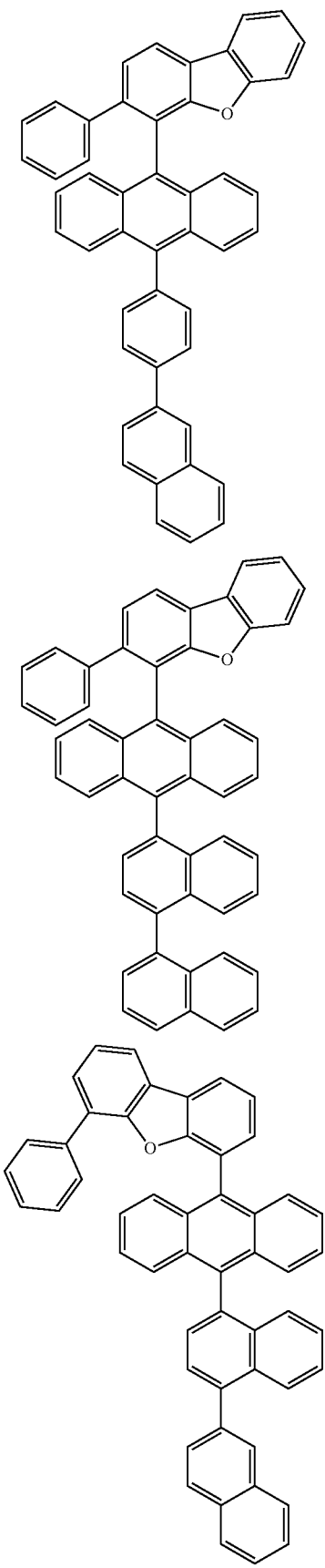
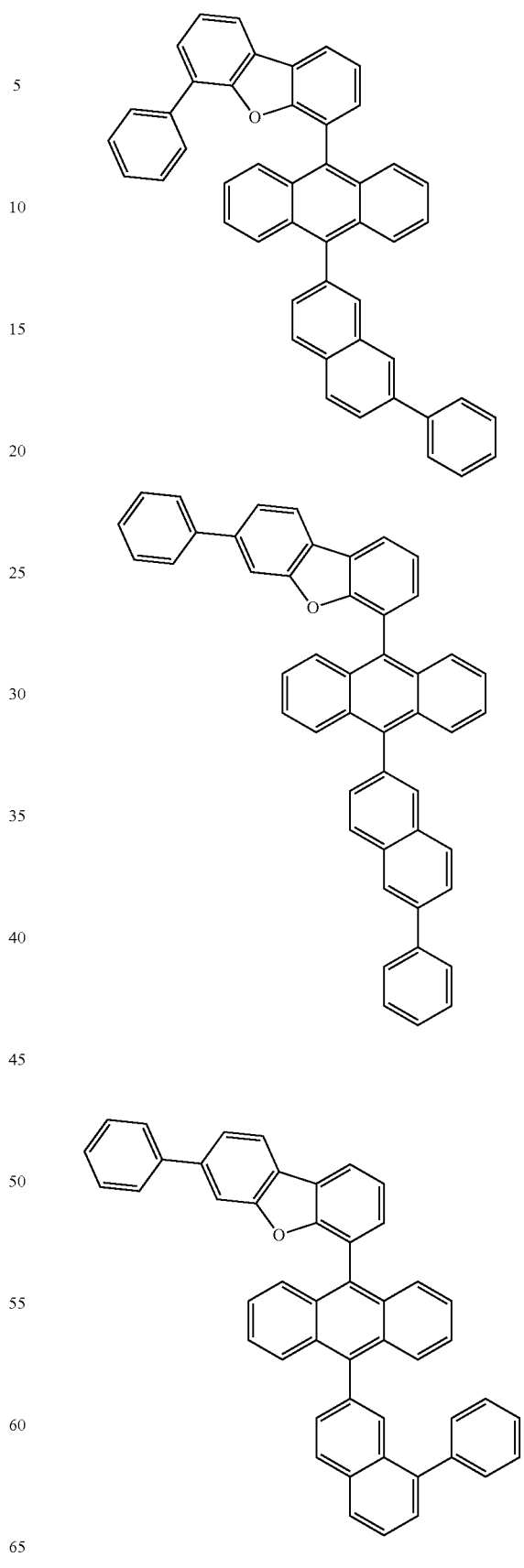

291
-continued
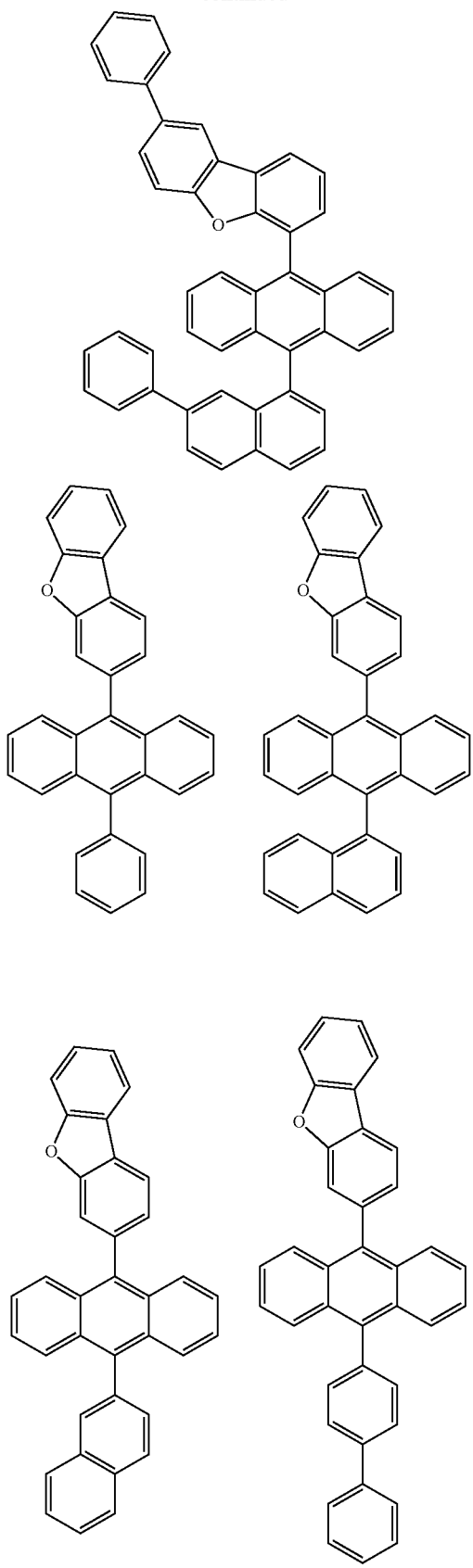
292
-continued
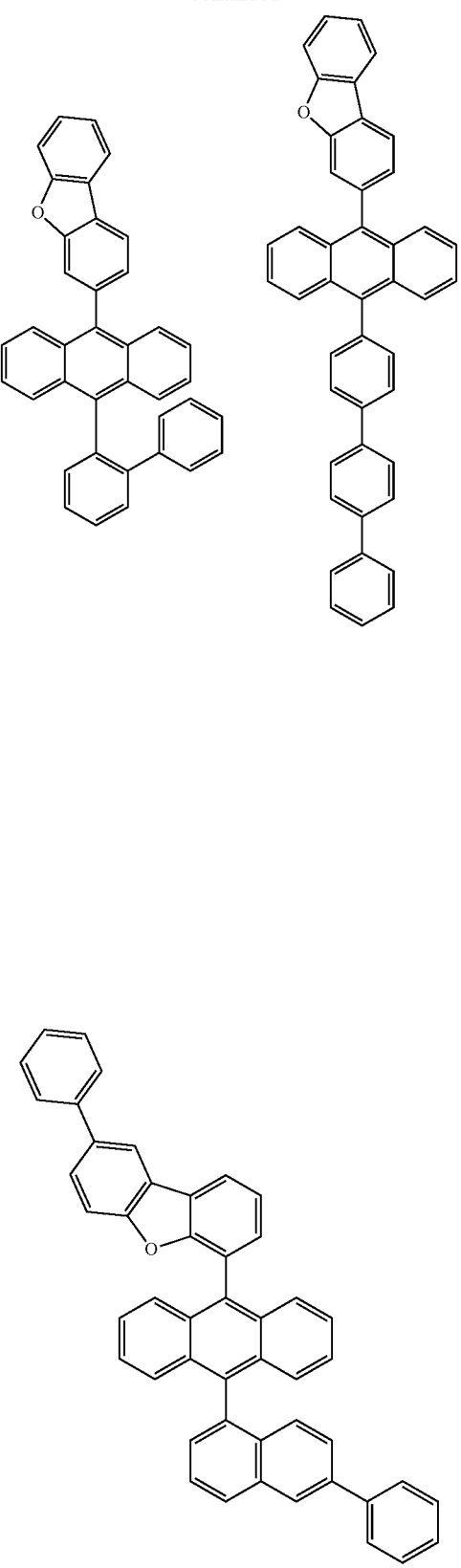

293
-continued
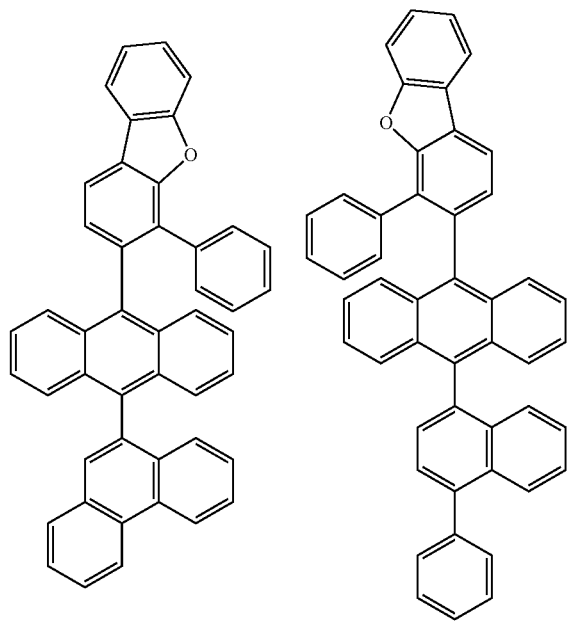
294
-continued
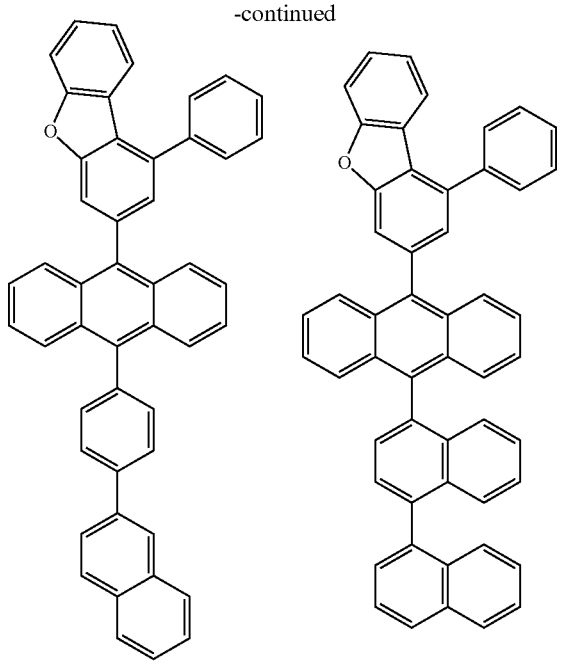
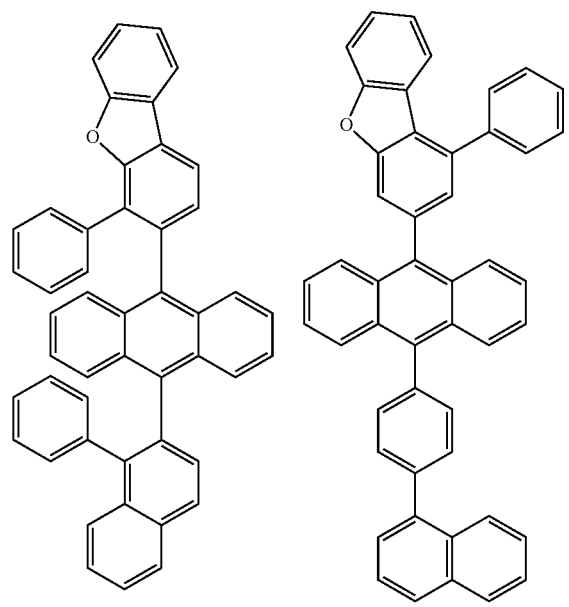
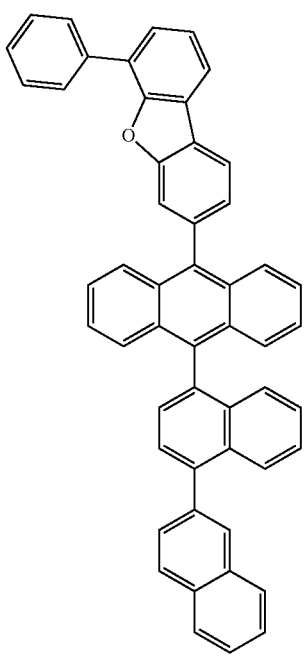

295
-continued
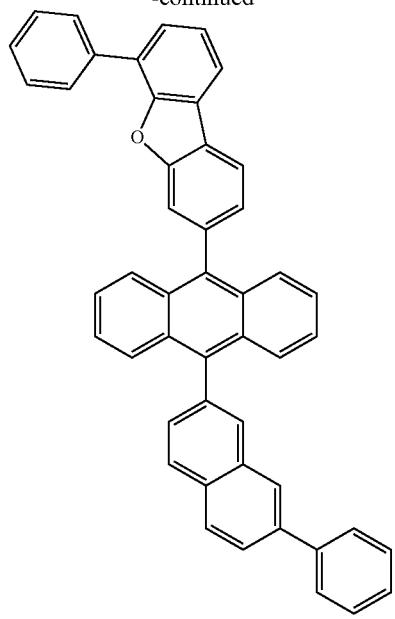
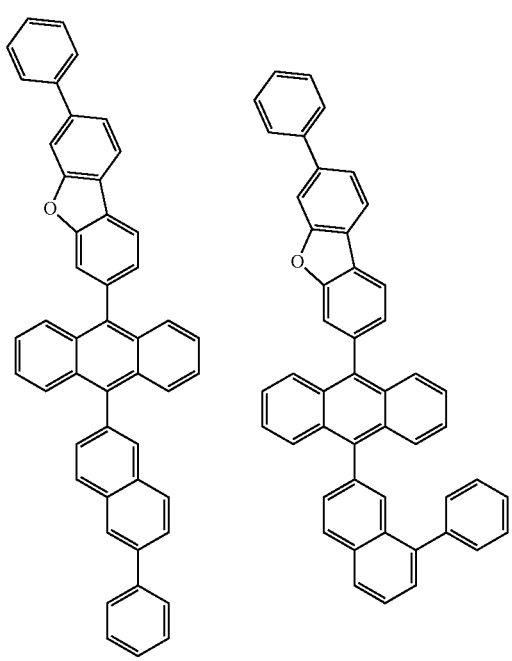
296
-continued
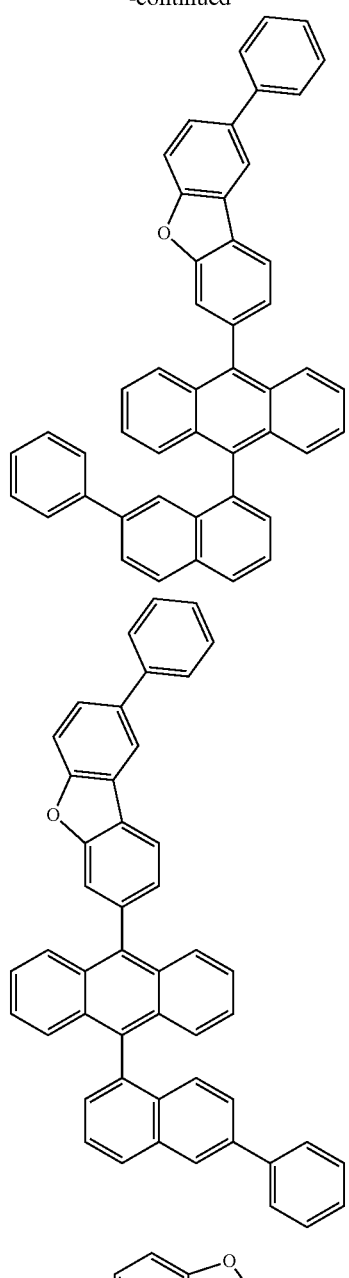
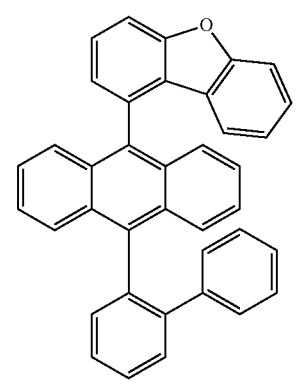

297
-continued
298
-continued
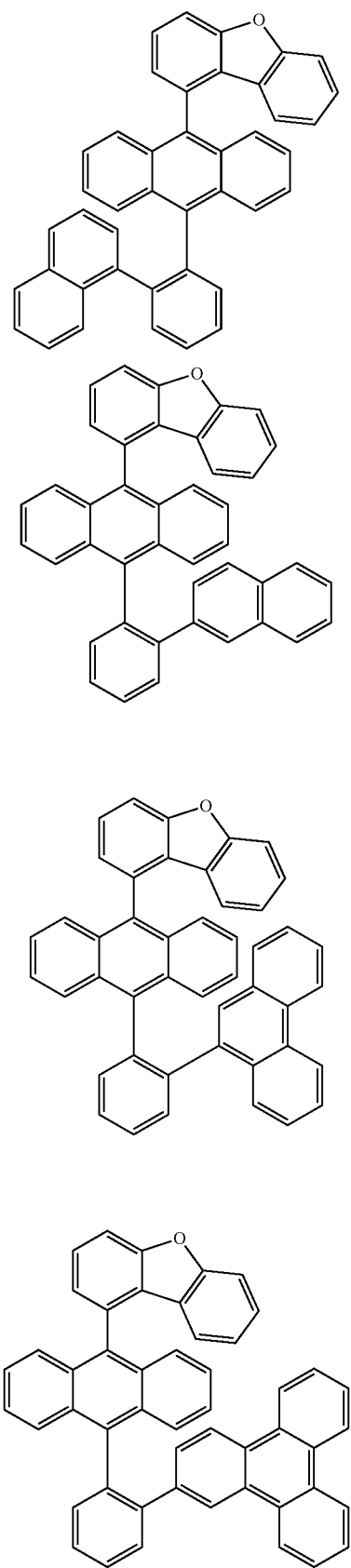
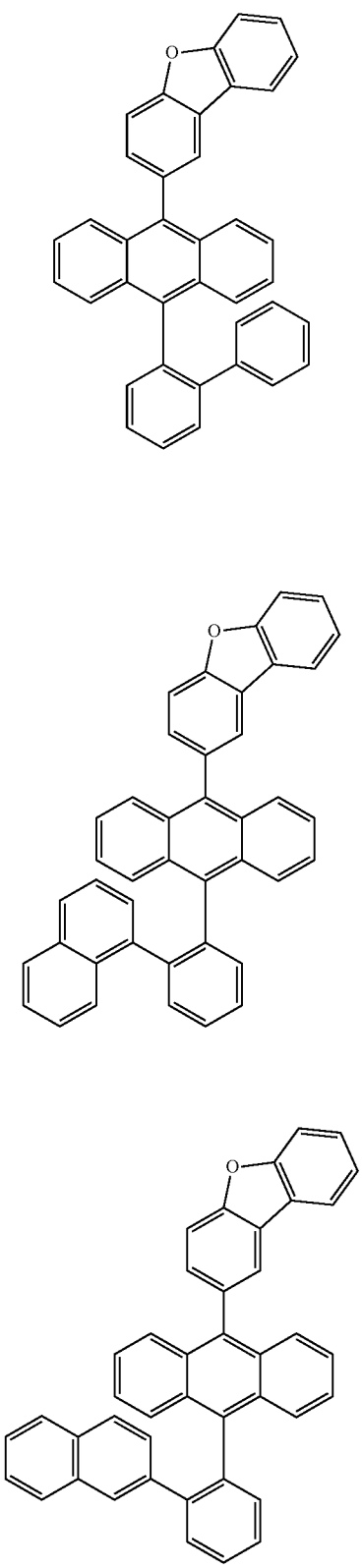

299
-continued
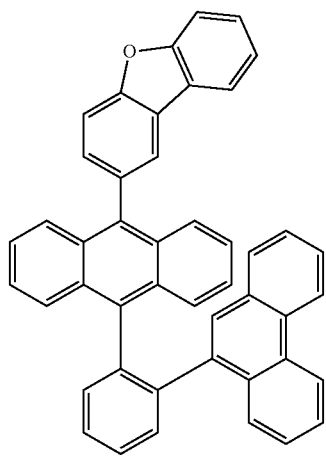
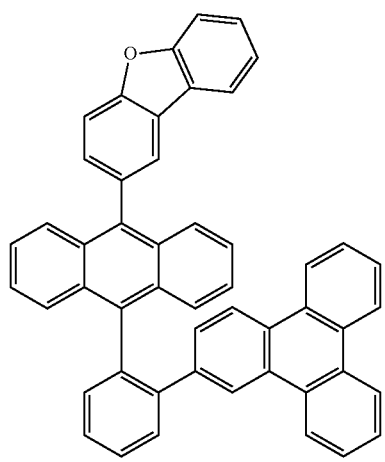
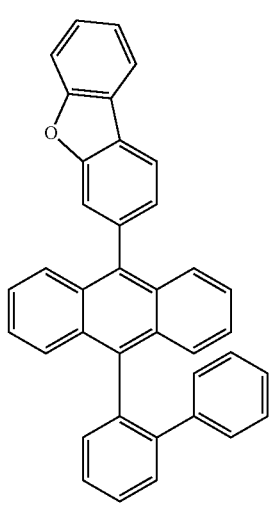
300
-continued
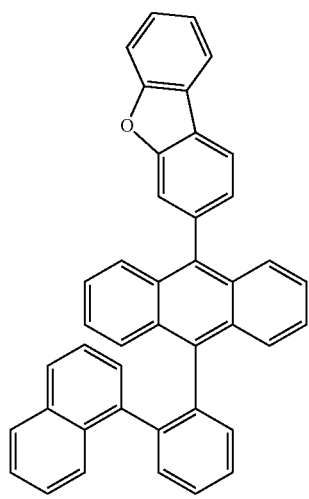
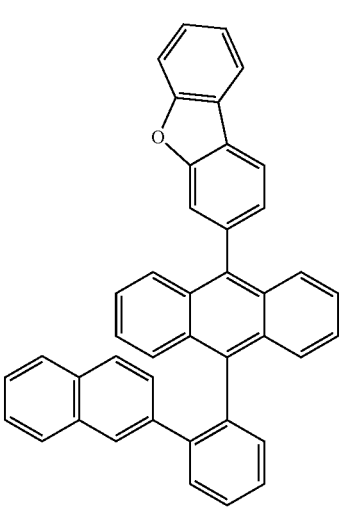
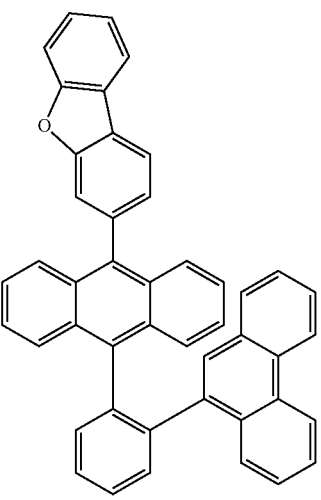

301
-continued
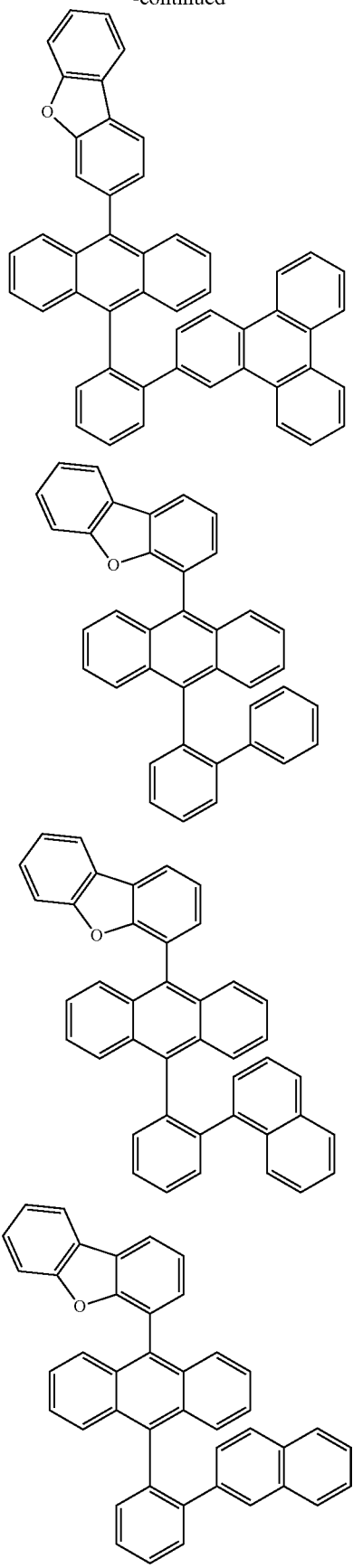
302
-continued
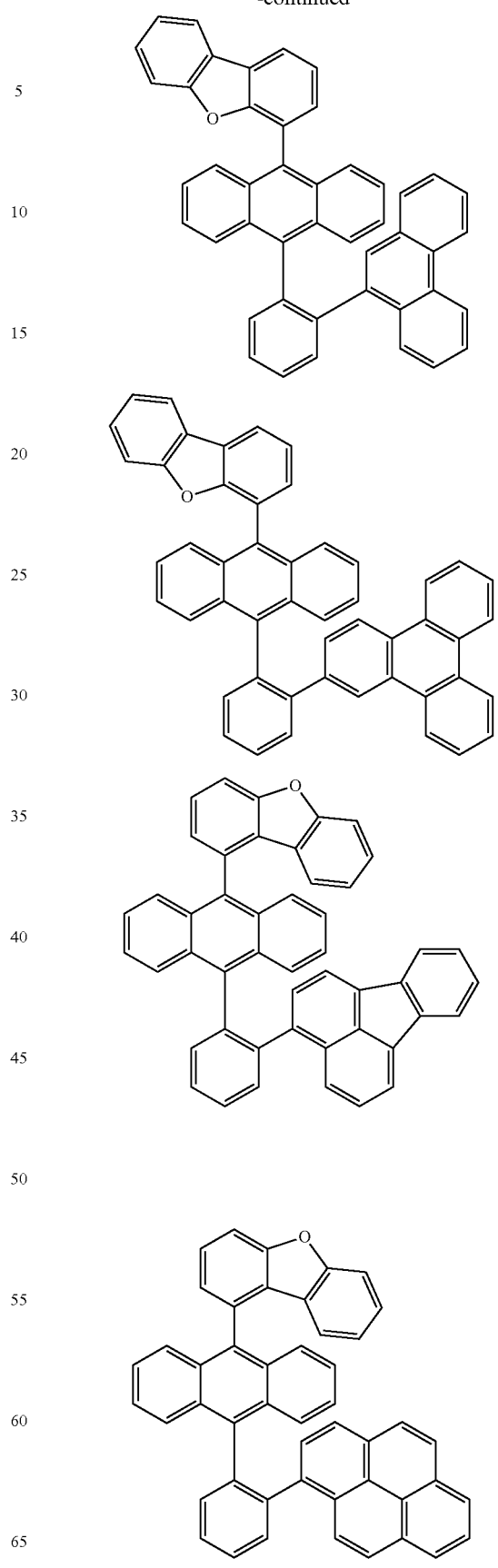

| 303 -continued | 304 -continued |
|---|---|
| 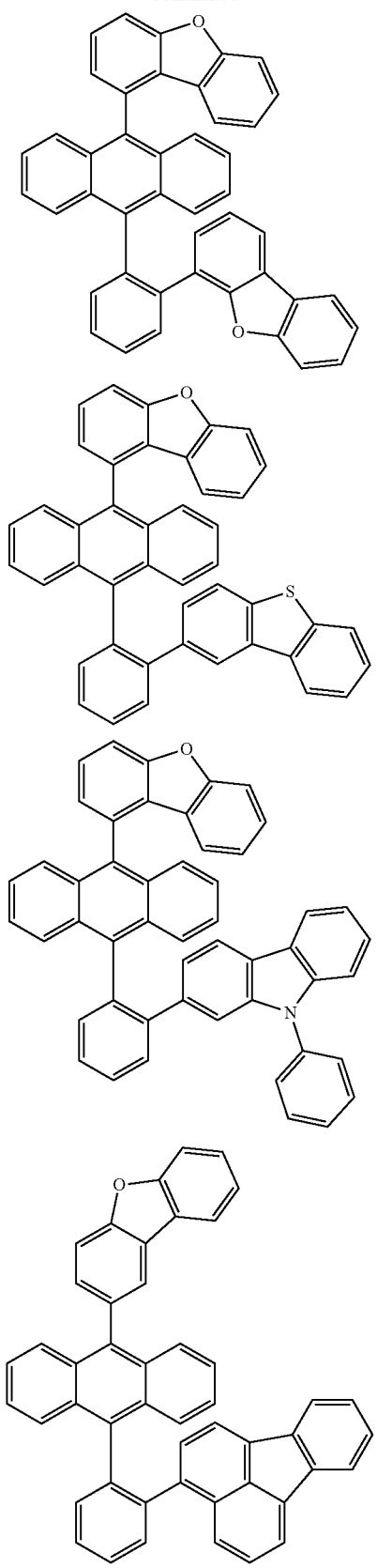 | 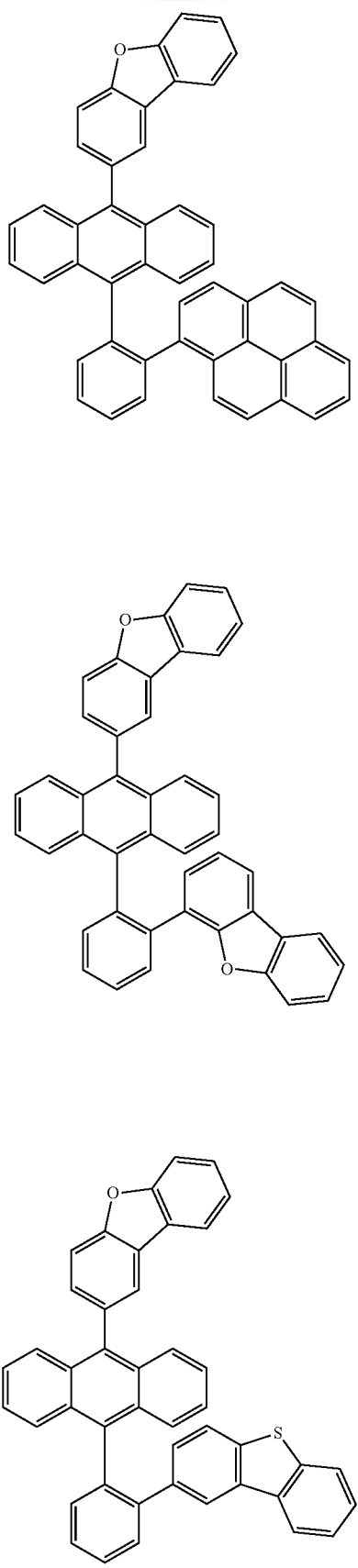 |

305
-continued
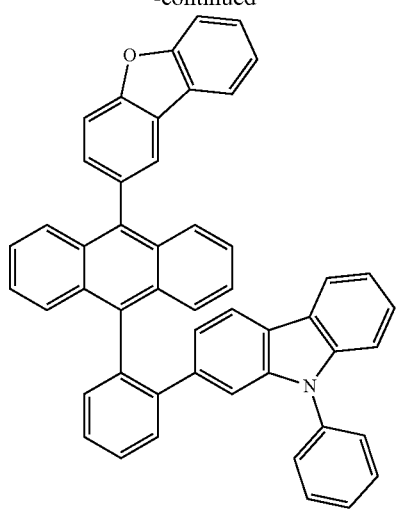
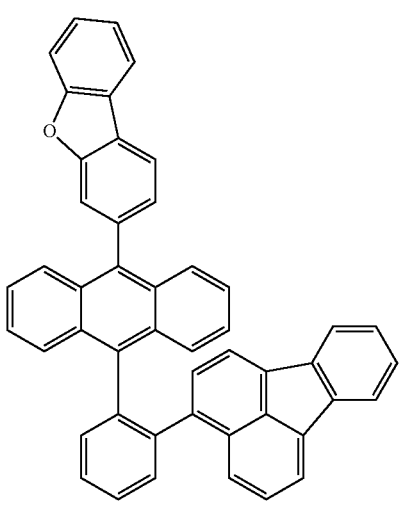
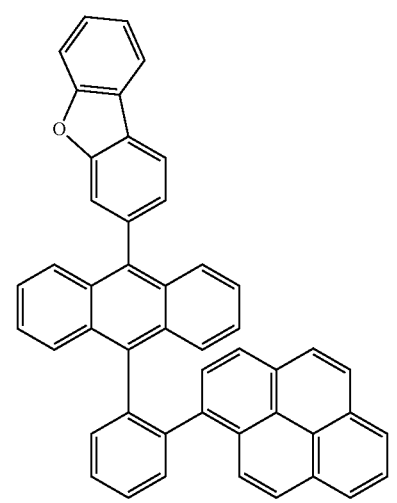
306
-continued
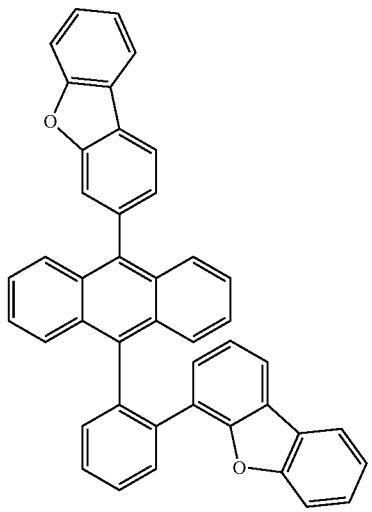
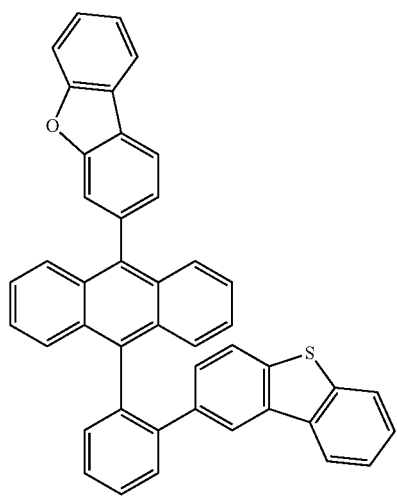
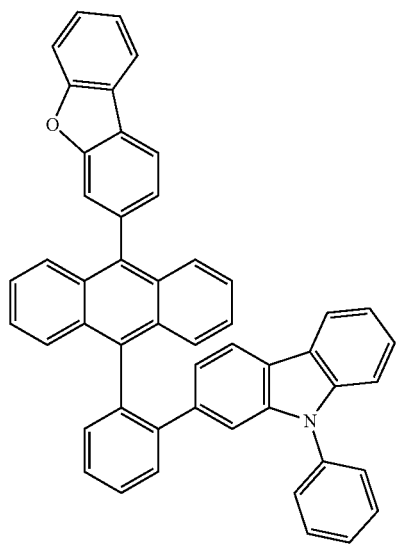

307
-continued
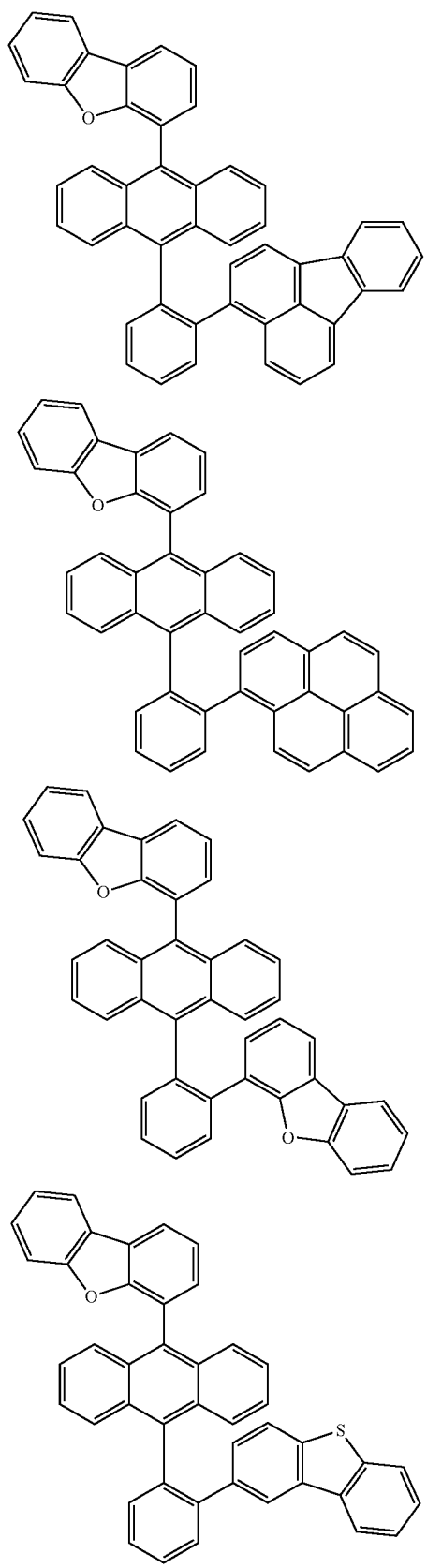
308
-continued
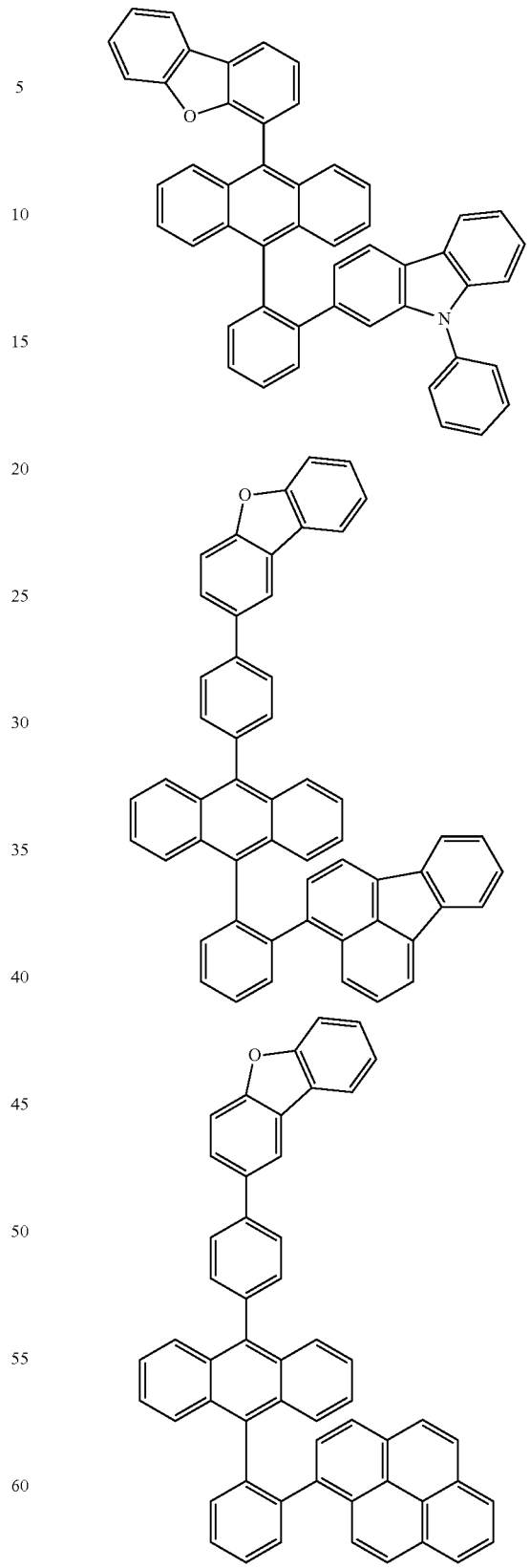

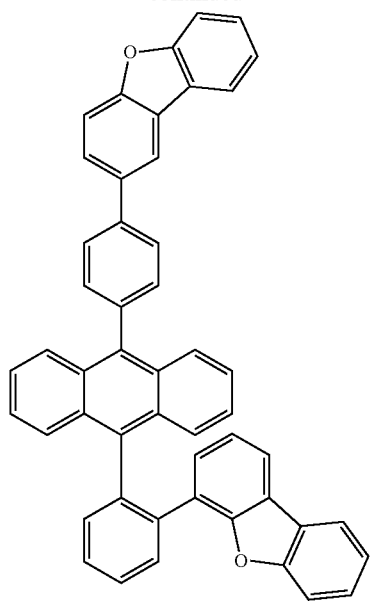
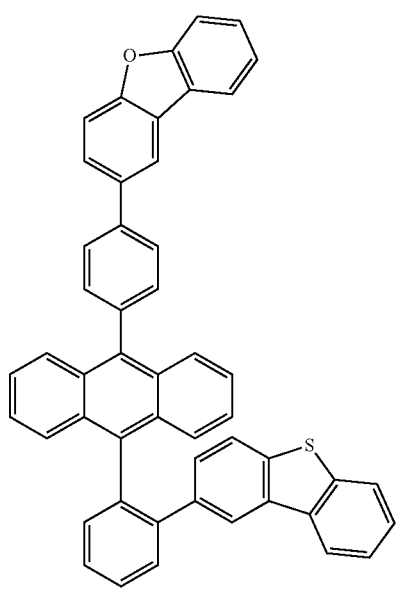
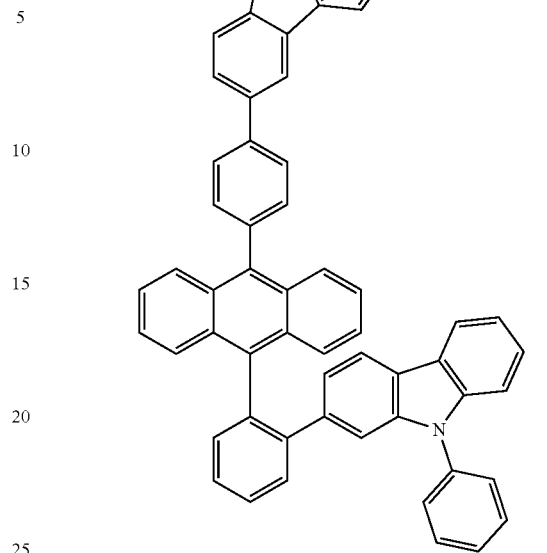
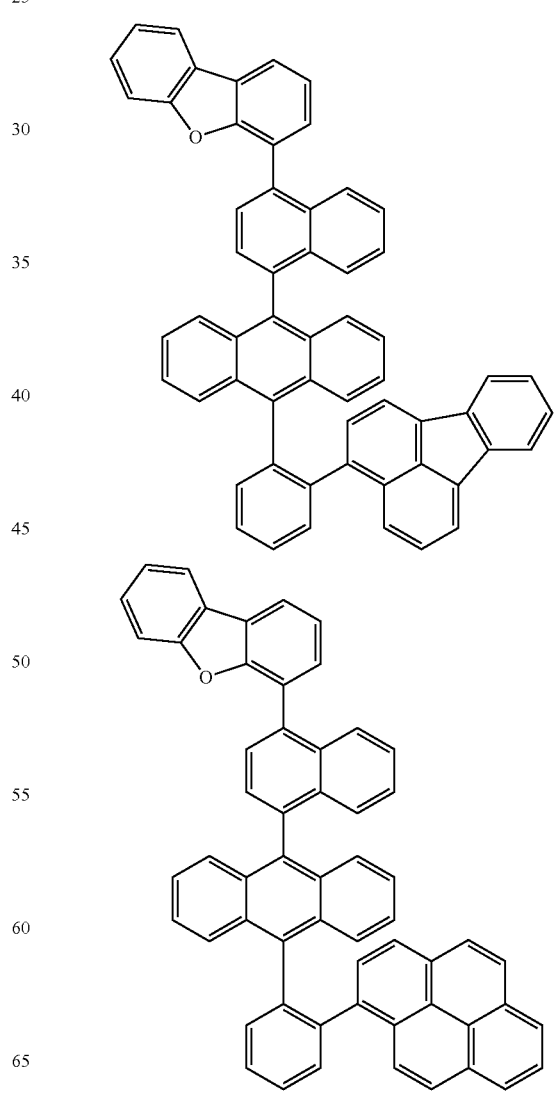

311
-continued
312
-continued
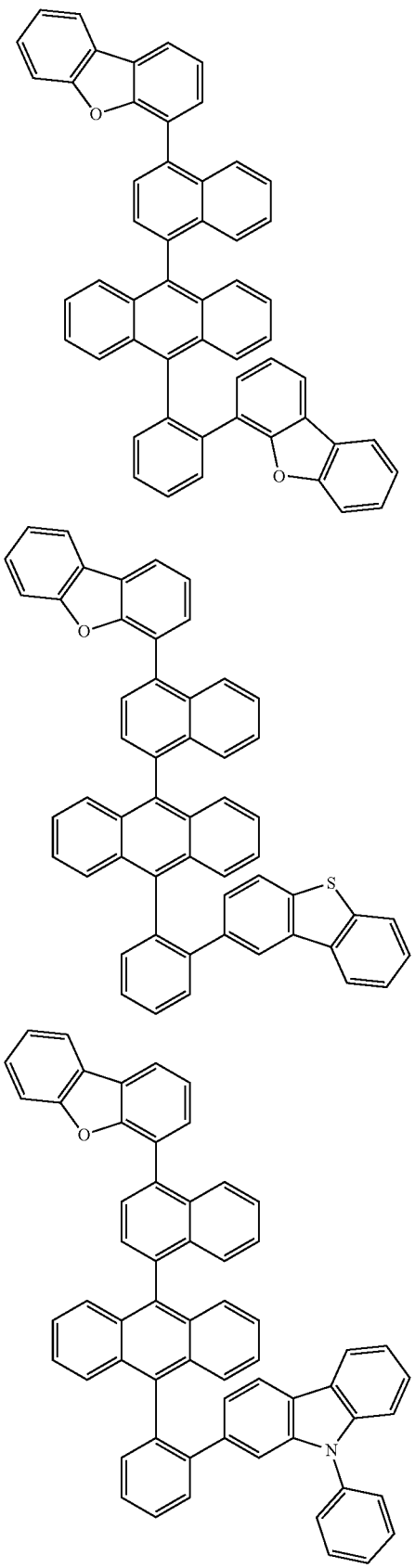
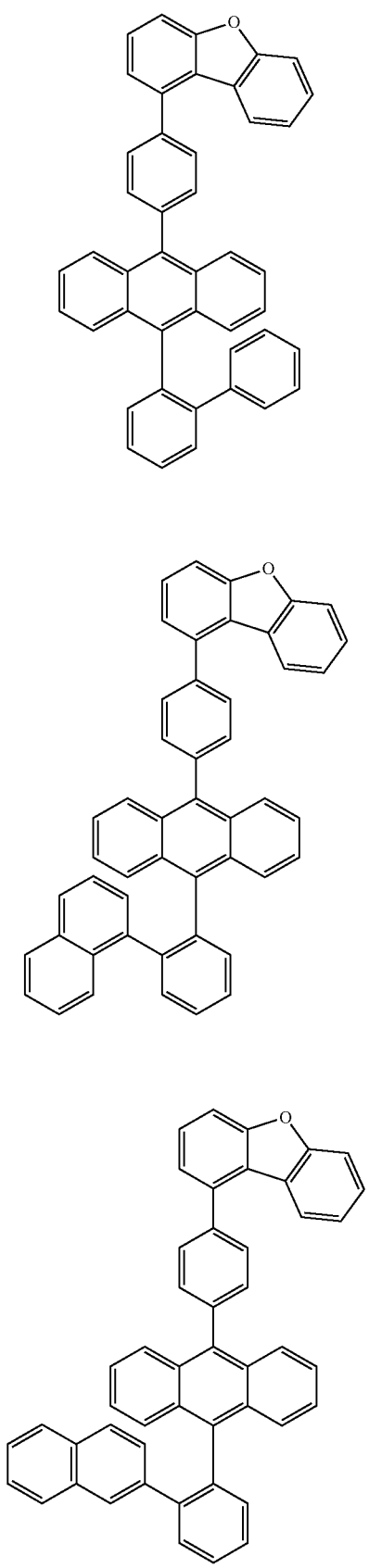

313
-continued
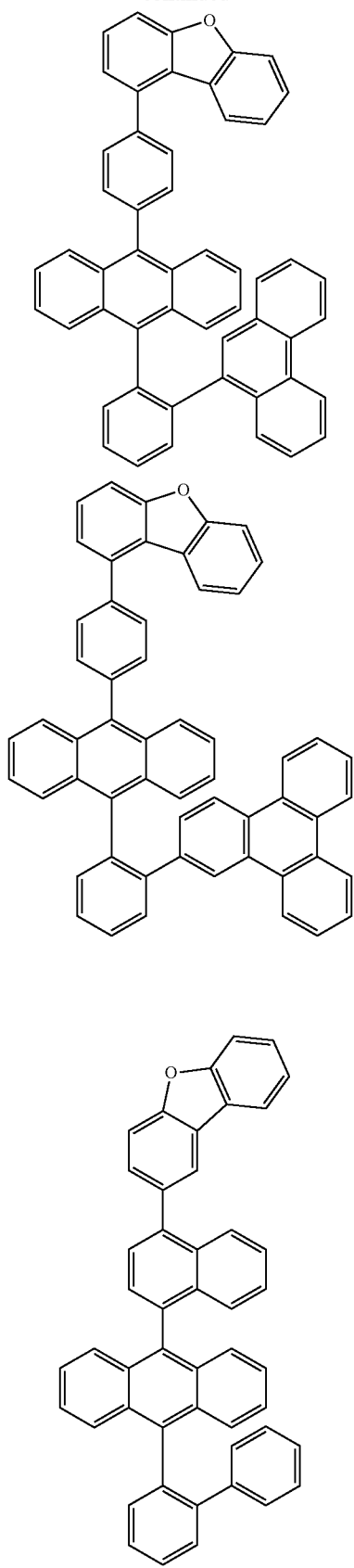
314
-continued

315
-continued
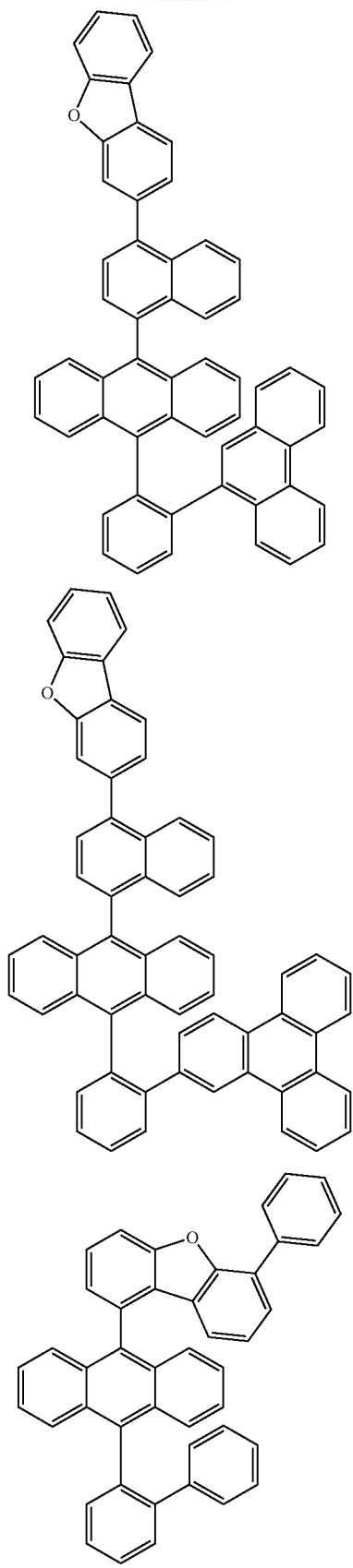
316
-continued
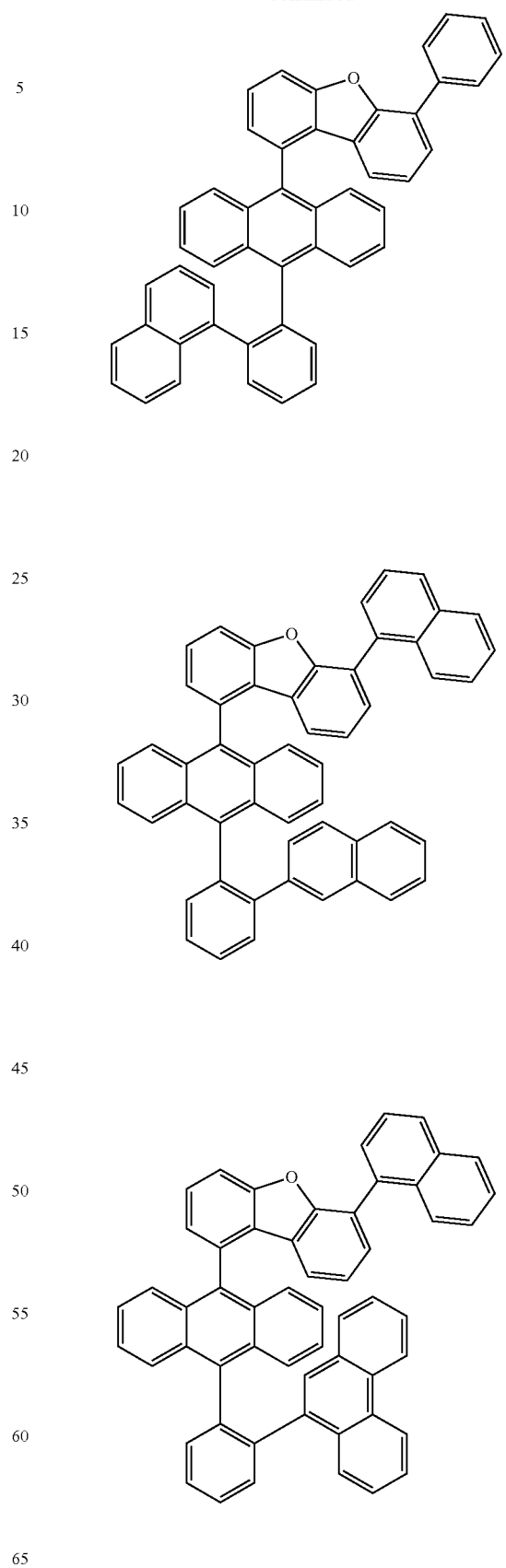

-continued
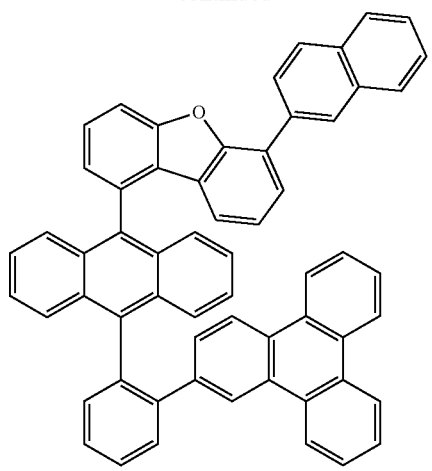
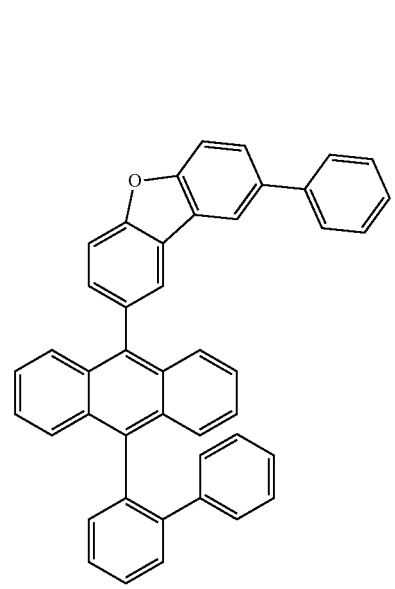
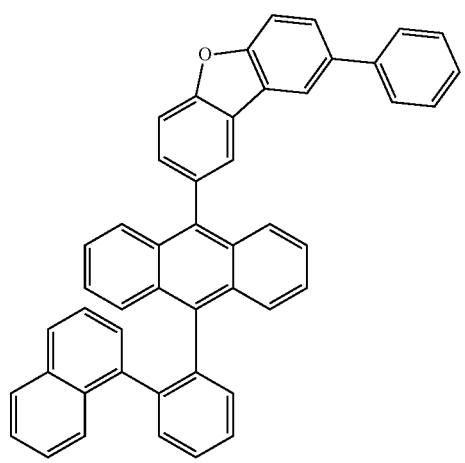
-continued
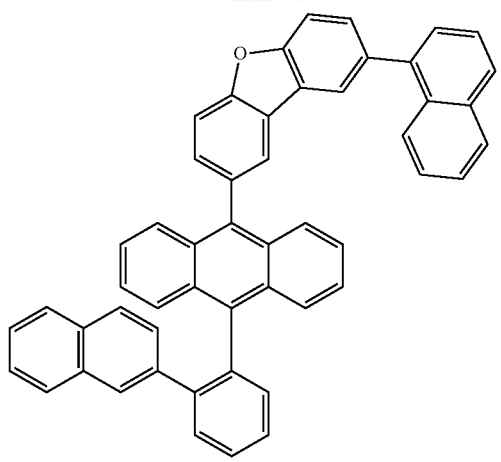
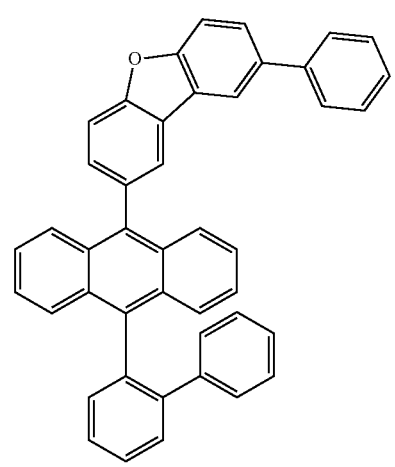
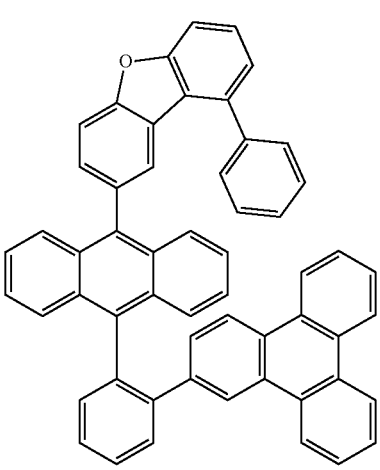

319
-continued
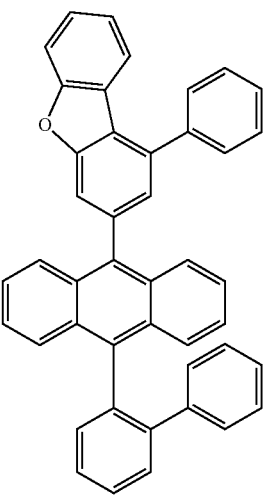
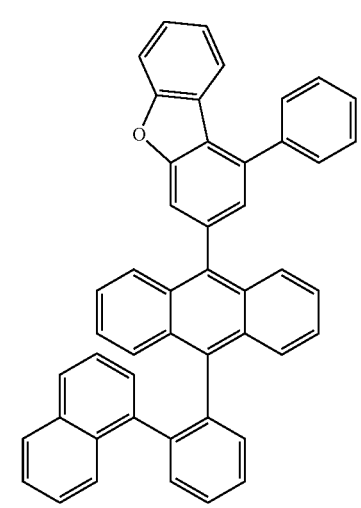
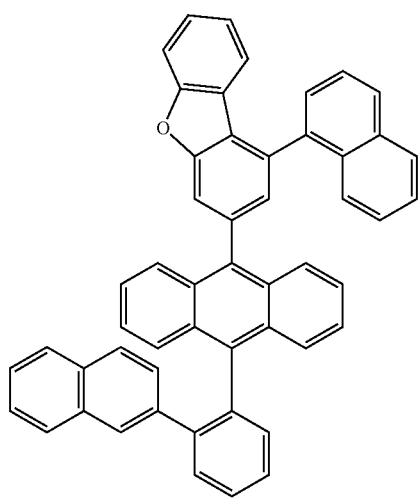
320
-continued
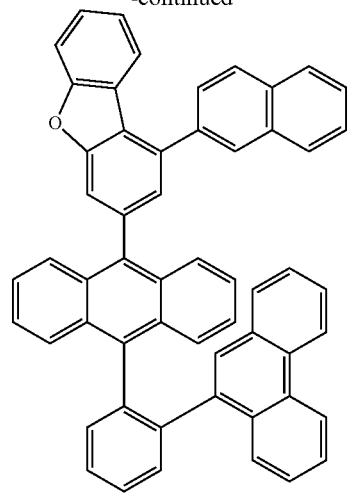
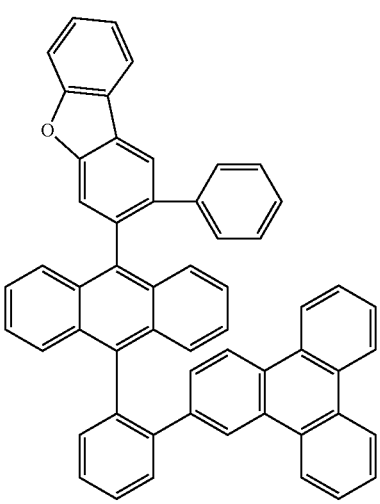
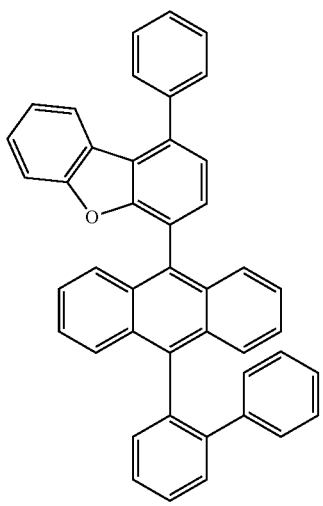

321
-continued
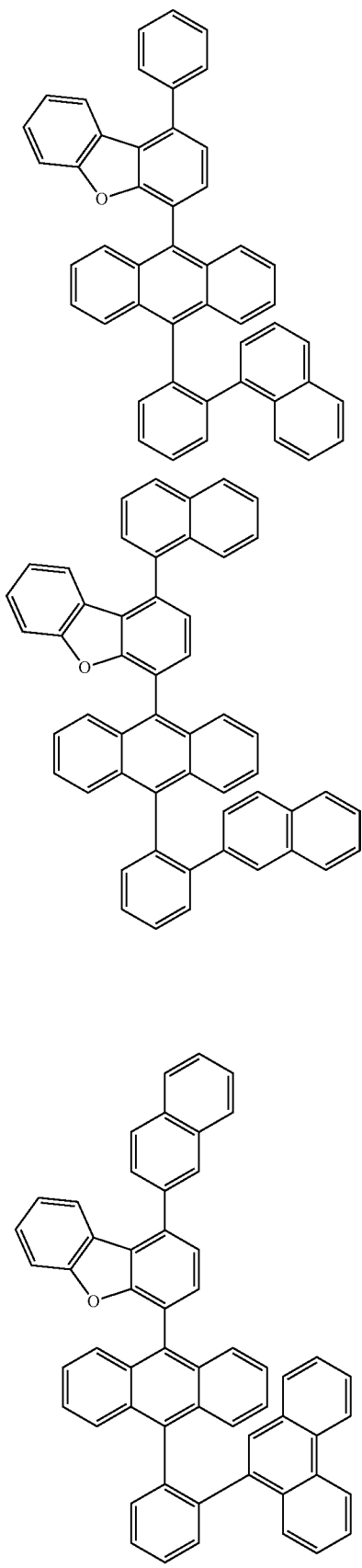
322
-continued
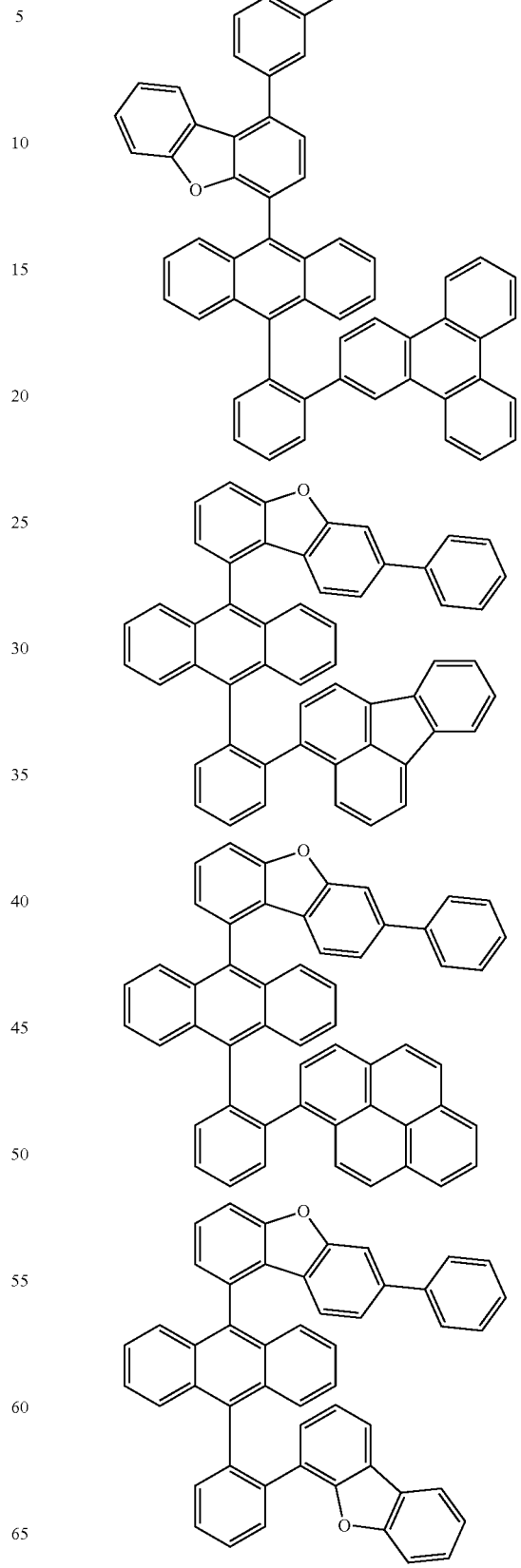

323
-continued
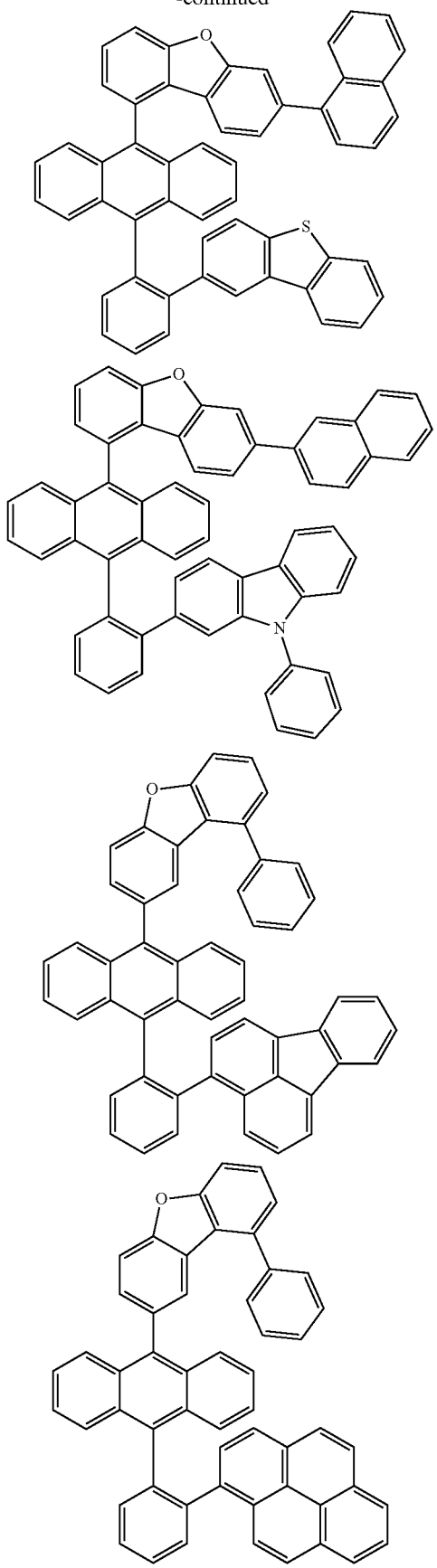
324
-continued
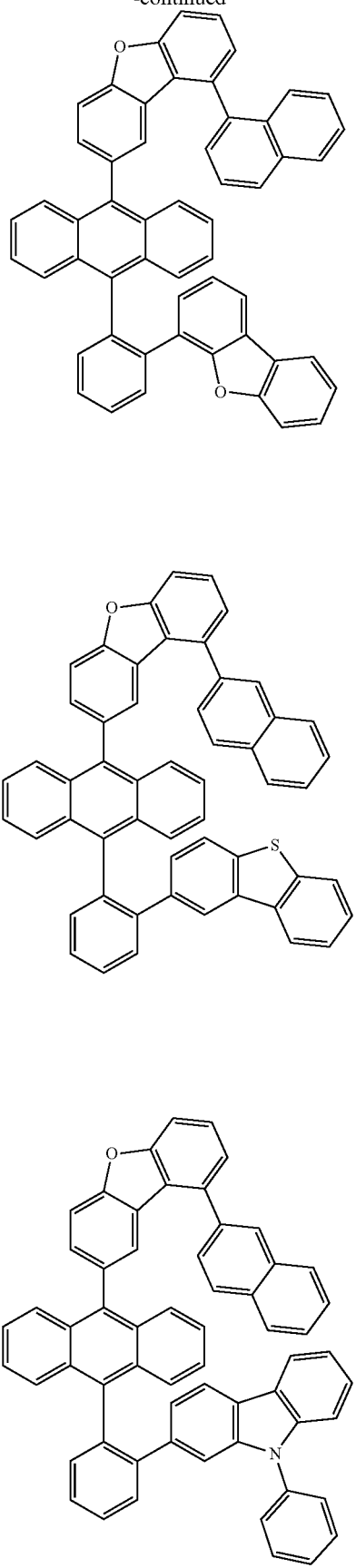

325
-continued
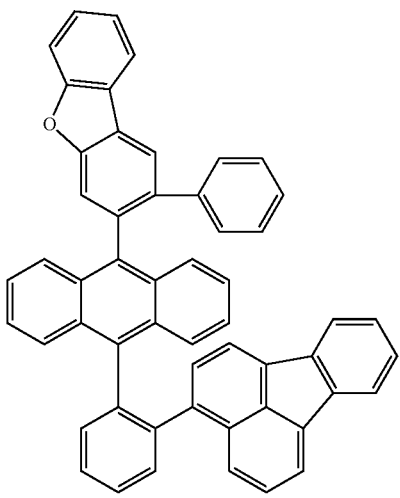
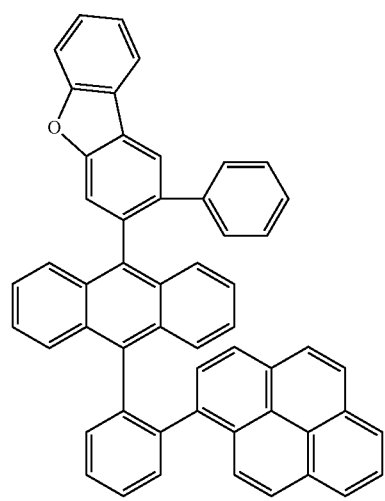
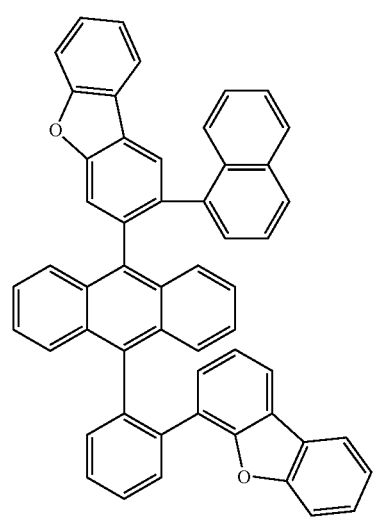
326
-continued
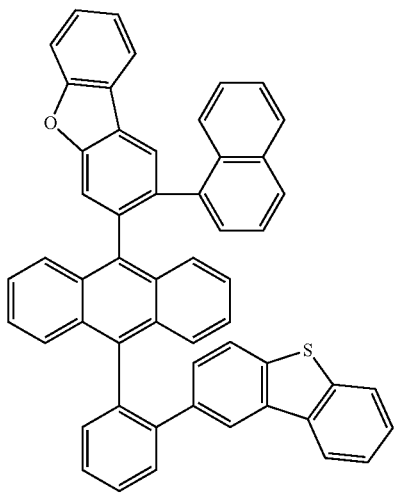
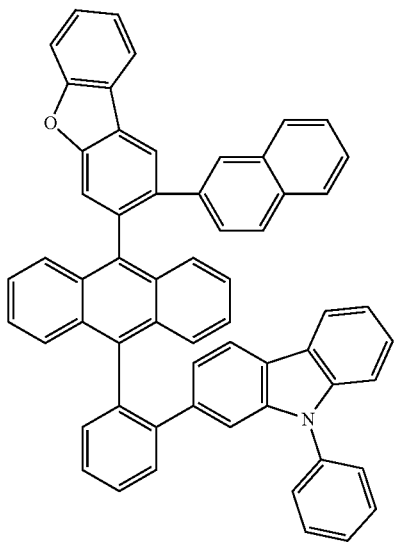
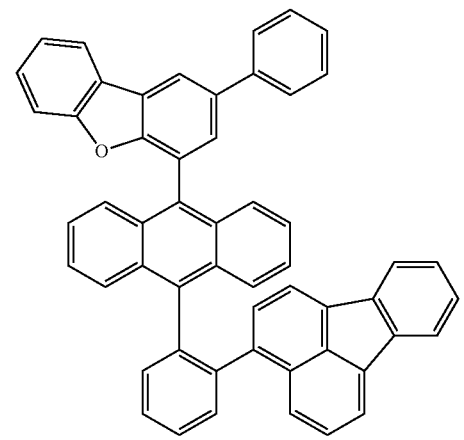

327
-continued
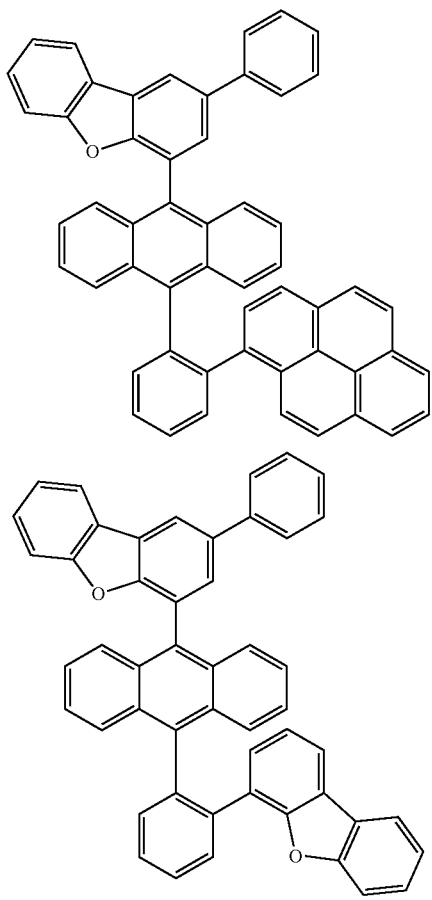
328
-continued
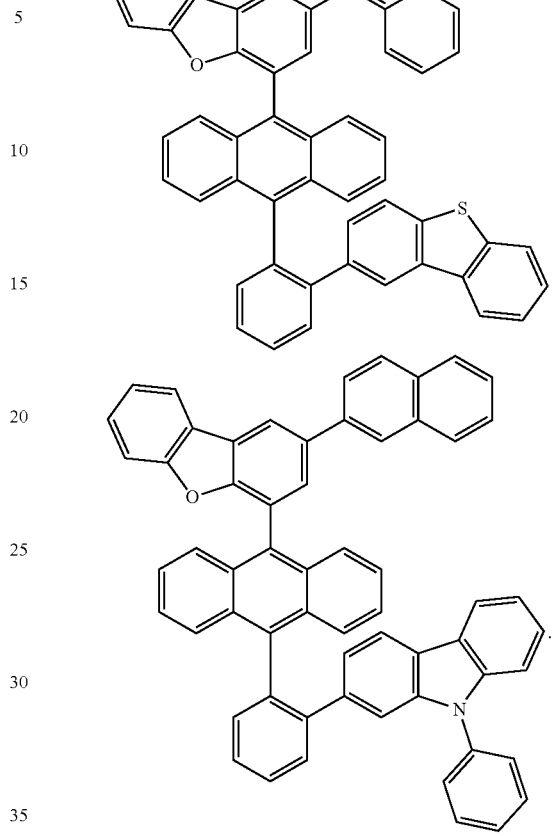
* * * * *